US010546841B2

(12) United States Patent
Rogers et al.

(10) Patent No.: US 10,546,841 B2
(45) Date of Patent: Jan. 28, 2020

(54) PRINTED ASSEMBLIES OF ULTRATHIN, MICROSCALE INORGANIC LIGHT EMITTING DIODES FOR DEFORMABLE AND SEMITRANSPARENT DISPLAYS

(71) Applicant: The Board of Trustees of the University of Illinois, Urbana, IL (US)

(72) Inventors: John A. Rogers, Champaign, IL (US); Ralph Nuzzo, Champaign, IL (US); Hoon-sik Kim, Champaign, IL (US); Eric Brueckner, Champaign, IL (US); Sang Il Park, Savoy, IL (US); Rak Hwan Kim, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 15/470,780

(22) Filed: Mar. 27, 2017

(65) Prior Publication Data
US 2017/0200707 A1    Jul. 13, 2017

Related U.S. Application Data

(63) Continuation of application No. 14/479,100, filed on Sep. 5, 2014, now Pat. No. 9,647,171, which is a
(Continued)

(51) Int. Cl.
*H01L 33/32* (2010.01)
*H01L 25/075* (2006.01)
(Continued)

(52) U.S. Cl.
CPC ...... *H01L 25/0753* (2013.01); *H01L 21/6835* (2013.01); *H01L 24/83* (2013.01);
(Continued)

(58) Field of Classification Search
CPC ... H01L 33/0079; H01L 33/32; H01L 33/486; H01L 33/507; H01L 33/54; H01L 33/62;
(Continued)

(56) References Cited

U.S. PATENT DOCUMENTS 3,949,410 A    4/1976  Bassous
4,058,418 A   11/1977  Lindmayer
(Continued)

FOREIGN PATENT DOCUMENTS

CN    1222758    7/1999
CN    1454045   11/2003
(Continued)

OTHER PUBLICATIONS

Abbaschian et al. (Dec. 2005) "High Pressure-High Temperature Growth of Diamond Crystals Using Split Sphere Apparatus," *Diamond Relat. Mater.* 14(11-12):1916-1919.
(Continued)

*Primary Examiner* — Michael M Trinh
(74) *Attorney, Agent, or Firm* — Leydig, Voit & Mayer, Ltd.

(57) ABSTRACT

Described herein are printable structures and methods for making, assembling and arranging electronic devices. A number of the methods described herein are useful for assembling electronic devices where one or more device components are embedded in a polymer which is patterned during the embedding process with trenches for electrical interconnects between device components. Some methods described herein are useful for assembling electronic devices by printing methods, such as by dry transfer contact printing methods. Also described herein are GaN light emitting diodes and methods for making and arranging GaN light emitting diodes, for example for display or lighting systems.

13 Claims, 91 Drawing Sheets

Related U.S. Application Data continuation of application No. 12/778,588, filed on May 12, 2010, now Pat. No. 8,865,489.

(60) Provisional application No. 61/241,465, filed on Sep. 11, 2009, provisional application No. 61/177,458, filed on May 12, 2009.

(51) Int. Cl.
  *H01L 21/683* (2006.01)
  *H01L 23/00* (2006.01)
  *H01L 33/00* (2010.01)
  *H01L 25/00* (2006.01)
  *H01L 33/48* (2010.01)
  *H01L 33/50* (2010.01)
  *H01L 33/54* (2010.01)
  *H01L 33/62* (2010.01)

(52) U.S. Cl.
  CPC .............. *H01L 24/95* (2013.01); *H01L 25/50* (2013.01); *H01L 33/0079* (2013.01); *H01L 33/486* (2013.01); *H01L 33/507* (2013.01); *H01L 33/54* (2013.01); *H01L 33/32* (2013.01); *H01L 33/62* (2013.01); *H01L 2221/6835* (2013.01); *H01L 2221/68322* (2013.01); *H01L 2221/68354* (2013.01); *H01L 2221/68363* (2013.01); *H01L 2221/68386* (2013.01); *H01L 2224/8312* (2013.01); *H01L 2224/83868* (2013.01); *H01L 2224/83871* (2013.01); *H01L 2224/83874* (2013.01); *H01L 2224/95085* (2013.01); *H01L 2924/01322* (2013.01); *H01L 2924/05432* (2013.01); *H01L 2924/06* (2013.01); *H01L 2924/12033* (2013.01); *H01L 2924/12036* (2013.01); *H01L 2924/12041* (2013.01); *H01L 2924/12042* (2013.01); *H01L 2924/12043* (2013.01); *H01L 2924/13063* (2013.01); *H01L 2924/13064* (2013.01); *H01L 2924/13091* (2013.01); *H01L 2924/14* (2013.01); *H01L 2924/1461* (2013.01); *H01L 2924/15787* (2013.01); *H01L 2924/15788* (2013.01); *H01L 2924/181* (2013.01); *H01L 2924/2064* (2013.01); *H01L 2924/20641* (2013.01); *H01L 2933/005* (2013.01); *H01L 2933/0041* (2013.01); *Y10S 438/977* (2013.01)

(58) Field of Classification Search
  CPC .............. H01L 25/0753; H01L 21/6835; H01L 2221/68322; H01L 2221/6835; H01L 2221/68354; H01L 2221/68363; H01L 24/83; H01L 24/95
  See application file for complete search history.

(56) References Cited

U.S. PATENT DOCUMENTS

| | | |
|---|---|---|
| 4,392,451 A | 7/1983 | Mickelsen et al. |
| 4,471,003 A | 9/1984 | Cann |
| 4,487,162 A | 12/1984 | Cann |
| 4,663,828 A | 5/1987 | Hanak |
| 4,761,335 A | 8/1988 | Aurichio et al. |
| 4,766,670 A | 8/1988 | Gazdik et al. |
| 4,784,720 A | 11/1988 | Douglas |
| 4,855,017 A | 8/1989 | Douglas |
| 5,086,785 A | 2/1992 | Gentile et al. |
| 5,204,144 A | 4/1993 | Cann et al. |
| 5,313,094 A | 5/1994 | Beyer et al. |
| 5,339,180 A | 8/1994 | Katoh |
| 5,427,096 A | 6/1995 | Bogusiewicz et al. |
| 5,434,751 A | 7/1995 | Cole, Jr. et al. |
| 5,455,178 A | 10/1995 | Fattnger |
| 5,501,893 A | 3/1996 | Laermer et al. |
| 5,525,815 A | 6/1996 | Einset |
| 5,545,291 A | 8/1996 | Smith et al. |
| 5,648,148 A | 7/1997 | Simpson |
| 5,691,245 A | 11/1997 | Bakhit |
| 5,753,529 A | 5/1998 | Chang et al. |
| 5,757,081 A | 5/1998 | Chang et al. |
| 5,767,578 A | 6/1998 | Chang et al. |
| 5,772,905 A | 6/1998 | Chou |
| 5,783,856 A | 7/1998 | Smith et al. |
| 5,790,151 A | 8/1998 | Mills |
| 5,817,242 A | 10/1998 | Biebuyck et al. |
| 5,824,186 A | 10/1998 | Smith et al. |
| 5,904,545 A | 5/1999 | Smith et al. |
| 5,907,189 A | 5/1999 | Mertol |
| 5,915,180 A | 6/1999 | Hara et al. |
| 5,928,001 A | 7/1999 | Gilette et al. |
| 5,955,781 A | 9/1999 | Joshi et al. |
| 5,976,683 A | 11/1999 | Liehrr et al. |
| 5,998,291 A | 12/1999 | Bakhit et al. |
| 6,057,212 A | 5/2000 | Chan et al. |
| 6,080,608 A | 6/2000 | Nowak |
| 6,225,149 B1 | 5/2001 | Gan et al. |
| 6,265,326 B1 | 7/2001 | Ueno |
| 6,267,775 B1 | 8/2001 | Schulte |
| 6,274,508 B1 | 8/2001 | Jacobsen et al. |
| 6,276,775 B1 | 8/2001 | Schulte |
| 6,277,712 B1 | 8/2001 | Kang et al. |
| 6,281,038 B1 | 8/2001 | Jacobsen et al. |
| 6,291,896 B1 | 9/2001 | Smith |
| 6,316,278 B1 | 11/2001 | Jacobsen et al. |
| 6,316,283 B1 | 11/2001 | Saurer |
| 6,317,175 B1 | 11/2001 | Salerno et al. |
| 6,334,960 B1 | 1/2002 | Wilson et al. |
| 6,380,729 B1 | 4/2002 | Smith |
| 6,403,397 B1 | 6/2002 | Katz |
| 6,413,790 B1 | 6/2002 | Duthaler et al. |
| 6,417,025 B1 | 7/2002 | Gengel |
| 6,420,266 B1 | 7/2002 | Smith et al. |
| 6,433,401 B1 | 8/2002 | Clark et al. |
| 6,451,191 B1 | 9/2002 | Bentsen et al. |
| 6,459,418 B1 | 10/2002 | Comiskey et al. |
| 6,468,638 B2 | 10/2002 | Jacobsen et al. |
| 6,479,395 B1 | 11/2002 | Smith et al. |
| 6,555,408 B1 | 4/2003 | Jacobsen et al. |
| 6,527,964 B1 | 5/2003 | Smith et al. |
| 6,559,905 B1 | 5/2003 | Akiyama |
| 6,566,744 B2 | 5/2003 | Gengel |
| 6,580,151 B2 | 6/2003 | Vandeputte et al. |
| 6,586,338 B2 | 7/2003 | Smith et al. |
| 6,590,346 B1 | 7/2003 | Hadley et al. |
| 6,606,079 B1 | 8/2003 | Smith |
| 6,606,247 B2 | 8/2003 | Credelle et al. |
| 6,608,370 B1 | 8/2003 | Chen et al. |
| 6,623,579 B1 | 9/2003 | Smith et al. |
| 6,639,578 B1 | 10/2003 | Comiskey et al. |
| 6,655,286 B2 | 12/2003 | Rogers |
| 6,657,289 B1 | 12/2003 | Craig et al. |
| 6,661,037 B2 | 12/2003 | Pan et al. |
| 6,665,044 B1 | 12/2003 | Jacobsen et al. |
| 6,683,663 B1 | 1/2004 | Hadley et al. |
| 6,693,384 B1 | 2/2004 | Vicentini et al. |
| 6,706,402 B2 | 3/2004 | Rueckes et al. |
| 6,723,576 B2 | 4/2004 | Nozawa et al. |
| 6,730,990 B2 | 5/2004 | Kondo et al. |
| 6,731,353 B1 | 5/2004 | Credelle et al. |
| 6,743,982 B2 | 6/2004 | Biegelsen et al. |
| 6,780,696 B1 | 8/2004 | Schatz |
| 6,784,450 B2 | 8/2004 | Pan et al. |
| 6,787,052 B1 | 9/2004 | Vaganov |
| 6,814,898 B1 | 11/2004 | Deeman et al. |
| 6,816,380 B2 | 11/2004 | Credelle et al. |
| 6,844,673 B1 | 1/2005 | Bernkopf |
| 6,848,162 B2 | 2/2005 | Arneson et al. |
| 6,850,312 B2 | 2/2005 | Jacobsen et al. |
| 6,863,219 B1 | 3/2005 | Jacobsen et al. |
| 6,864,435 B2 | 3/2005 | Hermanns et al. |
| 6,864,570 B2 | 3/2005 | Smith |

(56) References Cited

U.S. PATENT DOCUMENTS

| | | |
|---|---|---|
| 6,872,645 B2 | 3/2005 | Duan et al. |
| 6,878,871 B2 | 4/2005 | Scher et al. |
| 6,887,450 B2 | 5/2005 | Chen et al. |
| 6,900,094 B2 | 5/2005 | Hammond et al. |
| 6,917,061 B2 | 7/2005 | Pan et al. |
| 6,949,199 B1 | 9/2005 | Gauzner et al. |
| 6,949,206 B2 | 9/2005 | Whiteford |
| 6,950,220 B2 | 9/2005 | Abramson et al. |
| 6,984,934 B2 | 1/2006 | Moller et al. |
| 6,989,285 B2 | 1/2006 | Ball |
| 7,029,951 B2 | 4/2006 | Chen et al. |
| 7,033,961 B1 | 4/2006 | Smart et al. |
| 7,067,903 B2 | 6/2006 | Tachibana et al. |
| 7,116,318 B2 | 10/2006 | Amundson et al. |
| 7,132,313 B2 | 11/2006 | O'Connor et al. |
| 7,148,512 B2 | 12/2006 | Leu et al. |
| 7,158,277 B2 | 1/2007 | Berggren et al. |
| 7,169,546 B2 | 1/2007 | Suzuki et al. |
| 7,169,669 B2 | 1/2007 | Blakers et al. |
| 7,170,164 B2 | 1/2007 | Chen et al. |
| 7,186,624 B2 | 3/2007 | Welser et al. |
| 7,195,733 B2 | 3/2007 | Rogers et al. |
| 7,253,442 B2 | 8/2007 | Huang et al. |
| 7,255,919 B2 | 8/2007 | Sakata et al. |
| 7,374,968 B2 | 5/2008 | Kornlivich et al. |
| 7,425,523 B2 | 9/2008 | Ikemizu et al. |
| 7,521,292 B2 | 4/2009 | Rogers et al. |
| 7,557,367 B2 | 7/2009 | Rogers et al. |
| 7,622,367 B1 * | 11/2009 | Nuzzo .................... B82Y 10/00 |
| | | 438/472 |
| 7,629,691 B2 | 12/2009 | Roush |
| 7,700,402 B2 | 4/2010 | Wild et al. |
| 7,704,684 B2 | 4/2010 | Rogers et al. |
| 7,705,280 B2 | 4/2010 | Nuzzo et al. |
| 7,799,699 B2 | 9/2010 | Nuzzo et al. |
| 7,982,296 B2 | 7/2011 | Nuzzo et al. |
| 8,367,035 B2 | 2/2013 | Rogers et al. |
| 8,394,706 B2 | 3/2013 | Nuzzo et al. |
| 8,440,546 B2 | 5/2013 | Nuzzo et al. |
| 8,562,095 B2 | 10/2013 | Alleyne et al. |
| 8,664,699 B2 | 3/2014 | Nuzzo et al. |
| 8,666,471 B2 | 3/2014 | Rogers et al. |
| 8,679,888 B2 | 3/2014 | Rogers et al. |
| 8,722,458 B2 | 5/2014 | Rogers et al. |
| 8,729,524 B2 | 5/2014 | Rogers et al. |
| 8,754,396 B2 | 6/2014 | Rogers et al. |
| 8,865,489 B2 | 10/2014 | Rogers et al. |
| 8,934,965 B2 | 1/2015 | Rogers et al. |
| 8,946,683 B2 | 2/2015 | Rogers et al. |
| 2002/0013061 A1 | 1/2002 | Siniaguine et al. |
| 2002/0021445 A1 | 2/2002 | Boxhevolnyi et al. |
| 2002/0110766 A1 | 8/2002 | Tsai et al. |
| 2003/0006527 A1 | 1/2003 | Jacobs et al. |
| 2003/0082889 A1 | 5/2003 | Maruyama et al. |
| 2003/0087476 A1 | 5/2003 | Oohata et al. |
| 2003/0178316 A1 | 9/2003 | Jacobs et al. |
| 2003/0222282 A1 | 12/2003 | Fjelstad et al. |
| 2003/0227116 A1 | 12/2003 | Halik et al. |
| 2004/0005723 A1 | 1/2004 | Empedocles et al. |
| 2004/0026684 A1 | 2/2004 | Empedocles et al. |
| 2004/0079464 A1 | 4/2004 | Kumakura |
| 2004/0095658 A1 | 5/2004 | Buretea et al. |
| 2004/0112964 A1 | 6/2004 | Empedocles et al. |
| 2004/0136866 A1 | 7/2004 | Pontis et al. |
| 2004/0146560 A1 | 7/2004 | Whiteford et al. |
| 2004/0178390 A1 | 9/2004 | Whiteford |
| 2004/0192082 A1 | 9/2004 | Wagner et al. |
| 2004/0114459 A1 | 10/2004 | Suenaga et al. |
| 2004/0206448 A1 | 10/2004 | Dubrow |
| 2004/0211458 A1 | 10/2004 | Gui et al. |
| 2004/0250950 A1 | 12/2004 | Dubrow |
| 2004/0252559 A1 | 12/2004 | Gupta |
| 2005/0006669 A1 | 1/2005 | Mishra et al. |
| 2005/0020094 A1 | 1/2005 | Forbes et al. |
| 2005/0233546 A1 | 1/2005 | Oohata et al. |
| 2005/0038498 A1 | 2/2005 | Dubrow et al. |
| 2005/0082526 A1 | 4/2005 | Bedell et al. |
| 2005/0124712 A1 | 6/2005 | Anderson et al. |
| 2005/0214962 A1 | 9/2005 | Daniels et al. |
| 2005/0227389 A1 | 10/2005 | Bhattacharya et al. |
| 2005/0238967 A1 | 10/2005 | Rogers et al. |
| 2005/0255686 A1 | 11/2005 | Yamano et al. |
| 2006/0038182 A1 | 2/2006 | Rogers et al. |
| 2006/0049485 A1 | 3/2006 | Pan et al. |
| 2006/0076561 A1 | 4/2006 | Hioki et al. |
| 2006/0085976 A1 | 4/2006 | Eldridge et al. |
| 2006/0102525 A1 | 5/2006 | Volkel et al. |
| 2006/0119853 A1 | 6/2006 | Baumberg et al. |
| 2006/0127817 A1 | 6/2006 | Ramanujan et al. |
| 2006/0132025 A1 | 6/2006 | Gao et al. |
| 2006/0134893 A1 | 6/2006 | Savage et al. |
| 2006/0169989 A1 | 8/2006 | Bhattacharya |
| 2006/0244105 A1 | 11/2006 | Forbes et al. |
| 2006/0255341 A1 | 11/2006 | Pinnington et al. |
| 2006/0258056 A1 | 11/2006 | Bauer |
| 2006/0279191 A1 | 12/2006 | Gehegan et al. |
| 2006/0286488 A1 | 12/2006 | Rogers et al. |
| 2006/0286785 A1 | 12/2006 | Rogers et al. |
| 2007/0031607 A1 | 2/2007 | Dubson et al. |
| 2007/0032044 A1 | 2/2007 | Henley |
| 2007/0032089 A1 | 2/2007 | Nuzzo et al. |
| 2007/0073130 A1 | 3/2007 | Finch et al. |
| 2007/0164648 A1 | 7/2007 | Jiang et al. |
| 2007/0215890 A1 | 9/2007 | Harbers et al. |
| 2007/0221944 A1 * | 9/2007 | Cheol Yoo .......... H01L 33/0079 |
| | | 257/99 |
| 2007/0227586 A1 | 10/2007 | Zapalac |
| 2008/0041617 A1 | 2/2008 | Chen et al. |
| 2008/0055581 A1 | 3/2008 | Rogers et al. |
| 2008/0108171 A1 | 5/2008 | Rogers et al. |
| 2008/0000871 A1 | 7/2008 | Suh et al. |
| 2008/0157235 A1 | 7/2008 | Rogers et al. |
| 2008/0212102 A1 | 9/2008 | Nuzzo et al. |
| 2009/0014748 A1 * | 1/2009 | Hirao .................. H01L 21/6835 |
| | | 257/99 |
| 2009/0199960 A1 | 8/2009 | Nuzzo et al. |
| 2009/0208555 A1 | 8/2009 | Kuttler et al. |
| 2009/0289246 A1 | 11/2009 | Schneider et al. |
| 2009/0294803 A1 | 12/2009 | Nuzzo et al. |
| 2010/0002402 A1 | 1/2010 | Rogers et al. |
| 2010/0052112 A1 | 3/2010 | Rogers et al. |
| 2010/0059863 A1 | 3/2010 | Rogers et al. |
| 2010/0176705 A1 | 7/2010 | Van Herpen et al. |
| 2010/0252840 A1 | 10/2010 | Ibbetson et al. |
| 2010/0283069 A1 | 11/2010 | Rogers et al. |
| 2010/0289124 A1 | 11/2010 | Nuzzo et al. |
| 2010/0317132 A1 | 12/2010 | Rogers et al. |
| 2011/0068672 A1 | 3/2011 | Hasnain |
| 2011/0170225 A1 | 7/2011 | Rogers et al. |
| 2011/0171813 A1 | 7/2011 | Rogers et al. |
| 2011/0187798 A1 | 8/2011 | Rogers et al. |
| 2011/0316120 A1 | 12/2011 | Rogers et al. |
| 2012/0157804 A1 | 6/2012 | Rogers et al. |
| 2012/0165759 A1 | 6/2012 | Rogers et al. |
| 2012/0261551 A1 | 10/2012 | Rogers |
| 2012/0320581 A1 | 12/2012 | Rogers et al. |
| 2013/0036928 A1 | 2/2013 | Rogers et al. |
| 2013/0041235 A1 | 2/2013 | Rogers et al. |
| 2013/0140649 A1 | 6/2013 | Rogers et al. |
| 2013/0333094 A1 * | 12/2013 | Rogers .................... A61B 5/01 |
| | | 2/161.7 |
| 2014/0092158 A1 | 4/2014 | Alleyne et al. |
| 2014/0140020 A1 | 5/2014 | Rogers et al. |
| 2014/0163390 A1 | 6/2014 | Rogers et al. |
| 2014/0191236 A1 | 7/2014 | Nuzzo et al. |
| 2014/0216524 A1 | 8/2014 | Rogers et al. |
| 2014/0220422 A1 | 8/2014 | Rogers et al. |
| 2014/0305900 A1 | 10/2014 | Rogers et al. |
| 2014/0323968 A1 | 10/2014 | Rogers et al. |
| 2014/0361409 A1 | 12/2014 | Rogers et al. |
| 2014/0362335 A1 | 12/2014 | Kornfield et al. |
| 2014/0373898 A1 | 12/2014 | Rogers et al. |
| 2014/0374872 A1 | 12/2014 | Rogers et al. |
| 2015/0001462 A1 | 1/2015 | Rogers et al. |

(56) References Cited

U.S. PATENT DOCUMENTS

| | | | |
|---|---|---|---|
| 2015/0132873 | A1 | 5/2015 | Rogers et al. |
| 2015/0141767 | A1 | 5/2015 | Rogers et al. |
| 2015/0181700 | A1 | 6/2015 | Rogers et al. |
| 2015/0207012 | A1 | 7/2015 | Rogers et al. |
| 2016/0072027 | A1 | 3/2016 | Rogers et al. |
| 2016/0086855 | A1 | 3/2016 | Bower et al. |
| 2016/0284544 | A1 | 9/2016 | Nuzzo et al. |
| 2016/0293794 | A1 | 10/2016 | Nuzzo et al. |
| 2017/0200707 | A1* | 7/2017 | Rogers ............... H01L 25/0753 |

FOREIGN PATENT DOCUMENTS

| | | |
|---|---|---|
| DE | 4241045 C1 | 5/1994 |
| DE | 102006051745 | 5/2008 |
| EP | 0 929 097 | 7/1999 |
| EP | 1 357 773 | 10/2003 |
| EP | 1 477 230 | 11/2004 |
| JP | 06-118441 | 4/1994 |
| JP | 11-026344 | 1/1999 |
| JP | 11-142878 | 5/1999 |
| JP | 2001-007340 | 1/2001 |
| JP | 2002-092984 | 3/2002 |
| TW | 367570 | 8/1999 |
| TW | 494257 | 7/2002 |
| TW | 200836353 | 9/2008 |
| WO | WO 96/21245 | 7/1996 |
| WO | WO 00/046854 | 8/2000 |
| WO | WO 00/049421 | 8/2000 |
| WO | WO 00/049658 | 8/2000 |
| WO | WO 00/055915 | 9/2000 |
| WO | WO 00/055916 | 9/2000 |
| WO | WO 01/31082 | 5/2001 |
| WO | WO 01/033621 | 5/2001 |
| WO | WO 02/027701 | 4/2002 |
| WO | WO 02/043032 | 5/2002 |
| WO | WO 02/45160 | 6/2002 |
| WO | WO 02/071137 | 9/2002 |
| WO | WO 02/073699 | 9/2002 |
| WO | WO 02/092778 | 11/2002 |
| WO | WO 02/097724 | 12/2002 |
| WO | WO 04/099068 | 12/2002 |
| WO | WO 03/032240 | 4/2003 |
| WO | WO 03/049201 | 6/2003 |
| WO | WO 03/063211 | 7/2003 |
| WO | WO 03/085700 | 10/2003 |
| WO | WO 03/085701 | 10/2003 |
| WO | WO 03/092073 | 11/2003 |
| WO | WO 04/003535 | 1/2004 |
| WO | WO 04/022637 | 3/2004 |
| WO | WO 04/022714 | 3/2004 |
| WO | WO 04/023527 | 3/2004 |
| WO | WO 04/024407 | 3/2004 |
| WO | WO 04/027822 | 4/2004 |
| WO | WO 04/032190 | 4/2004 |
| WO | WO 04/032191 | 4/2004 |
| WO | WO 04/032193 | 4/2004 |
| WO | WO 04/034025 | 4/2004 |
| WO | WO 04/086289 | 10/2004 |
| WO | WO 04/094303 | 11/2004 |
| WO | WO 04/100252 | 11/2004 |
| WO | WO 04/105456 | 12/2004 |
| WO | WO 2004/107973 | 12/2004 |
| WO | WO 05/005679 | 1/2005 |
| WO | WO 05/015480 | 2/2005 |
| WO | WO 05/017962 | 2/2005 |
| WO | WO 05/022120 | 3/2005 |
| WO | WO 2005/029578 | 3/2005 |
| WO | WO 2005/033786 | 4/2005 |
| WO | WO 2005/033787 | 4/2005 |
| WO | WO 2005/054119 | 6/2005 |
| WO | WO 05/099310 | 10/2005 |
| WO | WO 2005/104756 | 11/2005 |
| WO | WO 2005/106934 | 11/2005 |
| WO | WO 02/097708 | 12/2005 |
| WO | WO 05/122285 | 12/2005 |
| WO | WO 2006/130558 | 12/2006 |
| WO | WO 2006/130721 | 12/2006 |
| WO | WO 2007/000037 | 1/2007 |
| WO | WO 2007/046656 | 4/2007 |
| WO | WO 2007/126412 | 11/2007 |
| WO | WO 2008/030666 | 3/2008 |
| WO | WO 2008/030960 | 3/2008 |
| WO | WO 2008/036837 | 3/2008 |
| WO | WO 08/055054 | 5/2008 |
| WO | WO 2008/143635 | 11/2008 |
| WO | WO 2009/011709 | 1/2009 |
| WO | WO 2009/034349 | 3/2009 |
| WO | WO 2009/111641 | 9/2009 |
| WO | WO 2010/005707 | 1/2010 |
| WO | WO 2010/036807 | 4/2010 |
| WO | WO 2010/132552 | 11/2010 |

OTHER PUBLICATIONS

Adachi et al (1982) "Chemical Etching of InGaAsP/InP DH Wafer," *J. Electrochem. Soc.* 129:1053-1062.

Adachi et al. (1983) "Chemical Etching Characteristics of (001)GaAs," *J. Electrochem. Soc.* 130:2427-2435.

Ago et al. (2005) "Aligned Growth of Isolated Single-Walled Carbon Nanotubes Programmed vby Atomic Arrangement of Substrate Surface," *Chem. Phys. Lett.* 408:433-438.

Ago et al. (2006) "Synthesis of Horizontally-Aligned Single-Walled Carbon Nanotubes with Controllable Density on Sapphire Surface and Polarized Raman Spectroscopy," *Chem. Phys. Lett.* 421:399-403.

Ahmed et al. (Web Release Oct. 11, 2005) "Extending the 3ω-Method to the MHz Range for Thermal Conductivity Measurements of Diamond Thin Films," *Diamond Relat. Mater.* 15(2-3):389-393.

Ahn et al. (2007) "Bendable Integrated Circuits on Plastic Substrates by Use of Printed Ribbons of Single-Crystalline Silicon," *Appl. Phys. Lett.* 90:213501.

Ahn et al. (2009) "Omnidirectional Printing of Flexible, Stretchable, and Spanning Silver Microelectrodes," *Science.* 323:1590-1593.

Ahn et al. (Dec. 15, 2006) "Heterogeneous Three-Dimensional Electronics by Use of Printed Semiconductor Nanomaterials," *Science* 314:1754-1757.

Ahn et al. (Jun. 2006) "High-Speed Mechanically Flexible Single-Crystal Silicon Thin-Film Transistors on Plastic Substrates," *IEEE Electron Dev. Lett.* 27(6):460-462.

Alivisatos et al. (1996) "Semiconductor Clusters, Nanocrystals, and Quantum Dots," *Science* 271:933-937.

Alivisatos et al. (1998) "From Molecules to Materials: Current Trends and Future Directions," *Adv. Mater.* 10:1297-1336.

Allen et al. (Feb. 20, 2006) "Nanomaterial Transfer Using Hot Embossing for Flexible Electronic Devices," *Appl. Phys. Lett.* 88:083112.

Al-Sarawi et al. (Feb. 1998) "A Review of 3-D Packaging Technology," *IEEE Trans. Comp. Packag. Manufac. Technol. B* 21(1):2-14.

Amano et al. (Feb. 3, 1986) "Metalorganic Vapor Phase Epitaxial Growth of a High Quality GaN Film Using an AIN Buffer Layer," *Appl. Phys. Lett.* 48(5):353-355.

Ambrosy et al. (1996) "Silicon Motherboards for Multichannel Optical Modules," *IEEE Trans. Compon. Pack. A* 19:34-40.

Andersson et al. (Oct. 16, 2002) "Active Matrix Displays Based on All-Organic Electrochemical Smart Pixels Printed on Paper," *Adv. Mater.* 14:1460-1464.

Ando et al. (2004) "Self-Aligned Self-Assembly Process for Fabricating Organic Thin-Film Transistors," *Appl. Phys. Lett.* 85:1849-1851.

Angadi et al. (Web Release Jun. 1, 2006) "Thermal Transport and Grain Boundary Conductance in Ultrananocrystalline Diamond Thin Films," *J. Appl. Phys.* 99:114301.

Aoki et al. (2003) "Microassembly of Semiconductor Three Dimensional Photonic Crystals," *Nat. Mater.* 2:117-121.

(56) References Cited

OTHER PUBLICATIONS

Arnold et al. (2003) "Field-Effect Transistors Based on Single Semiconducting Oxide Nanobelts," *J. Phys. Chem. B* 107(3):659-663.
Axisa et al. (Sep. 1-4, 2008) "Laser based fast prototyping methodology of producing stretchable and conformable electronic systems," In; 2nd Electronics System-integration Technology Conference (ESTC 2008). Greenwich, UK. pp. 1387-1390.
Ayón et al. (Jan. 1999) "Characterization of a Time Multiplexed Inductively Coupled Plasma Etcher," *J. Electrochem. Soc.* 146(1):339-349.
Baca et al. (2008) "Semiconductor Wires and Ribbons for High-Performance Flexible Electronics," *Angew. Chem. Int. Ed.* 47:5524-5542.
Bachtold et al. (Nov. 9, 2001) "Logic Circuits with Carbon Nanotube Transistors," *Science* 294:1317-1320.
Bae et al. (Jul. 1, 2002) "Single-Crystalline Gallium Nitride Nanobelts," *Appl. Phys. Lett.* 81(1):126-128.
Balmer et al. (2005) "Diffusion of Alkanethiols in PDMS and Its Implications on Microcontact Printing (μCP)," *Langmuir* 21(2):622-632.
Banerjee et al. (May 2001) "3-D ICs: A Novel Chip Design for Improving Deep-Submicrometerinterconnect Performance and Systems-on-Chip Integration," *Proc. IEEE* 89(5):602-633.
Bao et al. (1997) "High-Performance Plastic Transistors Fabricated by Printing Techniques," *Chem. Mater.* 9:1299-1301.
Bao et al. (1999) "Printable Organic and Polymeric Semiconducting Materials and Devices," *J. Mater. Chem.* 9:1895-1904.
Barquins, M. (1992) "Adherence, Friction and Wear of Rubber-Like Materials," *Wear* 158:87-117.
Bates, F.S. (1991) "Polymer-Polymer Phase Behavior," *Science* 251:898-905.
Battaglia et al. (2003) "Colloidal Two-Dimensional Systems: CdSe Quantum Shells and Wells," Angew. Chem. Int. Ed. 442:5035-5039.
Bauer et al. (2004) "Biological Applications of High Aspect Ratio Nanoparticles," *J. Mater. Chem.* 14:517-526.
Berg et al. (2003) "Tailored Micropatters Through Weak Polyelectrolyte Stamping," Langmuir 19:2231-2237.
Bernard et al. (1998) "Printing Patterns of Proteins," *Langmuir* 14(9):2225-2229.
Bett et al. (Aug. 1999) "III-V Compounds for Solar Cell Applications," *Appl. Phys. A. Mater. Sci.* 69(2):119-129.
Bhunia et al. (2004) "Free-Standing and Vertically Aligned InP Nanowires Grown by Metalorganic Vapor Phase Epitaxy," *Physica E* 21:583-587.
Bhushan et al. (Nov. 2004) "Multiwalled Carbon Nanotube AFM Probes for Surface Characterization of Micro/Nanostructures," *Microsyst. Technol.* 10(8-9):633-639.
Bietsch et al. (Oct. 1, 2000) "Conformal Contact and Pattern Stability of Stamps Used for Soft Lithography," *J. Appl. Phys.* 88(7):4310-4318.
Bioflex—Biocompatible Flexible Electronic Circuits. Available at http://tfcg.elis.ugent.be/projects/bioflex. Accessed Feb. 8, 2012.
Bishay et al. (2000) "Temperature Coefficient of the Surface Resistivity of Two-Dimensional Island Gold Films," *J. Phys. D. Appl. Phys.* 33(18):2218-2222.
Blanchet et al. (2003) "Large Area, High Resolution, Dry Printing of Conducting Polymers for Organic Electronics," *Appl. Phys. Lett.* 82:463-465.
Blanchet et al. (2003) "Printing Techniques for Plastic Electronics," *J. Imag. Sci. Tech.* 47(4):296-303.
Blazdell et al. (Nov. 1999) "Preparation of Ceramic Inks for Solid Freeforming Using a Continuous Jet Printer," *J. Mat. Syn. Process.* 7(6):349-356.
Boltau et al. (1998) "Surface-Induced Structure Formation of Polymer Blends on Patterned Substrates," *Nature* 391:877-879.
Boncheva et al. (Mar. 15, 2005) "Magnetic Self-Assembly of Three-Dimensional Surfaces from Planar Sheets," *Proc. Natl. Acad. Sci. USA* 102(11):3924-3929.

Boncheva et al. (Mar. 8, 2005) "Templated Self-Assembly: Formation of Folded Structures by Relaxation of Pre-Stressed, Planar Tapes. The Path to Ubiquitous and Low-cost Organic Electronic Appliances on Plastic," *Adv. Mater.* 17(5):553-557.
Bour et al. (1994) "Strained $Ga_xIn_{1-x}P/(AlGa)_{0.5}In_{0.5}P$ Heterostructures and Quantum-Well Laser Diodes," *IEEE J. Quantum Electron.* 30:593-607.
Bowden et al. (1997) "Self Assembly of Mesoscale Objects into Ordered Two-Dimensional Arrays," *Science* 276:233-235.
Bowden et al. (1998) "Spontaneous Formation of Ordered Structures in Thin Films of Metals Supported on an Elastomeric Polymer," *Nature* 393:146-149.
Bowden et al. (2001) "Molecule-Mimetic Chemistry and Mesoscale Self-Assembly," *Acc. Chem. Res.* 34:231-238.
Bracher et al. (2009) "Shaped Films of Ionotropic Hydrogels Fabricated Using Templates of Patterns Paper," *Adv. Mater.* 21:445-450.
Bradley et al. (2003) "Flexible Nanotube Electronics," *Nano Lett.*, vol. 3, No. 10, pp. 1353-1355.
Braun et al. (1999) "Electrochemically Grown Photonic Crystals," *Nature* 402:603-604.
Britton et al. (Web Release Oct. 25, 2005) "Microstructural Defect Characterization of a Si:H Deposited by Low Temperature HW-CVD on Paper Substrates," *Thin Solid Films* 501(1-2):79-83.
Brown et al. (Dec. 19, 2001) "Heterogeneous Materials Integration: Compliant Substrates to Active Device and Materials Packaging," *Mater. Sci. Eng. B* 87(3):317-322.
Brown, H.R. (1991) "The Adhesion Between Polymers," *Ann. Rev. Mater. Sci.* 21:463-489.
Bruschi et al. (2001) "Micromachined Silicon Suspended Wires With Submicrometric Dimensions," *Microelectron. Eng.* 57-58:959-965.
Buma et al. (2001) "High-Frequency Ultrasound Array Element Using Thermoelastic Expansion in an Elastomeric Film," *Appl. Phys. Lett.* 79:548-550.
Burdinski et al. (2005) "Single Etch Patterning of Stacked Silver and Molybdenum Alloy Layers on Glass Using Microcontat Wave Printing," *J. Am. Chem. Soc.* 127(31):10786-10787.
Burdinski, D. (non-dated) "Soft Lithography and Microcontact Wave Printing," www. research.philips . com / technologies/light_dev_microsys/softlitho/ index. html , Downloaded May 23, 2007.
Burgin et al. (2000) "Large Area Submicrometer Contact Printing Using a Contact Aligner," *Langmuir* 16:5371-5375.
Burns et al. (2003) "Printing of Polymer Thin-Film Transistors for Active-Matrix-Display Applications," *J. Soc. Inf. Display* 11:599-604.
Campbell et al. (2000) "Fabrication of Photonic Crystals for the Visible Spectrum by Holographic Lithography," *Nature* 404:53-56.
Camperi-Ginestet et al. (1991) "Alignable epitaxial liftoff of GaAs material with selective deposition using polyimide diaphragms," *IEEE Trans. Photon. Tech. Lett.* 3, 1123 (1991).
Cao et al. (2006) "Bilayer Organic-Inorganic Gate Dielectrics for High-Performance, Low-Voltage, Single-Walled Carbon Nanotube Thin-Film Transistors, Complementary Logic Gates, and p-n Diodes on Plastic Substrates," *Adv. Funct. Mater.* 16:2355-2362.
Cao et al. (2006) "Highly Bendable,Transparent Thin-Film Transistors That Use Carbon-Nanotube-Based Conductors and Semiconductors with Elastomeric Delectrics," *Adv. Mater.* 18(3):304-309.
Cao et al. (2006) "Transparent flexible organic thin-film transistors that use printed single-walled carbon nanotube electrodes," *Applied Physics Letters* 88:113511.
Cao et al. (Jul. 24, 2008) "Medium-Scale Carbon Nanotube Thin-Film Integrated Circuits on Flexible Plastic Substrates," *Nature* 454:495-500.
Carr et al. (1998) "Measurement of Nanomechanical Resonant Structures in Single-Crystal Silicon," *J. Vac. Sci. Technol. B* 16:3821-3824.
Carter-Coman et al. (1997) "Analysis of layers on GaAs compliant substrates by double crystal x-ray diffraction," *Appl. Phys. Lett.* 70:1754.

(56) References Cited

OTHER PUBLICATIONS

Chadhury et al. (1991) "Direct Measurement of Interfacial Interactions Between Semispherical Lenses and Flat Sheets of Poly(dimethylsiloxane) and their Chemical Derivatives," *Langmuir* 7:1013-1025.

Chandrasekhar et al. (1977) "Effects of uniaxial stress on the electroreflectance spectrum of Ge and GaAs," Phys. Rev. B 15:2127.

Chang et al. (1994) "Process Techniques," "Lithography," and "Device-Related Physics and Principles," In; *GaAs High-Speed Devices: Physics, Technology and Circuit Application*, John Wiley and Sons, New York, pp. 115-278.

Chang et al. (2009) "A Large Area Flexible Array Sensors Using Screen Printing Technology," *J. Display Technol.* 5:178-183.

Chen et al. (1986) "Low resistance Pd/Ge/Au and Ge/Pd/Au ohmic contacts to n-type GaAs," *Appl. Phys. Lett.* 48:535.

Chen et al. (2003) "Characterization of Pd—GaAs Schottly Diodes Prepared by the Electrodes Plating Technique," *Semiconductor. Sci. Technol.* 18:620-626.

Chen et al. (2003) "Electronic Paper: Flexible Active-Matrix Electronics Ink Display," *Nature* 423:136.

Chen et al. (2005) "InGaN Nanorings and Nanodots by Selective Area Epitaxy," *Appl. Phys. Lett.* 87:143111.

Chen et al. (2005) "The Role of Metal-Nanotube Caontact in the Performance of Carbon Nanotube Field-Effect Transistors," *Nano Lett.* 5(7):1497-1502.

Chen et al. (Feb. 27, 2006) "Complementary Carbon Nanotube-Gated Carbon Nanotube Thin-Fim Transistor," *Appl. Phys. Lett.* 88:093502.

Chen et al. (Jun. 2002) Effect of Process Parameters on the Surface Morphology and Mechanical Performance of Silicon Structures After Deep Reactive Ion Etching (DRIE) *J. Microelectromech. Syst.* 11(3):264-275.

Chen et al. (Mar. 2004) "A Family of Herringbone Patterns in Thin Films," *Scr. Mater.* 50(6):797-801.

Chen et al. (Mar. 24, 2006) "An Integrated Logic Crcuit Assembled on a Single Carbon Nanotube," *Science* 311:1735.

Chen et al. (Sep. 2004) "Herringbone Buckling Patterns of Compressed Thin Films on Compliant Substrates," *J. Appl. Mech.* 71:597-603.

Cheng et al. (2005) "Ink-Jet Printing, Self-Assembled Polyelectrolytes, and Electroless Plating: Low Cost Fabrication of Circuits on a Flexible Substrate at Room Temperature," *Macromol. Rapid Commun.* 26:247-264.

Childs et al. (2002) "Decal Transfer Microlithography: A New Soft-Lithographic Patterning Method," *J. Am. Chem. Soc.* 124:13583-13596.

Childs et al. (2005) "Masterless Soft-Lithography: Patterning UV/Ozone-Induced Adhesion on Poly(dimethylsiloxane) Surfaces," *Langmuir* 21:10096-10105.

Childs et al. (Aug. 14, 2004) "Patterning of Thin-Film Microstructures on Non-Planar Substrate Surfaces Using Decal Transfer Lithography," *Adv. Mater.* 16(15):1323-1327.

Choi et al. (2007) "Biaxially Stretchable 'Wavy' Silicon Nanomembranes," *Nano Lett.* 7(6):1655-1663.

Choi et al. (Web Release Jan. 25, 2005) "Simple Detachment Patterning of Organic Layers and Its Applications to Organic Light-Emitting Diodes," *Adv. Mater.* 17(2):166-171.

Chou et al. (2004) "An Orientation-Controlled Pentacene Film Aligned by Photoaligned Polyimide for Organic Thin-Film Transistor Applications," *Adv. Func. Mater.* 14:811-815.

Chou et al. (Jun. 8, 1999) "Micromachining on (111)-Oriented Silicon," *Sens. Actuators A* 75(3):271-277.

Chu et al. (2005) "High-Performance Organic Thin-Film Transistors with Metal Oxide/Metal Bilayer Electrode," *Appl. Phys. Lett.* 87:193508.

Chung et al. (2000) Silicon Nanowire Devices *Appl. Phys. Lett.* 76(15):2068-2070.

Chung et al. (Jul. 1, 2003) "A Study on Formation of Al and $Al_2O_3$ on the Porous Paper by DC Magnetron Sputtering," *Surf. Coat. Technol.* 171(1-3):65-70.

Collins et al. (Apr. 27, 2001) "Engineering Carbon Nanotubes and Nanotube Circuits Using Electrical Breakdown," *Science* 292:706-709.

Creagh et al. (2003) "Design and Performance of Inkjet Print Heads for Non-Graphic-Arts Applications," *MRS Bull.* 28:807-811.

Crone et al. (Feb. 3, 2000) "Large-Scale Complementary Integrated Circuits Based on Organic Transistors," *Nature* 403:521-523.

Crowder et al. (1998) "Low-Temperature Single-Crystal Si TFTs Fabricated on Si Films Processed via Sequential Lateral Solidification," *IEEE Electron. Dev. Lett.* 19:306-308.

Cui et al. (2001) "Nanowire Nanosensors for Highly Sensitive and Selective Detection of Biological and Chemical Species," *Science* 293:1289-1292.

Dai et al. (2002) "Gallium Oxide Nanoribbons and Nanosheets," *J. Phys. Chem. B* 106(5):902-904.

Dai et al. (2003) "Novel Nanostructures of Functional Oxides Synthesized by Thermal Evaporation," *Adv. Funct. Mater.* 13:9-24.

Davidson et al. (2004) "Supercritical Fluid-Liquid-Solid Synthesis of Gallium Arsenide Nanowires Seeded by Alkanethiol-Stabilized Gold Nanocrystals," *Adv. Mater.* 16:646-649.

de Gans (2004) "Inkjet Printing of Polymers: State of the Art and Future Developments," *Adv. Mater.* 16(3):203-213.

De Sio et al. (Web Release May 18, 2005) "Electro-Optical Response of a Single-Crystal Diamond Ultraviolet Photoconductor in Transverse Configuration," *Appl. Phys. Lett.* 86:213504.

DeBoer et al. (2004) "Organic Single-Crystal Field-Effect Transistors," *Phys. Stat. Sol.* 201:1302-1331.

Deen et al. (2004) "Electrical Characterization of Polymer-Based FETs Fabricated by Spin-Coating Poly(3-alkylthiophene)s," *IEEE Trans. Electron Devices* 51:1892-1901.

Delmerche et al. (1997) "Stability of Molded Polydimethylsiloxane Microstructures," *Adv. Mat.* 9:741-746.

Deruelle et al. (1995) "Adhesion at the Solid-Elastomer Interface: Influence of Interfacial Chains," *Macromol.* 28:7419-7428.

Derycke et al. (Sep. 2001) "Carbon Nanotube Inter- and Intramolecular Logic Gates," *Nano Lett.* 1(9):453-456.

Desai et al. (Feb. 1999) "Nanopore Technology for Biomedical Applications," *Biomed. Microdevices* 2(1):11-40.

Dick et al. (Jun. 2004) "Synthesis of Branched 'Nanotrees' by Controlled Seeding of Multiples Branching Events," *Nat. Mater.* 3:380-384.

Dimroth et al. (Mar. 2007) "High Efficiency Multijunction Solar Cells," *MRS Bull.* 32:230-235.

Ding et al. (Oct. 4, 2004) "Self Catalysis and Phase Transformation in the Formation of CdSe Nanosaws," *Adv. Mater.* 16(19):1740-1743.

Dinsmore et al. (2002) "Colloidosomes: Selectively Permeable Capsules Composed of Colloidal Particles," *Science* 298:1006-1009.

Divliansky et al. (2003) "Fabrication of Three-Dimensional Polymer Photonic Crystal Structures Using Single Diffraction Element Interference Lithography," *Appl. Phys. Lett.* 82(11):1667-1669.

Dodabalapur A. (Apr. 2006) "Organic and Polymer Transistors for Electronics," *Mater Today* 9(4):24-30.

Dodabalapur et al. (1995) "Organic Transistors: Two-Dimensional Transport and Improved Electrical Characteristics," *Science* 268:270-271.

Duan et al. (2000) "General Synthesis of Compound Semiconductor Nanowires," *Adv. Mater.* 12:298-302.

Duan et al. (2003) "High-performance Thin-Film Transistors Using Semiconductor Nanowires and Nanoribbons," *Nature* 425:274-278.

Duan X, (2003) "Semiconductor Nanowires: From Nanoelectronics to Macroelectronics," Abstract from a presentation given at the 11th Foresight Conference on Molecular Nanotechnology, Oct. 10-20, Burlingame, CA.

Duboz et al. (1998) "Transistors and Detectors Based on GaN-Related Materials," In; *Group III Nitride Semiconductor Compounds*, Gill, B. ed., Clarendon, Oxford, pp. 343-387.

Duesberg et al. (2000) "Polarized Raman Spectroscopy on Isolated Single-Wall Carbon Nanotubes," *Phys. Rev. Lett.*, vol. 85, No. 25, pp. 5436-5439.

Duffy et al. (1998) "Rapid Prototyping of Microfluidic Systems in Poly(dimethylsiloxane)," *Anal. Chem.* 70:4974-4984.

(56) References Cited

OTHER PUBLICATIONS

Durkop et al. (2004) "Extraordinary Mobility in Semiconducting Carbon Nanotube," *Nano Lett.* 4(1):35-39.
Eder et al. (Apr. 5, 2004) "Organic Electronics on Paper," *Appl. Phys. Lett.* 84(14):2673-2675.
Edrington et al. (2001) "Polymer-Based Photonic Crystals," *Adv. Mater.* 13:421-425.
Efimenko et al. (Oct. 15, 2002) "Surface Modification of Sylgard-184 Poly(dimethyl Siloxane) Networks by Ultraviolet and Ultraviolet/Ozone Treatment," *J. Colloid Interface Sci.* 254(2):306-315.
Eftekhari, G. (1993) "Variation in the Effective Richardson Constant of Metal—GaAs and Metal—InP Contacta Due to the Effect of Processing Parameters," *Phys. Status Solid A—Appl. Res.* 140:189-194.
Ensell, G. (1995) "Free Standing Single-Crystal Silicon Microstructures," *J. Micromech. Microeng.* 5:1-4.
Exam Report, Written Opinion and Response to Written Opinion, Corresponding to Singapore Patent Application No. 2007/18082-1, dated Aug. 26, 2009.
Examination Report and Response, Corresponding to Malaysian Patent Application No. PI 20062672, dated Aug. 28, 2009.
Examination Report, Corresponding to European Application No. EP 05 756 327.2, dated Jan. 20, 2010.
Examination Report, Corresponding to Malaysian Patent Application No. PI 20092343, dated Jun. 15, 2010.
Examination Report, Corresponding to Malaysian Patent Publication No. PI 20052553, dated Mar. 13, 2009.
Examination Report, Corresponding to Singapore Patent Application No. 200608359-6, Completed on Aug. 27, 2008.
Examination Report, Response and Search Report, Corresponding to Malaysian Patent Application No. PI 20062537, dated Nov. 20, 2009.
Examination Report, Written Opinion and Response, Corresponding to Singapore Patent Application No. 2007/18082-1, dated Feb. 26, 2009.
Extended European Search Report dated Jan. 30, 2015, corresponding to European Patent Application No. 10775462.4.
Faez et al. (1999) "An Elastomeric Conductor Based on Poluaniline Prepared by Mechanical Mixing," *Polymer* 40:5497-5503.
Fan et al. (2008) "Wafer-Scale Assembly of Highly Ordered Semiconductor Nanowire Arrays by Contact Printing," *Nano Lett.* 8:20-25.
Fan et al. (2009) "Three-dimensional nanopillar-array photovoltaics on low-cost and flexible substrates," *Nat. Mater.* 8:648-653.
Felgner et al. (1996) "Flexural Rigidity of Microtubules Measured with the Use of Optical Tweezers," *J. Cell Sci.* 109:509-516.
Fink et al. (1999) "*Block Copolymers as Photonic Bandgap Materials*," *J. Lightwave Tech.* 17:1963-1969.
Flewitt et al. (2005) "Low-Temperature Deposition of Hydrogenated Amorphous Silicon in an Electron Cyclotron Resonance Reactor for Flexible Displays," *Proc. IEEE* 93:1364-1373.
Folch et al. (1999) "Wafer-Level In-Registry Microstamping," *J. Microelectromech. Syst.* 8:85-89.
Forment et al. (2004) "Influence of Hydrogen Treatment and Annealing Processes Upon the Schottky Barrier Height of Au/n-GaAs and Ti/n-GaAs Diodes," *Semicond. Sci. Technol.* 19:1391-1396.
Forrest et al. (2004) "The Path to Ubiquitous and Low-Cost Organic Electronic Appliances on Plastic," *Nature* 428:911-918.
Fortunato et al. (2005) "Flexible a-Si: H Position-Sensitive Detectors," *Proc. IEEE* 93:1281-1286.
Fortunato et al. (Sep. 2008) "High-Performance Flexible Hybrid Field-Effect Transistors Based on Cellulose Fiber Paper," *IEEE Electron. Dev. Lett.* 29(9):988-990.
Freire et al. (1999) "Thermal Stability of Polyethylene Terephthalate (PET): Oligomer Distribution and Formation of Volatiles," *Packag. Technol. Sci.* 12:29-36.
Freund, L.B. (2000) "The Mechanics of Electronic Materials," *Int. J. Solids Struct.* 37:185-196.

Friedman et al. (2005) "High-Speed Integrated Nanowire Circuits," *Nature* 434:1085.
Fu et al. (Jan. 10, 2003) "Patterning of Diamond Microstructures on Si Substrate by Bulk and Surface Micromachining," *J. Mater. Process. Technol.* 132(1-3):73-81.
Furneaux et al. (1989) "The Formation of Controlled-Porosity Membranes from Anodically Oxidized Aluminum," *Nature* 337:147-149.
Gan et al. (2002) "Preparation of Thin-Film Transostros With Chemical Bath Deposited CdSe and CdS Thin Films," *IEEE Trans. Electron. Dev.* 49:15-18.
Gao et al. (Sep. 9, 2005) "Conversion of Zinc Oxide Nanobelts into Superlattice-Structures Nanohelices," *Science* 309:1700-1704.
Garcia et al. (2004) "Etchant Anisotropy Controls the Step Bunching Instability in KOH Etching of Silicon," *Phys. Rev. Lett.* 93(16):166102.
Garnier et al. (1994) "All-Polymer Field-Effect Transistor Realized by Printing Techniques," *Science* 265:1684-1686.
Gaul et al. (2000) "True Blue Inorganic Optoelectronic Devices," *Adv. Mater.* 12, 935-946.
Geim et al. (Mar. 2007) "The Rise of Graphene," *Nature Mater.* 6:183-191.
Geissler et al. (2003) "Fabrication of Metal Nanowires Using Microcontact Printing," *Langmuir* 19(15):6301-6311.
Geissler et al. (Jun. 2003) "Selective Wet-Etching of Microcontact-Printed Cu Substrates with Control Over the Etch Profile," *Microelec. Eng.* 67-68:326-332.
Gelinck et al. (2000) "High-Performance All-Polymer Integrated Circuits," *Appl. Phys. Lett.* 77:1487-1489.
Gelinck et al. (2004) "Fleible Active-Matrix Displays and Shift Registers Based on Solution-Processed Organic Transistors," *Nat. Mater.* 3:106-110.
Georgakilas et al. (2002) "Wafer-Scale Integration of GaAs Optoelectronic Devices with Standard Si Integrated Circuits Using a Low-Temperature Bonding Procedure," *Appl. Phys. Lett.* 81:5099-5101.
Givargizov, E.I. (1991) "Applications," In; *Oriented Crystallization on Amorphous Substrates*, Plenum Press, New York, pp. 341-363.
Goetting et al. (1999) "Microcontact Printing of Alkanephosphonic Acids on Aluminum: Pattern Transfer by Wet Chemical Etching," *Langmuir* 15:1182-1191.
Goldman et al. (1996) "Correlation of Buffer Strain Relaxation Modes with Transport Properties of Two-Dimensional Electron Gases," *J. Apple. Phys.* 80:6849-6854.
Goldmann et al. (2004) "Hole Mobility in Organic Single Crystals Measured by a "Flip-Crystal" Field-Effect Technique," *J. Appl. Phys.* 96:2080-2086.
Goldsmith, T.H. (Sep. 1990) "Optimization, Constraint, and History in the Evolution of Eyes," *Quart. Rev. Biol.* 65(3):281-322.
Gratz et al. (1991) "Atomic Force Microscopy of Atomic-Scale Ledges and Etch Pits Formed During Dissolution of Quartz," *Science*, 251:1343-1346.
Gray et al. (Dec. 2001) "Screen Printed Organic Thin Film Transistors (OTFTs) on a Flexible Substrate," *Proc. SPIE* 4466:89-94.
Gray et al. (Mar. 5, 2004) "High-Conductivity Elastomeric Electronics," *Adv. Mater.* 16(5):393-397.
Grayson, T. (2002) "Curved Focal Plane Wide Field of View Telescope Design," *Proc. SPIE* 4849:269-274.
Gruen et al. (Mar. 21, 1994) "Fullerenes as Precursors for Diamond Film Growth Without Hydrogen or Oxygen Additions," *Appl. Phys. Lett.* 65(12):1502-1504.
Gudiksen et al. (Web Release Apr. 18, 2001) "Synthetic Control of the Diameter and Length of Single Crystal Semiconductor Nanowires," *J. Phys. Chem. B* 105:4062-4064.
Guo et al. (Aug. 19, 2002) "Metal-Insulator-Semiconductor Electrostatics of Carbon Nanotubes," *Appl. Phys. Lett.* 81(8):1486-1488.
Gur et al. (2005) "Air-Stable All-Inorganic Nanocrystal Solar Cells Processed from Solution," *Science* 310:462-465.
Gurbuz et al. (Jul. 2005) "Diamond Semiconductor Technology for RF Device Applications." *Solid State Electron.* 49(7):1055-1070.
Haberer et al. (2005) "Freestanding, optically-pumped, GaN/InGaN microdisk lasers fabricated by photoelectrochemical etching," *Appl. Phys. Lett.* 85:5179.

(56) References Cited

OTHER PUBLICATIONS

Haisma et al. (2002) "Contact Bonding, Including Direct-Bonding in a Historical and Recent Context of Materials Science and Technology, Physics and Chemistry," *Mater. Sci Eng.* 37:1-60.
Halik et al. (2004) "Low-Voltage Organic Transistors with an Amorphous Molecular Gate Dielectric," *Nature* 431:963-966.
Hamedi et al. (May 2007) "Towards Woven Logic from Organic Electronic Fibres," *Nat. Mater.* 6:357-362.
Hamilton et al. (2004) "Field-Effect Mobility of Organic Polymer Thin-Film Transistors," *Chem. Mater.* 16:4699-4704.
Han et al. (2005) "Template-Free Directional Growth of Single-Walled Carbon Nanotues on a- and r-Plane Sapphire," *J. Am. Chem. Soc.* 127:5294-5295.
Harada et al. (2001) "Catalytic Amplification of the Soft Lithographic Patterning of Si. Nonelectrochemical Orthogonal Fabrication of Photoluminescent Porous Si Pixel Arrays," *J. Am. Chem. Soc.* 123:8709-8717.
Harkonen et al. (Jun. 8, 2006) "4 W Single-Transverse Mode VECSEL Utilizing Intra-Cavity Diamond Heat Spreader," *Electron Lett.* 42(12):693-694.
He et al. (2005) "Si Nanowire Bridges in Microtrenches: Integration of Growth into Device Fabrication," *Adv. Mater.* 17:2098-2102.
Heffelfinger et al. (1997) "Steps and the structure of the (0001) α-alumina surface," *Surf. Sci.*, 370:L168-L172.
Hillbrog et al. (Web Release Dec. 30, 2003) "Nanoscale Hydrophobic Recovery: A Chemical Force Microscopy Study of UV/Ozone-Treated Cross-Linker Poly(dimethylsiloxane)," *Langmuir* 20(3):785-794.
Hines et al. (2005) "Nanotransfer Printing of Organic and Carbon Nanotube Thin-Film Transistors on Plastic Substrates," *Appl. Phys. Lett.* 86:163101.
Holmes et al. (Feb. 25, 2000) "Control of Thickness and Orientation of Solution-Grown Silicon Nanowires," *Science* 287:1471-1473.
Horn et al. (1992) "Contact Electrification and Adhesion Between Dissimilar Materials," *Science* 256:362-364.
Hoyer, P. (1996) "Semiconductor Nanotube Formation by a Two-Step Template Process," *Adv. Mater.* 8:857-859.
Hsia et al. (2005) "Collapse of Stamps for Soft Lithography Due to Interfacial Adhesion," *Appl. Phys. Lett.* 86:154106.
Hsu et al. (2002) "Amorphous Si TFTs on Plastically Deformed Spherical Domes," *J. Non-Crystalline Solids* 299-302:1355-1359.
Hsu et al. (2003) "Nature of Electrical Contacts in a Metal-Molecule-Semiconductor System," *J. Vac. Sci. Technol. B* 21(4):1928-1935.
Hsu et al. (Jan. 15, 2004) "Spherical Deformation of Compliant Substrates with Semiconductor Device Islands," *J. Appl. Phys.* 95(2):705-712.
Hsu et al. (Mar. 2004) "Effects of Mechanical Strain on TFT's on Spherical Domes," *IEEE Trans. Electron Dev.* 51(3):371-377.
Hu et al. (1997) "Using Soft Lithography to Fabricate GaAs/AlGaAs Heterostructure Field Effect Transistors," *Appl. Phys. Lett.* 71:2020-2022.
Hu et al. (1999) Chemistry and Physics in One Dimension: Synthesis and Properties of Nanowires and Nanotubes, *Acc. Chem. Res.* 32:435-445.
Hu et al. (2004) "Percolation in Transparent and Conducting Carbon Nanotube Networks," *Nano Lett.*, vol. 4, No. 12, pp. 2513-2517.
Hua et al. (2006) "Processing Dependent Behavior of Soft Imprint Lithography on the 1-10-nm Scale," *IEEE Trans. Nanotechnol.* 5:301-308.
Huang et al. (2001) "Directed Assembly of One-Dimensional Nanostructures into Functional Networks," *Science* 291:630-633.
Huang et al. (2001) "Room-Temperature Ultraviolet Nanowire Nanolasers," *Science* 292:1897-1899.
Huang et al. (2003) "Growth of Millimeter-Long and Horizontally Aligned Single-Walled Carbon Nanotubes on Flat Substrates," *J. Am. Chem. Soc.*, 125:5636-5637.
Huang et al. (2004) "Long and Oriented Single-Walled Carbon Nanotubes Grown by Ethanol Chemical Vapor Deposition," *J. Phys. Chem. B.* 108:16451-16456.
Huang et al. (2004) "Self-Organizing High-Density Single-Walled Carbon Nanotube Arrays from Surfactant Suspensions," *Nanotechnol.* 15:1450-1454.
Huang et al. (2005) "Nanomechanical Architecture of Strained Bilayer Thin Films: From Design Principles to Experimental Fabrication," *Adv. Mater.* 17(23):2860-2864.
Huang et al. (2005) "Nanowires for Integrated Multicolor Nanophotonics," *Small* 1(1):142-147.
Huang et al. (2005) "Nonlinear Analyses of Wrinkles in a Film Bonded to a Compliant Substrate," *J. Mech. Phys. Solids* 53:2101-2118.
Huang et al. (2005) "Stamp Collapse in Soft Lithography," *Langmuir* 21:8058-8068.
Huang et al. (Jan. 16, 2001) "Catalytic Growth of Zinc Oxide Nanowires by Vapor Transport," *Adv. Mater.* 13(2):113-116.
Huck et al. (2000) "Ordering of Spontaneously Formed Buckles on Planar Surfaces," *Langmuir* 16:3497-3501.
Huie, J.C. (2003) "Guided Molecular Self Assembly: A review of Recent Efforts," *Smart Mater. Struct.* 12:264-271.
Huitema et al. (2001) "Plastic Transistors in Active-Matrix Displays," *Nature* 414:599.
Hur et al. (2005) "Printed thin-film transistors and complementary logic gates that use polymer-coated single-walled carbon nanotube networks," *J. Appl. Phys.*, 98, 114302.
Hur et al. (205) "Organic Nanodelectrics for Low Voltage Carbon Nanotube Thin Film Transistors and Complementary Logc Gates," *J. Am. Chem. Soc.* 127:13808-13809.
Hur et al. (Dec. 2004) "Nanotransfer Printing by Use of Noncovalent Surface Forces: Applications to Thin-Film Transistors that Use Single-Walled Carbon Nanotube Networks and Semiconducting Polymers," *Appl. Phys. Lett.* 85(23):5730-5732.
Hur etal. (Jun. 13, 2005) "Extreme Bendability of Single Walled Carbon Nanotube Networks Transferred From High-Temperature Growth Substrates to Plastic and Their Use in Thin-Film Transistors," *Appl. Phys. Lett.* 243502.
Hutchinson et al. (1992) "Mixed Mode Cracking in Layered Materials," *Adv. Appl. Mech.* 29:63-191.
Imparato et al. (2005) "Excimer Laser Induced Crystallization of Amorphous Silicon on Flexible Polymer Substrates," *Thin Solid Films* 487:58-62.
International Preliminary Report on Patentability, Corresponding to International Application No. PCT/US2010/034520, dated Nov. 24, 2011.
International Search Report and Written Opinion dated Jul. 30, 2012, corresponding to International Patent Application No. PCT/US12/37973.
International Search Report and Written Opinion, Corresponding to International Application No. PCT/US2006/032125, dated Mar. 21, 2008.
International Search Report and Written Opinion, Corresponding to International Application No. PCT/US2009/058231, dated Nov. 17, 2009.
International Search Report and Written Opinion, Corresponding to International Application No. PCT/2005/014449, dated Jul. 3. 2008.
International Search Report and Written Opinion, Corresponding to International PCT Application No. PCT/US05/19354, dated Apr. 18, 2007.
International Search Report and Written Opinion, Corresponding to International PCT Application No. PCT/US2007/079070, dated Apr. 23, 2008.
International Search Report and Written Opinion, Corresponding to International PCT Application No. PCT/US2007/077759, dated Apr. 11, 2008.
International Search Report and Written Opinion, Corresponding to International PCT Application No. PCT/US2007/022959, dated Oct. 14, 2008.
International Search Report and Written Opinion, Corresponding to International PCT Application No. PCT/US2006/021161, dated Feb. 28, 2008.
International Search Report and Written Opinion, Corresponding to International Application No. PCT/US2009/036192, dated Jul. 6, 2009.

(56) References Cited

OTHER PUBLICATIONS

International Search Report and Written Opinion, Corresponding to International Application No. PCT/US2010/034520, dated Sep. 24, 2010.
International Search Report and Written Opinion, Corresponding to International Application No. PCT/US07/74293, dated Jul. 24, 2008.
International Search Report and Written Opinion, Corresponding to International Application No. PCT/US07/82633, dated May 16, 2008.
International Search Report and Written Opinion, Corresponding to International Application No. PCT/US07/77217, dated Jun. 3, 2008.
International Search Report and Written Opinion, Corresponding to International Application No. PCT/US09/47442, dated Sep. 21, 2009.
International Search Report and Written Opinion, Corresponding to International Application No. PCT/US04/40192, dated Jul. 6, 2005.
International Search Report and Written Opinion, Corresponding to International Application No. PCT/US10/50468, dated Jan. 6, 2011.
Isberg et al. (Sep. 6, 2002) "High Carrier Mobility in Single-Crystal Plasma-Deposited Diamond," *Science* 297:1670-1672.
Islam et al. (Jan. 16, 2003) "High Weight Fraction Surfactant Solubilization of Single-Wall Carbon Nanotubes in Water," *Nano Lett.* 3(2):269-273.
Ismach et al. (2004) "Atomic-Step-Templated Formation of Single Wall Carbon Nanotube Patters," *Angew. Chem. Int. Ed.* 43:6140-6143.
Itoh et al. (1991) "Cathodoluminescence Properties of Undoped and Zn-Doped $Al_xGa_{1-x}N$ Grown by Metaloganic Vapor Phase Epitaxy," *Jap. J. Appl Phys.* 30:1604-1608.
J. Vanfleteren. SWEET: Stretchable and Washable Electronics for Embedding Textiles. Available at ftp://ftp.cordis.europa.eu/pub/ist/docs/mnd/ws-sfit_en.pdf. Accessed Feb. 8, 2012.
Jabbour et al. (2001) "Screen Printing for the Fabrication of Organic Light-Emitting Devices," *IEEE J. Select. Top. Quantum. Electron.* 7:769-773.
Jackman et al. (Aug. 4, 1995) "Fabrication of Submicrometer Features on Curved Substrates by Microcontact Printing," *Science* 269:664-666.
Jacobs et al. (2002) "Fabrication of a Cylindrical Display by Patterned Assembly," *Science* 296:323-325.
Jain et al. (2000) "III-Nitrides: Growth, Characterization, and Properties," *J. Appl. Phys.* 87:965-1006.
Jain et al. (2005) "Flexible Electronics and Displays: High-Resolution, Roll-to-Roll, Projection Lithography and Photoblation processing Technologies for Hiogh-Throughput Production," *Proc. IEEE* 93:1500-1510.
James et al. (1998) "Patterned Protein Layers on Solid Substrates by This Stamp Microcontact Printing," *Langmuir* 14:742-744.
Jang et al. (2003) "Lateral Growth of Aligned Multiwalled Carbon Nanotubes Under Electric Fiels," *Solid State Commun.* 126:305-308.
Jang et al. (2006) "Low-Voltage and High-Field-Effect Mobility Organic Transistors with a Polymer Insulator," *Appl. Phys. Lett.* 88:072101.
Javey et al. (2002) "High-κ Dielectrics for Advanced Carbon-Nanotube Transistors and Logic Gates," *Nature Mater.* 1:241-246.
Javey et al. (2005) "High Performance n-Type Carbon Nanotube Field-Effect Transistors with Chemically Doped Contacts," *Nano Lett.*, vol. 5, No. 2, pp. 345-348.
Javey et al. (2007) "Layer-by-Layer Assembly of Nanowires for Three-Dimensional, Multifunctional Electronics," *Nano Lett.* 7:773-777.
Javey et al. (Aug. 7, 2003) "Ballistic Carbon Nanotube Field-Effect Transistors," *Nature* 424:654-657.
Jenkins et al. (1994) "Gallium Arsenide Transistors: Realization Through a Molecularly Designs Insulator," *Science* 263:1751-1753.
Jeon et al. (1995) "Patterning of Dielectric Oxide Thin Layers by Microcontact Printing of Self-Assembled Monolayers," *J. Mater. Res.* 10:2996-2999.

Jeon et al. (2004) "Fabricating Complex Three-Dimensional Nanostructures with High Resolution Conformable Phase Masks," *Proc. Natl. Acad. Sci. USA* 101:12428-12433.
Jeon et al. (2004) "Three Dimensional Nanofabrication with Arubber Stamps and Conformable Photomasks," *Adv. Mater.* 16:593-600.
Jeon et al. (Aug. 4, 2004) "Three Dimensional Nanofabrication with Rubber Stamps and Conformable Photomasks," *Adv. Mater.* 16(15):1369-1375.
Jiang et a. (Oct. 2, 2007) "Finite Deformation Mechanics in Buckled Thin Films on Compliant Supports," *Proc. Natl. Acad. Sci. USA* 104(40):15607-15612.
Jiang et al. (1999) "Preparation of Macroporous Metal Films from Colloidal Crystals," *J. Am. Chem. Soc.* 121:7957-7958.
Jiang et al. (2001) "III-nitride blue microdisplays," *Appl. Phys. Lett.* 78:1303.
Jiang et al. (2002) "Polymer-on-Polymer Stamping: Universal Approaches to Chemically Patterned Surfaces," *Langmuir* 18:2607-2615.
Jin et al. (2004) "Scalable Interconnection and Integration of Nanowire Devices Without Registration," *Nano Lett.* 4:915-919.
Jin et al. (2004) "Soft Lithographic Fabrication of an Image Sensor Array on a Curved Substrate," *J. Vac. Sci. Technol. B* 22(5):2548-2551.
Jiyun, C.H. (2003) "Guided Molecular Self-Assembly: A Review of Recent Efforts," *Smart Mater. Struct.* 12:264-271.
Joachim et al. (Nov. 30, 2000) "Electronics Using Hybrid-Molecular and Mono-Molecular Devices," *Nature* 408:541-548.
Johnson et al. (1999) "Ordered Mesoporous Polymers of Tunable Pore Size from Colloidal Silica Templates," *Science* 283:963-965.
Jones et al. (Jul./Aug. 2004) "Stretchable Wavy Metal Interconnects," *J. Vac. Sci. Technol. A* 22(4):1723-1725.
Joo et al. (2006) "Low-Temperature Solution-Phase Synthesis of Quantum Well Structures CdSe Nanoribbons," *J. Am. Chem. Soc.* 128(17):5632-5633.
Jortner et al. (2002) "Nanostructured Advanced Materials Perspectives and Directions," *Pure Appl. Chem.* 74(9):1491-1506.
Joselevich (2002) "Vectorial Growth of Metallic and Semiconducting Single-Wall Carbon Nanotubes," *Nano Lett.*, vol. 2, No. 10, pp. 1137-1141.
Kagan (1999) "Organic-Inorganic Hybrid Materials as Semiconducting Channels in Thin-Film Field-Effect Transistors," *Science* 286:945-947.
Kagan et al. (2001) "Patterning Organic-Inorganic Thin-Film Transistors Using Microcontact Printed Templates," *Appl. Phys Lett.* 79(21):3536-3538.
Kagan et al. (2003) *Thin Film Transistors*, Dekker, New York, pp. 1-34.
Kane et al. (2000) "Analog and Digital Circuits Using Organic Thin-Film Transistors on Polyester Substrates," *IEEE Electron. Dev. Lett.* 21:534-536.
Kang et al. (2007) "Printed Multilayer Superstructures of Aligned Single-Walled Carbon Nanotubes for Electronic Applications," *Nano Lett.* 7(11):3343-3348.
Kang et al. (Apr. 2007) "High-Performance Electronics Using Dnese, Perfectly aligned Arrays of Single-Walled Carbon Nanotubes," *Nat. Nanotechnol.* 2(4):230-236.
Kar et al. (2005) "Controlled Synthesis and Photoluminescence Properties of ZnS Nanowires and Nanoribbons," *J. Phys. Chem. B* 109(8):3298-3302.
Kar et al. (2005) "Synthesis and Optical Properties of CdS Nanoribbons," *J. Phys. Chem B.* 109(41):19134-19138.
Kar et al. (2006) "Shape Selective Growth of CdS One-Dimensional Nanostructures by a Thermal Evaporation Process," *J. Phys. Chem. B.* 110(10):4542-4547.
Karnik et al. (2003) "Lateral Polysilicon $p^+$-p-$n^+$ and $p^+$-n-$n^+$ Diodes," *Solid-State Electronics* 47:653-659.
Karnik et al. (2003) "Multiple Lateral Polysilicon Diodes as Temperature Sensors for Chemical Microreaction Systems," *Jpn. J. Appl. Phys.* 42:1200-1205.
Kato et al. (2004) The Characteristic Improvement of Si(111) Metal-Oxide-Semiconductor Field-Effect Transistor by Long-Time Hydrogen Annealing, *Jpn. J. Appl. Phys.* 43(10):6848-6853.

(56) References Cited

OTHER PUBLICATIONS

Katz et al. (2001) "Synthetic Chemistry for Ultrapure, Processable, and High-Mobility Organic Transistor Semiconductors," *Acc. Chem. Res.* 34:359-369.
Katz, H.E. (2004) "Recent Advances in Semiconductor Performance and Printing Processes for Organic Transistor-Based Electronics," *Chem. Mater.* 16:4748-4756.
Kawata et al. (2001) "Finer Features for Functional Microdevices," *Nature* 412:697-698.
Kendall, D.L. (1979) "Vertical Etching of Silicon at Very High Apect Ratios," *Ann. Rev. Mater. Sci.* 9:373-403.
Khakani et al. (2006) "Lateral Growth of Single Wall Carbon Nanotubes on Various Substrates by Means of an 'All-Laser' Synthesis Approach," *Diamond Relat. Mater.* 15:1064-1069.
Khan et al. (1993) "High Electron Mobility Transistor Based on a GaN—$Al_xGa_{1-x}N$ Heterojunction," *Appl. Phys. Lett.* 63:1214-1215.
Khang et al. (2006) "A Stretchable Form of Single-Crystal Silicon for High-Performance Electronics on Rubber Substraights," *Science* 311:208-212.
Kilby, J.S. (1976) "Invention of the Integrated Circuit," *IEEE Trans. Electron. Dev.* 23:648-654.
Kim et al. (2000) "Field Emission from Carbon Nanotubes for Displays," *Diamond and Related Mater.* 9(3-6):1184-1189.
Kim et al. (2002) "Nanolithography Based on Patterned Metal Transfer and Its Application to Organic Electronic Devices," *Appl. Phys. Lett.* 80:4051-4053.
Kim et al. (2003) "Epitaxial Self-Assembly of Block Copolymers on Lithographically Defined Nanopatterned Substrates," *Nature* 424:411-414.
Kim et al. (2007) "Organic thin film transistor using silver electrodes by the ink-jet printing technology," *Thin Solid Films* 515:7692-7696.
Kim et al. (2009) "Optimized Structural Designs for Stretchable Silicon Integrated Circuits," *Small* 5(24):2841-2847.
Kim et al. (Apr. 25, 2008) "Stretchable and Foldable Silicon Integrated Circuits," *Science* 320:507-511.
Kim et al. (Dec. 2, 2008) "Materials and Noncoplanar Mesh Designs for Integrated Circuits with Linear Elastic Responses to Extreme Mechanical Deformations," *Proc. Natl. Acad. Sci. USA* 105(48):18675-18680.
Kim et al. (Jan. 2008) "Complementary Logic Gates and Ring Oscillators Plastic Substrates by Use of Printed Ribbons Single-Crystalline Silicon," *IEEE Electron. Dev. Lett.* 29(1):73-76.
Kim et al. (Nov. 15, 1999) "Direct Observation of Electron Emission Site on Boron-Doped Polycrystalline Diamond Thin Films Using an Ultra-High-Vacuum Scanning Tunneling Microscope," *Appl. Phys. Lett.* 75(20):3219-3221.
Kim et al. (Oct. 2004) "Organic TFT Array on a Paper Substrate," *IEEE Electron. Dev. Lett.* 25(10):702-704.
Kim et al. (Web Release Feb. 29, 2008) "Highly Emissive Self-Assembled Organic Nanoparticles Having Dual Color Capacity for Targeted Immunofluorescence Labeling," *Adv. Mater.* 20(6):1117-1121.
Kim et al. (Web Release Jul. 6, 2009) "Ultrathin Silicon Circuits with Strain-Isolation Layers and Mesh Layouts for High-Performance Electronics on Fabric, Vinyl, Leather and Paper," *Adv. Mater.* 21(36):3703-3707.
Kim, Y.S. (Web Release Aug. 9, 2005) "Microheater-Integrated Single Gas Sensor Array Chip Fabricated on Flexible Polyimide Substrate," *Sens. Actuators B* 114(1):410-417.
Klauk et al. (2002) "High-Mobility Polymer Gate Dielectric Pentacene Thin Film Transistors," *J. Appl. Phys.* 92:5259-5263.
Klein-Wiele et al. (2003) "Fabrication of Periodic Nanostructures by Phase-Controlled Multiple-Beam Interference," *Appl. Phys. Lett.* 83(23):4707-4709.
Knipp et al. (2003) "Pentacine Thin Film Transistors on Inorganic Dielectrics: Morphology, Structural Properties, and Electronic Transport," *Appl. Phys. Lett.* 93:347-355.
Ko et al. (2006) "Bulk Quantities of Single-Crystal Silicon Micro-/Nanoribbons Generated from Bulk Wafers," *Nano Lett.* 6(10):2318-2324.
Ko et al. (Aug. 7, 2008) "A Hemispherical Electronic Eye Camera Based on Compressible Silicon Optoelectronics," *Nature* 454:748-753.
Ko et al. (Web Release Oct. 28, 2009) "Curvilinear Electronics Formed Using Silicon Membrane Circuits and Elastomeric Transfer Elements," *Small* 5(23):2703-2709.
Kocabas et al. (2004) "Aligned Arrays of Single-Walled Carbon Nanotubes Generated from Random Networks by Orientationally Selective Laser Ablation," *Nano Lett.*, vol. 4, No. 12, pp. 2421-2426.
Kocabas et al. (2005) "Guided Growth of Large-Scale, Horizontally Aligned Arrays of Single-Walled Carbon Nanotubes and Their Use in Thin-Film Transstors," *Small* 1(11):1110-1116.
Kocabas et al. (2006) "Large Area Aligned Arrays of SWNTs for High Performance Thin Film Transistors," American Physical Society, APS March Meeting, Mar. 13-17, Abstract # W31.004.
Kocabas et al. (2006) "Spatially Selective Guided Growth of High-Coverage Arrays and Random Networks of Single-Walled Carbon Nanotbes and Thir Integration into Electronic Devices," *J. Am. Chem. Soc.* 128:4540-4541.
Kocabas et al. (2007) "Experimental and Theoretical Studies of Transport Through Large Scale, Partially Aligned Arrays of Single-Walled Carbon Nanotubes ni Thin Film Type Transistors," *Nano Lett.* 7(5):1195-1202.
Kocabas et al. (Feb. 5, 2008) "Radio Frequency Analog Electronics Based on Carbon Nanotube Transistors," *Proc. Natl. Acad. Sci. USA* 105(5)1405-1409.
Kodambaka et al. (2006) "Control of Si Nanowire Growth by Oxygen," *Nano Lett.* 6(6):1292-1296.
Koide et al. (2000) "Patterned Luminescence of Organic Light-Emitting Diodes by Hot Microcontact Printing (H/ᴵ CP) of Self-Assembled Monolayers," *J. Am. Chem. Soc.* 122:11266-11267.
Konagai et al. (1978) "High Efficiency GaAs Thin Film Solar Cells by Peeled Film Technology," *J. Cryst. Growth* 45:277-280.
Kong et al. (2004) "Single-Crystal Nanorings Formed by Epitaxial Self0Coating of Polar Nanobelts," *Science* 303:1348-1351.
Kong et al. (Jan. 28, 2000) "Nanotube Molecular Wires as Chemical Sensors," *Science* 287:622-625.
Kong et al. (Oct. 2003) "Structure of Indium Oxide Nanobelts," *Solid State Commun.* 128(1):1-4.
Kong et al. (Oct. 29, 1998) "Synthesis of Individual Single-Walled Carbon Nonotubes on Patterned Silicon Wafers," *Nature* 395:878-881.
Kudo et al. (Web Release Jun. 13, 2006) "A Flexible and Wearable Glucose Sensor Based on Functional Polymers with Soft-MEMS Techniques," *Biosens. Bioelectron.* 22:558-562.
Kulkarni et al. (2002) "Mesoscale Organization of Metal Nanocrystals," *Pure Appl. Chem* 74(9):1581-1591.
Kumar et al. (1993) "Features of Gold Having Micrometer to Centimeter Dimensions can be Formed Through a Combination of Stamping with an Elastomeric Stamp and an Alkanethiol "Ink" Followed by Chemical Etching," *Appl. Phys. Lett.* 63(4):2002-2004.
Kumar et al. (1994) "Patterning Self-Assembled Monolayers: Applications in Materials Science," *Langmuir* 10:1498-1511.
Kumar et al. (2002) "Thermally-Stable Low-Resistance Ti/Al/Mo/Au Multilayer Ohmic Contacts on n-GaN," *J. Appl. Phys.* 92:1712-1714.
Kumar et al. (2005) "Percolating in Finite Nanotube Networks," *Phys. Rev. Lett.*, 95, 066802.
Kuo et al. (1985) "Effect of Mismatch Strain on Band Gap in III-V Semiconductors," *J. Appl. Phys.* 57:5428-5432.
Kuykendall et al. (Aug. 2004) "Crystallographic Alignment of High Density Gallium Nitride Nanowire Arrays," *Nat. Mater.* 3:524-528.
Lacour et al. (2005) "Stretchable Interconnects for Elastic Electronic Surfaces," *Proc. IEEE* 93:1459-1467.
Lacour et al. (Apr. 14, 2003) "Stretchable Gold Conductors on Elastomeric Substrates," *Appl. Phys. Lett.* 82(15):2404-2406.
Lacour et al. (Apr. 2004) "Design and Performance of Thin Metal Film Interconnects for Skin-Like Electronic Circuits," *IEEE Electron. Dev. Lett.* 25(4):179-181.

(56) References Cited

OTHER PUBLICATIONS

Lacour et al. (Dec. 2004) "An Elastically Stretchable TFT Circuit," *IEEE Electron Dev. Lett.* 25(12):792-794.
Lacour et al. (Web Release Jul. 14, 2006) "Stiff Subcircuit Islands of Diamondlike Carbon for Stretchable Electronics," *J. Appl. Phys.* 100:014913.
Lacour et al. (Web Release May 16, 2006) "Mechanisms of Reversible Stretchability of Thin Metal Films on Elastomeric Substrates," *Appl. Phys. Lett.* 88:204103.
Laimer et al. (Mar. 1997) "Diamond Growth in a Direct-Current Low-Pressure Supersonic Plasmajet," *Diamond Relat. Mater.* 6:406-410.
Lambacher et al. (2004) "Electrical Imaging of Neuronal Activity by Multi-Transistor-Array (MTA) Recording at 7.8 μm Resolution," *Appl. Phys. A* 79:1607-1611.
Landes et al. (2002) "Some Properties of Spherical and Rod-Shaped Semiconductor and Metal Nanocrystals," *Pure Appl. Chem.* 74(9):1675-1692.
Law et al. (2004) "Semiconductor Nanowires and Nanotubes," *Ann. Rev. Mater. Res.* 34:83-122.
Law et al. (Aug. 27, 2004) "Nanoribbon Waveguides for Subwavelength Photonics Integration," *Science* 305:1269-1273.
Lay et al. (2004) "Simple Route to Large-Scale Ordered Arrays of Liquid-Deposited Carbon Nanotubes," *Nano Lett.*, vol. 4, No. 4, pp. 603-606.
Leclercq et al. (1998) "III-V Micromachined Devices for Microsystems," *Microelectronics J.* 29:613-619.
Lecomte et al. (Apr. 2006) "Degradation Mechanism of Diethylene Glycol Units in a Terephthalate Polymer," *Polym. Degrade. Stab.* 91(4):681-689.
Lee et al. (2000) "Thin Film Transistors for Displays on Plastic Substrates," *Solid State Electron.* 44:1431-1434.
Lee et al. (2003) "High-Performance Poly-Si TFTs on Plastic Substrates Using a Nano-Structured Separation Layer Approach," *IEEE Elec. Dev. Lett.* 24:19-21.
Lee et al. (2004) "Organic Light-Emitting Diodes Formed by Soft Contact Lamination," *Proc. Natl. Acad. Sci. USA* 101(2):429-433.
Lee et al. (2005) "A Printable Form of Single-Crystalline Gallium Nitride for Flexable Optoelectronic Systems," *Small* 1:1164-1168.
Lee et al. (2005) "Large-Area, Selective Transfer of Microstructured Silicon (μs-Si): A Printing-Based Approach to High-Performance Thin0Film Transistors Supported on Flexible Substraights," *Adv. Mater.* 17:2332-2336.
Lee et al. (2006) "Micron and Submicron Patterning of Polydimethylsiloxane Resists on Electronic Materials by Decal Transfer Lithography and Reactive Ion-Beam Etching: Application to the Fabrication of High-Mobility, Thin-Film Transistors," *Appl. Phys. Lett.* 100:084907/1-7.
Lee et al. (Apr. 2005) "Fabrication of Stable Metallic Patterns Embedded in Poly(dimethylsiloxane) and Model Applications in Non-Planar Electronic and Lab-on-a-Chip Device Patterning," *Adv. Funct. Mater.* 15(4):557-566.
Lee et al. (Dec. 1999) "The Surface/Bulk Micromachining (SBM) Process: A New Method for Fabricating Released MEMS in Single Crystal Silicon," *J. Microelectromech. Syst.* 8(4):409-416.
Lee et al. (Feb. 2001) "Application of Carbon Nanotubes to Field Emission Displays," *Diamond and Related Mater.* 10(2):265-270.
Lee et al. (Feb. 2005) "Weave Patterned Organic Transistors on Fiber for E-Textiles," *IEEE Trans. Electron. Dev.* 52(2):269-275.
Létant et al. (Jun. 2003) "Functionalized Silicon Membranes for Selective Bio-Organisms Capture," *Nat. Mater.* 2:391-395.
Li et al. (2002) "High-Resolution Contact Printing with Dendrimers," *Nano Lett.* 2(4):347-349.
Li et al. (2003) "Ultrathin Single-Crystalline-Silicon Cantilever Resonators: Fabrication Technology and Significant Specimen Size effect on Young's Modulus," *Appl. Phys. Lett.* 83:3081-3083.
Li et al. (2004) "Electrospinning of Nanofibers: Reinventing the Wheel," *Adv. Mater.* 16(14):1151-1170.
Li et al. (2006) "Catalyst-Assisted Formation of Nanocantilever Arrays on ZnS Nanoribbons by Post-Annealing Treatment," *J. Phys. Chem. B* 110(13):6759-6762.
Li et al. (Dec. 2005) "Compliant Thin Film Patterns of Stiff Materials as Platforms for Stretchable Electronics," *J. Mater. Res.* 20(12):3274-3277.
Li et al. (Jul. 1, 2002) "ZnO Nanobelts Grown on Si Substrate," *Appl. Phys. Lett.* 81:144-146.
Lieber, C. (2001) "The Incredible Shrinking Circuit," *Sci. Am.* 285(3):58-64.
Lieber, C.M. (2003) "Nanoscale Science and Technology: Building a Bog Future from Small Things," *MRS. Bull.* 28:486-491.
Lim et al. (2005) "Flexible Membrane Pressure Sensor," *Sens. Act. A* 119:332-335.
Lima et al. (2007) "Creating Micro- and Nanostructures on Tubular and Spherical Surfaces," *J. Vac. Sci. Technol. B* 25(6):2412-2418.
Lin et al. (Sep. 2005) "High-Performance Carbon Nanotube Field-Effect Transistor With Tunable Polarities," *IEEE Trans. Nano* 4(5):481-489.
Linder et al. (1994) "Fabrication Technology for Wafer Through-Hole Interconnections and Three-Dimensional Stacks of Chips and Wafers," *Proc. IEEE Micro. Electro Mech. Syst.* 349-354.
Ling et al. (2004) "Thin Film Deposition, Patterning, and Printing in Organic Thin Film Transistors," *Chem. Mater.* 16:4824-4840.
Liu et al. (1999) "Controlled deposition of individual single-walled carbon nanotubes on chemically functionalized templates," *Chem. Phys. Lett.*, 303:125-129.
Lo et al. (2007) "Development of Dendrimers: Macromolecules for Use in Organic Light-Emitting Diodes and Solar Cells," *Chem. Rev.* 107:1097-1116.
Long et al. (1990) "Heterostructure FETs and Bipolar Transistors," In; *Gallium Arsenide Digital Integrated Circuit Design*, McGraw-Hill, New York, pp. 58-69.
Loo et al. (2002) "Additive, Nanoscale Patterning of Metal Films with a Stamp and a Surface Chemistry Mediated Transfer Process: Applications in Plastic Electronics," *Appl. Phys. Lett.* 81:562-564.
Loo et al. (2002) "High-Resolution Transfer Printing on GaAs Surfaces Using Alkane Dithiol Monolayers," *J. Vac. Sci. Technol. B* 20(6):2853-2856.
Loo et al. (2002) "Interfacial Chemistries for Nanoscale Transfer Printing," *J. Am. Chem. Soc.* 124:7654-7655.
Loo et al. (2002) "Soft, Conformable Electrical Contacts for Organic Semiconductors: High-Resolution Plastic Circuits by Lamination," *Proc. Natl. Acad. Sci. USA* 99(16):10252-10256.
Loo et al. (2003) "Electrical Contacts to Molecular Layers by Nanotransfer Printing," *Nano Lett.* 3(7):913-917.
Lopes et al. (Sep. 2004) "Thermal Conductivity of PET/(LDPE/Al) Composites Determined by MDSC," *Polym. Test.*23(6):637-643.
Lu et al. (Dec. 2006) "Electronic Materials-Buckling Down for Flexible Electronics," *Nat. Nanotechnol.* 1:163-164.
Lu et al. (Jul. 19, 2005) "One Dimensional Hole Gas in Germanium/Silicon Nanowire Heterostructures," *Proc. Nat. Acad. Sci. USA* 102(29):10046-10051.
Lu et al. (Nov. 2008) "Nanowire Transistor Performance Limits and Applications," *IEEE Trans Electron Dev.* 55(11):2859-2876.
Luan et al. (1992) "An Experimental Study of the Source/Drain Parasitic Resistance Effects in Amorphous Silicon Thin Film Transistors," *J. Appl. Phys.* 72:766-772.
Ma et al. (2004) "Single-Crystal CdSe Nanosaws," *J. Am. Chem. Soc.* 126(3):708-709.
Mack et al. (2006) "Mechanically Flexible Thin-Film Transistors that Use Ultrathin Ribbons of Silicon Derived from Bulk Wafers," *Appl. Phys. Lett.* 88:213101.
Madou, M. (1997) "Etch-Stop Techniques," In; *Fundamentals of Microfabrication*, CRC Press, New York, pp. 193-199.
Maikap et al. (2004) "Mechanically Strained-Si NMOSFETs," *IEEE Electron. Dev. Lett.* 25:40-42.
Maldovan et al. (2004) "Diamond-Structured Photonic Crystals," *Nature Materials* 3:593-600.
Mandlik et al. (Aug. 2006) "Fully Elastic Interconnects on Nanopatterned Elastomeric Substrates," *IEEE Electron Dev. Lett.* 27(8):650-652.

(56) References Cited

OTHER PUBLICATIONS

Manna et al. (Web Release May 25, 2003) "Controlled Growth of Tetrapod-Branched Inorganic Nanocrystals," *Nat. Mater.* 2:382-385.
Markovich et al. (1999) "Architectonic Quantum Dot Solids," *Acc. Chem. Res.* 32:415-423.
Marquette et al. (2004) "Conducting Elastomer Surface Texturing: A Path to Electrode Spotting Application to the Biochip Production," *Biosens. Bioelectron.* 20:197-203.
Martensson et al. (2004) "Nanowire Arrays Defined by Nanoimprint Lithography," *Nano Lett.* 4:699-702.
Martin, C.R. (1995) "Template Synthesis of Electronically Conductive Polymer Nanostructures," *Acc. Chem. Res.* 28:61-68.
Mas-Torrent et al. (2006) "Large Photoresponsivity in High-Mobility Single-Crystal Organic Field-Effect Phototransistors," *ChemPhysChem* 7:86-88.
Masuda et al. (2000) "Fabrication of Ordered Diamonds/Metal Nanocomposite Structures," *Chem. Lett.* 10:1112-1113.
Matsunaga et al. (2003) "An Improved GaAs Device Model for the Simulation of Analog Integrated Circuit," *IEEE Trans. Elect. Dev.* 50:1194-1199.
McAlpine et al. (2003) "High-Performance Nanowire Electronics and Photonics on Glass and Plastic Substrates," *Nano Lett.* 3:1531-1535.
McAlpine et al. (2005) "High-Performance Nanowire Electronics and Photonics and Nanoscale Patterning on Flexible Plastic Substrates," *Proc. IEEE* 93:1357-1363.
McCaldin et al. (1971) "Diffusivity and Solubility of Si in the Al Metallization of Integrated Circuits," *Appl. Phys. Lett.* 19:524-517.
Meisel et al. (2004) "Three-Dimensional Photonic Crystals by Holographic Lithography Using the Umbrella Configuration: Symmetries and Complete Photonic Band Gaps," *Phys. Rev. B.* 70:165101:1-10.
Meitl et al. (2004) "Solution Casting and Transfer Printing Single-Walled Carbon Nanotube Films," *Nano Lett.* 4:1643-1947.
Meitl et al. (2006) "Transfer Printing by Kinetic Control of Adhesion to an Elastomeric Stamp," *Nat. Mater.* 5:33-38.
Meitl et al. (Web Release Feb. 22, 2007) "Stress Focusing for Controlled Fracture in Microelectromechanical Systems," *Appl. Phys. Lett.* 90:083110.
Melosh et al. (2003) "Ultrahigh-Density Nanowire Lattices and Circuits," *Science* 300:112-115.
Menard et al. (2004) "A Printable Form of Silicon for High Performance Thin Film Transistors on Plastic Substrates," *Appl. Phys. Lett.* 84:5398-5400.
Menard et al. (2004) "Improved Surface Chemistries, Thin Film Deposition Techniques, and Stamp Designs for Nanotransfer Printing," *Langmuir* 20:6871-6878.
Menard et al. (2004) "High-Performance n- and p-Type Single-Crystal Organic Transistors with Free-Space Gate Dielectrics," *Adv. Mat.* 16:2097-2101.
Menard et al. (2005) "Bendable Single Crystal Silicon Thin Film Transistors Formed by Printing on Plastic Substrates," *Appl. Phys. Lett.* 86(093507):1-3.
Menard et al. (2007) "Micro- and Nanopatterning Techniques for Organic Electronic and Optoelectronic Systems," *Chem. Rev.* 107:1117-1160.
Miao et al. (2003) "Micromachining of Three-Dimensional GaAs Membrane Structures Using High-Energy Nitrogen Implantation," *J. Micromech. Microeng.* 13:35-39.
Michel et al. (2001) "Printing Meets Lithography: Soft Approaches to High-Resolution Patterning," *IBM J. Res. Dev.* 45:697-719.
Miller et al. (2002) "Direct Printing of Polymer Microstructures on Flat and Spherical Surfaces Using a Letterpress Technique," *J. Vac. Sci. Technol. B* 20(6):2320-2327.
Milliron et al. (2004) "Colloidal Nanocrystal Heterostructures with Linear and Branched Topology," *Nature* 430:190-195.
Min, G. (Apr. 4, 2003) "Plastic Electronics and Their Packaging Technologies," *Syn. Metals.* 135:141-143.

Mirkin et al. (2001) "Emerging Methods for Micro- and Nanofabrication," *MRS Bulletin* 26(7):506-507.
Misewich et al. (May 2, 2003) "Electronically Induced Optical Emission from a Carbon Nanotube FET," *Science* 300:783-786.
Mishra et al. (2002) "AlGaN/GaN HEMTs—an Overview of Device Operation and Applications," *Proc. IEEE* 90:1022-1031.
Mitzi et al. (2004) "High-Mobility Ulltrathin Semiconducting Films Prepared by Spin Coating," *Nature* 428:299-303.
Moon et al. (2002) "Ink-Jet Printing of Binders for Ceramic Components," *J. Am. Ceram. Soc.* 85:755-762.
Moore et al. (Sep. 9, 2003) "Individually Suspended Single-Walled Carbon Nanotubes in Various Surfactants," *Nano Lett.* 3(10):1379-1382.
Morales et al. (Jan. 9, 1998) "A Laser Ablation Method for the Synthesis of Crystalline Semiconductor Nanowires," *Science* 279:208-211.
Morent et al. (2007) "Adhesion Enhancement by a Dielectric Barrier Discharge of PDMS used for Flexible and Stretchable Electronics," *J. Phys. D. Appl. Phys.* 40:7392-7401.
Mori et al. (1978) "A New Etching Solution System, $H_3PO_4$—$H_2O_2$—$H_2O$, for GaAs and Its Kinetics," *J. Electrochem. Soc.* 125:1510-1514.
Morkoc et al. (1995) "High-Luminosity Blue and Blue-Green Gallium Nitride Light-Emitting Diodes," *Science* 267:51-55.
Morkved et al. (1994) "Mesoscopic Self-Assembly of Gold Islands on Diblock-Copolymer Films," *Appl. Phys. Lett.* 64:422-424.
Morra et al. (1990) "On the Aging of Oxygen Plasma-Treated Polydimthylsiloxane Surfaces," *J. Colloid Interface Sci.* 137:11-24.
Murakami et al. (2005) "Polarization Dependence of the Optical Absorption of Single-Walled Carbon Nanotubes," *Phys. Rev. Lett.*, 94, 087402.
Murata et al. (2005). "Super-fine ink-jet printing: toward the minimal manufacturing system" *Microsystem Technologies* 12:2-7.
Namazu et al. (2000) "Evaluation of Size Effect on Mechanical Properties of Single Crystal Silicon by Nanoscale Bending Test Using AFM," *J. MEMS* 9:450-459.
Nath et al. (2002) "Nanotubes of the Disulfides of Groups 4 and 5 Metals," *Pure Appl. Chem.* 74(9):1545-1552.
Nathan et al. (2000) "Amorphous Silicon Detector and Thin Film Transistor Technology for Large-Area Imaging of X-Rays,." *Microelectron J.* 31:883-891.
Nathan et al. (2002) "Amorphous Silicon Technology for Large Area Digital X-Ray and Optical Imaging," *Microelectronics Reliability* 42:735-746.
Newman et al. (2004) "Introduction to Organic Thin Film Transistors and Design of n-Channel Organic Semiconductors," *Chem. Mater.* 16:4436-4451.
Nirmal et al. (1999) "Luminescence Photophysics in Semiconductor Nanocrystals," *Acc. Chem. Res.* 32:407-414.
Noda et al. (1996) "New Realization Method for Three-Dimensional Photonic Crystal in Optical Wavelength Region," *Jpn. J. Appl. Phys.* 35:L909-L912.
Nomura et al. (2004) "Room-Temperature Fabrication of Transparent Flexible Thin-Film Transistors Using Oxide Semiconductors," *Nature* 432:488-492.
Notice of Allowance and Notice of References Cited, Corresponding to U.S. Appl. No. 12/778,588 dated Jun. 6, 2014.
Notice of Reasons for Rejection corresponding to Japanese Patent Application No. P2008-514820, Dispatched May 8, 2012—includes English translation.
Notice of Reasons for Rejection corresponding to Japanese Patent Application No. P2006-165159, Dispatched Apr. 24, 2012—includes English translation.
Notice of Reasons for Rejection corresponding to Japanese Patent Application No. P2009-546361, Dispatched Jul. 3, 2012—includes English translation.
Novoselov et al. (Oct. 22, 2004) "Electric Field Effect in Atomically Thin Carbon Films," *Science* 306:666-669.
O'Connell et al. (Jul. 26, 2002) "Bang Gap Fluorescence from Individual Single-Walled Caarbon Nanotubes," *Science* 297:593-596.

(56) References Cited

OTHER PUBLICATIONS

O'Riordan et al. (2004) "Field Configured Assembly: Programmed Manipulation and Self-Assembly at the Mesoscale," *Nano Lett.* 4:761-765.
Odom et al. (2002) "Improved Pattern Transfer in Soft Lithography Using Composite Stamps," *Langmuir* 18(13):5314-5320.
Office Action and Response, Corresponding to Malaysian Patent Publication No. PI 20052553, dated Mar. 13, 2009 and Dec. 8, 2009.
Office Action and Response, Corresponding to U.S. Appl. No. 11/423,287, dated Feb. 13, 2008.
Office Action and Response, Corresponding to U.S. Appl. No. 11/421,654, dated Sep. 29, 2009.
Office Action and Response, Corresponding to U.S. Appl. No. 11/858,788, dated Jan. 28, 2011.
Office Action and Response, Corresponding to U.S. Appl. No. 12/778,588 dated Jan. 8, 2013.
Office Action Corresponding to Chinese Patent Application No. 200780049982.1, dated May 12, 2010.
Office Action Corresponding to Chinese Patent Application No. 200780041127.6, dated Apr. 8, 2011.
Office Action Corresponding to Chinese Patent Application No. 201010519400.5 dated Nov. 3, 2011.
Office Action Corresponding to U.S. Appl. No. 11/851,182, dated Apr. 1, 2010.
Office Action of the Intellectual Property Office of Taiwan dated Dec. 31, 2014, corresponding to Taiwan Patent Application No. 099115162.
Office Action, Corresponding to Chinese Paten Application No. 200580013574.1, dated May 11, 2010.
Office Action, Corresponding to Taiwan Patent Application No. 095121212, dated May 7, 2010.
Office Action, Corresponding to U.S. Appl. No. 11/981,380, dated Sep. 23, 2010.
Office Actions and Responses, Corresponding to U.S. Appl. No. 11/145,542, dated between Apr. 5, 2007 and Dec. 23, 2008.
Office Actions and Responses, Corresponding to U.S. Appl. No. 11/981,380, dated Sep. 23, 2010.
Office Actions, Corresponding to Chinese Patent Application No. 200580018159.5, dated Jan. 23, 2009 and Feb. 12, 2010.
Ohzono et al. (2004) "Ordering of Microwrinkle Patterns by Compressive Strain," *Phys. Rev. B* 69(13):132202.
Ohzono et al. (Web Release Jul. 7, 2005) "Geometry-Dependent Stripe Rearrangement Processes Induced by Strain on Preordered Microwrinkle Patterns," *Langmuir* 21(16):7230-7237.
Ong et al. (2004) "High-Performance Semiconducting Poolythiophenes for Organic Thin-Film Transistors," *J. Am. Chem. Soc.* 126:3378-3379.
Ong et al. (2005) "Design of High-Performance Regioreular Polythiophenes for Organic Thin-Film Transistors," *Proc. IEEE* 93:1412-1419.
Origin Energy (May 2004) "Fact Sheet—Sliver Cells," www.orginenergy.com.au/sliver.
Ouyang et al. (2002) "High-Performance, Flexible Polymer Light-Emitting Diodes Fabricated by a Continuous Polymer Coating Process," *Adv. Mat.* 14:915-918.
Ouyang et al. (2008) "High Frequency Properties of Electro-Textiles for Wearable Antenna Applications," *IEEE Trans. Antennas Propag.* 56(2):381-389.
Ouyang et al. (Web Release Mar. 20, 2000) "Conversion of Some Siloxane Polymers to Silicon Oxide by UV/Ozone Photochemical Processes," *Chem. Mater.* 12(6):1591-1596.
Pan et al. (1988) "Photoreflectance study of narrow-well strained-layer InxGa1—xAs/GaAs coupled multiple-quantum-well structures," *Phys. Rev. B* 38:3375.
Pan et al. (1999) "Screen Printing Process Design of Experiments for Fine Line Printing of Thick Film Ceramic Substrates," *J. Electronics Manufacturing* 9:203.
Pan et al. (2001) "Nanobelts of Semiconducting Oxides," *Science* 291:1947-1949.

Panev et al. (2003) "Sharp Excitation from Single InAs Quantum Dots in GaAs Nanowires," *Appl. Phys. Lett.* 83:2238-2240.
Pardo et al. (2000) "Application of Screen Printing in the Fabrication of Organic Ligh-Emitting Devices," *Adv. Mater.* 12(17):1249-1252.
Park et al. (1997) "Block Copolymer Lithography: Periodic Arrays of ~$10^{11}$ Holes in 1 Square Centimeter," *Science* 276:1401-1404.
Park et al. (1998) "Fabrication of Three-Dimensional Macroporous Membranes with Assemblies of Microspheres as templates," *Chem. Mater.* 10:1745-1747.
Park et al. (2007) "High Resolution Electrohydrodynamic Jet Printing," *Nature Materials.* 6:782-789.
Park et al. (Aug. 2009) "Printed Assemblies of Inorganic Light-Emitting Diodes for Deformable and Semitransparent Displays," *Science* 325:977-981.
Patton et al. (Mar. 1998) "Effect of Diamond like Carbon Coating and Surface Topography on the Performance of Metal Evaporated Magnetic Tapes," *IEEE Trans Magn.* 34(2):575-587.
Paul et al. (Apr. 2003) "Patterning Spherical Surfaces at the Two Hundred Nanometer Scale Using Soft Lithography," *Adv. Func. Mater.* 13(4):259-263.
Pearton et al. (1999) "GaN: Processing, Defects, and Devices," *J. Appl. Phys.* 86:1-78.
Peng et al. (Mar. 2, 2000) "Shape Control of CdSe Nanocrystals," *Nature* 404:59-61.
Piazza et al. (2005) "Protective Diamond-Like Carbon Coatings for Future Optical Storage Disks," *Diamond Relat. Mater.* 14:994-999.
Pimparkar et al. (Feb. 2007) "Current-Voltage Characteristics of Long-Channel Nanobundle Thin-Film Transistors: A 'Bottom-Up' Perspective," *IEEE Electron Dev. Lett.* 28(2):157-160.
Podzorov et al. (2005) "Hall Effect in the Accumulation Layers on the Surface of Orgaic Semiconductors," *Phys. Rev. lett.* 95:226601.
Pollak (1973) "Modulation spectroscopy under uniaxial stress," *Surf. Sci.* 37:863-895.
Pushpa et al. (2002) "Stars and Stripes. Nanoscale Misfit Dislocation Patterns on Surfaces," *Pure Appl. Chem.* 74(9):1663-1671.
Quake et al (2000) "From Micro- to Nanofabrication with Soft Materials," *Science* 290:1536-1540.
Radtke et al. (Feb. 5, 2007) "Laser-Lithography on Non-Planar Surfaces," *Opt. Exp.* 15(3):1167-1174.
Raman et al. (1989) "Study of Mesa Undercuts Produced in GaAs with $H_3PO_4$-Based Etchants," *J. Electrochem. Soc.* 136:2405-2410.
Rao et al. (2003) "Large-scale assembly of carbon nanotubes," *Nature*, 425:36-37.
Razeghi et al. (1994) "High-Power Laser Diode Based on In GaAsP Alloys," *Nature* 369:631-633.
Razouk et al. (Sep. 1979) "Dependence of Interface State Density on Silicon Thermal Oxidation Process Variables," *J. Electrochem. Soc.* 126(9):1573-1581.
Reuss et al. (Jul. 2005) "Macroelectronics: Perspectives on Technology and Applications," *Proc. IEEE* 93(7):1239-1256.
Reuss et al. (Jun. 2006) "Macroelectronics," *MRS Bull.* 31:447-454.
Ribas et al. (1998) ",,Bulk Micromachining Characterization of 1.2 μm HEMT MMIC Technology for GaAs MEMS Design, *Mater. Sci. Eng. B* 51:267-273.
Ridley et al. (1999) "All-Inorganic Field Effect Transistors Fabricated by Printing," *Science* 286:746-749.
Roberts et al. (1979) "Looking at Rubber Adhesion," *Rubber Chem. Technol.* 52:23-42.
Roberts et al. (Mar. 2006) "Elastically Relaxed Free-Standing Strained-Silicon Nanomembranes," *Nat. Mater.* 5:388-393.
Robinson et al. (1983) "GaAs Readied for High-Speed Microcircuits," *Science* 219:275-277.
Roelkens et al. (Dec. 2005) "Integration of InP/InGaAsP Photodetectors onto Silicon-on-Insulator Waveguide Circuits," *Optics Express* 13(25):10102-10108.
Rogers et al. (1997) "Using an Elastomeric Phase Mask for Sub-100 nm Photolithography in the Optical Near Field," *Appl. Phys. Lett.* 70:2658-2660.
Rogers et al. (1998) "Generating ~90 Nanometer Features Using Near Field Contact Mode Photolithography with an Elastomeric Phase Mask," *J. Vac. Sci. Technol.* 16(1):59-68.

(56) References Cited

OTHER PUBLICATIONS

Rogers et al. (1998) "Quantifying Distortions in Soft Lithography," *J. Vac. Sci. Technol.* 16:88-97.
Rogers et al. (1998) "Using Printing and Molding Techniques to Produce Distributed Feedback and Bragg Reflector Resonators for Plastic Lasers," *Appl. Phys. Lett.* 73:1766-1768.
Rogers et al. (1999) Printing Process Sutable for Reel-to-Reel Production of High-Performance Organic Transistors and Circuits, *Adv. Mater.* 11(9):741-745.
Rogers et al. (2002) "Paper-Like Electronic Displays: Large-Area Rubber-Stamped Plastic Sheets of Electronics and Microencazpsulated Electrophoretic Inks," *Proc. Nat. Acad. Sci. USA* 98:4835-4840.
Rogers et al. (2002) "Printed Plastic Electronics and Paperlike Displays," *J. Polym. Sci. Part A. Polym. Chem.* 40:3327-3334.
Rogers et al. (Mar. 2000) "Organic Smart Pixels and Complementary Inverter Circuits Formed on Plastic Substrates by Casting and Rubber Stamping," *IEEE Electron Dev. Lett.* 21(3):100-103.
Rogers, J. (Jul. 9, 2010) "Farewell to Flatland," *Science* 329:138-139.
Rogers, J.A. (2001) "Rubber Stamping for Plastic Electronics and Fiber Optics," *MRS Bulletin* 26(7):530-534.
Rogers, J.A. (2001) "Toward Paperlike Displays," *Science* 291:1502-1503.
Rosenblatt et al. (2002) "High Performance Electrolyte Gated Carbon Nanotube Transistors," *Nano Lett.* 2(8):869-872.
Rotkin et al. (2003) "Universal Description of Channel Conductivity for Nanotube and Nanowire Transistors," *Appl. Phys. Lett.* 83:1623-1625.
Roundy et al. (2003) "Photonic Crystal Structure with Square Symetry within Each Layer and a Three-Dimensional Band Gap," *Appl. Phys Lett.* 82:3835-3837.
Ruchehoeft et al. (2000) "Optimal Strategy for Controlling Linewidth on Spherical Focal Surface Arrays," *J. Vac. Sci. Technol. B* 18(6):3185-3189.
Samuelson et al. (2004) "Semiconductor Nanowires for Novel One-Dimensional Devices," *Physica E* 21:560-567.
Sangwal et al. (1997) "Nature of multilayer steps on the {100} cleavage planes of MgO single crystals," *Surf. Sci.*, 383:78-87.
Sanyal et al. (2002) "Morphology of Nanostructures Materials," *Pure Appl. Chem.* 74(9):1553-1570.
Sazonov et al. (2005) "Low-Temperature Materials and Thin-Film Transistors for Flexible Electronics," *Proc. IEEE* 93:1420-1428.
Schermer et al. (Web Release Apr. 28, 2005) "Thin-Film GaAs Epitaxial Lift-Off Solar Cells for Space Applications," *Prog. Photovoltaics: Res. Applic.* 13:587-596.
Schermer et al. (Web Release Jan. 19, 2006) "Photon Confinement in High-Efficiency, Thin-Film III-V Solar Cells Obtained by Epitaxial Lift-Off," *Thin Solid Films* 511-512:645-653.
Schlegel et al. (2002) "Structures of quartz (1010)- and (1011)-water interfaces determined by X-ray reflectivity and atomic force microscopy of natural growth surfaces," *Geochim. Cosmochim. Acta*, vol. 66, No. 17, pp. 3037-3054.
Schmid et al. (2003) "Preparation of metallic Films on Elastomeric Stamps and Their Application on Contact Processing and Contact Printing," *Adv. Funct. Mater.* 13:145-153.
Schmid et al. (Mar. 25, 2000) "Siloxane Polymers for High-Resolution, High-Accuracy Soft Lithography," *Macromolecules* 33(8):3042-3049.
Schmidt et al. (Mar. 8, 2001) "Thin Solid Films Roll up into Nanotubes," *Nature* 410:168.
Schneider et al. (2008) "Mechanical Properties of Silicones for MEMS," *J. Micromech. Microeng.* 18:065008.
Schon et al. (1995) "Ambipolar Pentacene Field-Effect Transistors and Inverters," *Science* 287:1022-1023.
Schrieber et al. (1998) "The Effectiveness of Silane Adhesion Promotors in the Performance of Polyurethane Adhesives," *J. Adhesion* 68:31-44.
Scnable et al. (1969) "Aluminum Metallization; Advantages and Limitations for Integrated Circuit Applications," *IEEE* 57:1570-1580.
Scorzoni et al. (Oct. 4, 2004) "On the Relationship Between the Temperature coefficient of Resistance and the Thermal Conductance of Integrated Metal Resistors," *Sens Actuators A* 116(1):137-144.
Search and Examination Report, Corresponding to Singapore Application No. 200904208-6, dated Dec. 17, 2010.
Search Report and Examination Report Corresponding to Singapore Patent Application No. 200901178-4, Completed Mar. 13, 2010.
Search Report and Written Opinion, Corresponding to Singapore Application No. 200901451-5, dated Dec. 22, 2010.
Search Report Corresponding to Singapore Patent Application No. SG 200607372-0, dated Oct. 17, 2007.
Search Report Corresponding to Taiwanese Patent Application No. 095121212, Completed Oct. 8, 2010.
Search Report, Corresponding to Republic of China (Taiwan) Patent Application No. 094118507, dated Feb. 24, 2007.
Seidel et al. (2004) "High-Current Nanotube Transistors," *Nano Lett.*, vol. 4, No. 5, pp. 831-834.
Sekitani et al. (2005) "Bending Experiment on Pentacene Fiield-Effect Transistors on Plastic Films," *Appl. Phys. Lett.* 86:073511.
Sekitani et al. (Apr. 1, 2008) "Organic Transistors Manufactured Using Inkjet Technology with Subfemtoliter Accuracy," *Proc. Nat. Acad. Sci. USA* 105(13):4976-4980.
Sekitani et al. (Sep. 12, 2008) "A Rubberlike Stretchable Active Matrix Using Elastic Conductors," *Science* 321:1468-1472.
Sen et al. (2002) "Nonequilibrium Processes for Generating Silicon Nanostructures in Single-Crystalline Silicon," *Pure Appl. Chem.* 74(9):1631-1641.
Serikawa et al. (May 1, 2000) "High-Mobility Poly-Si Thin Film Transistors Fabricated on Stainless-Steel Foils by Low-Temperature Processes Using Sputter-Depositions," *Jpn. J. Appl. Phys.* 39:L393-L395.
Servanti et al. (2005) "Functional Pixel Circuits for Elastic AMOLED displays," *Proc. IEEE* 93:1257-1264.
Service, R.F. (Aug. 15, 2003) "Electronic Textiles Charge Ahead," *Science* 301:909-911.
Shan et al. (2004) "From Si Source Gas Directly to Positioned, Electrically Contained Si Nanowires: The Self-Assembling 'Grow-in-Place' Approach," *Nano Lett.* 4(11):2085-2089.
Sharma et al. (2005) "Vertically Oriented GaN-Based Air-Gap Distributed Bragg Reflector Structure Fabricated Using Band-Gap-Selective Photoelectrochemical Etching," *Appl. Phys. Lett.* 87:051107.
Sharp et al. (2003) "Holographic Photonic Crystals with Diamond Symmetry," *Phys. Rev. B* 68:205102/1-205102/6.
Sheraw et al. (2002) "Organic Thin-Film Transistor-Driven Polymer-Dispersed Liquid Crystal Displays on Flexible Polymeric Substrates," *Appl. Phys. Lett.* 80:1088-1090.
Shetty et al. (2005) "Formation and Characterization of Silicon Films on Flexible Polymer Substrates," *Mater. Lett.* 59:872-875.
Shi et al. (2001) "Free-Standing Single Crystal Silicon Nanoribbons," *J. Am. Chem. Soc.* 123(44):11095-11096.
Shi et al. (Sep. 2000) "Synthesis of Large Areas of Highly Oriented, Very Long Silicon Nanowires," *Adv. Mater.* 12(18):1343-1345.
Shtein et al. (Oct. 15, 2004) "Direct Mask-Free Patterning of Molecular Organic Semiconductors Using Organic Vapor Jet Printing," *J. Appl. Phys.* 96(8):4500-4507.
Shull et al. (1998) "Axisymmetric Adhesion Tests of Soft Materials," *Macromol. Chem. Phys.* 199:489-511.
Siegel et al. (Web Release Feb. 7, 2007) "Microsolidics: Fabrication of Three-Dimensional Metallic Microstructures in Poly(dimethylsiloxane)," *Adv. Mater.* 19(5):727-733.
Sim et al. (1993) "An Analytical Back-Gate Bias Effect Model for Ultrathin SOI CMOS Devices," *IEEE Trans. Elec. Dev.* 40:755-765.
Sirringhaus et al. (2003) "Inkjet Printing of Functional Materials," *MRS Bull.* 28:802-806.
Sirringhaus et al. (Dec. 15, 2000) "High-Resolution Inkjet Printing of All-Polymer Transistor Circuits," *Science* 290:2123-2126.
Sirringhaus, H. (2005) "Device Physics of Solution-Processed Organic Field-Effect Transistors," *Adv. Mater.* 17:2411-2425.
Smay et al. (2002) "Colloidal Inks for Directed Assembly of 3-D Periodic Structures," *Langmuir* 18:5429-5437.
Smith et al. (2000) "Electric-Field Assisted Assembly and Alignment of Metallic Nanowires," *Appl. Phys. Lett.* 77(9):1399-1401.

(56) References Cited

OTHER PUBLICATIONS

Snow et al. (2003) "Random networks of carbon nanotubes as an electronic material," *Appl. Phys. Lett.*, vol. 82, No. 13, pp. 2145-2147.
Snow et al. (2005) "High-mobility carbon-nanotube transistors on a polymeric substrate," *Appl. Phys. Lett.*, 86, 033105.
So et al. (2008) "Organic Light-Emitting Devices for Solid-State Lighting," *MRS Bull.* 33:663-669.
Someya et al. (2005) "Conformable, Flexible, Large-Area Networks of Pressure and Thermal Sensors with Organic Transistor Active Matrixes," *Proc. Nat. Acad. Sci. USA* 102:12321-12325.
Someya et al. (2005) "Integration of Organic FETs with Organic Photodiodes for a Large Area, Flexible, and Lightweight Sheet Image Scanners," *IEEE Trans. Electron Devices* 52:2502-2511.
Someya et al. (Jul. 6, 2004) "A Large-Area, Flexible, Pressure Sensor Matric with Organic Field-Effect Transistors for Artificial Skin Applications," *Proc. Nat. Acad. Sci. USA* 101(27):9966-9970.
Someya, T. (Aug. 7, 2008) "Electronic Eyeballs," *Nature* 454:703-704.
Soole et al. (Mar. 1991) "InGaAs Metal-Semiconductor-Metal Photodetectors for Long Wavelength Optical Communications," *IEEE J. Quantum Electron.* 27(3):737-752.
Srinivasan et al. (Web Release Mar. 26, 2007) "Piezoelectric/Ultrananocrystalline Diamond Heterostructures for High-Performance Multifunctional Micro/Nanoelectromechanical Systems," *Appl. Phys. Lett.* 90:134101.
Stafford et al. (Aug. 2004) "A Buckling-Based Metrology for Measureing the Elastic Moduli of Polymeric Thin Films," *Nature Mater.* 3:545-550.
Star et al. (2004) "Nanotube Optoelectric Memory Devices," *Nano Lett.*, vol. 4, No. 9, pp. 1587-1591.
Stareev (1993) "Formation of extremely low resistance Ti/Pt/Au ohmic contacts to p-GaAs," *Appl. Phys. Lett.* 62:2801.
Stauth et al. (2006) "Self-assembled single-crystal silicon circuits on plastic," *Proc. Natl. Acad. Sci. USA* 103:13922-13927.
Stella Project—Stretchable Electronics for Large-Area Applications. Available at www.stella-project.de. Accessed Feb. 8, 2012.
Stocker et al. (1998) "Crystallographic wet chemical etching of GaN," *Appl. Phys. Lett.* 73:2654.
Storm et al. (Aug. 2003) "Fabrication of Solid-State Nanopores with Single-Nanometre Precision," *Nat. Mater.* 2:537-540.
Streetman et al. (2000) "Intrinsic Material," In; *Solid State Electronic Devices*, 5$^{th}$ Ed., Prentice Hall; Upper Saddle River, NJ; pp. 74-75.
Strukov et al. (2005) "CMOL FPGA: A Reconfigurable Architecture for Hybrid Digital Circuits with Two-Terminal Nanodevices," *Nanotechnology* 16:888-900.
Su et al. (2000) "Lattice-Oriented Growth of Single-Walled Carbon Nanotubes," *J. Phys. Chem. B* 104(28):6505-6508.
Sumant et al. (Apr. 2005) "Toward the Ultimate Tribological Interface: Surface Chemistry and Nanotribology of Ultrananocrystalline Diamond," *Adv. Mater.* 17(8):1039-1045.
Sun et al. (2004) "Fabricating Semiconductor Nano/Microwires and Transfer Printing Ordered Arrays of Them onto Plastic Substrates," *Nano Lett.* 4:1953-1959.
Sun et al. (2005) "Advances in Organic Field-Effect Transistors," *J. Mater. Chem.* 15:53-65.
Sun et al. (2005) "Bendable GaAs Metal-Semiconductor Field-Effect Transistors Formed with a Printed GaAs Wire Arrays on Plastic Substrates," *Appl. Phys. Lett.* 87:083501.
Sun et al. (2005) "Photolithographic Route to the Fabrication of Micro/Nanowires of III-V Semiconductors," *Adv. Fuct. Mater.* 15:30-40.
Sun et al. (2007) "Controlled Buckling of Semiconductor Nanoribbons for Stretchable Electronics," *Nat. Nanotechnol.* 1:201-207.
Sun et al. (2007) "Inorganic Semiconductors for Flexible Electronics," *Adv. Mater.* 19:1897-1916.
Sun et al. (2007) "Structural Forms of Single Crystal Semiconductor Nanoribbons for High-Performance Stretchable Electronics," *J. Mater Chem.* 17:832-840.

Sun et al. (Nov. 2006) "Buckled and Wavy Ribbons of GaAs for High-Performance Electronics on Elastomeric Substrates," *Adv. Mater.* 18(21):2857-2862.
Sundar et al. (2004) "Elastomeric Transistor Stamps: Reversible Probing of CHaarge Transport in Organic Crystals," *Science* 303:1644-1646.
Suo et al. (Feb. 22, 1999) "Mechnics of Rollable and Foldable Film-on-Foil Electronics," *Appl. Phys. Lett.* 74(8):1177-1179.
Supplementary European Search Report Corresponding to European Patent Application No. 07 84 1968, Completed Mar. 31, 2011.
Supplementary European Search Report dated Jun. 15, 2012, corresponding to European Patent Application No. 09 71 6695.
Supplementary European Search Report, Corresponding to European Application No. 05 75 6327, Completed Sep. 25, 2009.
Swain et al. (2004) "Curved CCD Detector Devices and Arrays for Multi-Spectral Astrophysical Application and Terrestrial Stereo Panoramic Cameras," *Proc. SPIE* 5499:281-301.
SWEET: Stretchable and Washable Electronics for Embedding Textiles. Available at http://tfcg.elis.ugent.be/projects/sweet. Accessed Feb. 8, 2012.
Sze et al. (1985) *Semiconductor Devices, Physics and Technology*, 2$^{nd}$ ed., Wiley, New York, pp. 190-192.
Sze, S. (1985) *Semiconductor Devices: Physics and Technology*, New York: Wiley, pp. 428-267.
Sze, S. (1988) *VLSI Technology*, Mcgraw-Hill, 327-374, 566-611.
Sze, S. (1994) *Semiconductor Sensors*, John Wiley and Sons: New York, pp. 17-95.
Takamoto et al. (Jan. 20, 1997) "Over 30% Efficient InGaP/GaAs Tandem Solar Cells," *Appl. Phys. Lett.* 70(3):381-383.
Talapin et al. (Oct. 7, 2005) "PbSe Nanocrystal Solids for n- and p-Channel Thin Film Field-Effect Transistors," *Science* 310:86-89.
Tamura et al. (1998) "Estimation of Sidewall Nonradiative Recombination in GaInAsP/InP Wire Structures Fabricated by Low Energy Electron-Cyclotron-Resonance Reactive-Ion-Beam-Etching," *Jpn. J. Appl. Phys.* 37:3576-3584.
Tan et al. (Apr. 12, 2004) "Performance Enhancement of InGaN Light Emitting Diodes by Laser-Lift-off and Transfer from Sapphire to Copper Substrate," *Appl. Phys. Lett.* 84(15):2757-2759.
Tanase et al. (2002) "Magnetic Trapping and Self-Assembly of Multicomponent Nanowires," *J. Appl. Phys.* 91:8549-8551.
Tang et al. (2005) "One-Dimensional Assemblies of Nanoparticles: Preparation, Properties, and Promise," *Adv. Mater.* 17:951-962.
Tao et al. (2003) "Langmuir-Blodgett Silver Nanowire Monolayers for Molecular Sensing Using Surface-Enhanced Raman Spectroscopy," *Nano Lett.* 3:1229-1233.
Tate et al. (2000) "Anodization and Microcontact Printing on Electroless Silver: Solution-Based Fabrication Procedures for Low-Voltage Electronic Systems with Organic Active Components," *Langmuir* 16:6054-6060.
Tekin et al. (2008) "Inkjet printing as a deposition and patterning tool for polymers and inorganic particles," *Soft Matter.* 4:703-713.
Teshima et al. (2001) "Room-Temperature Deposition of High-Purity Silicon Oxide Films by RF Plasma-Enhanced CVD," *Surf. Coat. Technol.* 146-147:451-456.
Theiss et al. (1998) "PolySilicon Thin Film Transistors Fabricated at 100°C on a Flexible Plastic Substrate," *IEDM* 98:257-260.
Toader et al. (2004) "Photonic Band Gap Architectures for Holographic Lithography," *Phy. Rev. Lett.* 043905/1-043905/4.
Toader et al. (2004) "Photonic Band Gaps Based on Tetragonal Lattices of Slanted Pores," *Phys. Rev. Lett.* 90:233901/1-233901/4.
Tong (1999) *Semiconductor Wafer Bonding: Science and Technology*, John Wiley; New York, pp. 187-221.
Trau et al. (1997) "Microscopic Patterning of Orientated Mesoscopic Silica Through Guided Growth," *Nature* 390:674-676.
Trentler et al. (1995) "Solution-Liquid-Solid Growth of Crytalline III-V Semiconductors: An Analogy to Vapor-Liquid-Solid Growth," *Science* 270:1791-1794.
Tseng et al. (Web Release Dec. 19, 2003) "Monolithic Integration of Carbon Nanotube Devices with Silicon MOS Technology" *Nano Lett.* 4(1):123-127.
Ucjikoga, S. (2002) "Low-Temperature Polycrystalline Silicon Thin-Film Transistor Technologies ofr System-on-Glass Displays," *MRS Bull.* 27:881-886.

(56) References Cited

OTHER PUBLICATIONS

Urruchi et al. (2000) "Etching of DLC Films Using a Low Intensity Oxygen Plasma Jet," *Diamond Relat. Mater.* 9:685-688.
Vanhollenbeke et al. (2000) "Compliant Substrate Technology: Integration of Mismatched Materials for Opto-Electronic Applications," *Prog. Cryst. Growth Charact. Mater.* 41(1-4):1-55.
Velev et al. (1997) "Porous silica via colloidal crystallization," *Nature* 389:447-448.
Vilan et al. (2000) "Molecular Control Over Au/GaAs Diodes," *Nature* 404:166-168.
Vlasov et al. (2001) "On-Chip Natural Assembly of Silicon Photonic Bandgap Crystals," *Nature* 414:289-293.
Voss, D. (2000) "Cheap and Cheerful Circuits," *Nature* 407:442-444.
Wagner et al. (2003) "Silicon for Thin-Film Transistors," *Thin Solid Films* 430:15-19.
Wagner et al. (2005) "Electronic Skin: Architecture and Components," *Physica E* 25:326-334.
Wagner et al. (Mar. 1, 1964) "Vapor-Liquid-Solid Mechanism of Single Crystal Growth," *Appl. Phys. Lett.* 4(5):89-90.
Wang et al. (2003) "A Solution-Phase, Precursor Route to Polycrystalline $SnO_2$ Nanowores that can be Used for Gas Sensing under Ambient Conditions," *J. Am. Chem. Soc.* 125:16176-16177.
Wang et al. (2005) "Electronically Selective Chemical Functionalization of Carbon Nanotubes: Correlation between Raman Spectral and Electrical Responses," *J. Am. Chem. Soc.*, 127:11460-11468.
Wang et al. (2005) "Oxidation Resistant Germanium Nanowires: Bulk Synthesis, Long Chain Alkanethiol Functionalization, and Langmuir-Blodgett Assembly," *J. Am. Chem. Soc.* 127(33):11871-11875.
Wang et al. (2006) "Direct Synthesis and Characterization of CdS Nanobelts," *Appl. Phys. Lett.* 89:033102.
Weber et al. (Jan. 2004) "A Novel Low-Cost, High Efficiency Micromachined Silicon Solar Cell," *IEEE Electron Device Lett.* 25(1):37-39.
Wen et al. (Web Release Dec. 4, 2004) "Controlled Growth of Large-Area, Uniform, Vertically Aligned Arrays of α-$Fe_2O_2$ Nanobelts and Nanowires," *J. Phys. Chem. B* 109(1):215-220.
Whang et al. (2003) "Large-Scale Hierarchical Organization of Nanowire Arrays for Integrated Nanosystems," *Nano Lett.* 3(9):1255-1259.
Whitesides et al. (2002), "Beyond molecules: Self-assembly of mesoscopic and macroscopic components", *PNAS*, vol. 99, No. 8, pp. 4769-4774.
Williams et al. (Oct. 2006) "Growth and Properties of Nanocrystalline Diamond Films," *Phys. Stat. Sol. A* 203(13):3375-3386.
Williams et al. (Web Release Jan. 23, 2006) "Comparison of the Growth and Properties of Ultranocrystalline Diamond and Nanocrystalline Diamond," *Diamond Relat. Mater.* 15:654-658.
Willner et al. (2002) "Functional Nanoparticle Architectures for Senoric, Optoelectronic, and Bioelectronic Applications," *Pure Appl. Chem.* 74(9):1773-1783.
Wind et al. (May 20, 2002) "Vertical Scaling of Carbon Nanotube-Field-Effect Transitors Using Top Gate Electrodes," *Appl. Phys. Lett.* 80(20):3871-3819.
Won et al. (2004) "Effect of Mechanical and Electrical Stresses on the Performance of an a-Si:H TFT on Plastic Substrate," *J. Electrochem. Soc.* 151:G167-G170.
Wu et al. (2001) "Amorphous Silicon Crystallization and Polysilicon Thin Film Transistors on SiO2 Passivated Steel Foil Substrates," *Apple. Surf. Sci* 175-176:753-758.
Wu et al. (2001) "Direct Observation of Vapor-Liquid-Solid Nanowire Growth," *J. Am. Chem. Soc.* 123(13):3165-3166.
Wu et al. (2001) "Thermal Oxide of Polycrystalline Silicon on Steel Foil as a Thin-Film Transistor Gate Dielectric," *Appl. Phys. Lett.* 78:3729-2731.
Wu et al. (2002) "Block-by-Block Growth of Single-Crystalline Si/SiGe Superlattice Nanowires," *Nano Lett.* 2(2):83-86.
Wu et al. (2002) "Growth of Au-Catalyzed Ordered GaAs Nanowire Arrays by Molecular-Beam Epitaxy," *Appl. Phys. Lett.* 81:5177-5179.
Wu et al. (2002) "Inorganic Semiconductor Nanowires: Rational Growth, Assembly, and Novel Properties," *Chem. Eur. J.* 8(6):1261-1268.
Wu et al. (2003) "Growth, Branching, and Kinking of Molecular-Beam Epitaxial (110) GaAs Nanowires," *Appl. Phys. Lett.* 83:3368-3370.
Wu et al. (Jul. 1, 2004) "Single-Crystal Metallic Nanowires and Metal/Semiconductor Nanowire Heterostructures," *Nature* 430:61-65.
Wu et al. (Nov. 2002) "Complementary Metal-Oxide-Semiconductor Thin-Film Transistor Circuits from a High-Temperature Polycrystalline Silicon Process on Steel Foil Substrates," *IEEE Trans. Electr. Dev.* 49(11):1993-2000.
Xia (1998) "Soft Lithography" *Angew. Chem. Int. Ed.* 37:551-575.
Xia et al. (1996) "Shadowed Sputtering of Gold on V-Shaped Microtrenches Etched in Silicon and Applications in Microfabrication," *Adv. Mater.* 8(9):765-768.
Xia et al. (1998) "Soft Lithography," *Annu. Rev. Mater. Sci.* 28:153-184.
Xia et al. (1999) "Unconventional Methods for Fabricating and Patterning Nanostructures," *Chem. Rev.* 99:1823-1848.
Xia et al. (2003) "One-Dimensional Nanostructures: Synthesis, Characterization and Applications," *Adv. Mater.* 15:353-389.
Xia et al. (Jul. 19, 1996) "Complex Optical Surfaces Formed by Replica Molding Against Elastomeric Masters," *Science* 273:347-349.
Xiang et al. (Mar. 25, 2006) "Ge/Si Nanowire Heterostructures as High-Performance Field-Effect Transistors," *Nature* 441:489-493.
Xiao et al. (2003) "High-mobility thin-film transistors based on aligned carbon nanotubes," *Appl. Phys. Lett.*, vol. 83, No. 1, pp. 150-152.
Xie et al. (May 2003) "Polymer-Controlled Growth of $Sb_2Se_3$ Nanoribbons Via a Hydrothermal Process," *J. Cryst. Growth* 252(4):570-574.
Xin et al. (Jun. 2005) "Evaluation of Polydimethylsiloxane Scaffolds with Physiologically-Relevant Elastic Moduli: Interplay of Substrate Mechanics and Surface Chemistry Effects on Vascular Smooth Muscle Cell Response," *Biomaterials* 26(16):3123-3129.
Yablonovitch et al. (1987) "Extreme selectivity in the lift-off of epitaxial GaAs films," *Appl. Phys. Lett.* 51:2222.
Yablonovitch et al. (1990) "Van der Waals bonding of GaAs epitaxial liftoff films onto arbitrary substrates," *Appl. Phys. Lett.* 56:2419.
Yang et al. (1997) "Mesoporous Silica with Micrometer-Scale Desgns," *Adv. Mater.* 9:811-814.
Yang et al. (2000) "Stability of Low-Temperature Amorphous Silicon Thin Film Transistors Formed on Glass and Transparent Plastic Substrates," *J. Vac. Sci. Technol. B* 18:683-689.
Yang et al. (2002) "Creating Periodic Three-Dimensional Structures by Multibeam Interface of Visible Laser," *Chem. Mater.* 14:2831-2833.
Yang et al. (Dec. 2007) "RFID Tag and RF Structures on a Paper Substrate Using Inkjet-Printing Technology," *IEEE Trans. Microw. Theory Tech.* 55(12):2894-2901.
Yang, P. (2005) "The Chemistry and Physics of Semiconductor Nanowires," *MRS Bull.* 30:85-91.
Yanina et al. (2002) "Terraces and ledges on (001) spinel surfaces," *Surf. Sci.*, 513:L402-L412.
Yao et al. (Mar. 2000) "High-Field Effect Electrical Transport in Single-Walled Carbon Nanotubes," *Phys. Rev. Lett.* 84(13):2941-2944.
Yeh et al. (1994) "Fluidic Self-Assembly for the Integration of GaAs Light Emitting Diodes on Si Substrates," *IEEE Photon. Techn. Lett.* 6:706-708.
Yin et al. (2000) "A Soft Lithography Approach to the Fabrication of Nanostructures of Single Crystalline Silicon with Well-Defined Dimensions and Shapes," *Adv. Mater.* 12:1426-1430.
Yin et al. (2005) "Colloidal Nanocrystal Synthesis and the Organic-Inorganic Interface," *Nature* 437:664-670.

(56) References Cited

OTHER PUBLICATIONS

Yoon et al. (2005) "Low-Voltage Organic Field-Effect Transistors and Inverters Enabled by Ultrathin Cross-Linked Polymers as Gate Dielectrics," *J. Am. Chem. Soc.* 127:10388-10395.
Yoon et al. (2008) "Ultrathin Silicon Solar Microcells for Semi-transparent, Mechanically Flexible and Microconcentrator Module Designs," *Nat. Mater.* 7:907-915.
Yu et al. (2000) "Silicon Nanowires: Preparation, Device Fabrication, and Transport Properties," *J. Phys. Chem. B* 104(50):11864-11870.
Yu et al. (2003) "Solution-Liquid-Solid Growth of Soluble GaAs Nanowires," *Adv. Mater.* 15:416-419.
Yu et al. (2003) „Two-Versus Three-Dimensional Quantum Confinement in Indium Phosphide Wires and Dots, *Nat. Mater.* 2:517-520.
Yuan et al. (2006) "High-Speed Strained-Single-Crystal-Silicon Thin-Film Transistors on Flexible Polymers," *J. Appl. Phys.* 100:013708.
Yurelki et al. (Jul. 24, 2004) "Small-Angle Neutron Scattering from Surfactant-Assisted Aqueous Dispersions of Carbon Nanotubes," *J. Am. Chem. Soc.* 126(32):9902-9903.
Zakhidov et al. (1998) "Carbon Structure with Three-Dimensional Periodicity at Optical Wavelengths," *Science* 282:897-901.
Zaumseil et al. (2003) "Nanoscale Organic Transistors that use Source/Drain Electrodes Supported by High Resolution Rubber Stamps," *Appl. Phys. Lett.* 82(5):793-795.
Zaumseil et al. (2003) "Three-Dimensional and Multilayer Nanostructures Formed by Nanotransfer Printing," *Nano Lett.* 3(9):1223-1227.
Zhang et al. (2001) "Electric-field-directed growth of aligned single-walled carbon nanotubes," *Appl. Phys. Lett.*, vol. 79, No. 19. pp. 3155-3157.
Zhang et al. (2005) "Low-Temperature Growth and Photoluminescence Property of ZnS Nanoribbons," *J. Phys. Chem. B* 109(39):18352-18355.
Zhang et al. (2006) "Anomalous Coiling of SiGe/Si and SiGe/Si/Cr Helical Nanobelts," *Nano Lett.* 6(7):1311-1317.
Zhang et al. (Apr. 2003) "Oxide-Assisted Growth of Semiconducting Nanowires," *Adv. Mater.* 15(7-8):635-640.
Zhang et al. (Apr. 5, 2004) "Structure and Photoiluminescence of ZnSe Nanoribbons Grown by Metal Organic Chemical Vapor Deposition," *Appl. Phys. Lett.* 84(14):2641-2643.
Zhang et al. (Feb. 9, 2006) "Electronic Transport in Nanometre-Scale Silicon-on-Insulator Membranes," *Nature* 439:703-706.
Zhao et al. (Mar. 2007) "Improved Field Emission Properties from Metal-Coated Diamond Films," *Diamond Relat Mater.* 16(3):650-653.
Zheng et al. (2004) "Shape-and Solder-Directed Self-Assembly to Package Semiconductor Device Segments," *Appl. Phys. Lett.* 85:3635-3637.
Zheng et al. (2006) "Fluidic heterogeneous microsystems assembly and packaging," *J. Microelectromech. Syst.* 15:864.
Zheng et al. (Aug. 31, 2004) "Sequential Shape-and-Solder-Directed Self Assembly of Functional Microsystems," *Proc. Natl. Acad. Sci. USA* 101(35):12814-12817.
Zhou et al. (2002) "An Efficient Two-Photon-Generated Photoacid Applied to Positive-Tone 3D Microfabrication," *Science* 296:1106-1109.
Zhou et al. (2004) "p-Channel, n-Channel Thin Film Transistors and p-n Diodes Based on Single Wall Carbon Nanotube Networks," *Nano Lett.* 4:2031-2035.
Zhou et al. (2005) "Band Structure, Phonon Scattering, and the Performance Limit of Single-Walled Carbon Nanotube Transistors," *Phys. Rev. Lett.* 95:146805.
Zhou et al. (2005) "Mechanism for Stamp Collapse in Soft Lithography," *Appl. Phys. Lett.* 87:251925.
Zhu et al. (2005) "Spin on Dopants for High-Performance Single Crystal Silicon Transistors on Flexible Plastic Substrates," *Appl. Phys. Lett.* 86(133507)1-3.
Office Action corresponding to Taiwanese Patent Application No. 104121890, dated Feb. 26, 2016—with English translation.
Office Action corresponding to European Patent Application No. 10775462.4, dated Oct. 20, 2016, 5 pages.
Notice of Allowance corresponding to Korean Patent Application No. 10-2011-7029750, with English Translation, 5 pages.
Office Action corresponding to European Patent Application No. 10775462.4, dated Apr. 18, 2017, 6 pages.
Notice of Preliminary Rejection corresponding to Korean Patent Application No. 10-2011-7029750, dated Mar. 22, 2016, with English Translation, 5 pages.
European First Office Action, dated Sep. 25, 2018, in European Patent Application No. 10775462.4, a related application, 5 pp.

\* cited by examiner

| Layer | Layer Name | Material | Thickness (nm) | Type | Dopant | Concentration (cm$^{-3}$) |
|---|---|---|---|---|---|---|
| 1 | Contact | GaAs | 5 | P | C | 1.00E+19 |
| 2 | Spreader | Al$_{0.45}$Ga$_{0.55}$As | 800 | P | C | 1.00E+18 |
| 3 | Clad | In$_{0.5}$Al$_{0.5}$P | 200 | P | Zn | 3E17 to 6E17 |
| 4 | Barrier | Al$_{0.25}$Ga$_{0.25}$In$_{0.5}$P | 6 | - | - | <1E16 |
| 5 | Well | In$_{0.56}$Ga$_{0.44}$P | 6 | - | - | <1E16 |
| 6 | Barrier | Al$_{0.25}$Ga$_{0.25}$In$_{0.5}$P | 6 | - | - | <1E16 |
| 7 | Clad | In$_{0.5}$Al$_{0.5}$P | 200 | N | Si | 1.00E+18 |
| 8 | Spreader | Al$_{0.45}$Ga$_{0.55}$As | 800 | N | Si | 1.00E+18 |
| 9 | Contact | GaAs | 500 | N | Si | 4.00E+18 |
| 10 |  | Al$_{0.96}$Ga$_{0.04}$As | 1500 | N | Si | 1.00E+17 |
| 11 |  | GaAs | 1500 | N | Si | 1.00E+17 |
| 12 |  | Al$_{0.96}$Ga$_{0.04}$As | 500 | N | Si | 1.00E+17 |
| 13 | Substrate | GaAs |  | N | Si | >1E18 |

B

— 20 μm

C

— 500 nm

D

— 20 μm (a)

(b)

1: Transfer-printed LED
2: Electrical interconnection between LEDs
3: Mechanical interconnection between micro-lens
4: Micro-lens 1: Elastomer
2: Phosphors in the cavity 1: Phosphors in the cavity
2: Underlying Blue LED

PRINTED ASSEMBLIES OF ULTRATHIN, MICROSCALE INORGANIC LIGHT EMITTING DIODES FOR DEFORMABLE AND SEMITRANSPARENT DISPLAYS

CROSS-REFERENCE TO RELATED APPLICATIONS

This application is a continuation of U.S. application Ser. No. 14/479,100, filed on Sep. 5, 2014 and issued as U.S. Pat. No. 9,647,171 on May 9, 2017, which claims priority to U.S. application Ser. No. 12/778,588, filed on May 12, 2010 and issued as U.S. Pat. No. 8,865,489 on Oct. 21, 2014, which claims the benefit of and priority to U.S. Provisional Applications 61/177,458 filed on May 12, 2009 and 61/241,465 filed on Sep. 11, 2009, all of which are hereby incorporated by reference in their entireties.

STATEMENT REGARDING FEDERALLY SPONSORED RESEARCH OR DEVELOPMENT

This invention was made with United States governmental support under Award Nos. DE-FG02-07ER46471 and DE-FG02-07ER46453 awarded by the U.S. Department of Energy and Award No. DMI-0328162 awarded by the National Science Foundation. The U.S. government has certain rights in the invention.

BACKGROUND OF INVENTION

This invention is in the field of printable electronics. This invention relates generally to methods for making and assembling electronic devices and printable electronic devices.

A variety of platforms are available for printing structures on device substrates and device components supported by device substrates, including nanostructures, microstructures, flexible electronics, and a variety of other patterned structures. For example, a number of patents and patent applications describe different methods and systems for making and printing a wide range of structures, including U.S. Pat. Nos. 7,195,733, 7,557,367, 7,622,367 and 7,521,292, U.S. Patent Application Publication Nos. 2009/0199960, 2007/0032089, 2008/0108171, 2008/0157235, 2010/0059863, 2010/0052112 and 2010/0002402, and U.S. patent application Ser. No. 11/145,574 (filed Jun. 2, 2005) and Ser. No. 11/981,380 (filed Oct. 31, 2007); all of which are hereby incorporated by reference in their entireties to the extent not inconsistent herewith.

SUMMARY OF THE INVENTION

Provided herein are methods for making electronic devices including flexible devices and arrays of light emitting diodes (LEDs). Methods are also provided for assembling electronic devices including simultaneously embedding device components into a polymer and molding of the polymer with recessed features.

In one aspect, provided herein are methods for making electronic devices. A method of this aspect comprises the steps of: providing a growth substrate having a receiving surface; forming a semiconductor epilayer on the receiving surface via epitaxial growth; the semiconductor epilayer having a first contact surface; bonding the first contact surface of the semiconductor epilayer to a handle substrate; releasing the semiconductor epilayer from the growth substrate wherein the semiconductor epilayer remains bonded to the handle substrate, thereby exposing a second contact surface of the semiconductor epilayer; patterning the second contact surface of the semiconductor epilayer with a mask, thereby generating exposed regions and one or more masked regions of the second contact surface; removing semiconductor material from the exposed regions by etching the exposed regions, thereby generating one or more semiconductor structures supported by the handle substrate; at least partially releasing the one or more semiconductor structures from the handle substrate; and transferring at least one of the one or more semiconductor structures from the handle substrate to a device substrate via dry transfer contact printing, thereby assembling the semiconductor structures on the device substrate to make the electronic device.

For certain embodiments, the growth substrate is lattice matched to the semiconductor epilayer, for example to within ±3.4% or ±1.9%. In certain embodiments, the growth substrate is lattice matched to the semiconductor epilayer to within ±13.8%. Lattice matched growth substrate and epilayers are useful, for example, for growing high quality single crystalline layers via epitaxial growth. In embodiments, useful semiconductor epilayers include, but are not limited to a GaN layer, an InGaN layer, a GaAsN layer, an AlGaN layer, an AlGaAsN layer, a GaAs layer, an InGaAs layer, an AlGaAs layer, an AlGaAsP layer, a GaAsSbN layer and an InN layer. Useful growth substrates include, but are not limited to, sapphire, silicon having a (111) orientation, SiC, ZnO, Si(100), MGAl$_2$O$_4$ (100), MgAl$_2$O$_4$ (111), A-plane sapphire, M-plane sapphire, AlN, MnO, ZrB$_2$, LiGaO$_2$, (La,Sr)(Al,Ta)O$_3$, LaAlO$_3$, LaTaO$_3$, SrAlO$_3$SrTaO$_3$, LiAlO$_2$, GaAs and InP.

Useful semiconductor epilayers include those having thicknesses selected from the range of 5 nm to 20 µm or 1 µm to 5 µm. In some embodiments, the semiconductor epilayer is a multilayer. Useful multilayers include those comprising layers of semiconductors having different compositions, different doping levels, different dopants or any combination of these. In one embodiment of this aspect, a multilayer comprises at least one p-type semiconductor layer in electrical communication with at least one n-type semiconductor layer. In one embodiment, the multilayer comprises a plurality of light emitting diode (LED) device layers. Useful LED device layers include contact layers, spreader layers, cladding layers and barrier layers.

In one embodiment, the semiconductor epilayer comprises GaN and optionally a GaN multilayer. Useful GaN layers include those having different doping levels, different dopants, different thicknesses or both. For example, in one embodiment, a GaN multilayer comprises at least one p-type GaN layer in electrical communication with at least one n-type GaN layer. In an embodiment, a GaN multilayer comprises material including GaN, InGaN, AlGaN, GaN:Mg, GaN:Si, GaN:AlN, GaN:ZnO or any combination of these.

In a specific embodiment, the handle substrate comprises silicon and the step of bonding the first contact surface of the semiconductor epilayer to the handle substrate comprises contacting the first contact surface to an external surface of the handle substrate so as to establish Van der Waals bonding between the semiconductor epilayer and the handle substrate. Useful handle substrates include those comprising an adhesion layer. Useful adhesion layers include, but are not limited to, those comprising Au, Al, Pd, In, Ni and polymers such as polyurethanes, photoresists, polyimide, silicones and any combination of these.

In certain embodiments, a sacrificial layer is provided between the growth substrate and the semiconductor epilayer. For these embodiments, the step of partially releasing the semiconductor epilayer optionally comprises at least partially removing the sacrificial layer, for example by etching or dissolving the sacrificial layer. Useful etching processes include electrochemical and photoelectrochemical etching processes. Useful sacrificial layers include, but are not limited to InGaN, $SiO_2$, AlAs, $Si_3N_4$, ZnO, AlN, HfN, AlInN and any combination of these.

In one embodiment, the semiconductor epilayer and the growth substrate meet at an interface and the step of releasing the semiconductor layer from the growth substrate comprises exposing the interface to electromagnetic radiation. In an embodiment, the electromagnetic radiation is passed through the growth substrate. Optionally, the electromagnetic radiation comprises laser radiation. Useful electromagnetic radiation comprises electromagnetic radiation having a wavelength selected over the range of 100 to 800 nm, a fluence selected over the range of 400 to 600 $mJ/cm^2$ and any combination thereof. Specific examples of electromagnetic radiation include, but are not limited to: KrF pulsed excimer laser at 248 nm, 38 ns pulse time at 600 $mJ/cm^2$, for epilayers grown on sapphire; third harmonic of pulsed Q-switched Nd:YAG laser at 355 nm, 5 ns pulse time at 400 $mJ/cm^2$, for epilayers grown on sapphire; pulsed second harmonic Nd:YAG at 532 nm, 10 ns pulse time at energy greater than 12 $mJ/cm^2$, for epilayers grown on sapphire. In a further embodiment of this aspect, an absorbing layer is provided at the interface between the growth substrate and the semiconductor epilayer and the electromagnetic radiation is at least partially absorbed by the absorbing layer to release the semiconductor epilayer.

In one embodiment, the mask provided on the second contact surface of the epilayer includes a first mask layer comprising $Si_3N_4$. Optionally the mask includes a second mask comprising a metal provided over the first mask layer. Useful mask layers further include those comprising a dielectric, such as $Si_3N_4$ and $SiO_2$; a metal, such as Al, Au and Cu; and any combination of these.

In embodiments, the step of removing material from exposed regions of the masked semiconductor epilayer comprises etching the exposed regions. Useful etching processes include reactive ion etching, deep reactive ion etching and inductive coupled plasma reactive ion etching. In some embodiments, removing material from exposed regions of the masked semiconductor epilayer exposes side-walls of the remaining semiconductor structure. In certain embodiments, an etch block layer, a mask layer or both is deposited on at least a portion of the exposed side-walls, for example to protect the side walls from being etched during a subsequent releasing step.

In some embodiments, partially releasing semiconductor epilayers from a handle substrate results in semiconductor structures anchored to the handle substrate, for example by at least one homogenous anchor or at least one heterogeneous anchor. In other embodiments, one method further comprises a step of anchoring a semiconductor structure to handle substrate, for example by at least one homogeneous anchor or at least one heterogeneous anchor.

In embodiments, the step of transferring comprises a dry transfer contact printing method, for example as known in the art. A specific dry transfer contact printing technique useful for the methods described herein comprises transferring at least one semiconductor structure from a handle substrate to a device substrate via contact printing using a conformal transfer device, such as a PDMS stamp.

Useful device substrates include, but are not limited to, glass substrates, polymer substrates, flexible substrates, large area substrates, pre-metalized substrates, substrates pre-patterned with one or more device components, and any combination of these.

Another method of this aspect comprises the steps of: providing a growth substrate having a receiving surface; forming a semiconductor epilayer on the receiving surface via epitaxial growth; said semiconductor epilayer having a first contact surface; bonding the first contact surface of the semiconductor epilayer to a handle substrate; releasing the semiconductor epilayer from the growth substrate, wherein at least a portion of the semiconductor epilayer remains bonded to the handle substrate, thereby exposing a second contact surface of the semiconductor epilayer; processing the semiconductor epilayer on the handle substrate, thereby generating one or more semiconductor structures supported by said handle substrate; transferring at least one of the one or more semiconductor structures from the handle substrate to a device substrate via dry transfer contact printing, thereby assembling said semiconductor structures on said device substrate to make said electronic device.

Another method of this aspect comprises the steps of: providing a first growth substrate having a first receiving surface; forming a first semiconductor epilayer on the first receiving surface via epitaxial growth; the first semiconductor epilayer having a first contact surface; bonding the first contact surface of the first semiconductor epilayer to a handle substrate; releasing the first semiconductor epilayer from the first growth substrate, wherein at least a portion of the first semiconductor epilayer remains bonded to the handle substrate, thereby exposing a second contact surface of the first semiconductor epilayer; providing a second growth substrate having a second receiving surface; forming a second semiconductor epilayer on the second receiving surface via epitaxial growth; the second semiconductor epilayer having a third contact surface; bonding the third contact surface of the second semiconductor epilayer to the handle substrate, the first semiconductor epilayer or both; releasing the second semiconductor epilayer from the second growth substrate, the first semiconductor epilayer or both, wherein at least a portion of the second semiconductor epilayer remains bonded to the handle substrate, the first semiconductor epilayer or both, thereby exposing a fourth contact surface of the second semiconductor epilayer; processing the first semiconductor epilayer, the second semiconductor epilayer or both the first and the second semiconductor epilayers on the handle substrate, thereby generating one or more semiconductor structures supported by the handle substrate; transferring at least one of the one or more semiconductor structures from the handle substrate to a device substrate via dry transfer contact printing, thereby assembling the semiconductor structures on the device substrate to make the electronic device. In a specific embodiment, the step of bonding the third contact surface of the second semiconductor epilayer to the handle substrate, the first semiconductor epilayer or both comprises bonding at least a portion of the third contact surface of the second semiconductor epilayer to the second contact surface of the first semiconductor epilayer.

Certain embodiments further comprise a step of processing a semiconductor epilayer on a growth substrate, for example processing a first semiconductor epilayer on a first growth substrate, a second semiconductor epilayer on a second growth substrate or processing both a first semiconductor epilayer on a first growth substrate and a second semiconductor epilayer on a second growth substrate. In embodiments, the step of processing a semiconductor epilayer on a handle substrate or a growth substrate comprises a processing method including, but not limited to, a patterning process, a lithography process, a growth process, a polishing process, a deposition process, an implantation process, an etching process, an annealing process, a molding process, a curing process, a coating process, exposure to electromagnetic radiation or any combination of these. In specific embodiments, the step of processing a semiconductor epilayer on a handle substrate comprises forming one or more ohmic contacts on a semiconductor epilayer, forming one or more thermal management structures on a semiconductor epilayer or forming one or more ohmic contacts and forming one or more thermal management structures.

In certain embodiments, the handle substrate comprises a material including, but not limited to: a doped or undoped semiconductor; a single crystal material; a polycrystalline material; a ceramic such as SiC, $Si_3N_4$, fused silica, alumina ($Al_2O_3$), $ZrO_2$, MgO, pyrolytic Boron nitride (PBN), aluminum nitride, aluminum silicate and titania; a polymer; glass; quartz; a semiconductor with or without a thermal oxide layer; and any combination of these. Useful handle substrates also include substrates having an adlayer or substrates coated by or deposited with a film of any of the above materials or other materials including but not limited to a polymer, a sol-gel, a polymer precursor, an incompletely cured sol-gel. Use of certain materials for the handle substrate can be advantageous as subsequent processing of devices or device components on the handle substrate can also cure, anneal or otherwise process the materials of or coated on the handle wafer. For example when the processing includes a high temperature step a handle substrate including a film comprising a thermally curable polymer or an uncured or incompletely cured sol-gel can be cured. In certain embodiments, the composition of a handle substrate is driven by the requirements for subsequent processing of device elements on the handle substrate. For example, in embodiments when processing on the handle substrate includes high temperature processing (e.g., annealing or ohmic contact formation processes), the handle substrate is selected so as to be compatible with the associated high temperatures (e.g., ceramics, semiconductors). In embodiments when processing on the handle substrate includes exposure to reactive chemicals (e.g., acids, bases, chemical etchants), the handle substrate is selected so as to be compatible with the exposure conditions (e.g., chemically inert).

Methods of this aspect are useful, for example for making an array of LEDs. A specific method for making an array of LEDs comprises the steps of: providing a sapphire growth substrate having a receiving surface; forming a GaN epilayer on the receiving surface via epitaxial growth; wherein the GaN epilayer is a multilayer comprises at least one p-type GaN semiconductor layer in electrical communication with at least one n-type GaN semiconductor layer; the GaN multilayer having a first contact surface; bonding the first contact surface of the GaN multilayer to a handle substrate; releasing the GaN multilayer from the sapphire growth substrate wherein the GaN multilayer remains bonded to the handle substrate, thereby exposing a second contact surface of the GaN multilayer; patterning the second contact surface of the GaN multilayer with a mask, thereby generating exposed regions and one or more masked regions of the second contact surface; removing material from the exposed regions by etching the exposed regions, thereby generating one or more LED device structures supported by the handle substrate; at least partially releasing the one or more LED device structures from the handle substrate; and transferring at least a portion of the one or more LED device structures from the handle substrate to a device substrate via dry transfer contact printing, thereby making an array of LEDs.

Another specific method for making an array of LEDs comprises the steps of: providing a silicon growth substrate having a (111) orientation and having a receiving surface; generating a GaN multilayer on the receiving surface of the growth substrate via epitaxial growth; the GaN multilayer comprising at least one p-type GaN layer in electrical contact with at least one p-type GaN layer; the GaN multilayer having a contact surface; patterning the contact surface of the GaN multilayer with a mask, thereby generating exposed regions and one or more masked regions of the GaN multilayer; removing material from the exposed regions by etching the exposed regions and into the silicon growth substrate, thereby exposing a portion of the silicon growth substrate and generating one or more LED device structures; at least partially releasing the one or more LED device structures from the growth substrate by anisotropic etching the exposed portion of the silicon growth substrate; and transferring at least a portion of the one or more LED device structures from the silicon growth substrate to a device substrate via dry transfer contact printing, thereby making the array of LEDs.

For certain embodiments of methods for making an array of LEDs, the step of removing material etches a depth into the growth or host substrate greater than or equal to 5 nm, or selected over the range of 5 nm to 10 µm. In embodiments, anisotropic etching of a silicon (111) substrate occurs preferentially along <110> directions. Useful anisotropic etching methods include directional wet etching using an anisotropic etchant such as KOH or tetramethylammonium hydroxide (TMAH).

Another specific method for making an array of LEDs comprises the steps of: providing a sapphire growth substrate having a receiving surface; providing a sacrificial layer on the receiving surface of the sapphire growth substrate; generating a GaN multilayer on the sacrificial layer via epitaxial growth; the GaN multilayer comprising at least one p-type GaN layer in electrical contact with at least one n-type GaN layer; the GaN multilayer having a contact surface; patterning the contact surface of the GaN multilayer with a mask, thereby generating exposed regions and one or more masked regions of the GaN multilayer; removing material from the exposed regions by etching the exposed regions, thereby exposing a portion of the sacrificial layer and generating one or more LED device structures; at least partially releasing the one or more LED device structures from the growth substrate by removing at least a portion of the sacrificial layer using directional etching, electrochemical etching or photoelectrochemical etching; and transferring at least a portion of the one or more LED device structures from the sapphire growth substrate to a device substrate via dry transfer contact printing, thereby making the array of LEDs.

Useful sacrificial layers include InGaN, $SiO_2$, AlAs, $Si_3N_4$, ZnO, AlN, HfN, AlInN and any combination of these. In some embodiments, a buffer layer or an etch block layer is provided between the growth substrate and the sacrificial layer, for example a buffer layer or an etch block layer comprising GaN. Buffer layers and etch block layers are useful, for example, to prevent etching of a GaN device layer during a subsequent etching or releasing step.

In a specific embodiment, a method of this aspect comprises the steps of: providing a sapphire growth substrate having a receiving surface; providing a sacrificial layer on the receiving surface of said sapphire growth substrate; providing an etch block layer on the sacrificial layer, for example via epitaxial growth; generating a GaN multilayer on the etch block layer via epitaxial growth; patterning the contact surface of the GaN multilayer with a mask, thereby generating exposed regions and one or more masked regions of the GaN multilayer; removing material from the exposed regions by etching the exposed regions, thereby exposing a portion of the sacrificial layer and generating one or more LED device structures; at least partially releasing said one or more LED device structures from said growth substrate by removing at least a portion of the sacrificial layer using directional etching, electrochemical etching or photoelectrochemical etching; and transferring at least a portion of the one or more LED device structures from the sapphire growth substrate to a device substrate via dry transfer contact printing. In an embodiment, a method of this aspect further comprises generating an etch block layer in at least a portion of the exposed regions, for example to prevent further etching of said exposed regions during the step of at least partially releasing.

In some embodiments, a sacrificial layer is removed during the releasing step by exposing the sacrificial layer to a selective etchant, for example HCl, HF, $H_3PO_4$, KOH, $NH_4Cl$, chelating amines, 1,2-diaminoethane (DAE), NaOH and any combination of these. For specific embodiments, the releasing step comprises exposing the sacrificial layer to electromagnetic radiation, for example electromagnetic radiation having wavelengths selected over the range of 100 nm to 800 nm or electromagnetic radiation from a xenon lamp. In one embodiment, the electromagnetic radiation is first passed through an undoped GaN film before exposing the sacrificial layer, for example to optically filter the electromagnetic radiation to remove at least a portion of the electromagnetic radiation absorbed by the undoped GaN film. For some embodiments, the releasing step comprises providing the sacrificial layer at an electric potential, for example an electric potential 600 mV to 800 mV greater than the potential of a buffer layer, the growth substrate or an etching solution. For some embodiments, the sacrificial layer is simultaneously exposed to an etching solution while it is held at a potential different from the etching solution. For some embodiments, the sacrificial layer is simultaneously exposed to an etching solution while it is held at a potential different from the etching solution and being exposed to electromagnetic radiation. In a specific embodiment, the GaN multilayer is grown on a sacrificial layer comprising ZnO and the step of at least partially releasing comprises etching the sacrificial layer with $NH_4Cl$ etchant.

Another specific method for making an array of LEDs comprises the steps of: providing a sapphire growth substrate having a receiving surface; generating a GaN multilayer on the sapphire growth substrate via epitaxial growth; the GaN multilayer comprising at least one p-type GaN layer in electrical contact with at least one n-type GaN layer; the GaN multilayer having a first contact surface, wherein the GaN multilayer and the sapphire growth substrate meet at an interface; bonding the first contact surface of the GaN multilayer to a handle substrate; exposing the interface between the GaN multilayer and the sapphire growth substrate to electromagnetic radiation; releasing the GaN multilayer from the sapphire growth substrate wherein the GaN multilayer remains bonded to the handle substrate, thereby exposing a second contact surface of the GaN multilayer; patterning the second contact surface of the GaN multilayer with a mask, thereby generating exposed regions and one or more masked regions of the GaN multilayer; removing material from the exposed regions by etching the exposed region, thereby generating one or more LED device structures; at least partially releasing the one or more LED device structures from the handle substrate; and transferring at least a portion of the one or more LED device structures from the handle substrate to a device substrate via dry transfer contact printing, thereby making the array of LEDs.

In a specific embodiment, the interface is exposed to electromagnetic radiation, optionally laser radiation. Optionally, the electromagnetic radiation is passed through the sapphire growth substrate. In one embodiment, the handle substrate comprises an external metal film and the first contact surface of the GaN multilayer is bonded to the handle substrate when it is contacted to the external metal film. In embodiments where there is an external metal film and the interface is exposed to electromagnetic radiation, the external metal film optionally reflects at least a portion of the electromagnetic radiation, thereby exposing the interface to electromagnetic radiation.

In an exemplary embodiment for making an array of LEDs, the GaN multilayer comprises at least one p-type GaN layer, at least one n-type GaN layer and a quantum well region comprising InGaN positioned between the p-type GaN layer and the n-type GaN layer. Specific methods of this aspect further comprise depositing a metal film on an exposed region of the p-type GaN layer, the n-type GaN layer or both and optionally annealing the metal film to form an electrical contact on the p-type GaN layer, the n-type GaN layer or both. One method of this aspect comprises the optional step of etching a portion of the GaN multilayer to expose a region of the n-type GaN layer, a region of the p-type GaN layer or both, depositing a metal film on an exposed region of the n-type GaN layer, the p-type GaN layer or both and optionally annealing the metal film to form an electrical contact on the n-type GaN layer, the p-type GaN layer or both.

Embodiments of specific methods of this aspect further comprise the steps of providing one or more metallic contacts in electrical contact with a portion of the one or more LED device structures; coating the one or more LED device structures and one or more metallic contacts with a photosensitive polymer layer; and exposing select portions of the photosensitive polymer layer to electromagnetic radiation, wherein the electromagnetic radiation is at least partially transmitted through the device substrate and wherein the one or more metallic contacts block at least a portion of the electromagnetic radiation from reaching at least a portion of the photosensitive polymer layer, the one or more metallic contacts thereby serving as one or more self-aligned mask elements. An optional step comprises removing portions of the photosensitive polymer layer which are masked by the one or more metallic contacts serving as self-aligned mask elements. Optionally, the step of removing portions of the photosensitive polymer layer which are masked by the one or more metallic contacts serving as self-aligned mask elements comprises developing the photosensitive polymer layer, wherein regions of the photosensitive polymer layer that were not exposed to electromagnetic radiation are dissolved by exposure to a solvent.

In some embodiments, the LED device structures correspond to a vertical type LED. In embodiments, the GaN multilayer comprises a plurality of GaN layers, for example GaN layers including, but not limited to, GaN contact layers, GaN spreader layers, GaN cladding layers, GaN barrier layers, GaN etch block layers, GaN buffer layers and any combination of these.

In embodiments, the mask provided on the GaN multilayer comprises a first layer of $Si_3N_4$ and an optional metal second layer. Optionally, methods of this aspect comprise removing at least a portion of the mask. In embodiments, the step of removing material comprises etching exposed regions of a masked GaN multilayer via and etching method such as inductively coupled plasma reactive ion etching, reactive ion etching or deep reactive ion etching. After the removing step and/or the releasing step, some LED device structures optionally are anchored to the handle or growth substrate by at least one homogeneous anchor or at least one heterogeneous anchor. Some embodiments optionally comprise a step of anchoring one or more of the LED device structures by at least one homogeneous anchor or at least one heterogeneous anchor. In some embodiments, the step of at least partially releasing comprises photoelectrochemically or electrochemically etching at least a portion of the GaN multilayer.

In embodiments, the device substrate is a glass substrate, a polymer substrate, a flexible substrate, a large area substrate, a pre-metalized substrate, a substrate pre-patterned with one or more device components or any combination of these. Transfer of the LED device structures to the device substrate is optionally via contact printing using a conformal transfer device, for example a PDMS stamp. In certain methods of this aspect, the device substrate comprises one or more additional LED device structures and the step of transferring at least a portion of the one or more LED device structure comprises printing at least one of the one or more LED device structures on to of the one or more additional LED device structures, for example to make a stacked LED device structure. Another method of this aspect, comprises a step of printing one or more additional LED device structures on top of the one or more LED device structures on the device substrate, for example to make a stacked LED array.

In some embodiments, a stacked LED comprises multiple LEDs stacked one on top of another, each capable of outputting selected wavelengths of electromagnetic radiation, for example each capable of outputting different wavelengths of electromagnetic radiation. In a specific embodiment, a stacked LED comprises multiple LEDs whose total electromagnetic spectrum is visible as white light.

Optionally, multiple LEDs are connected in series, such that identical current flows through each LED. Optionally, multiple LEDs are connected in parallel, such that each LED experiences identical voltage. Multiple LEDs connected in series provide a benefit of similar output of electromagnetic radiation from each LED.

In some embodiments, an array of LEDs comprises a phosphor or an array of phosphors. A particular method embodiment comprises a step of printing phosphors over at least a portion of an LED array, for example via a contact printing method. Another method embodiment comprises making an array of phosphors, making an array of LEDs and laminating the array of phosphors over the array of LEDs.

In another aspect, provided are methods for making an array of phosphors. One method of this aspect comprises the steps of molding an elastomer layer with an array of recessed regions; providing phosphor particles over the elastomer layer, wherein the phosphor particles at least partially fill in the array of recessed regions; and providing an encapsulation layer over the elastomer layer, wherein the phosphor particles are encapsulated in the array of recessed regions, thereby making an array of phosphors. In exemplary embodiments, the recessed regions have depths selected over the range of 5 nm to 10 μm.

In another aspect, provided are methods for making a semiconductor device. A method of this aspect comprises the steps of providing a transparent substrate; assembling a semiconductor device on a surface of the transparent substrate via dry transfer contact printing; providing one or more metallic contacts in electrical contact with the semiconductor device; coating said semiconductor device and one or more metallic contacts with a photosensitive polymer layer; exposing select portions of the photosensitive polymer layer to electromagnetic radiation, wherein the electromagnetic radiation is at least partially transmitted through the transparent substrate and wherein the one or more metallic contacts block at least a portion of the electromagnetic radiation from reaching at least a portion of the photosensitive polymer layer, the one or more metallic contacts thereby serving as one or more self-aligned mask elements. Certain embodiments further comprises a step of removing portions of the photosensitive polymer layer which are masked by the one or more metallic contacts serving as self-aligned mask elements. In one embodiment, the step of removing portions of the photosensitive polymer layer which are masked comprises developing the photosensitive polymer layer and wherein regions of the photosensitive polymer layer that were not exposed to the electromagnetic radiation are dissolved by exposure to a solvent.

Useful transparent substrates for methods of this aspect include substrates comprising quartz, glass, sapphire and any combination of these. In certain embodiments, the transparent substrate, the semiconductor device or both transmit at least 50% of the electromagnetic radiation. In some embodiments, at least a portion of the electromagnetic radiation is reflected, absorbed or both by the one or more metallic contacts. In a specific embodiment, at least 50%, at least 75%, or at least 95% of the electromagnetic radiation received by a metallic contacts is reflected, scattered and/or absorbed by the metallic contact. Useful metallic contacts include those comprising gold, copper, nickel, aluminum, platinum and any combination of these. In specific embodiments, each of the metallic contacts has a thickness selected over the range of 5 nm to 10 μm.

In specific embodiments, the photosensitive polymer has a thickness selected over the range of 5 nm to 1 mm. Useful photosensitive polymers include, but are not limited to, negative tone photopolymers, polymers at least partially crosslinked by exposure to electromagnetic radiation, BCB (Benzo Cyclo Butene), WL-5351, SU-8, polyurethanes, silicones and any combination of these.

In another aspect, provided herein are methods for assembling an electronic device. A method of this aspect comprises the steps of: providing one or more electronic device components; contacting the one or more electronic device components with a conformal transfer and molding device, thereby transferring the one or more electronic device components onto the conformal transfer device; contacting a prepolymer layer disposed over a host substrate with the conformal transfer and molding device having the one or more electronic device components positioned thereon, thereby at least partially embedding the one or more electronic device components into the prepolymer layer and patterning the prepolymer layer with one or more recessed features; curing the prepolymer layer, thereby forming a polymer layer having one or more recessed features; and filling at least a portion of the one or more recessed features with a filling material.

Optionally, methods of this aspect further comprise the steps of providing a filling material on a surface of the polymer and dragging or moving a scraping tool along the surface of the polymer to fill the filling material into at least a portion of the one or more recessed features.

Useful filling materials include, but are not limited to, conductive materials, optical materials, heat transfer materials and any combination of these. Useful host substrates include substrates comprising polymer, glass, plastic, semiconductor, sapphire, ceramics and any combination of these. Useful prepolymer layers include, but are not limited to, those layers comprising a photocurable polymer, a thermally curable polymer, a photocurable polyurethane and any combination of these.

Optionally, methods of this aspect comprise a step of curing the prepolymer layer by exposing the prepolymer layer to electromagnetic radiation, heating the prepolymer layer or both. In one embodiment, a method of this aspect further comprises a step of curing the filling material, for example by heating the filling material, exposing the filling material to electromagnetic radiation or both.

In embodiments, at least one of the one or more electronic device components comprises one or more electrode contacts. Optionally, at least a portion of the polymer is etched in a further step to expose at least one of the one or more electrode contacts. In a specific embodiment, the filling material comprises a conductive material, for example in electrical communication with one or more electrode contacts. Conductive filling materials are useful, for example for providing one or more electrical interconnections to at least one of the electronic device components. Useful conductive materials include those materials having a resistivity selected over the range of $1\times10^{-10}$ to $1\times10^{-2}$ $\Omega\cdot$cm or $1\times10^{-10}$ to $1\times10^{-5}$ $\Omega\cdot$cm, for example a conductive past such as epoxies containing metallic particles, such as silver epoxy, gold epoxy, copper epoxy or aluminum epoxy; conductive carbon materials, such as carbon black, carbon nanotubes, graphite or grapheme; and any combination of these.

In a specific embodiment, the filling material comprises an optical material. Optionally, the optical material forms an optical element such as a collecting optic, a concentrating optic, a reflective optic, a diffusing optic, a dispersive optic, a lens, a phosphor, a waveguide, an optical fiber, an optical coating, a transparent optic, an optical filter, a polarizing optic and any combination of these. Useful optical materials include polymer, plastic, glass and any combination of these.

Useful electronic device components include, but are not limited to, a P-N junction, a thin film transistor, a single junction solar cell, a multi-junction solar cell, a photodiode, a light emitting diode, a laser, a sensor, a photodiode, an electro-optical device, a CMOS device, a MOSFET device, a MESFET device, a photovoltaic cell, a microelectromechanical device, a HEMT device, a light-emitting transistor and any combination of these. In a specific embodiment, the electronic device component has a dimension selected over the range of 10 nm to 10 mm or 10 nm to 10 µm, for example a height, width, diameter, and/or depth. In specific embodiments, the electronic device component has a height selected over the range of 10 nm to 10 µm, a width selected over the range of 1 µm to 10 mm, a depth selected over the range of 1 µm to 10 mm and/or a diameter selected over the range of 1 µm to 10 mm.

Another method of this aspect comprises the steps of: providing a conformal transfer and molding device having a contact surface comprising one or more transfer surfaces and one or more raised molding features; contacting one or more electronic device components with the conformal transfer and molding device, thereby positioning the one or more electronic device components on the one or more transfer surfaces of the conformal transfer and molding device; contacting a prepolymer layer disposed over a host substrate with the patterned conformal transfer and molding device having the one or more electronic device components positioned thereon, thereby at least partially embedding the one or more electronic device components and the one or more raised molding features into the prepolymer layer; curing the prepolymer layer, thereby forming a polymer layer, wherein the one or more raised molding features of the conformal transfer device are replicated as one or more recessed features in the polymer layer; separating the conformal transfer device from the polymer layer, wherein the one or more electronic device components are retained in the polymer layer; applying a filling material to a surface of the polymer layer; and dragging a scraping tool along the surface of the polymer to fill the filling material into at least a portion of the one or more recessed features.

Another method of this aspect comprises the steps of: providing a host substrate with a prepolymer disposed thereon; at least partially embedding one or more electronic device components into the prepolymer layer, wherein one or more recessed features are patterned in the prepolymer layer during the embedding step; curing the prepolymer layer, thereby forming a polymer layer having one or more recessed features and fixing the one or more electronic device components in the polymer layer; and filling at least a portion of the one or more recessed features with a conductive material, wherein the conductive material provides one or more electrical interconnections to at least one electronic device component.

In another aspect, provided are methods for making a printable electronic device on a device substrate. A method of this aspect comprises the steps of: providing a printable electronic device having a contact area, wherein the printable electronic device is anchored to a host substrate via one or more homogeneous or heterogeneous anchors; contacting the contact area of the printable electronic device with a contact surface of a conformable transfer device, wherein the contact surface of the conformable transfer device has an area smaller than the contact area of the printable electronic device, and wherein the contact area and the contact surface are aligned off center from each other, wherein contact between the contact surface and the contact area binds the printable electronic device to the contact surface; separating the printable electronic device and the host substrate, thereby releasing the one or more homogeneous or heterogeneous anchors; contacting the printable electronic device disposed on the contact surface with a receiving surface of the device substrate; and separating the contact surface of the conformable transfer device and the printable electronic device, wherein the printable electronic device is transferred onto the receiving surface, thereby assembling the printable electronic device on the receiving surface of the device substrate.

In embodiments, the contact surface of the conformable transfer device is a percentage of the contact area of the printable electronic device, for example 25%, 30%, 40%, 50%, less than 50% or selected over the range of 25 to 75%. In a specific embodiment, the contact surface of the conformable transfer device and the contact area of the electronic device are aligned off center from each other, for example by 1 µm, 2 µm, 10 µm, greater than 1 µm, greater than 10 µm or selected over the range of 1 µm to 100 µm. Optionally the contact surface of the conformable transfer device is provided on a relief feature of the conformable transfer device. In one embodiment, the conformable transfer device is a PDMS stamp.

In some embodiments, the conformable transfer device comprises a plurality of relief features providing a plurality of contact areas. Optionally, in an embodiment where the conformable transfer device comprises a plurality of relief features providing a plurality of contact regions, the method comprises providing a plurality of printable electronic devices each having a contact area, wherein each of the printable electronic devices is anchored to a host substrate via one or more homogeneous or heterogeneous anchors; contacting the contact areas of the printable electronic devices with the contact areas of the conformable transfer device, wherein each of the contact regions of the conformable transfer device has an area smaller than the each of contact areas of the printable electronic device, and wherein the contact areas and the contact regions are aligned off center from each other, wherein contact between the contact regions and the contact areas binds the printable electronic devices to the contact regions; separating the printable electronic devices and the host substrate, thereby releasing the homogeneous or heterogeneous anchors; contacting the printable electronic devices disposed on the contact regions with a receiving surface of the device substrate; and separating the contact regions of the conformable transfer device and the printable electronic devices, wherein the printable electronic devices are transferred onto the receiving surface, thereby assembling the printable electronic devices on the receiving surface of the device substrate.

Useful printable electronic devices include, but are not limited to a P-N junction, a thin film transistor, a single junction solar cell, a multi-junction solar cell, a photodiode, a light emitting diode, a laser, a CMOS device, a MOSFET device, a MESFET device, a photovoltaic cell, a microelectromechanical device, a HEMT device or any combination of these. In embodiments, the device substrate is a flexible substrate, a large area substrate, a pre-metalized substrate, a substrate pre-patterned with one or more device components, or any combination of these.

Optical micrographs of a set of four pixels in the display shown in (B). The upper and lower images show optical micrographs in the off (top) and on (bottom) states, with and without external illumination, respectively. The multiple red spots in the case of the configuration in the left result from reflections from the interconnection bridges. (D) Current (I)-voltage (V) measurements on a representative ILED in the display, at different applied strains. (E) Voltage (V) needed to generate a current of 20 µA measured after stretching cycles to 500 times at an applied strain of 22%. The inset shows the I-V behavior after these cycling tests. These devices have relatively high turn-on voltages, due to the use of nonohmic contacts.

Figure 5:
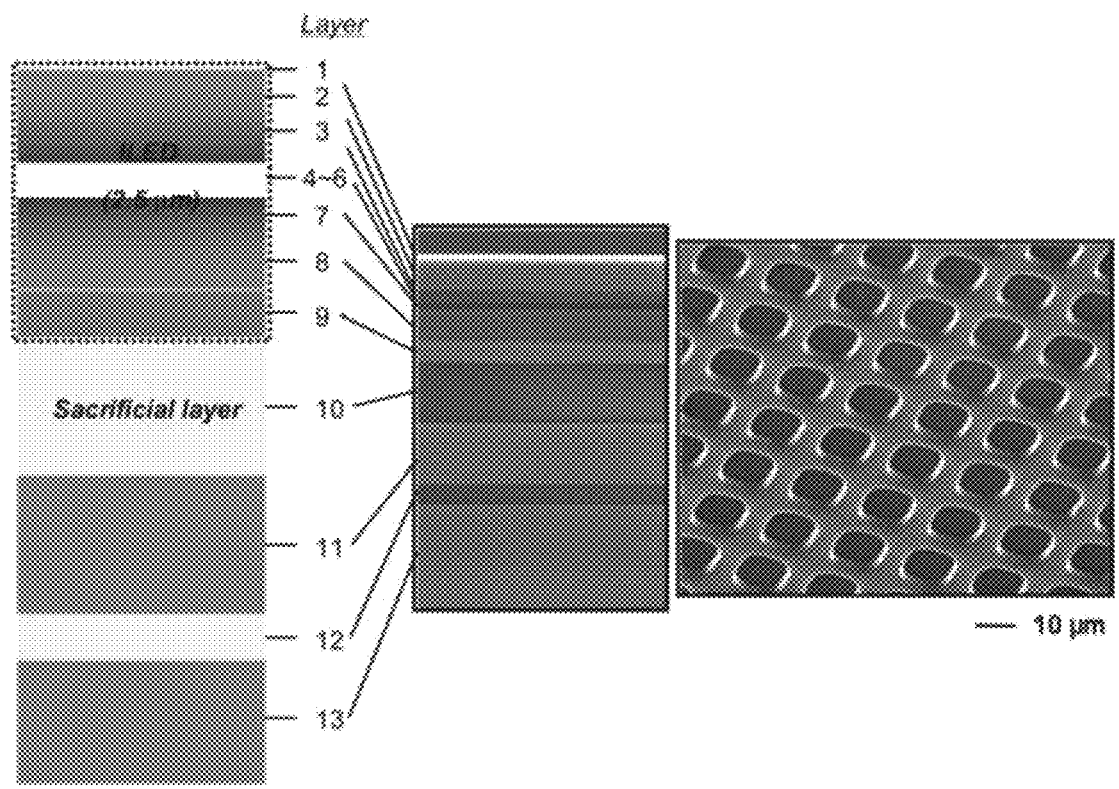

FIG. 5. Schematic illustration (left) and cross sectional scanning electron microscope (SEM) image (middle) of the epitaxial semiconductor multilayer stack on a GaAs wafer. (Right) SEM image of a square array of laterally delineated, square ILEDs on a GaAs wafer. (Bottom) Details of the epi-stack.

Figure 6:
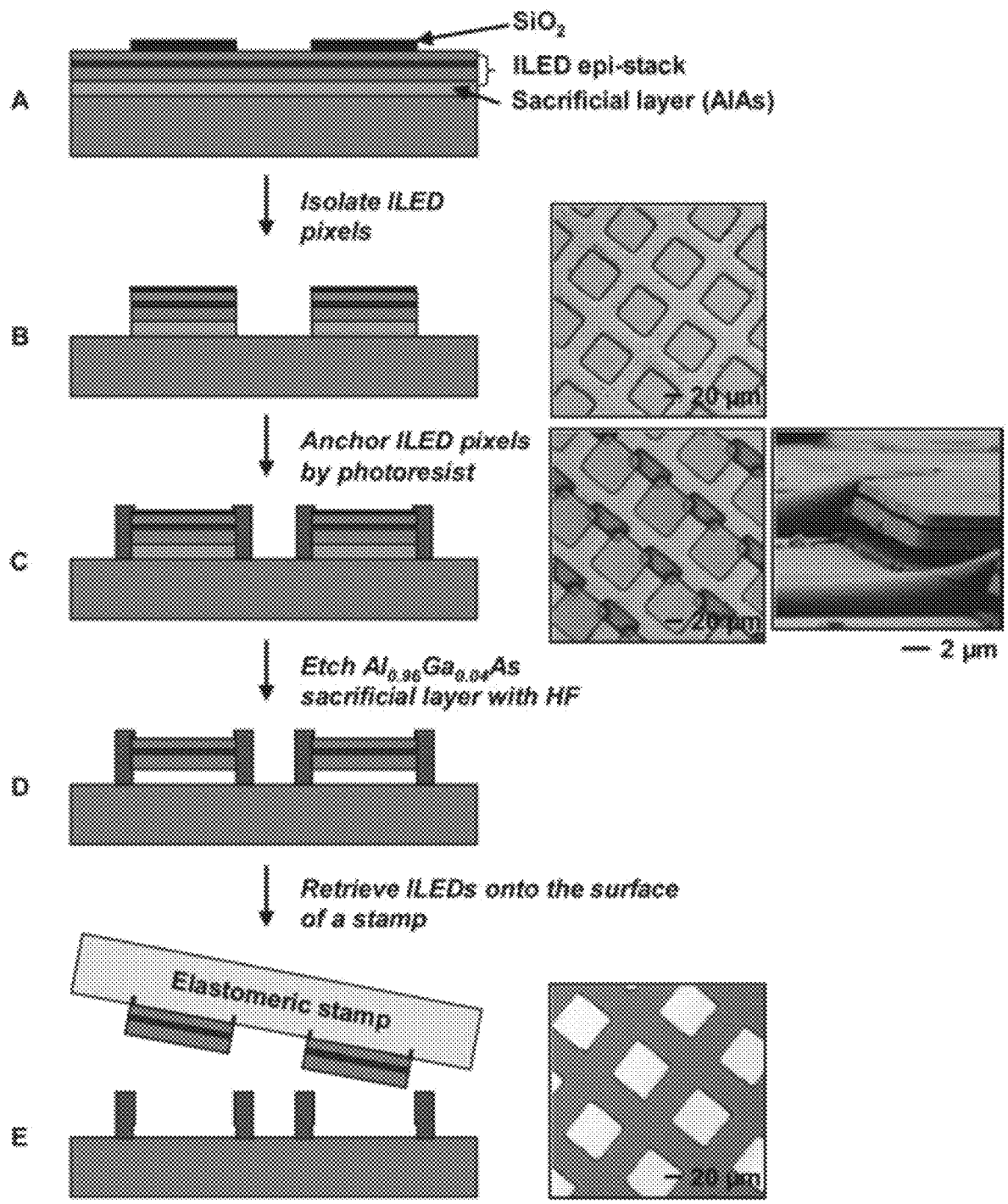

FIG. 6. Schematic illustration and optical microscope/SEM images of processing steps for retrieving ILEDs from a GaAs source wafer.

Figure 7:
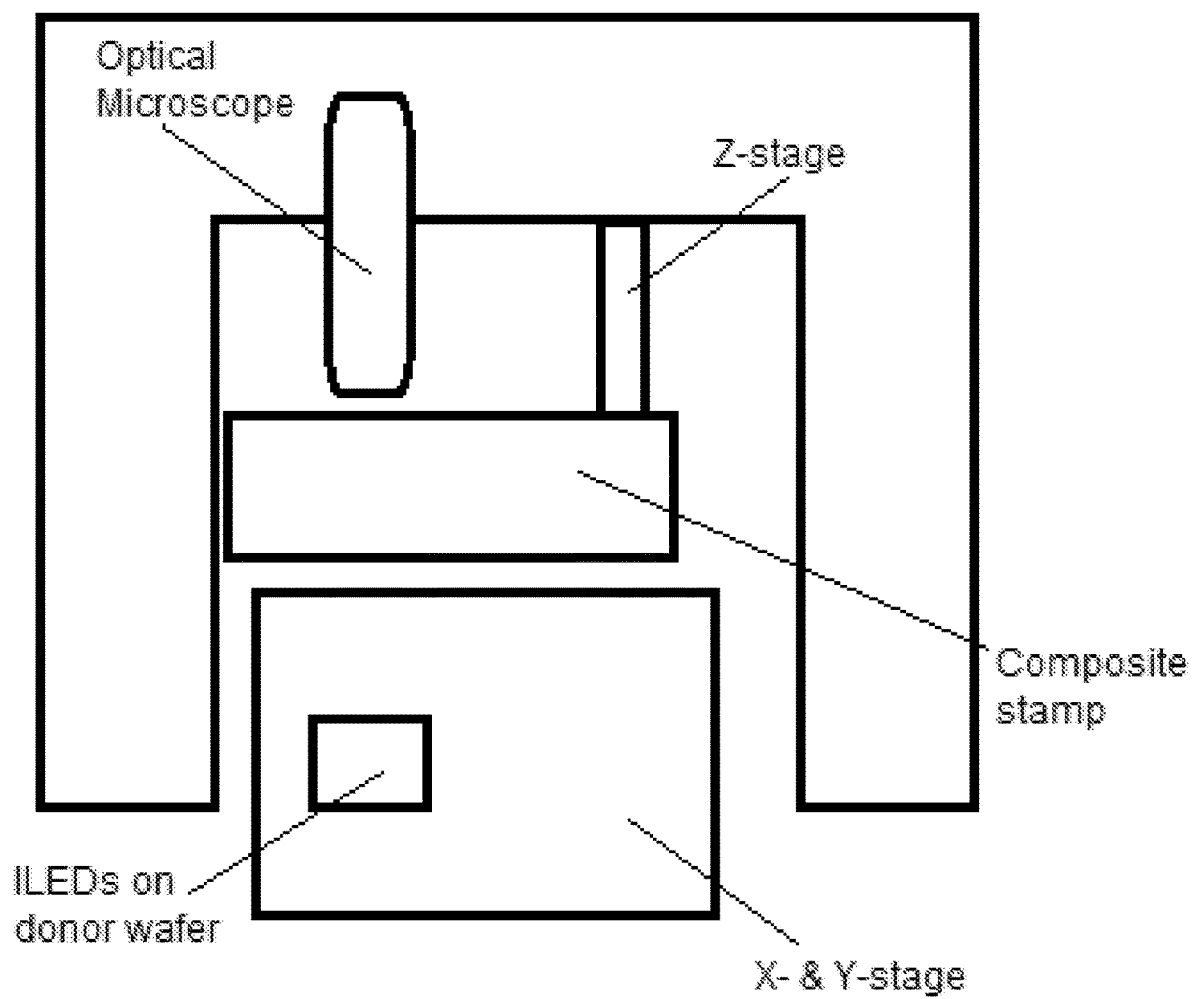

FIG. 7. Picture of the automated printing machine, with key parts labeled.

Figure 8:
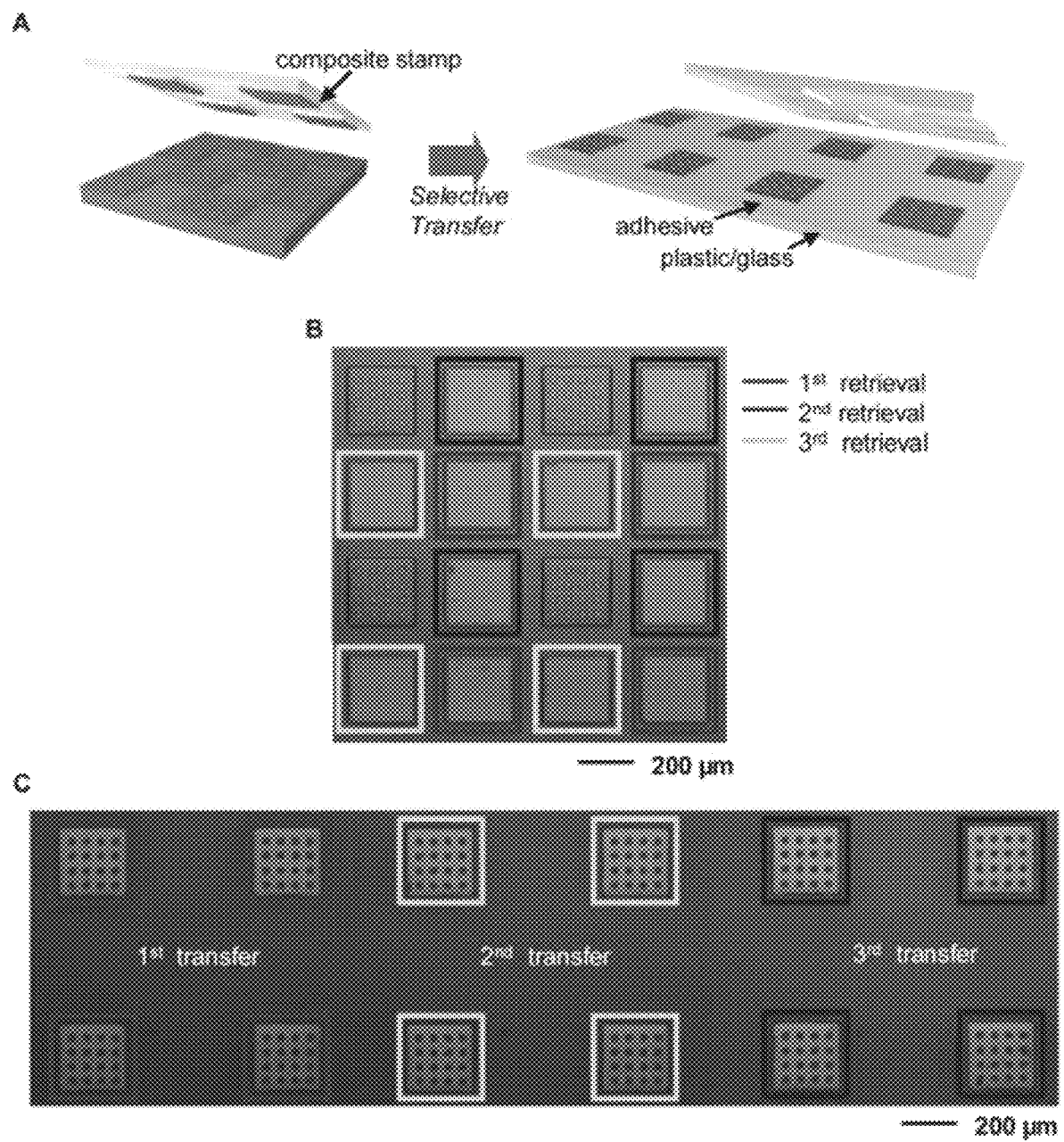

FIG. 8. (A) Schematic illustration of retrieving and printing selected sets of ILEDs with a composite stamp. (B) Optical microscope image of the source wafer after three cycles of printing. (C) Optical microscope image of a substrate with sparsely printed ILEDs derived from the source wafer of (B), illustrating the concept of area expansion.

Figure 9:
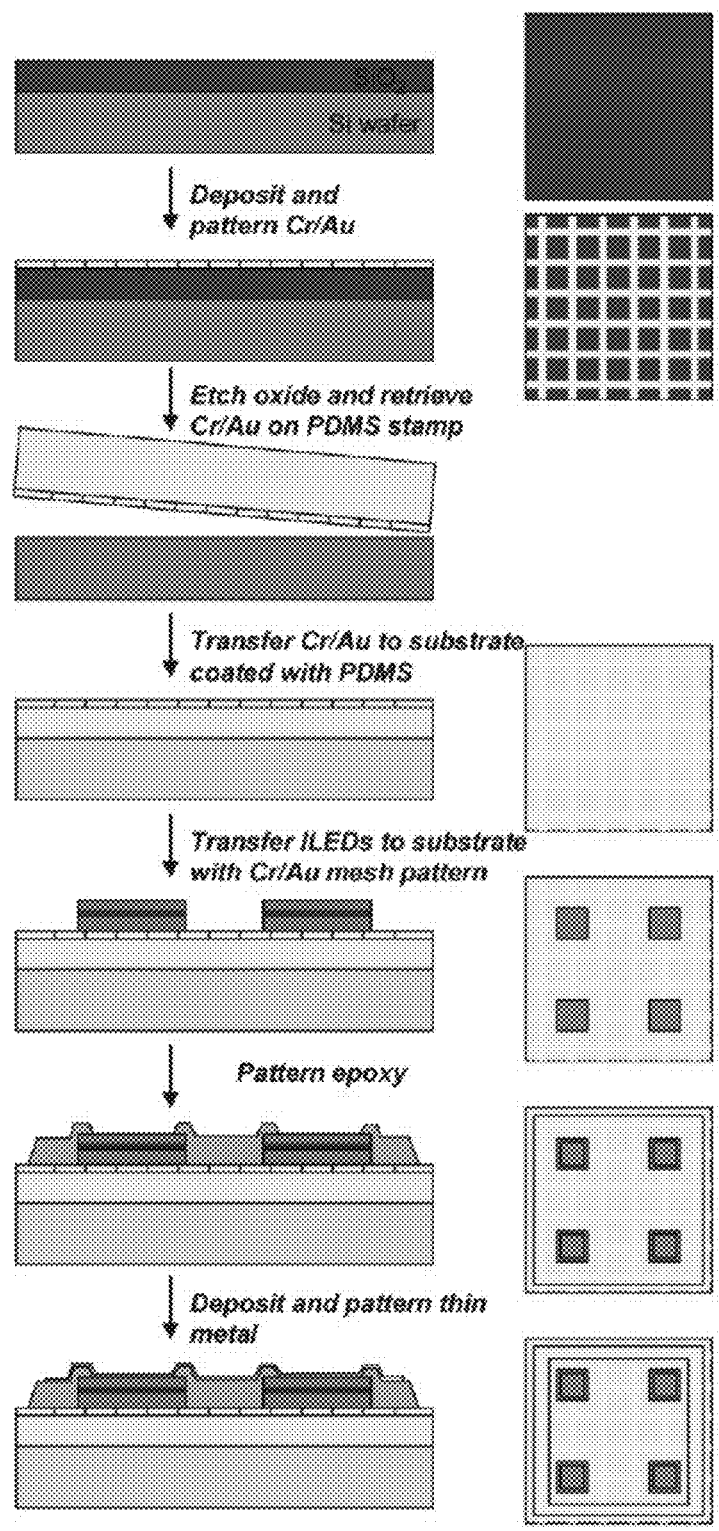

FIG. 9. Schematic illustration of processing steps for ILEDs of FIG. 2A.

Figure 10:
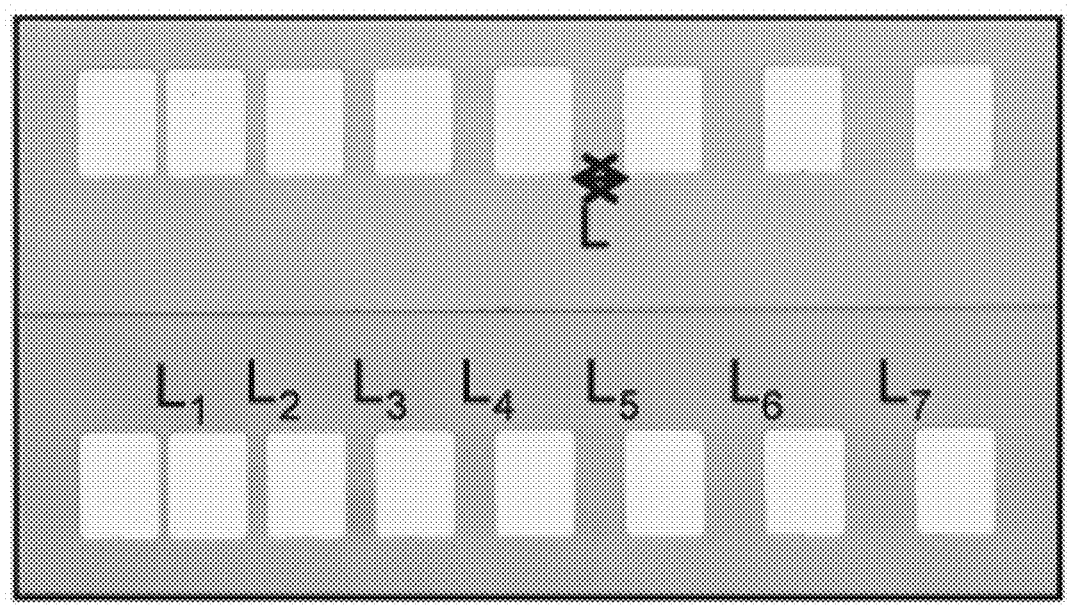
Figure 10:
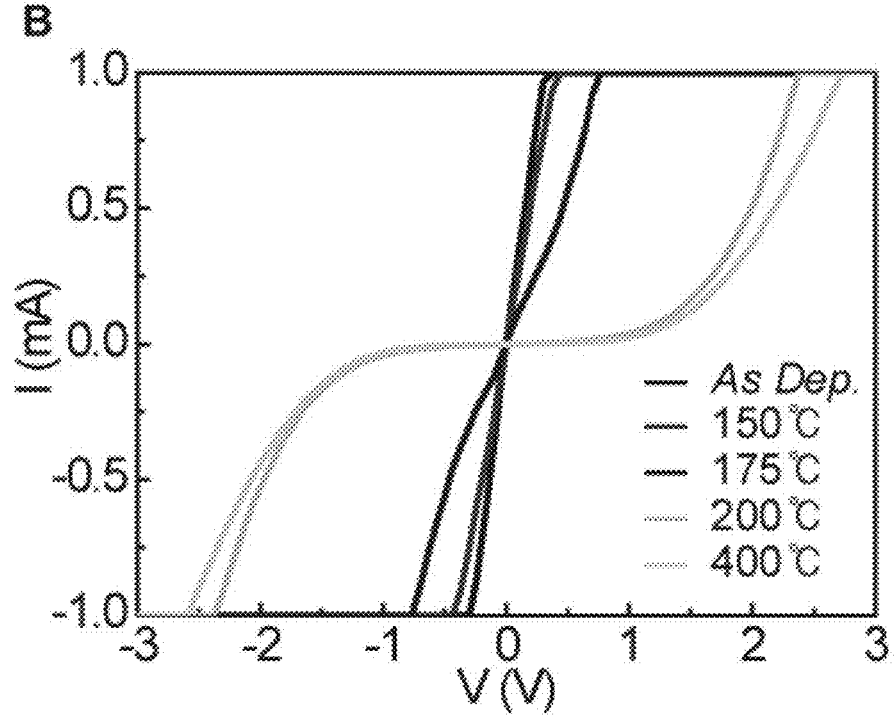
Figure 10:
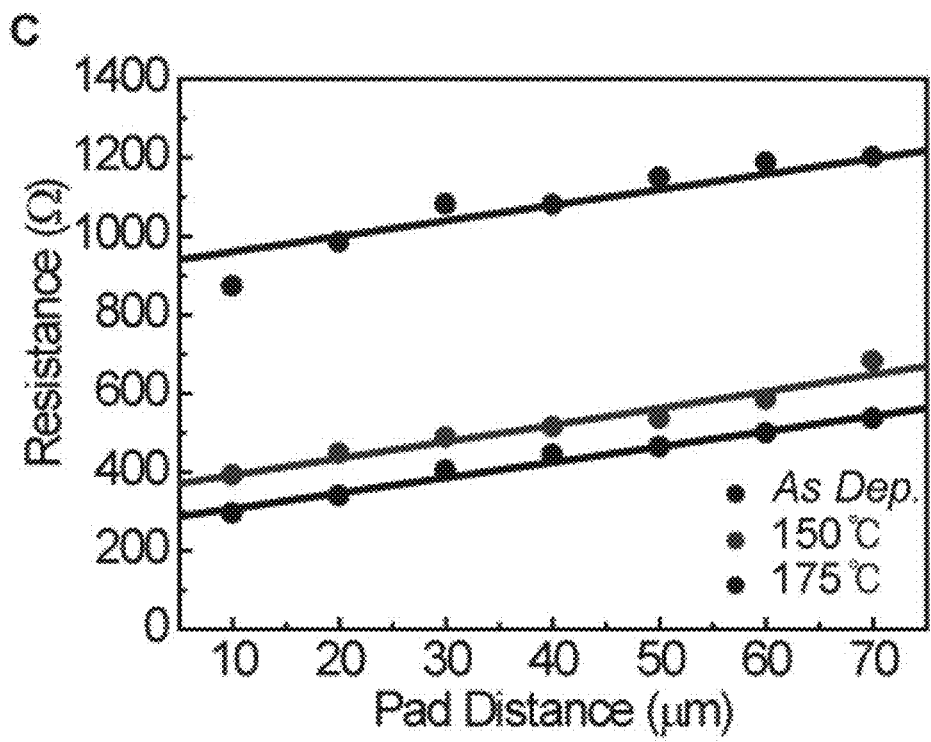
Figure 10:
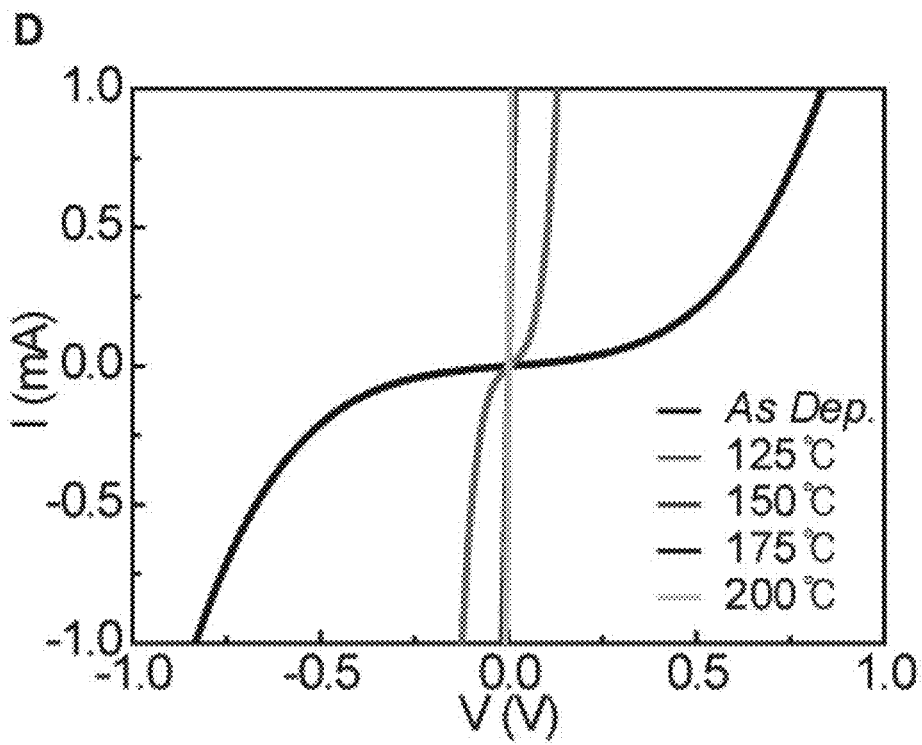
Figure 10:
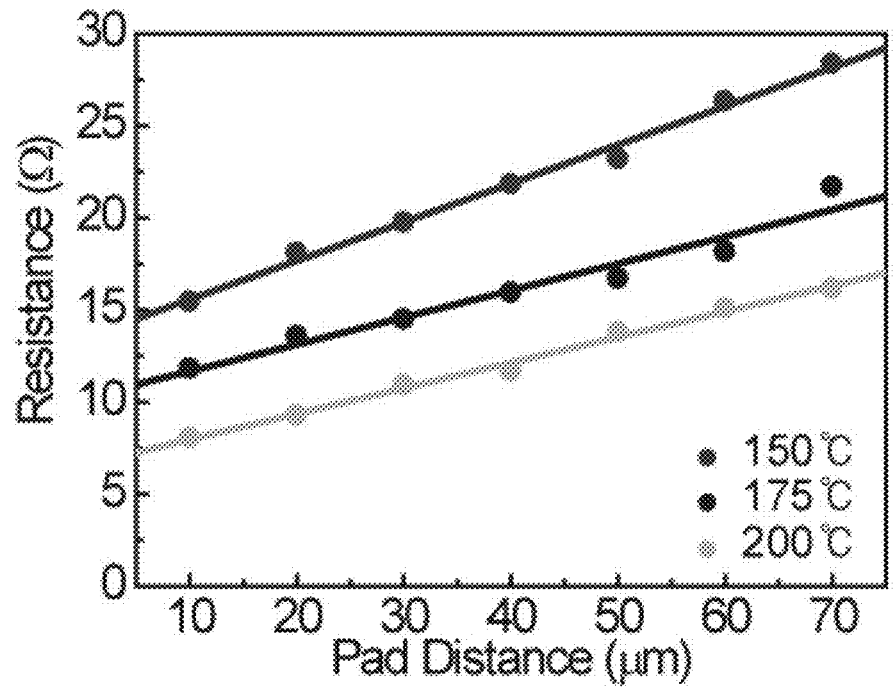

FIG. 10. (A) Optical microscope image of transmission line model (TLM) patterns with gaps of $L_1$=10 µm, $L_2$=20 µm, $L_3$=30 µm, $L_4$=40 µm, $L_5$=50 µm, $L_6$=60 µm, $L_7$=70 µm. (B) I (current)-V (voltage) curves associated with p contacts (Pt/Ti/Pt/Au=10/40/10/70 nm) as a function of annealing temperature. (C) Resistance as a function of gap length, for the p contact metallization, evaluated at different annealing temperatures. (D) I-V curves associated with n contacts (Pd/Ge/Au=5/35/70 nm) as a function of annealing temperature. (E) Resistance as a function of gap length, for the n contact metallization, evaluated at different annealing temperatures.

Figure 11:
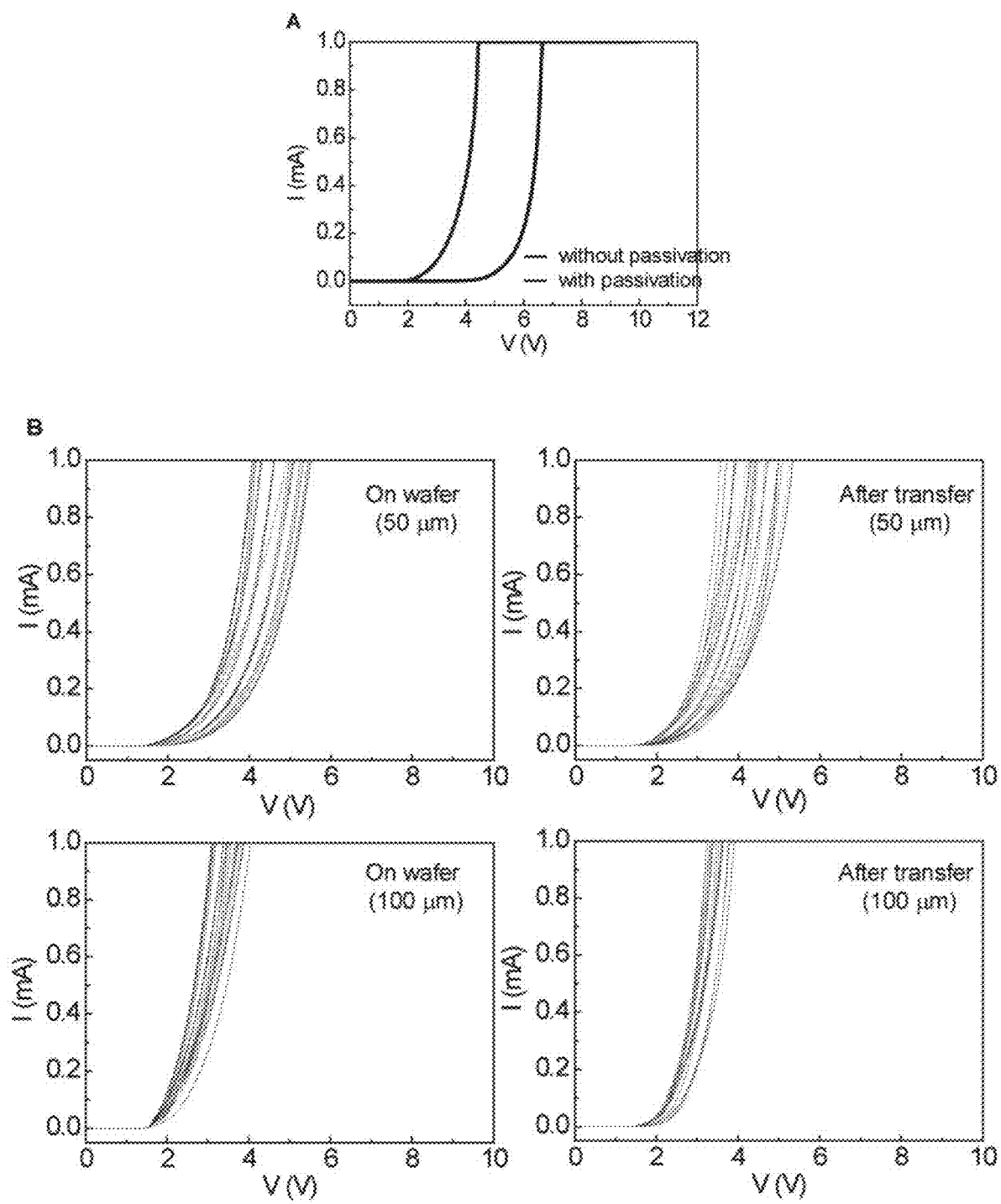

FIG. 11. (A) I-V curves of ILED devices with ohmic contacts with and without a passivation scheme to protect the sidewalls during undercut etching. (B) I-V curves of ILED devices (50×50 µm and 100×100 µm) with ohmic contacts and passivation scheme, before and after transfer.

Figure 12:
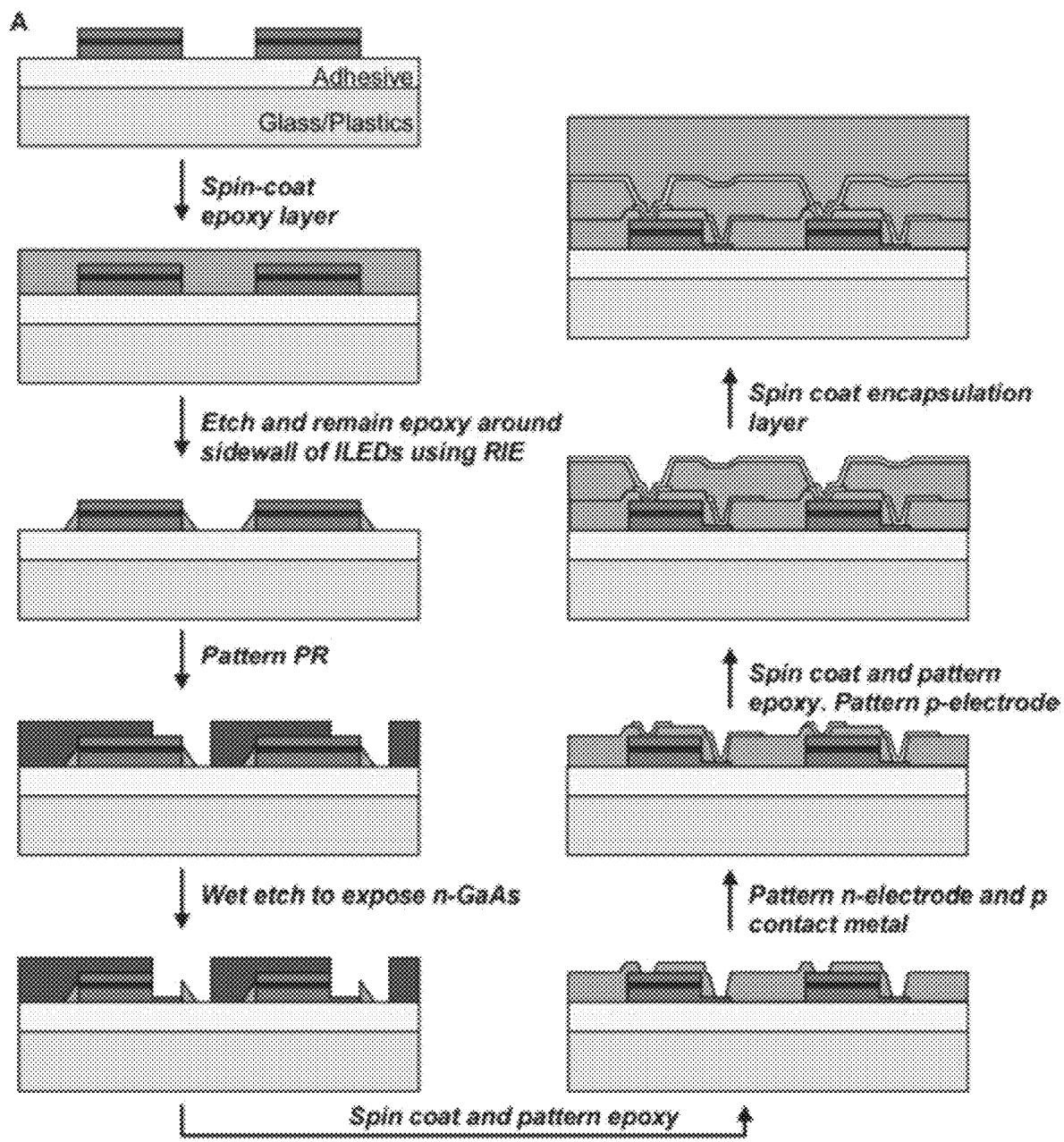
Figure 12:
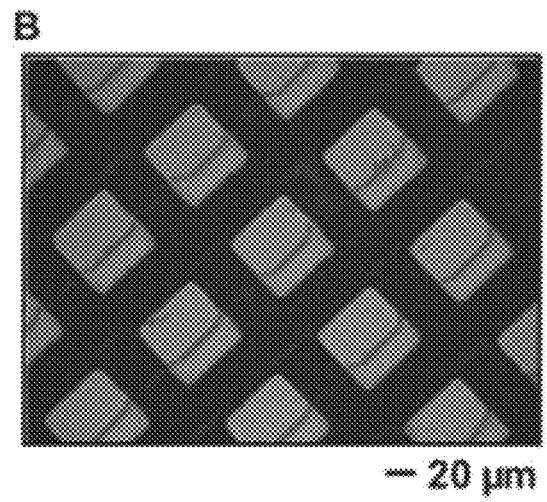
Figure 12:
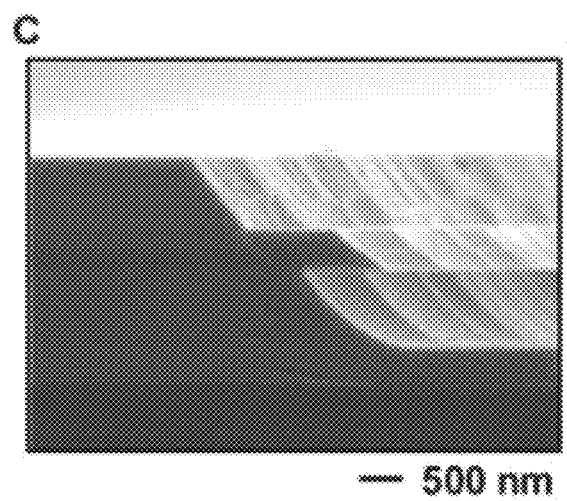
Figure 12:
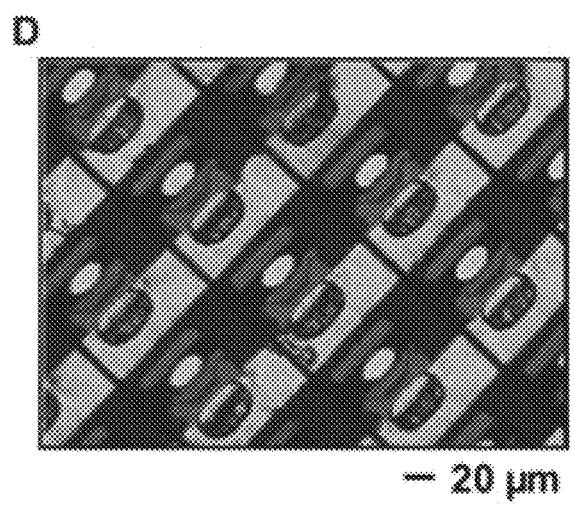

FIG. 12. (A) Schematic illustration of processing steps for fabricating electrical interconnections to complete a passive matrix array. (B) Optical microscope image of an array of ILEDs array after exposing n-GaAs by wet etching. (C) Cross sectional SEM view of an ILED after exposing n-GaAs by wet etching. (D) Optical microscope image of an array of ILEDs with electrical interconnections.

Figure 13:
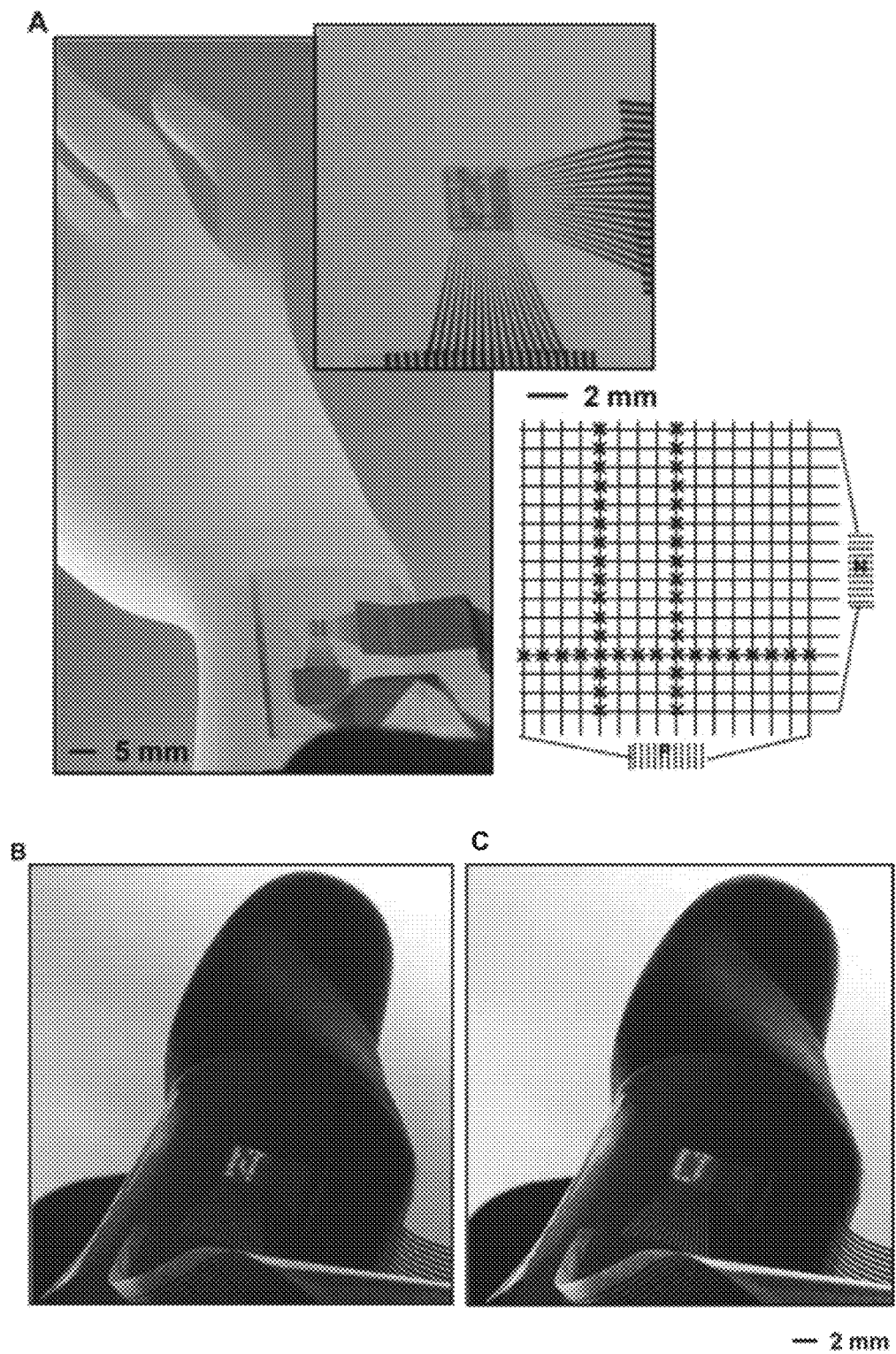

FIG. 13. Optical images of a 16×16 ILED (100 µm×100 µm with a pitch of 210 µm) display on a plastic substrate, wrapped onto the wrist (A) and finger (B, C) of mannequin. (Bottom right) a map of non-working pixels (indicated by 'x' symbols).

Figure 14:
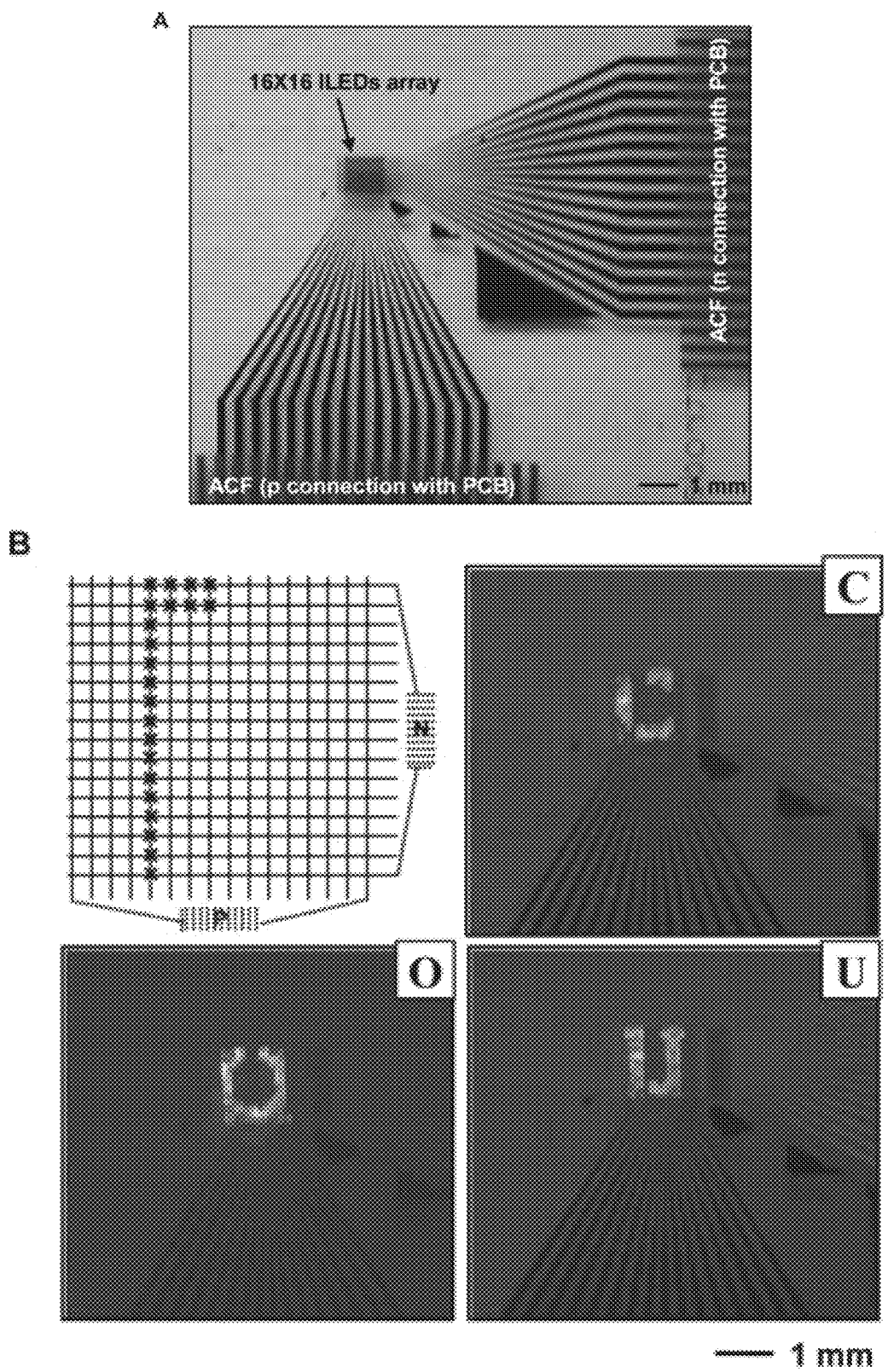

FIG. 14. (A) Optical image of a 16×16 ILED (50 µm×50 µm with a pitch of 70 µm) display on a glass substrate with ACF ribbon cable connection. (B) Optical images of the display during the operation. (Left-top) a map of non-working pixels (indicated by 'x' symbols).

Figure 15:
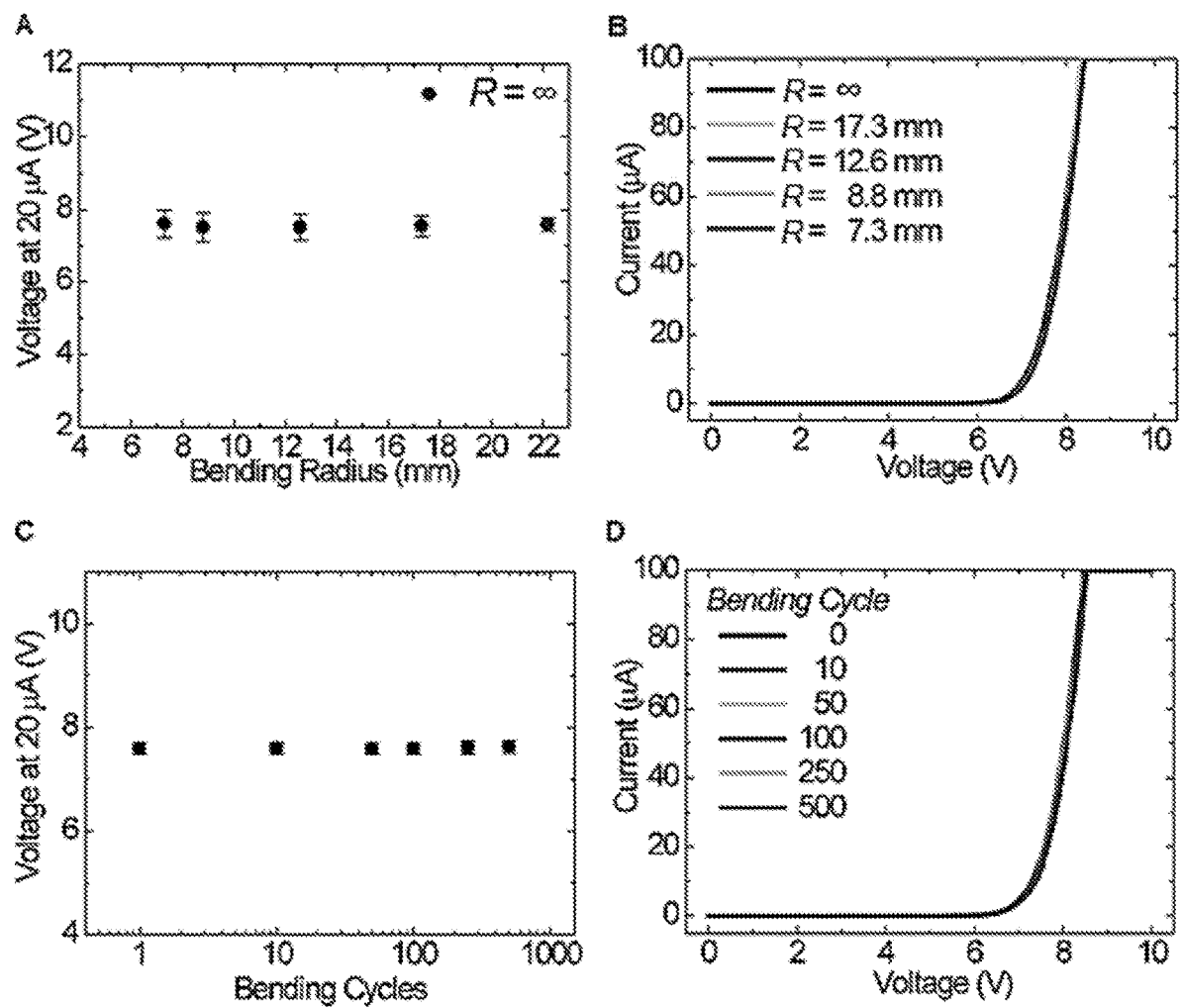

FIG. 15. Electrical properties of a 16×16 ILED (100 µm×100 µm with a pitch of 210 µm) display on a plastic substrate. (A) Plot of voltage at 20 µA and (B) I-V curves under R=∞, 17.3, 12.6, 8.8, 7.3 mm. (C) Plot of voltage at 20 µA and (D) I-V curves as a function of bending cycles up to 500 times at R=8.8 mm. The relatively high turn-on voltages are due to the use of non-ohmic contacts.

Figure 16:
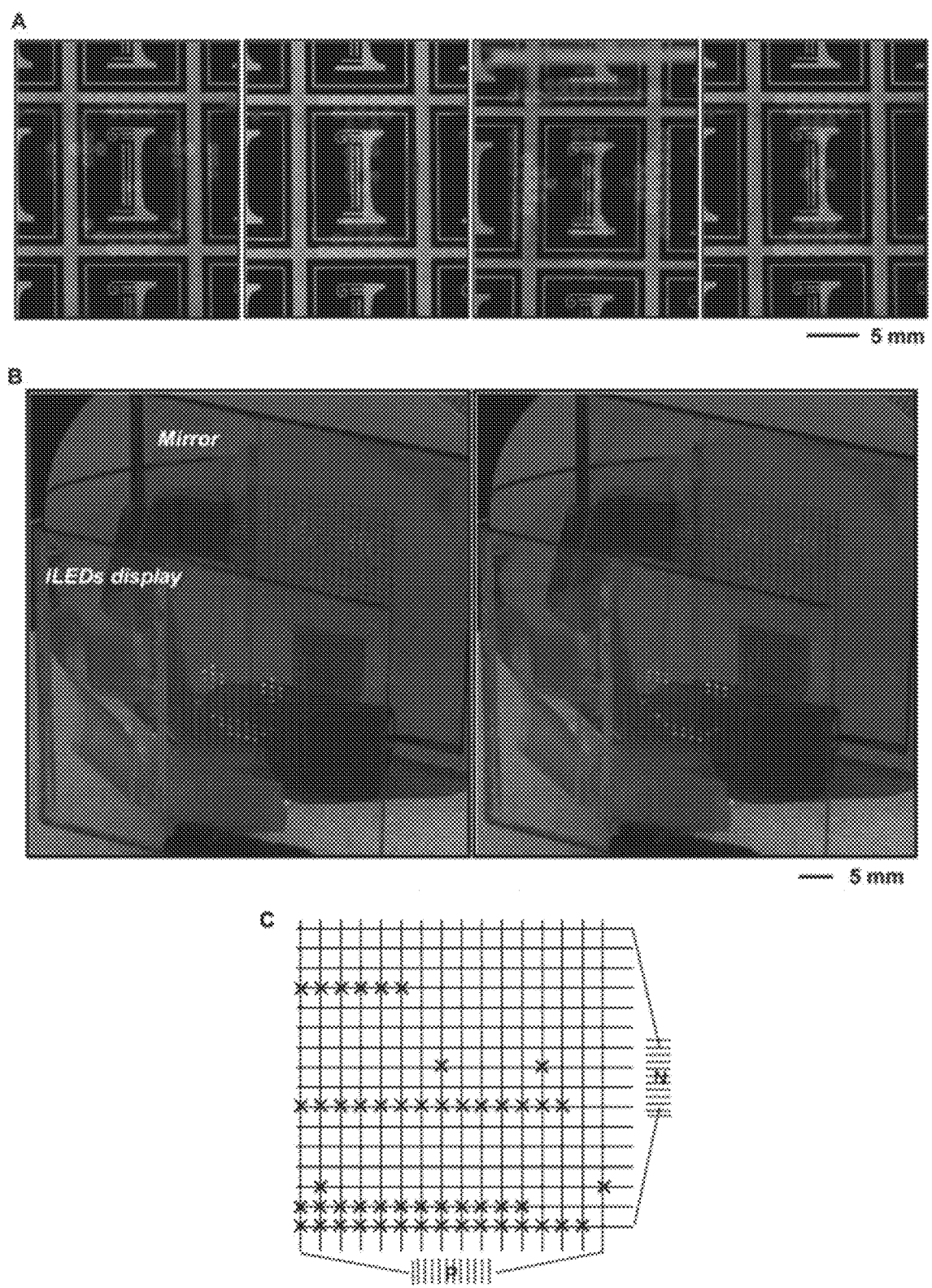

FIG. 16. (A, B) Optical images of a 16×16 ILED (100 µm×100 µm with a pitch of 1.20 mm) display on glass substrate during operation. (C) A map of non-working pixels (indicated by 'x' symbols).

Figure 17:
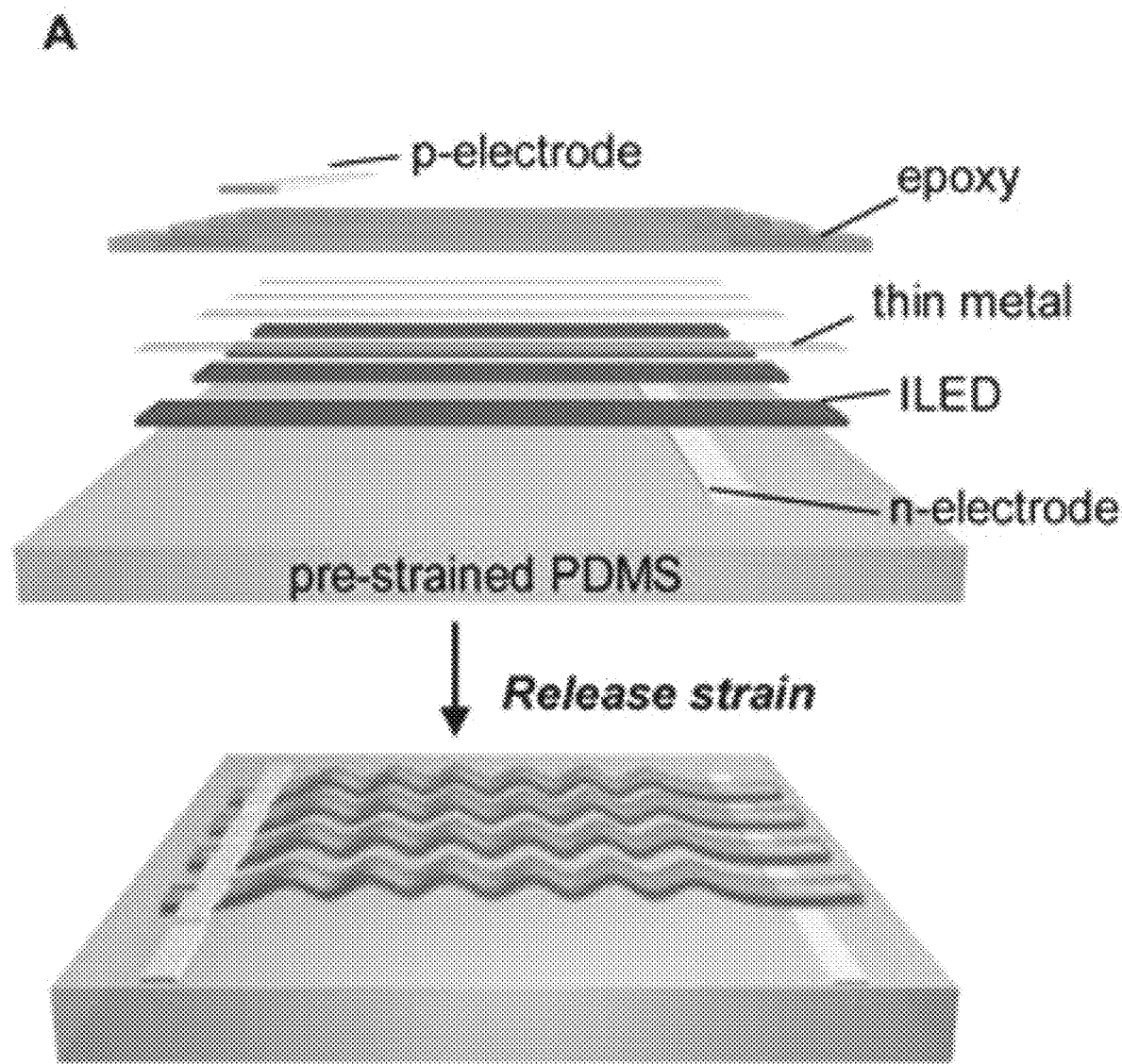
Figure 17:
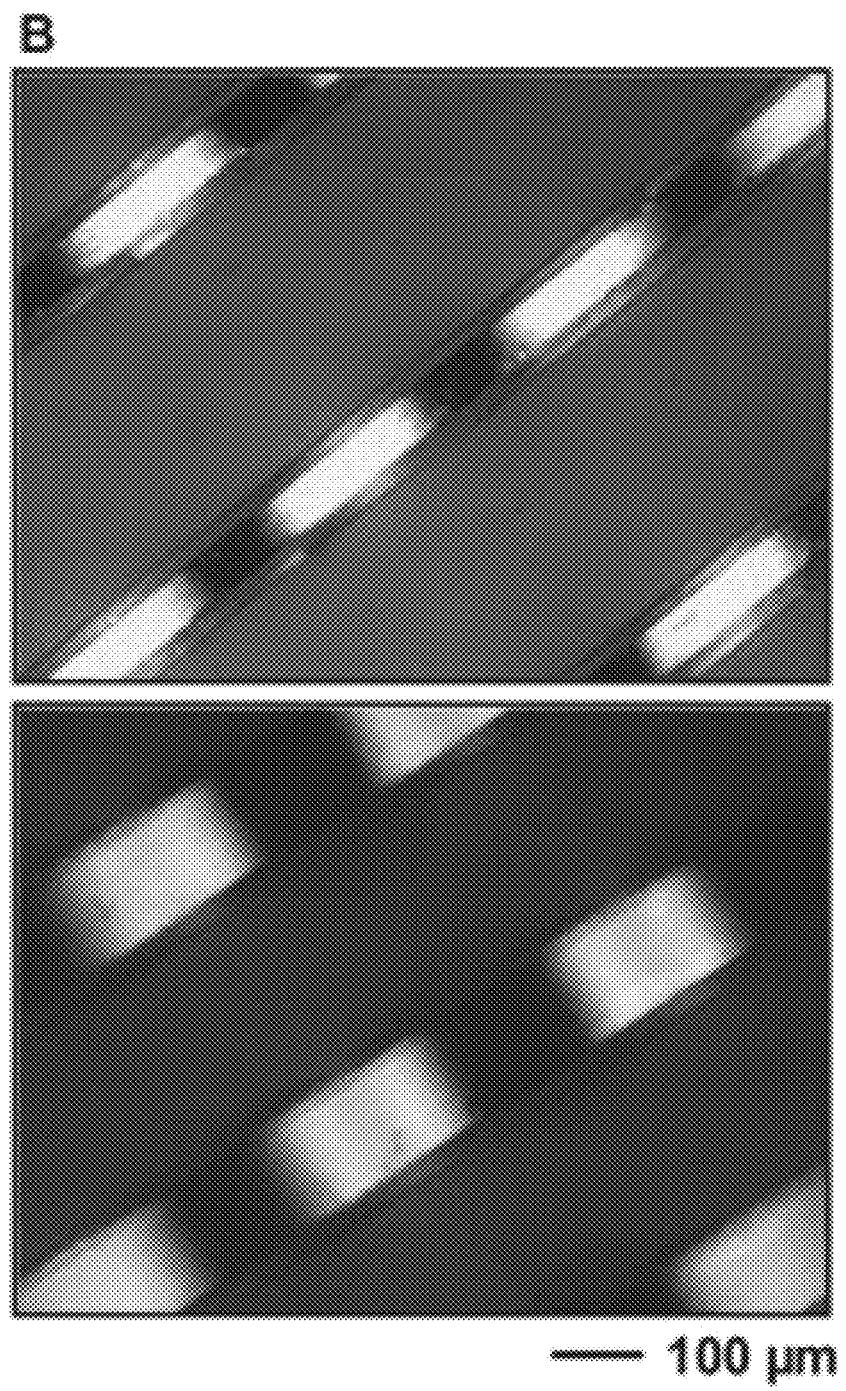
Figure 17:
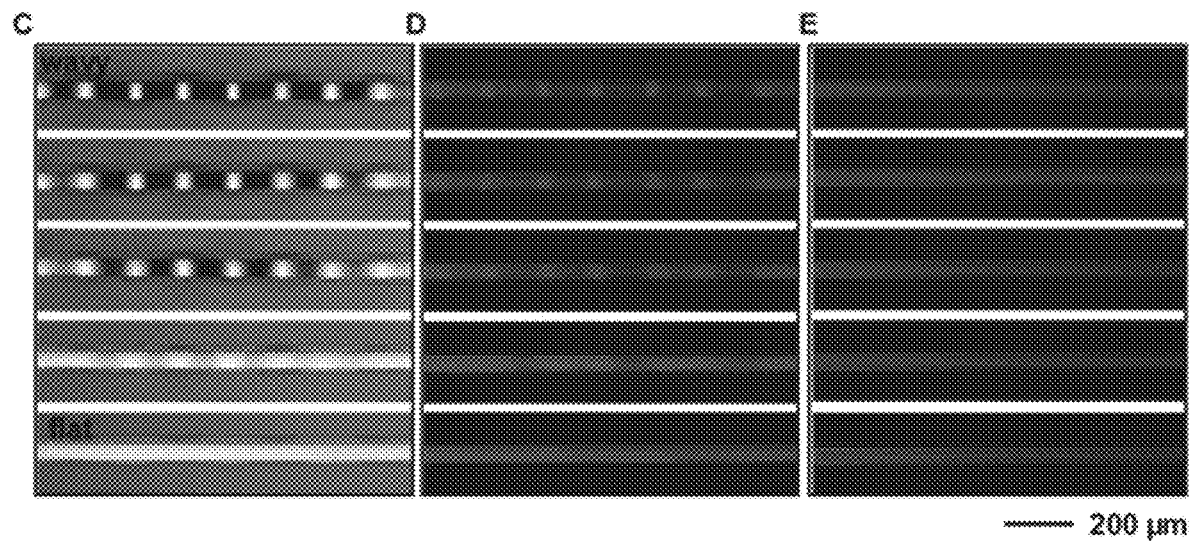
Figure 17:
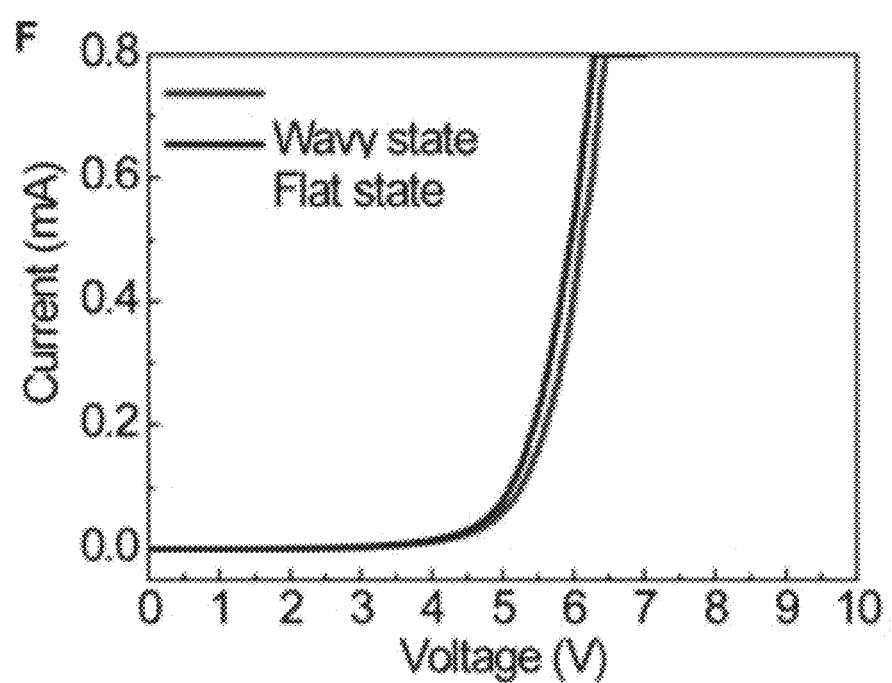

FIG. 17. (A) Exploded schematic illustration of processing steps for wavy ILEDs ribbons. (B) Optical microscope image of wavy ILEDs ribbons with 50 µm and 100 µm width collected with a scanning focal technique. Optical microscope image of a wavy ILEDs ribbon in different strained states (from wavy to flat): (C) non-emission with illumination, (D) emission with illumination, (E) emission without illumination. (F) I-V curves under different strained states. The relatively high turn-on voltages are due to the use of non-ohmic contacts.

Figure 18:
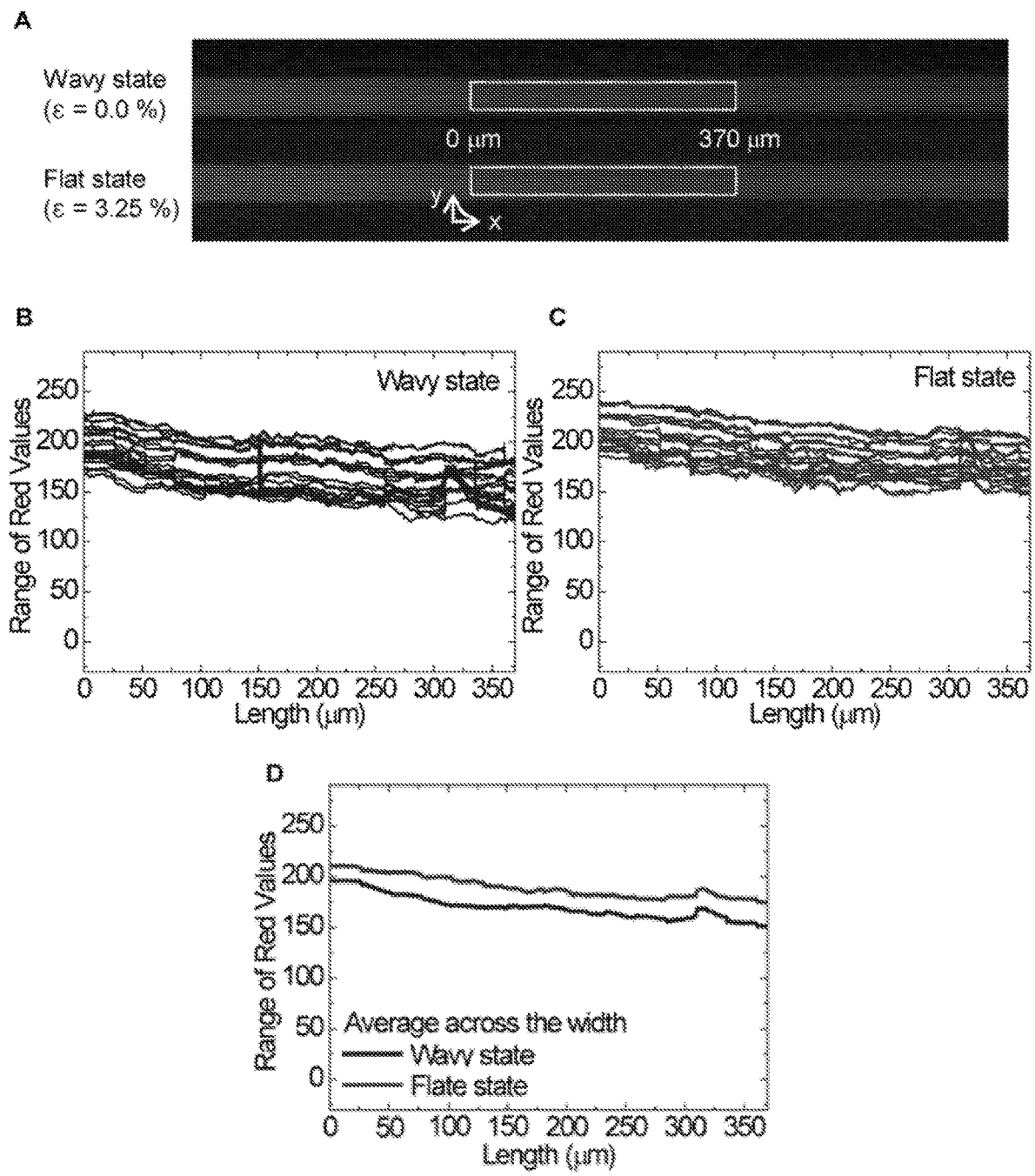

FIG. 18. (A) Optical microscope images of emission, collected without illumination, from wavy ILEDs ribbons in wavy (top) and flat (bottom) configurations. Color analysis of pixels recorded in white square box of (A) using a utilities available in a commercial software package (Photoshop, Adobe Systems): range of red values of emission from (B) the wavy and (C) flat configurations, as a function of position along the ribbon length (0=white, 255=full red). (D) Averaged range of red values of emission across the ribbon width from (B) and (C).

Figure 19:
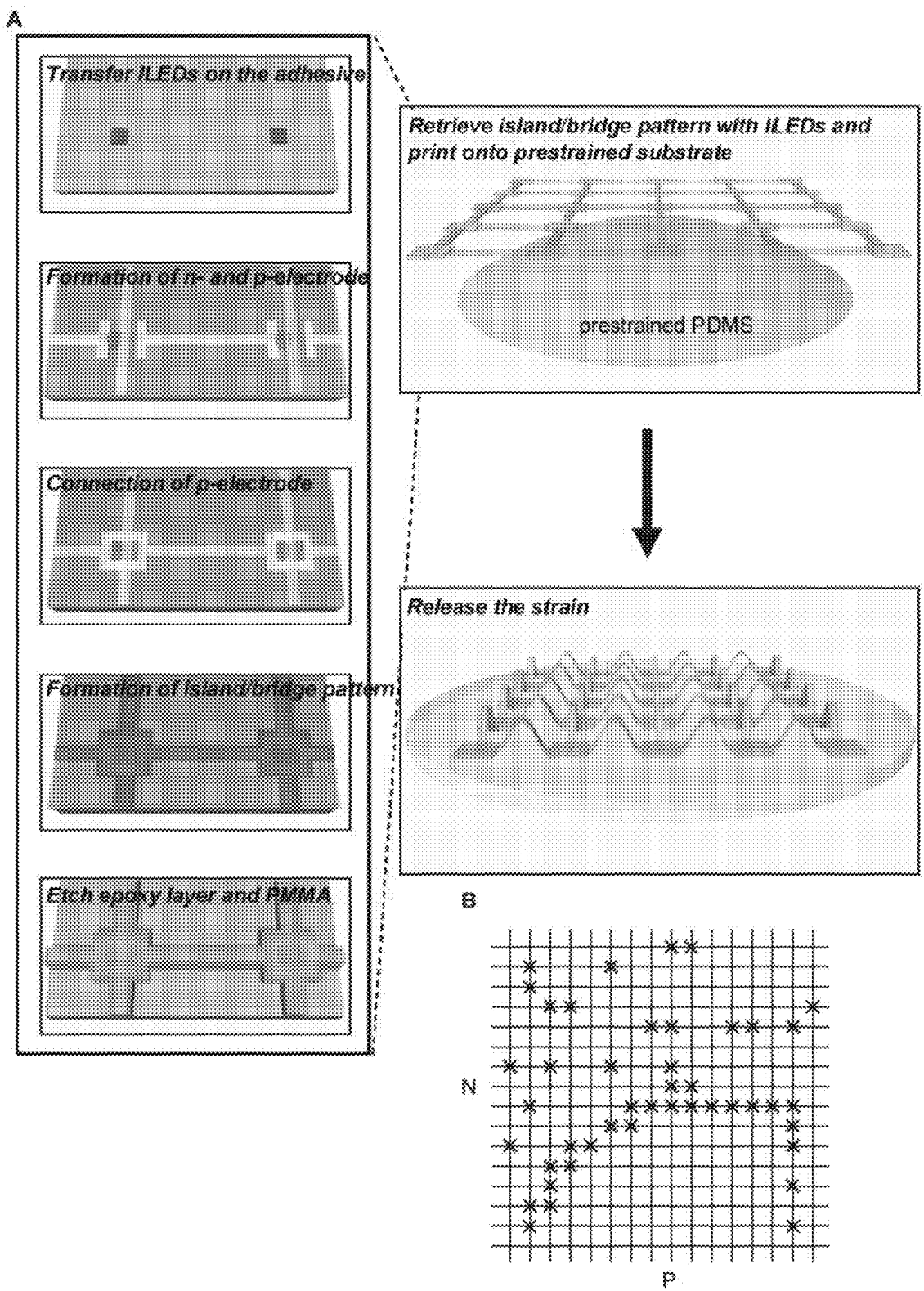

FIG. 19. (A) Schematic illustration of processing steps for stretchable ILEDs display. (B) A map of non-working pixels (indicated by 'x' symbols).

Figure 20:
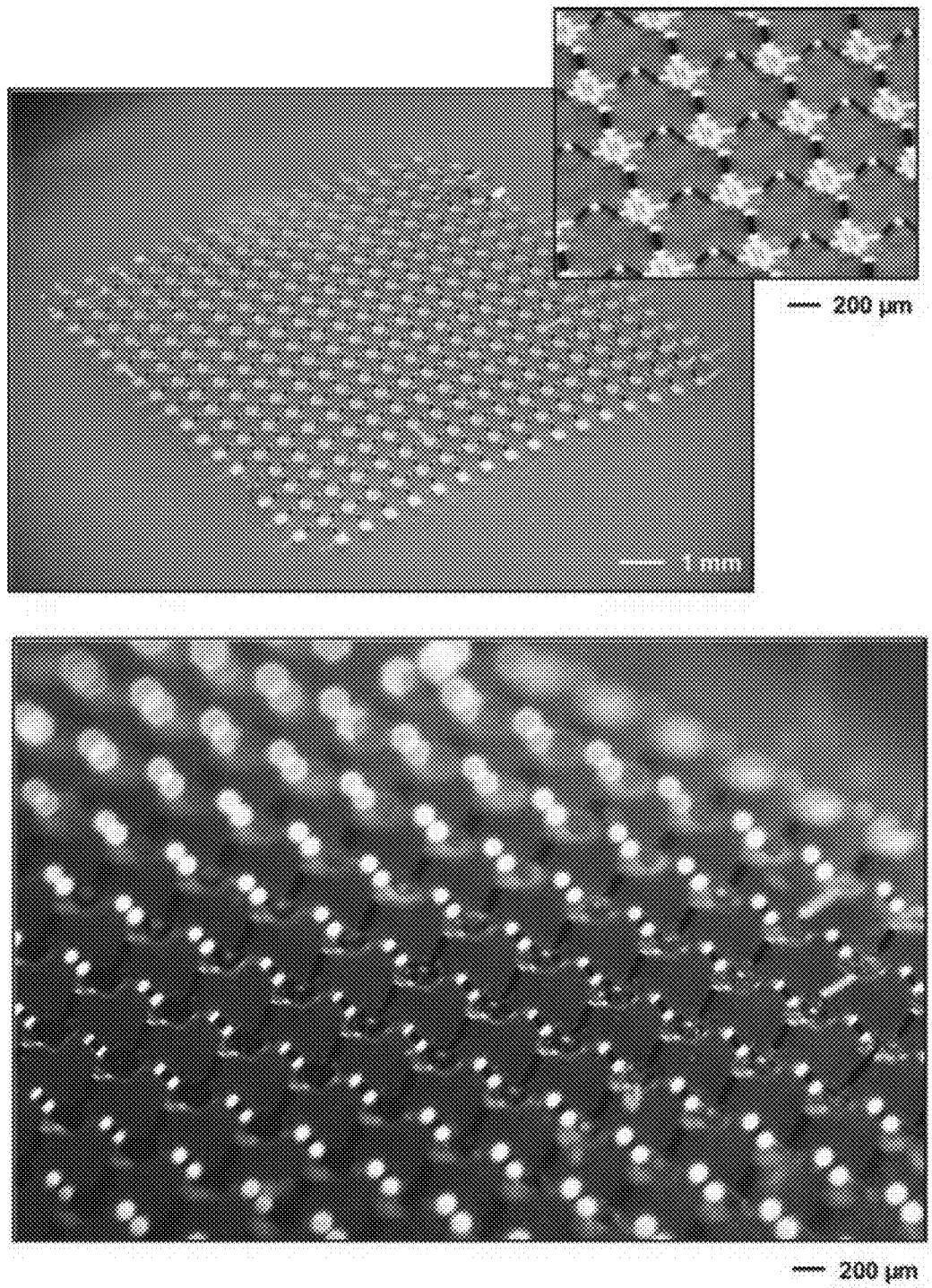

FIG. 20. Optical microscope images of a passive matrix, stretchable ILEDs display that uses a non-coplanar mesh configuration, on a flat rubber substrate.

Figure 21:
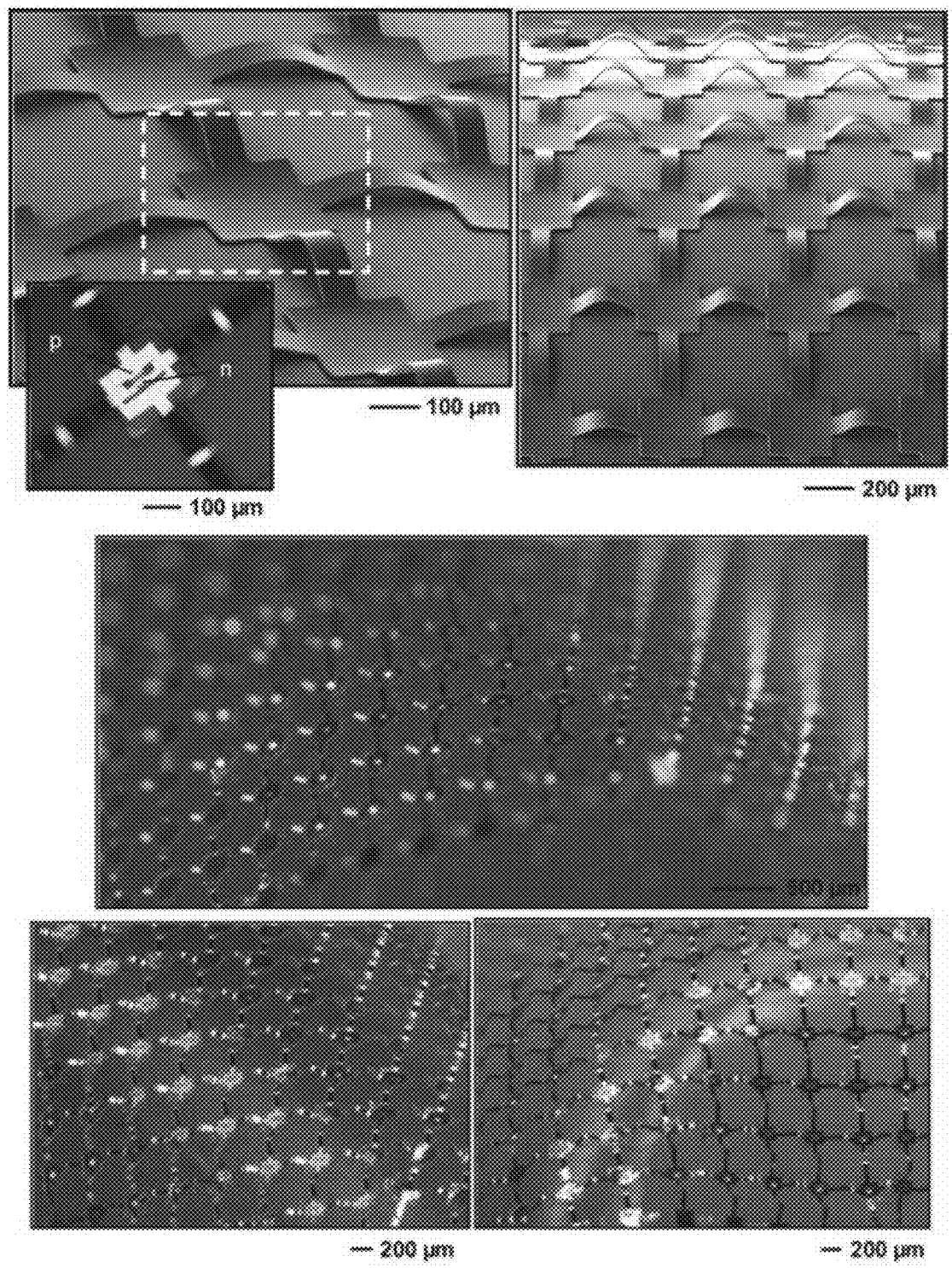

FIG. 21. Optical microscope and SEM images of a passive matrix, stretchable ILEDs display that uses a non-coplanar mesh configuration, on a bent/twisted rubber substrate.

Figure 22:
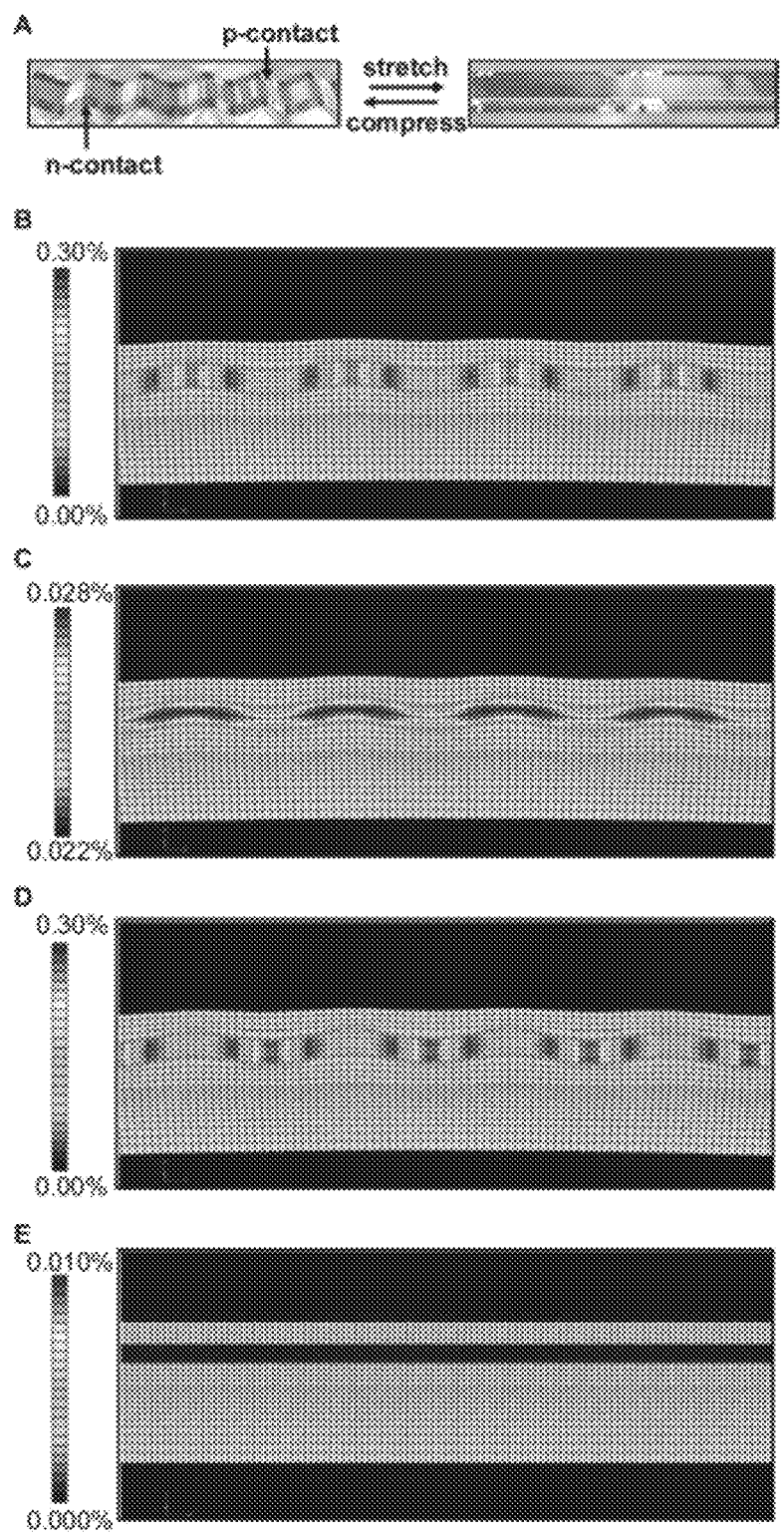

FIG. 22. (A) Schematic illustrations of a stretchable ILED on a rubber substrate in compressed (left) and stretched (right) configurations. Strain distributions in the device: (B) top surface, (C) middle surface (quantum well region), (D) bottom surface in a compressed state and (E) middle surface in a stretched state.

Figure 23:
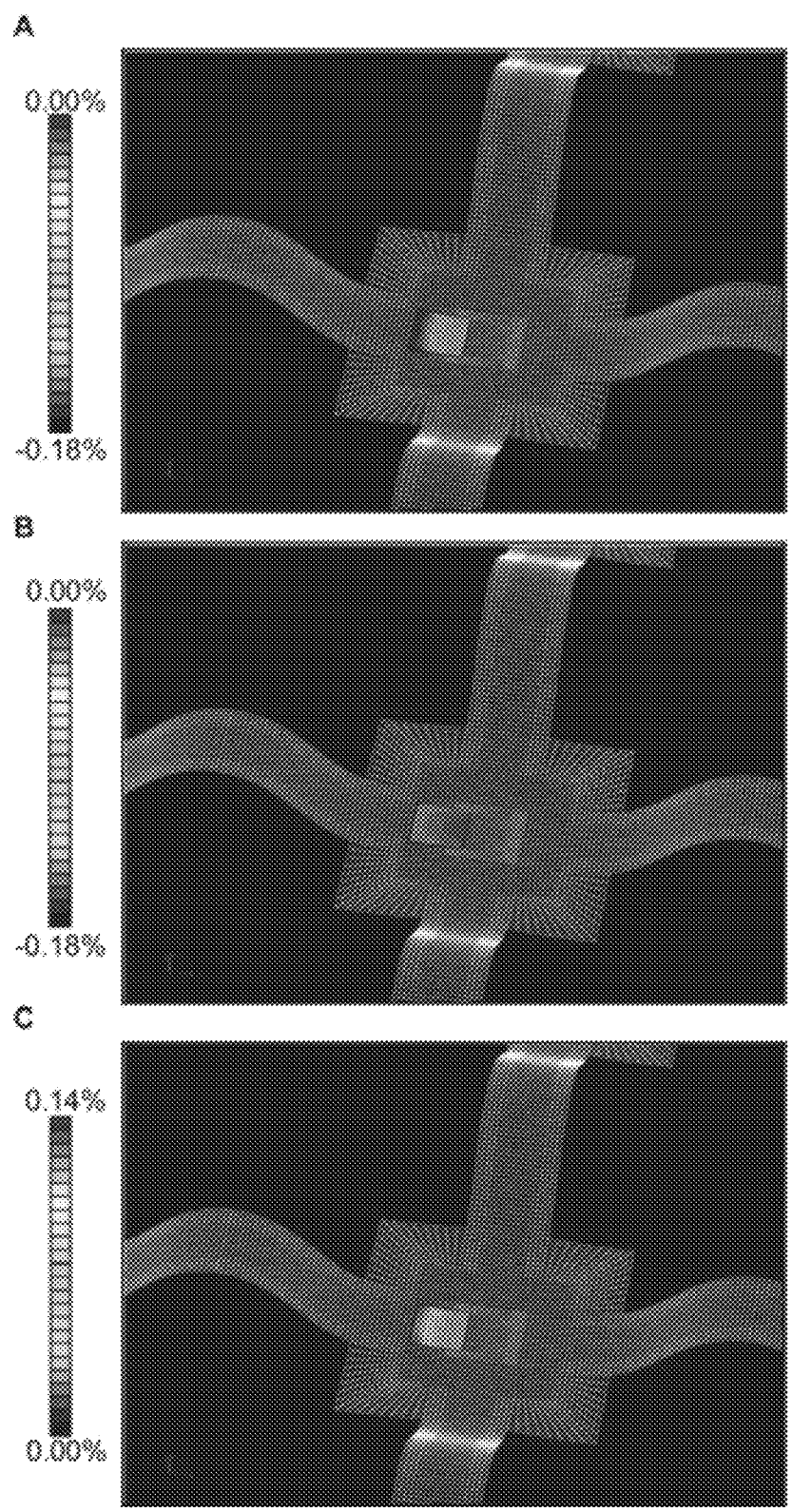

FIG. 23. Strain distributions of a stretchable ILED display: (A) top surface, (B) middle surface (quantum well region), and (C) bottom surface of ILED.

Figure 24:
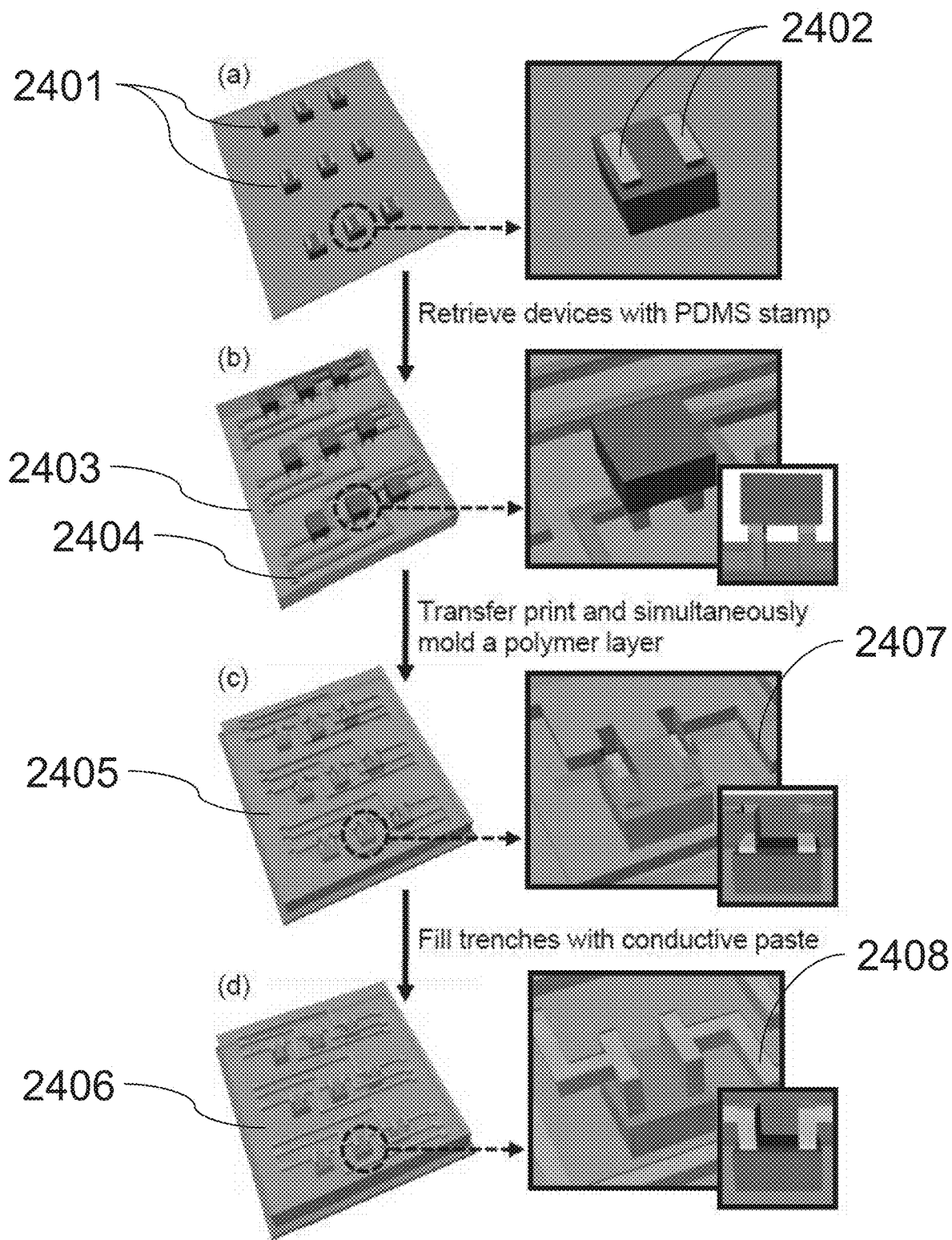

FIG. 24. Schematic illustration of procedures for printing and interconnecting microscale device components. (a) The first step involves fabrication of devices (square, dark grey blocks with rectangular, gold electrodes) on a source substrate. (b) An elastomeric stamp (light blue) retrieves a collection of these devices by van der Waals adhesion to features of relief that contact the electrode regions. (c) Bringing the stamp, 'inked' with devices in this manner, into contact with a layer of liquid prepolymer (tan), followed by curing to a solid form yields a molded structure with integrated, embedded devices. (d) Scraping a conductive paste (light grey) over this structure fills the molded features to form electrical contacts to the devices and interconnects between them.

Figure 25:
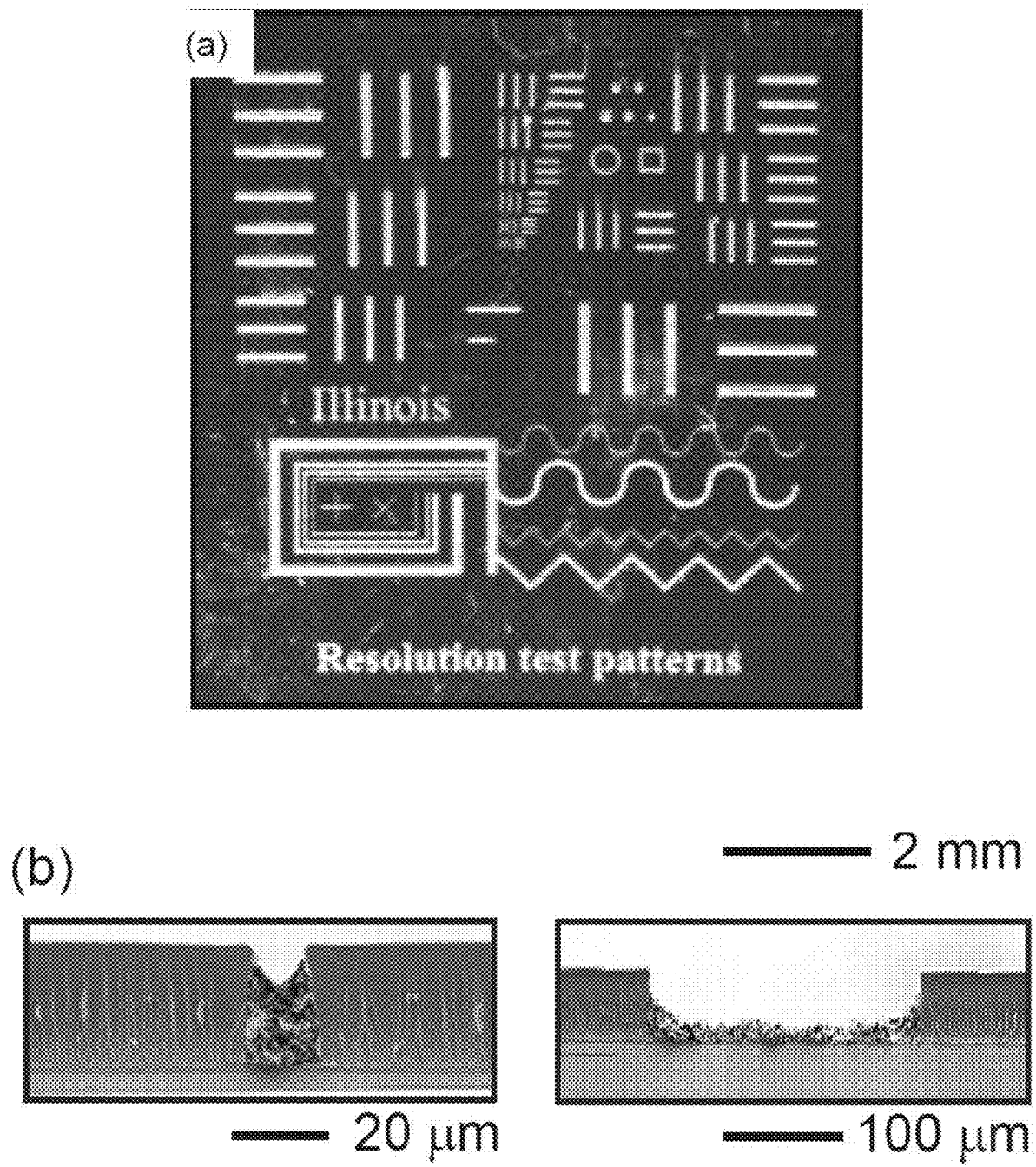
Figure 25:
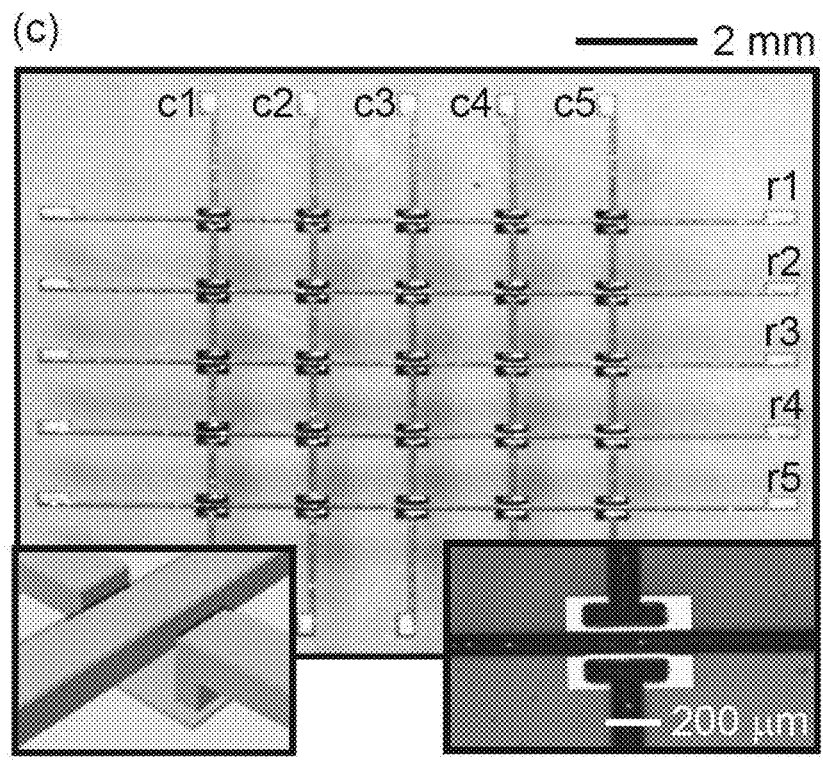
Figure 25:
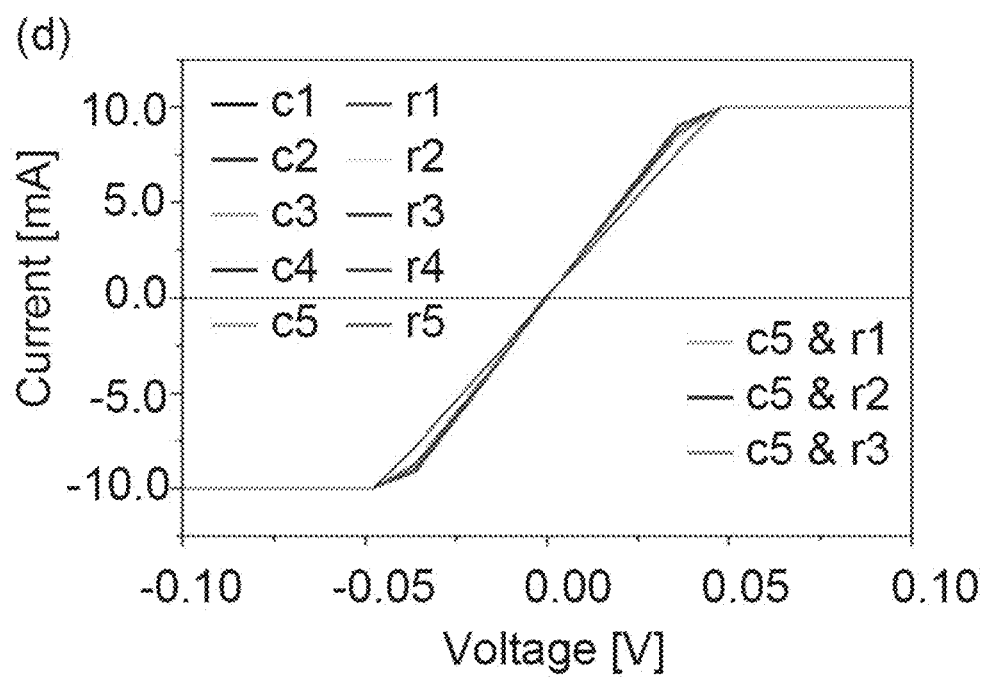

FIG. 25. (a) Optical image of a collection of conducting features formed by molding a layer of PU on a PET substrate, and then filling the resulting trenches with silver epoxy. These results illustrate the range of feature sizes and shapes and areas that can be formed easily. (b) Cross-sectional SEM images of filled lines with depths of 20 μm and widths of 20 μm (left) and 200 μm (right). Higher aspect ratios and narrower features can be achieved with suitable modifications to the conductive material. (c) Interconnected arrays of metal pads (Cr/Au, 100/1000 nm; 500×500 μm; 1.5 mm pitch) with crossed, but electrically isolated conducting lines on a PET substrate. This result used a stamp/mold with lines (100 μm widths and 20 μm depths) and rectangular features (100×300 μm lateral dimensions and 40 μm depths) to form the interconnects and the contacts to the metal pads, respectively. The bottom left and right frames provide a schematic cartoon illustration and a top view optical micrograph, respectively, of the structure near a representative pad. (d) Current/voltage data collected by probing contact pads to different combinations of row (r1, r2, etc) and column (c1, c2, etc) interconnect lines verifies electrical continuity along columns and rows and electrical isolation between columns and rows.

Figure 26:
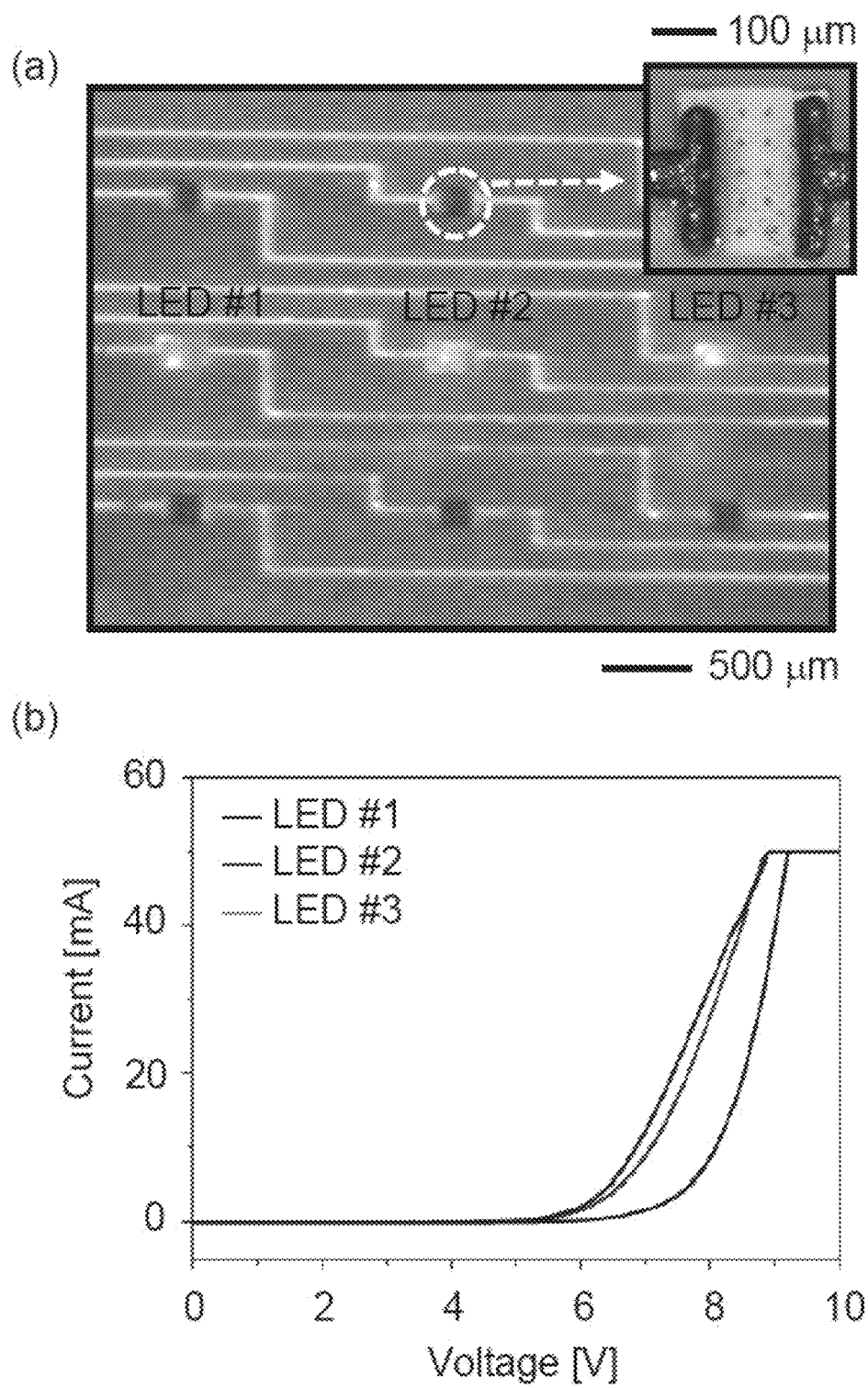

FIG. 26. (a) Optical image of a set of six AlInGaP light emitting diodes (LEDs; 250×250 μm) formed in ultrathin (2.5 μm thick) layouts and pairs of molded interconnect lines leading to each. Selective printing formed the arrays; aligned molding followed by filling with silver epoxy formed the interconnect. The top inset provides a top view optical micrograph. The three devices in the middle were connected to a power supply to cause light emission. (b) Current/voltage characteristics (non-ohmic contacts) of these LEDs.

Figure 27:
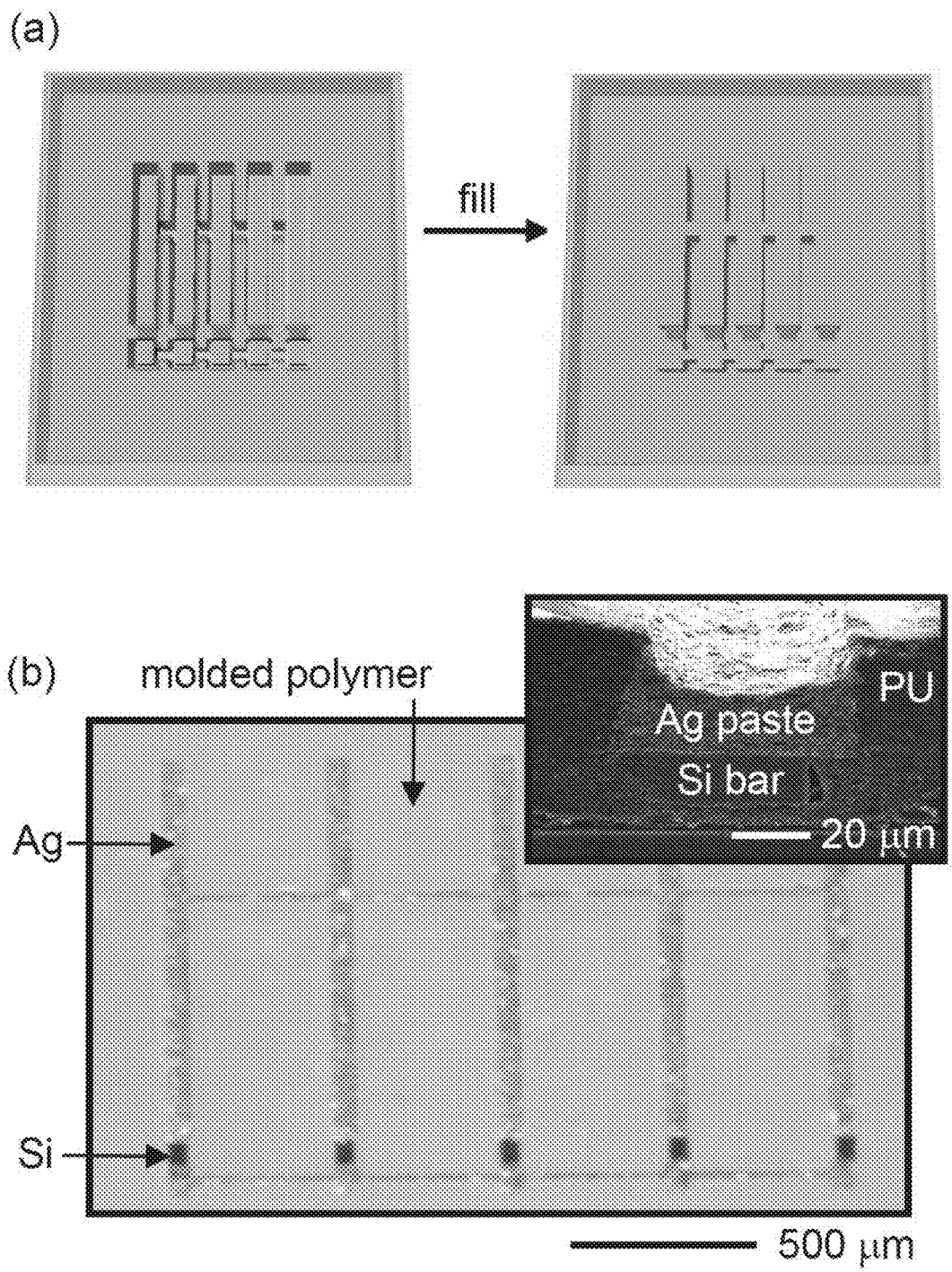
Figure 27:
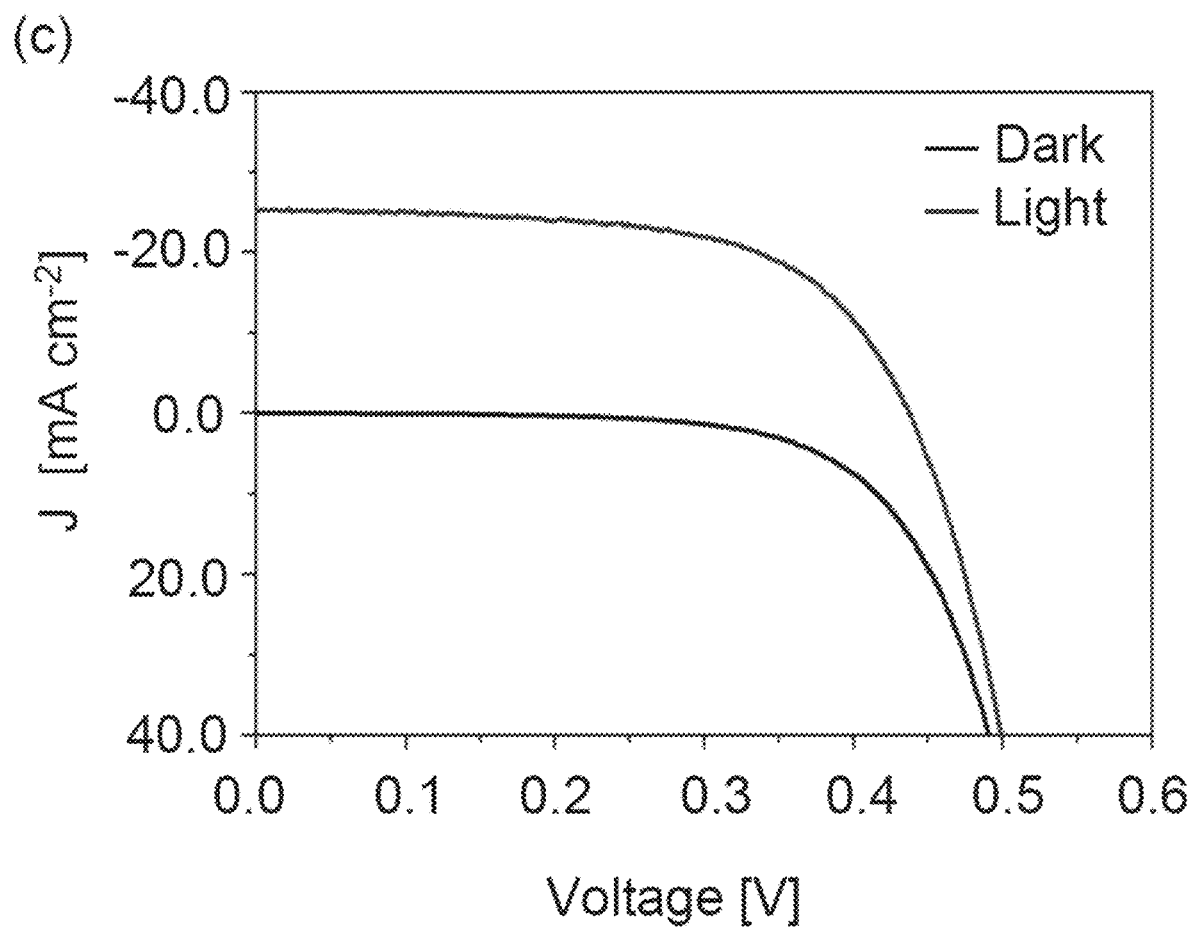

FIG. 27. (a) Schematic illustration of a photovoltaic minimodule consisting of five monocrystalline bars of silicon with integrated contacts. The left and right frames show the structure before and after filling molded trenches with silver epoxy, respectively. The molded polymer (PU) is illustrated in tan; the silicon cells are black, with gold contacts. Filling the molded trenches with silver epoxy (light grey) yields the interconnected structure on the right. Each bar is 50 μm wide, 1.55 mm long and 20 μm thick, with ohmic contacts of metal (Cr/Au, 100/1000 nm; 50 μm width and 100 μm length for p contact; 50 μm width and 1.4 mm length for n contact) on p and n doped regions. (b) Optical image of a sample, with an inset that shows a cross sectional view of part of the structure. (c) Current/voltage characteristics carried out at room temperature, in light and dark. The efficiency ($E_{ff}$) and fill factor (FF) of this solar cell were 6.5% and 0.61 respectively.

Figure 28:
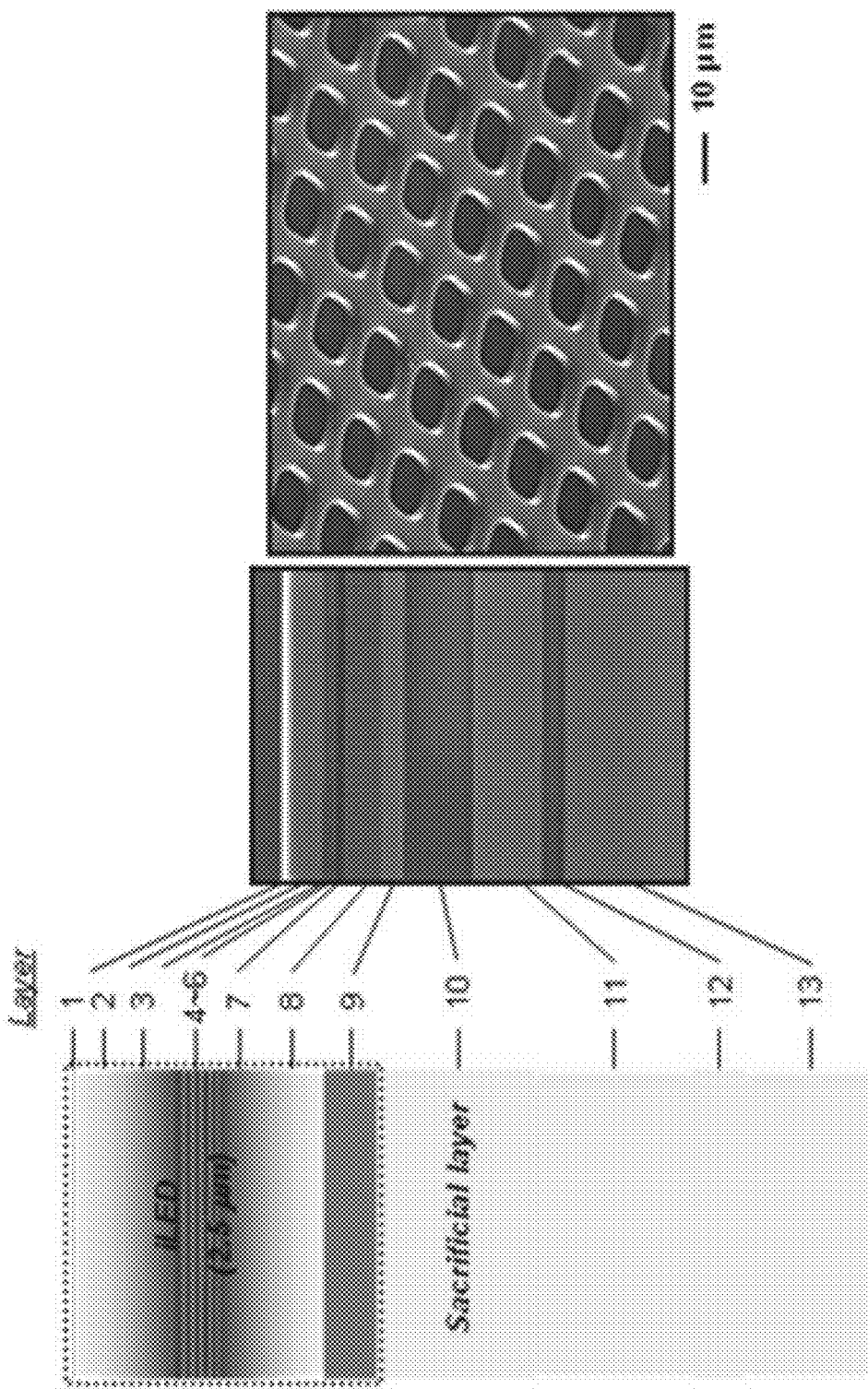

FIG. 28. Epitaxial layers of GaAs LED wafer.

Figure 29:
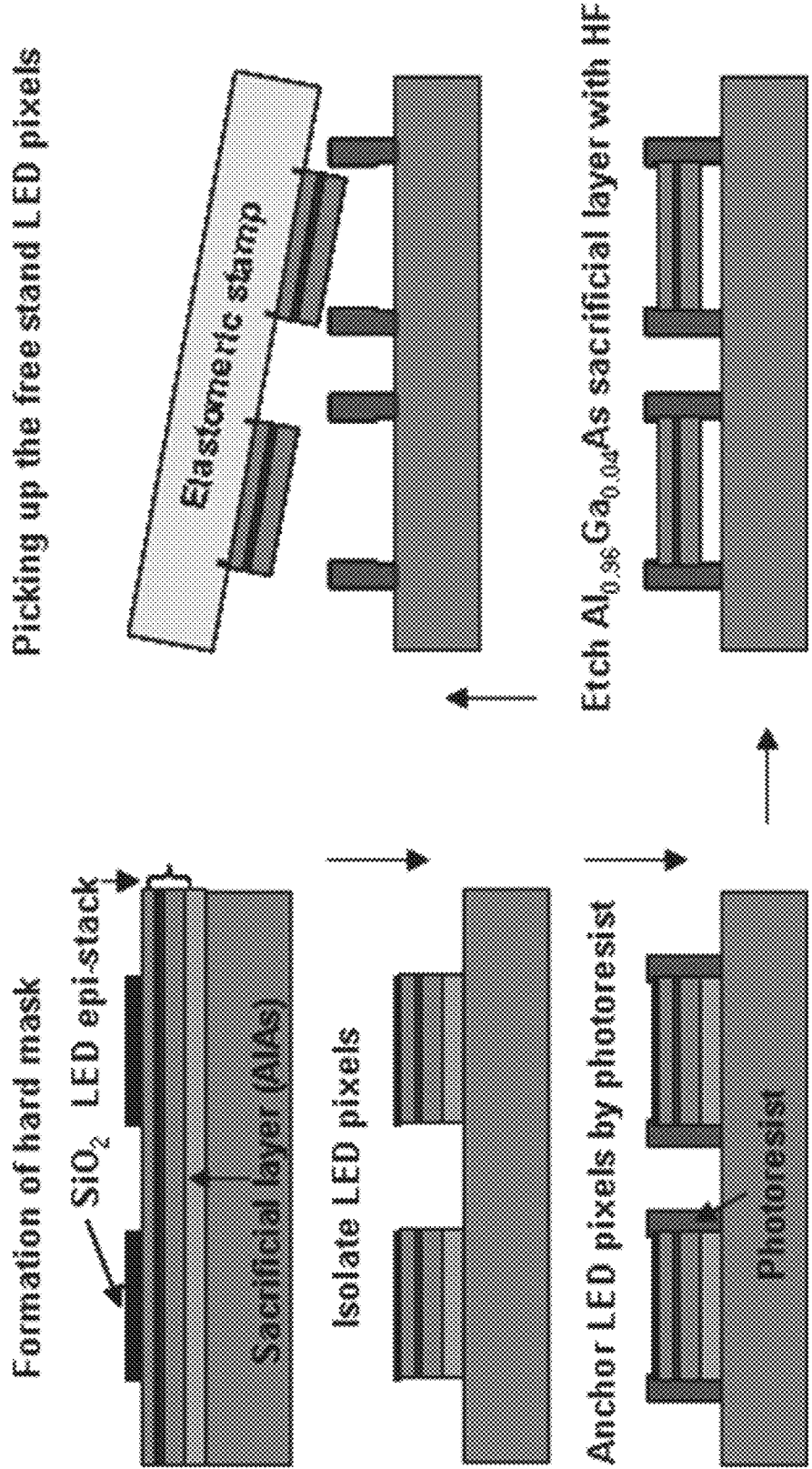

FIG. 29. Processing schematics for μ-GaAs LED.

Figure 30:
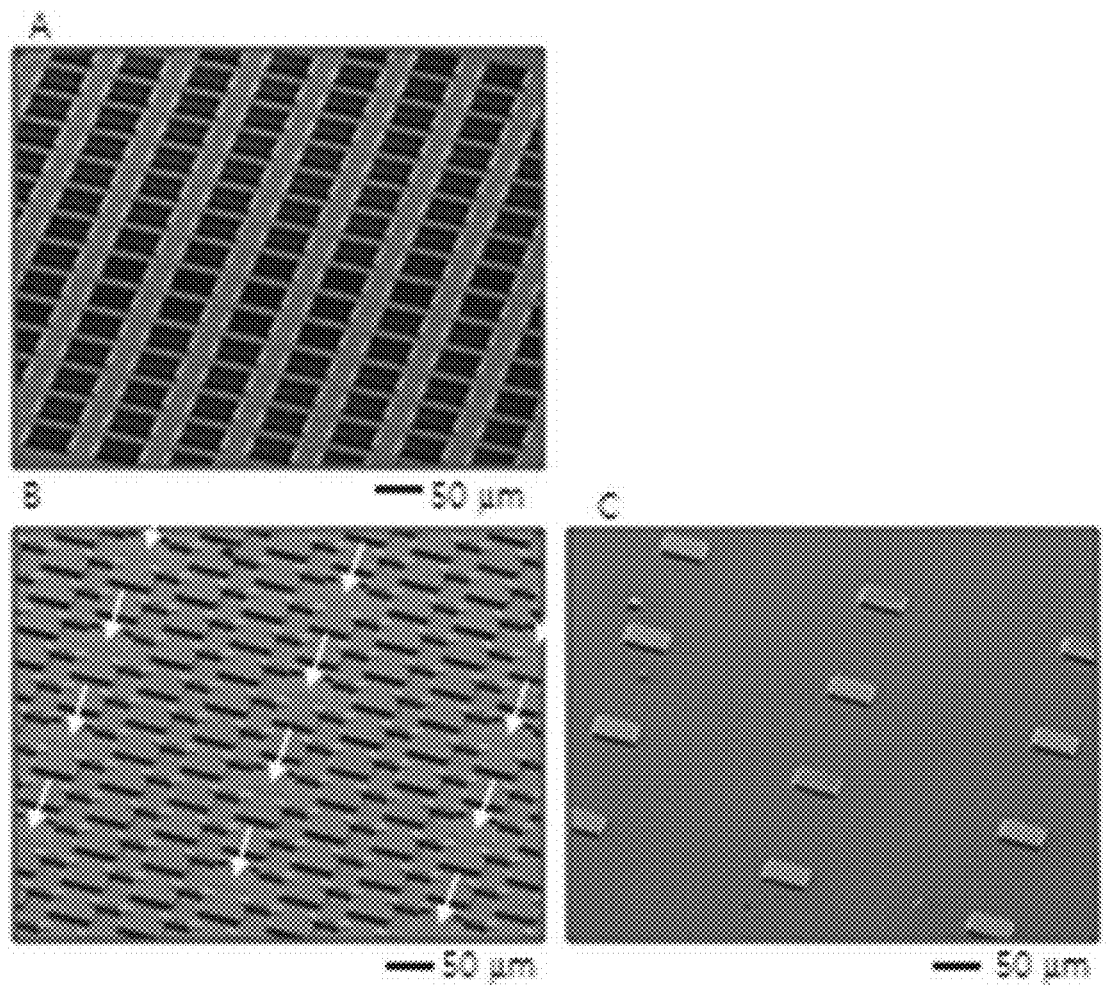
Figure 30:
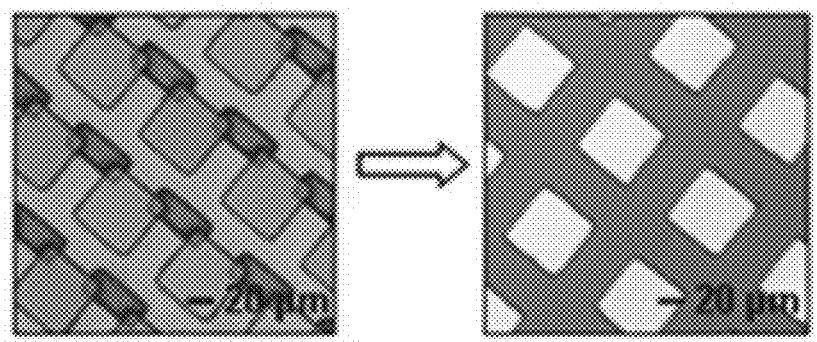

FIG. 30. A. Scanning Electron Microscopy (SEM) image of isolated GaAs LED on the host wafer. B. Scanning Electron Microscopy (SEM) image GaAs LED after heterogeneous anchors are photolithographically defined. C. Scanning Electron Microscopy (SEM) image of transfer-printed GaAs LEDs on a PET substrate. D. Optical Microscopy (OM) image of GaAs LEDs before & after transfer-printing process.

Figure 31:
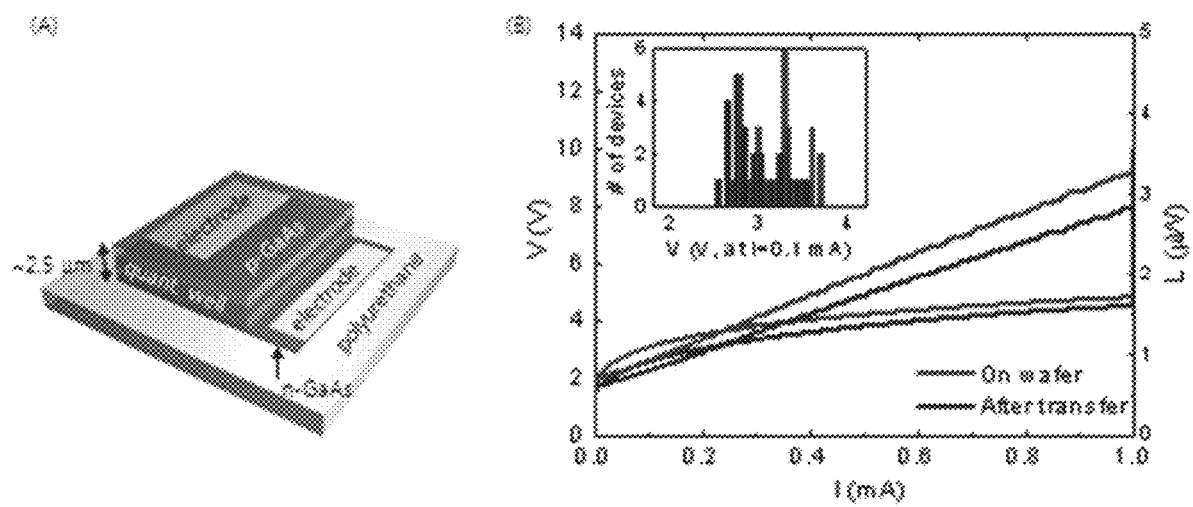

FIG. 31. (A). A cartoon illustrating the printed μ-GaAs LED. (B) Luminance vs. current-voltage characteristic plots.

Figure 32:
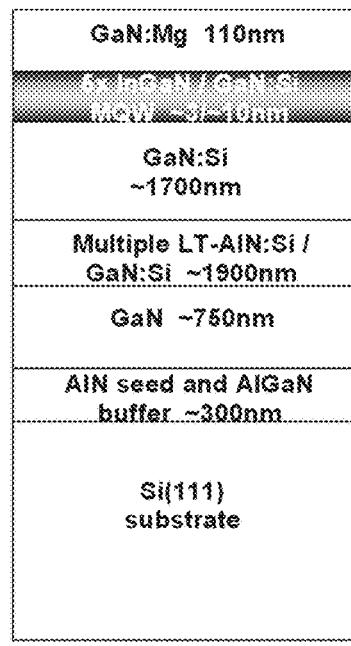

FIG. 32. Epitaxial layer structure of a typical GaN device on a silicon wafer.

Figure 33:
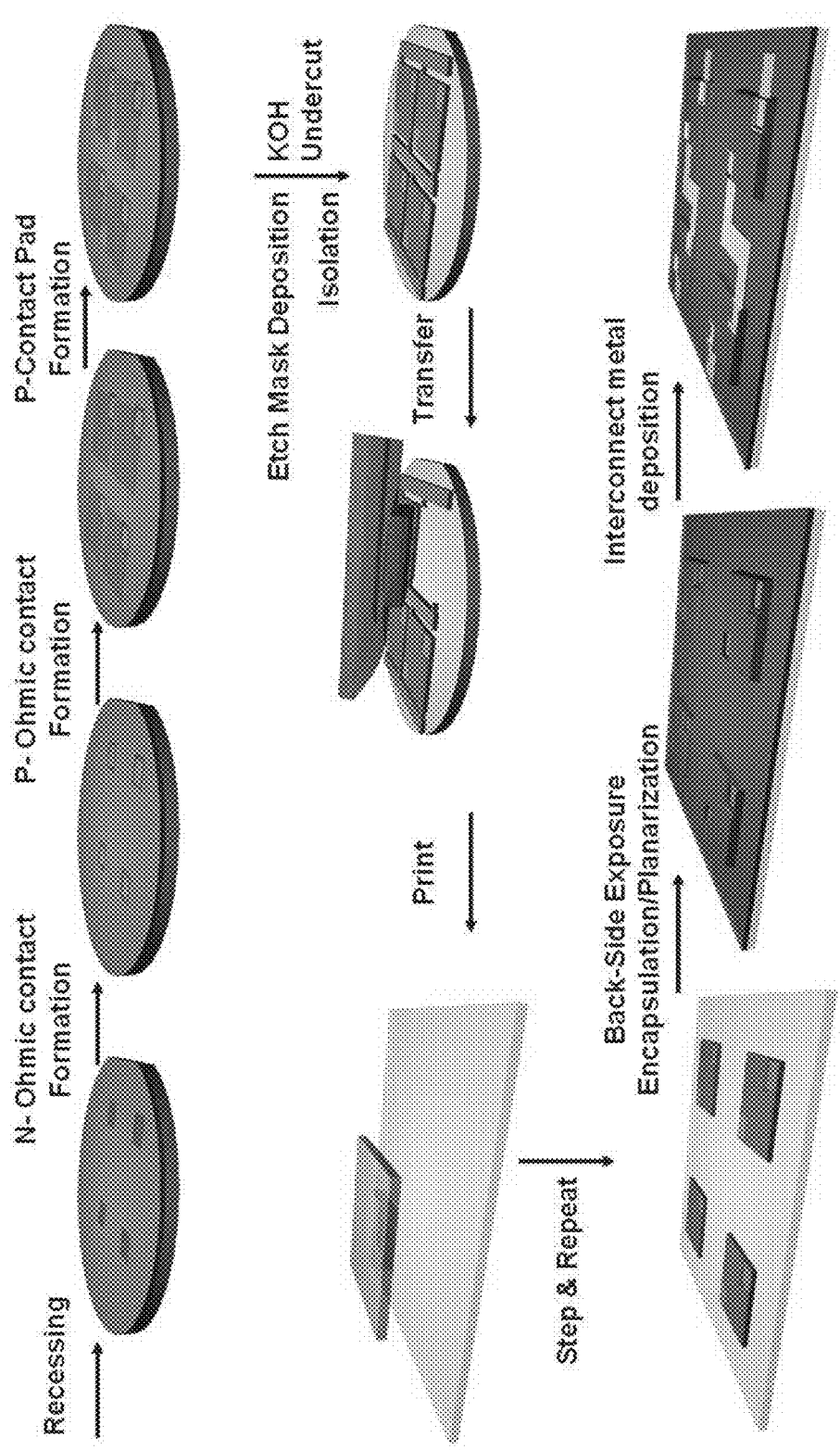

FIG. 33. Processing scheme of individually printable μ-GaN LEDs.

Figure 34:
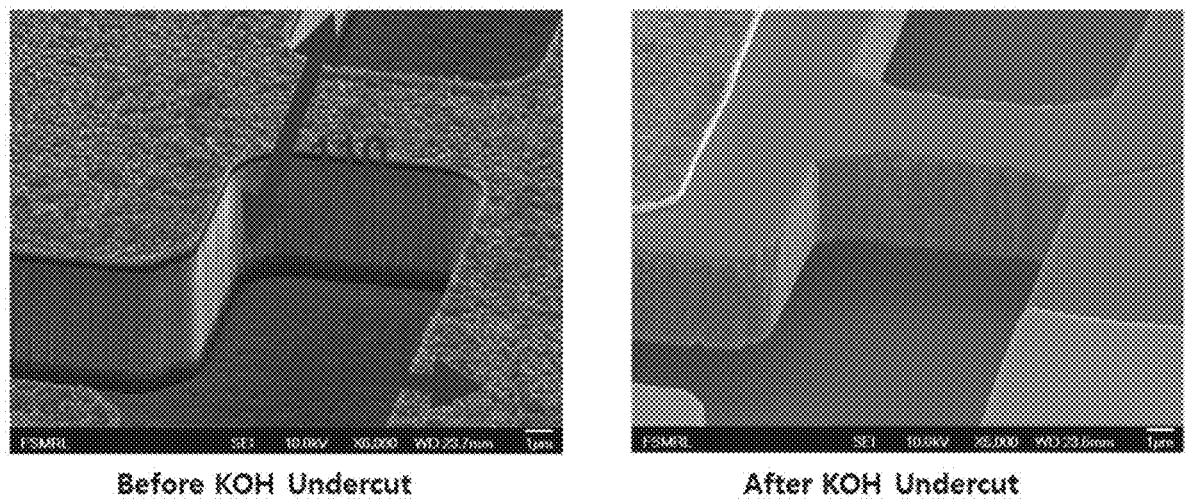

FIG. 34. Scanning electron microscopy (SEM) image of an anchor of μ-GaN LED cell before (left) and after (right) KOH undercut process.

Figure 35:
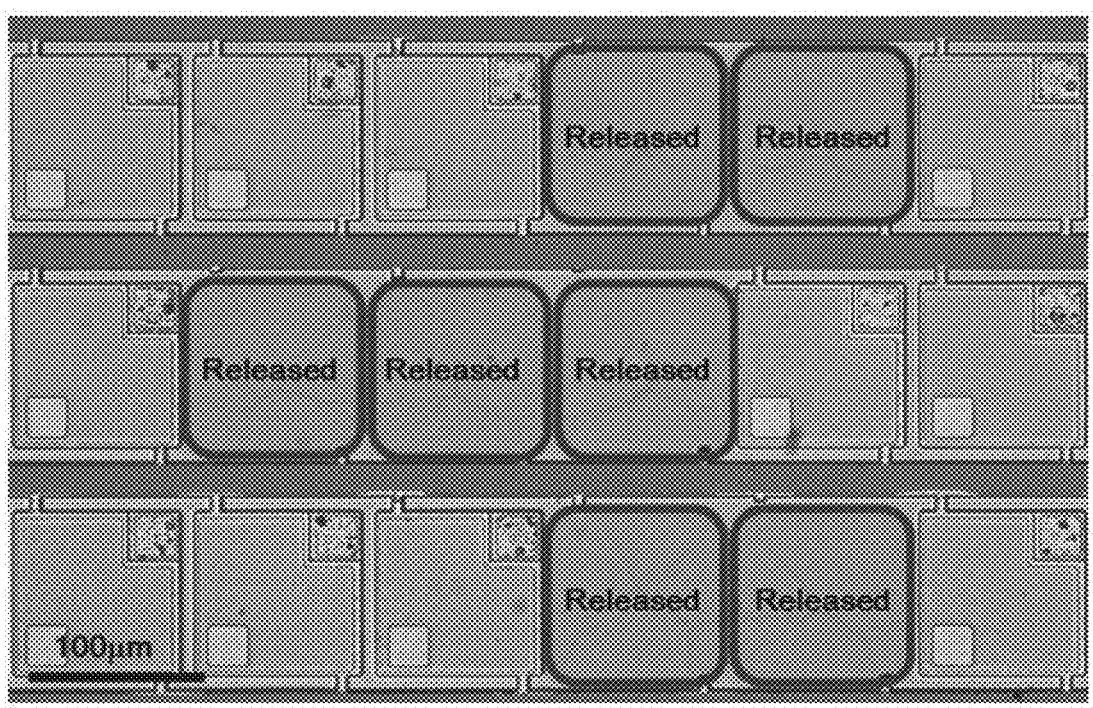

FIG. 35. Optical image of the donor substrate after several step-and-repeat transfer-printing process has been carried out.

Figure 36:
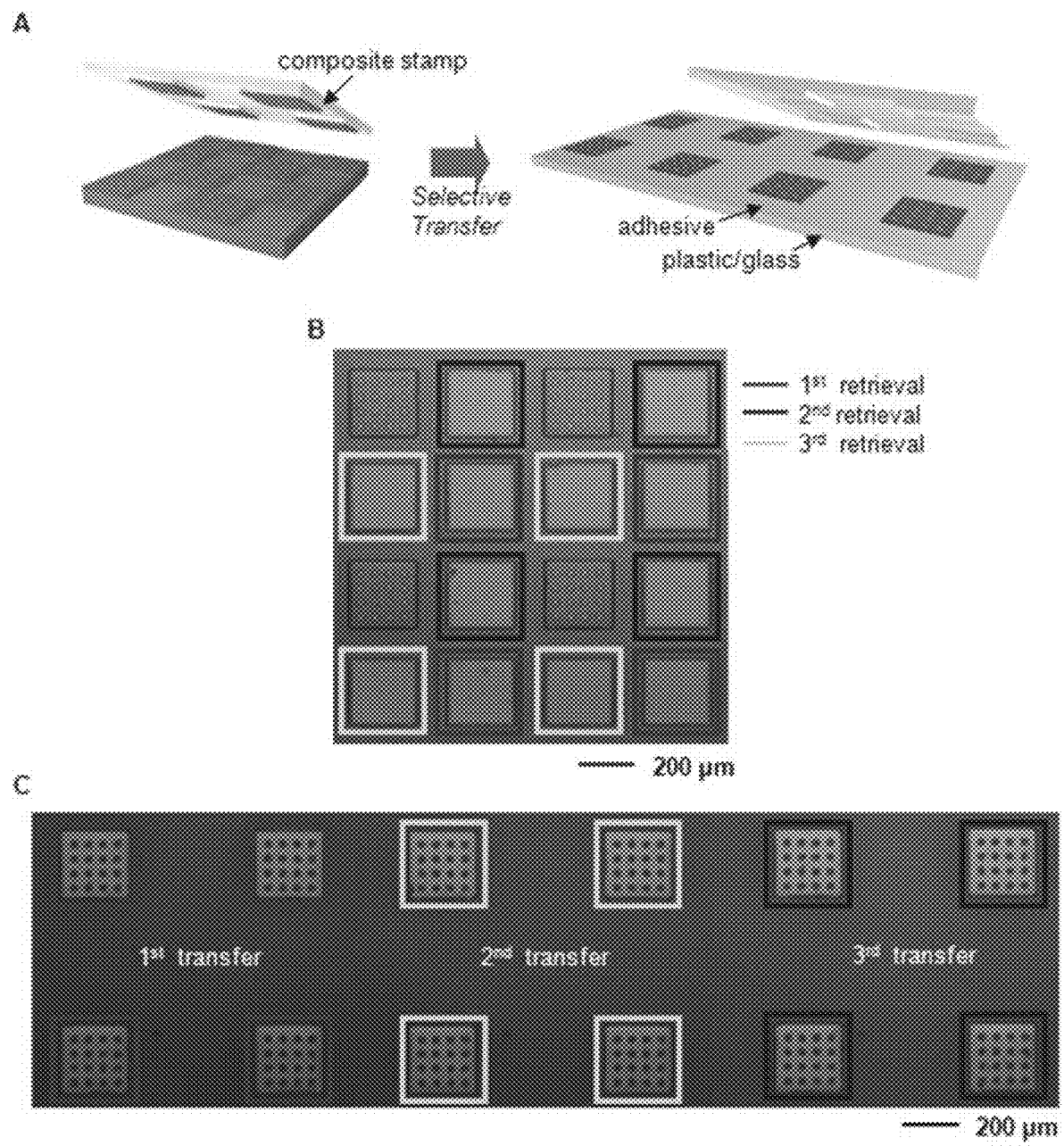

FIG. 36. Step-and-repeat process on GaAs μ-LEDs.

Figure 37:
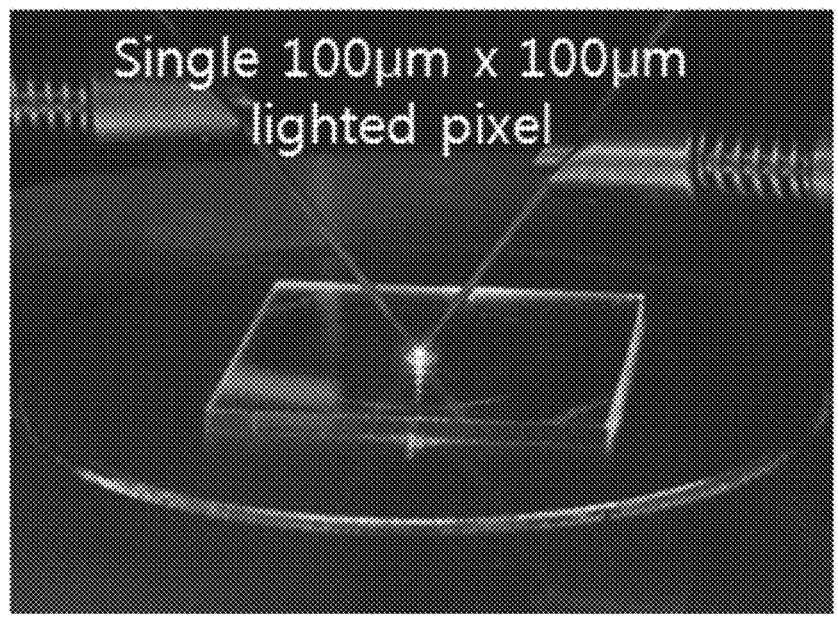
Figure 37:
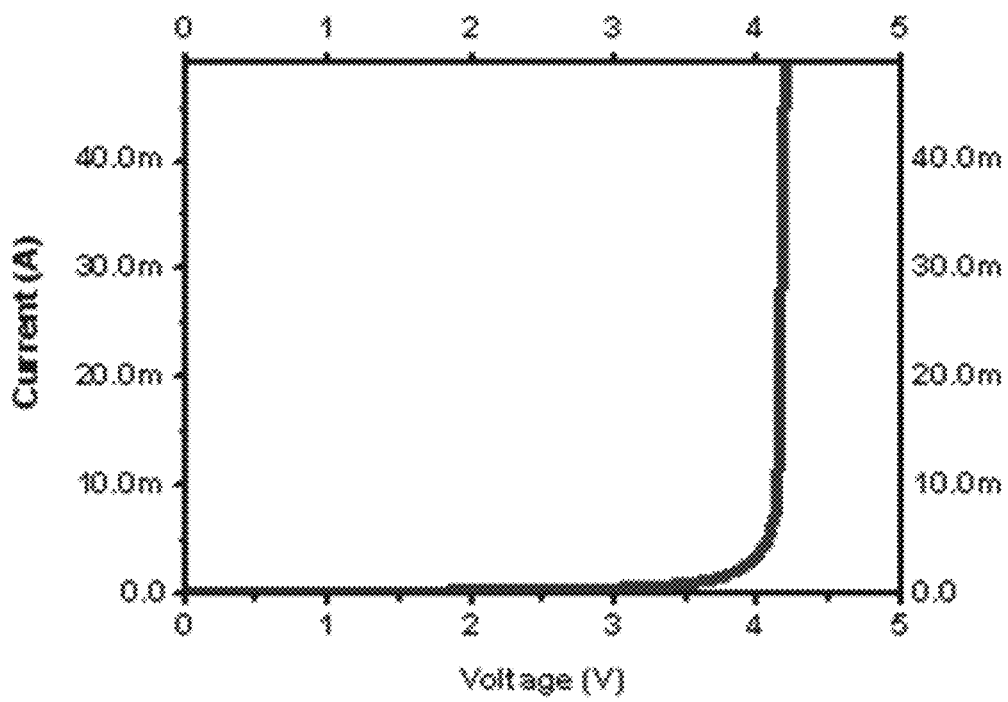
Figure 37:
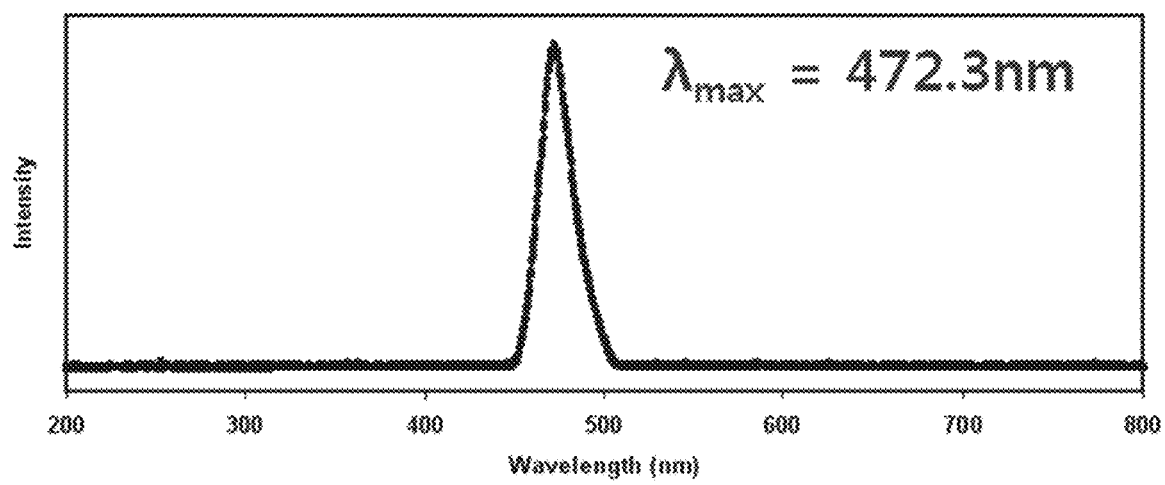

FIG. 37. (a) Optical image (b) current-voltage characteristic and (c) emission spectrum of an individual μ-GaN LED cell under operation.

Figure 38:
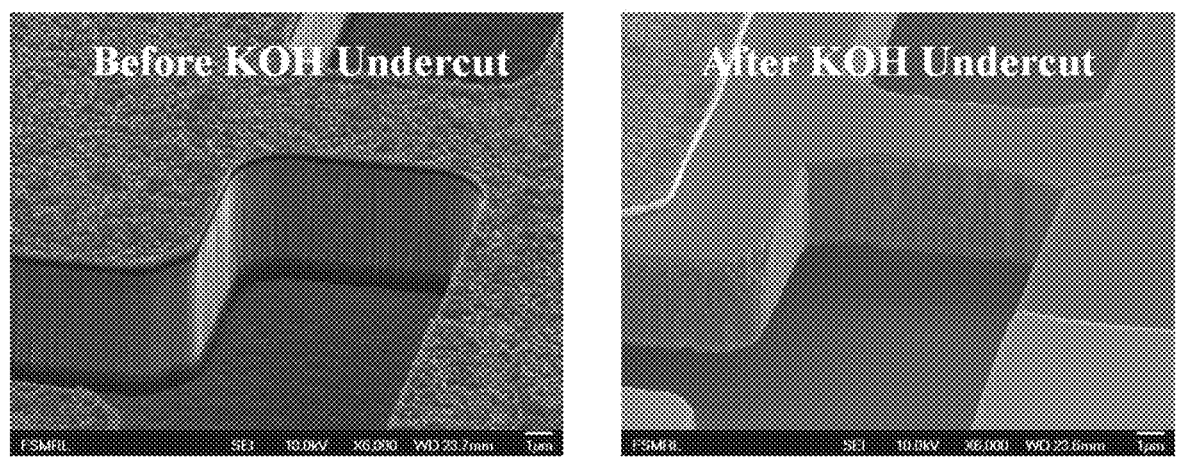

FIG. 38. SEM images of GaN LED devices before and after KOH undercut. Extended exposure to KOH causes moderate roughening of the GaN sidewalls.

Figure 39:
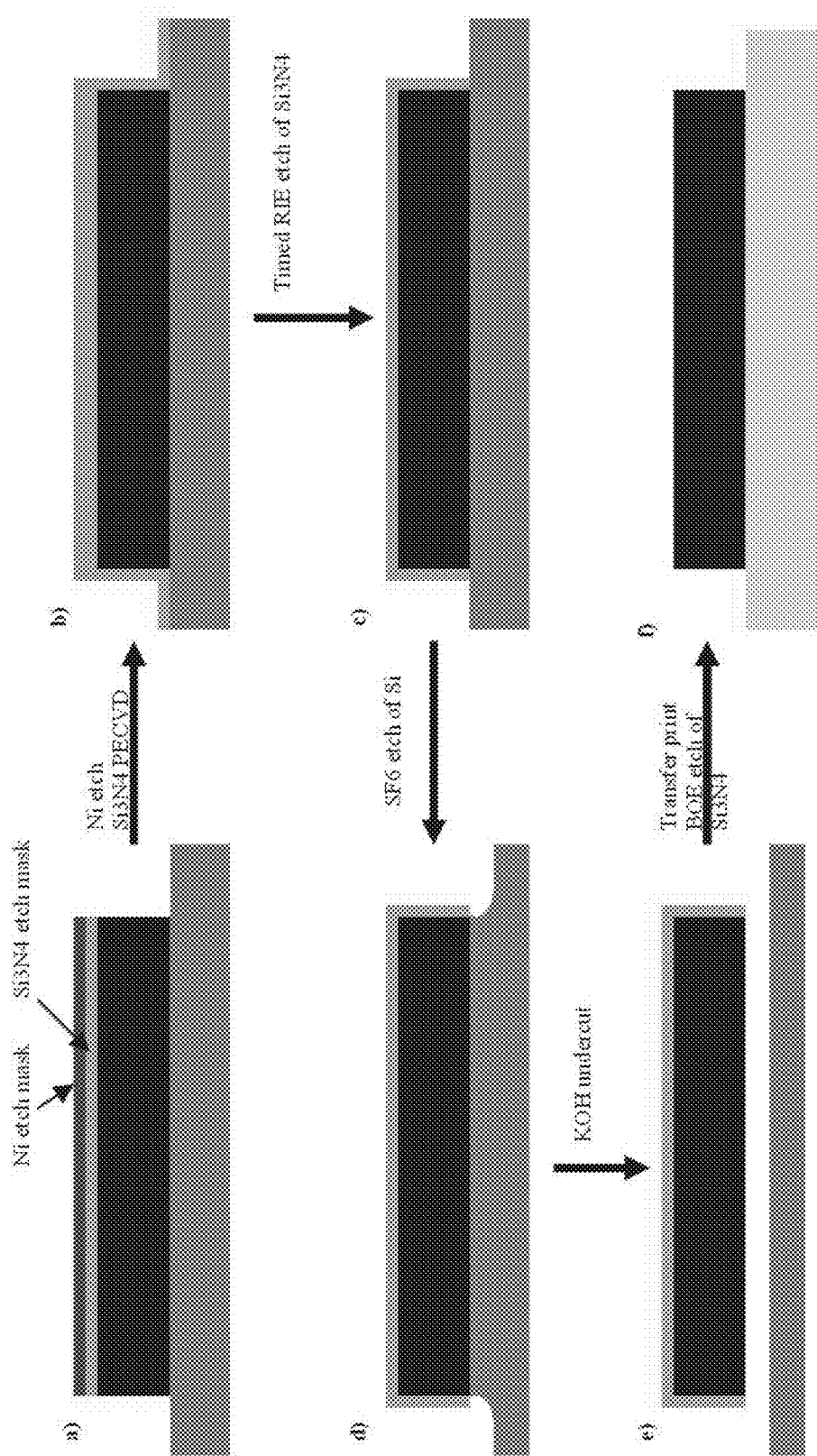

FIG. 39. Sidewall passivation scheme for printable GaN devices.

Figure 40:
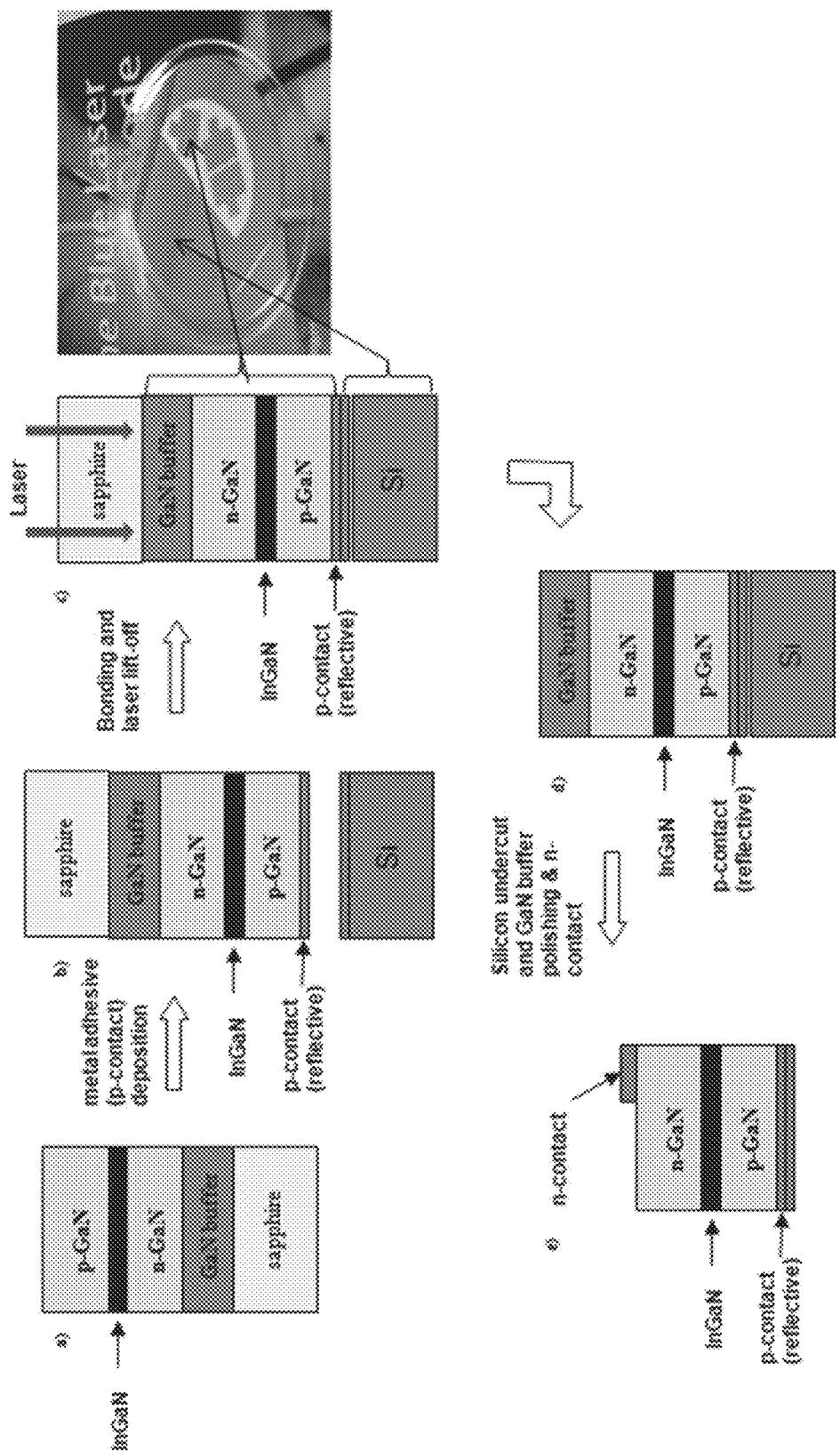

FIG. 40. Printable GaN devices utilizing laser lift-off.

Figure 41:
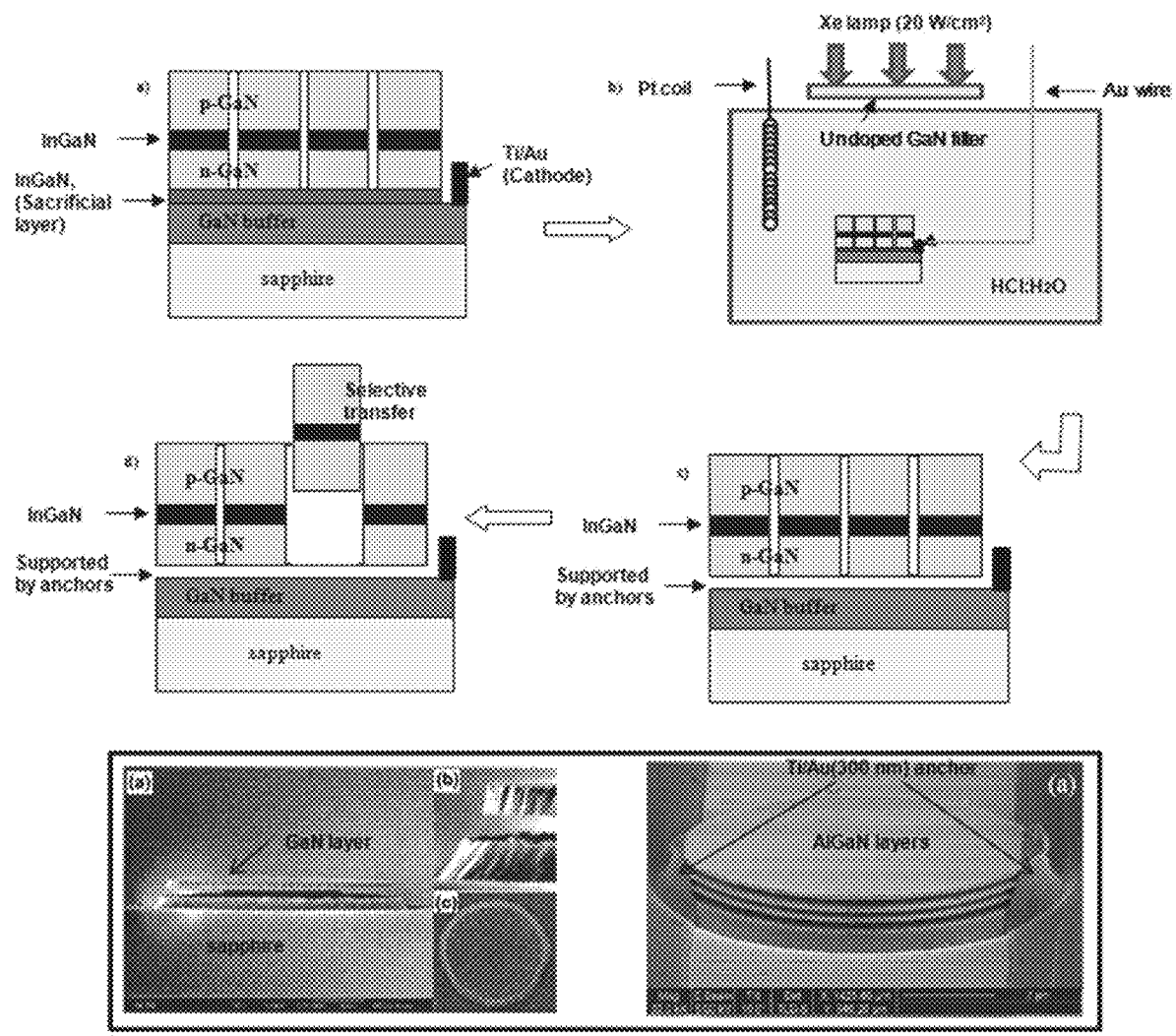

FIG. 41. Freestanding GaN device transfer utilizing PEC etching with InGaN sacrificial layer. SEM images* of PEC etching for freestanding GaN and AlGaN layers are inserted. (*left image: E. Haberer et al. Appl. Phys. Lett. 85, 5179 (2005), right image: R. Sharma et al Appl. Phys. Lett. 87, 051107 (2005)).

Figure 42:
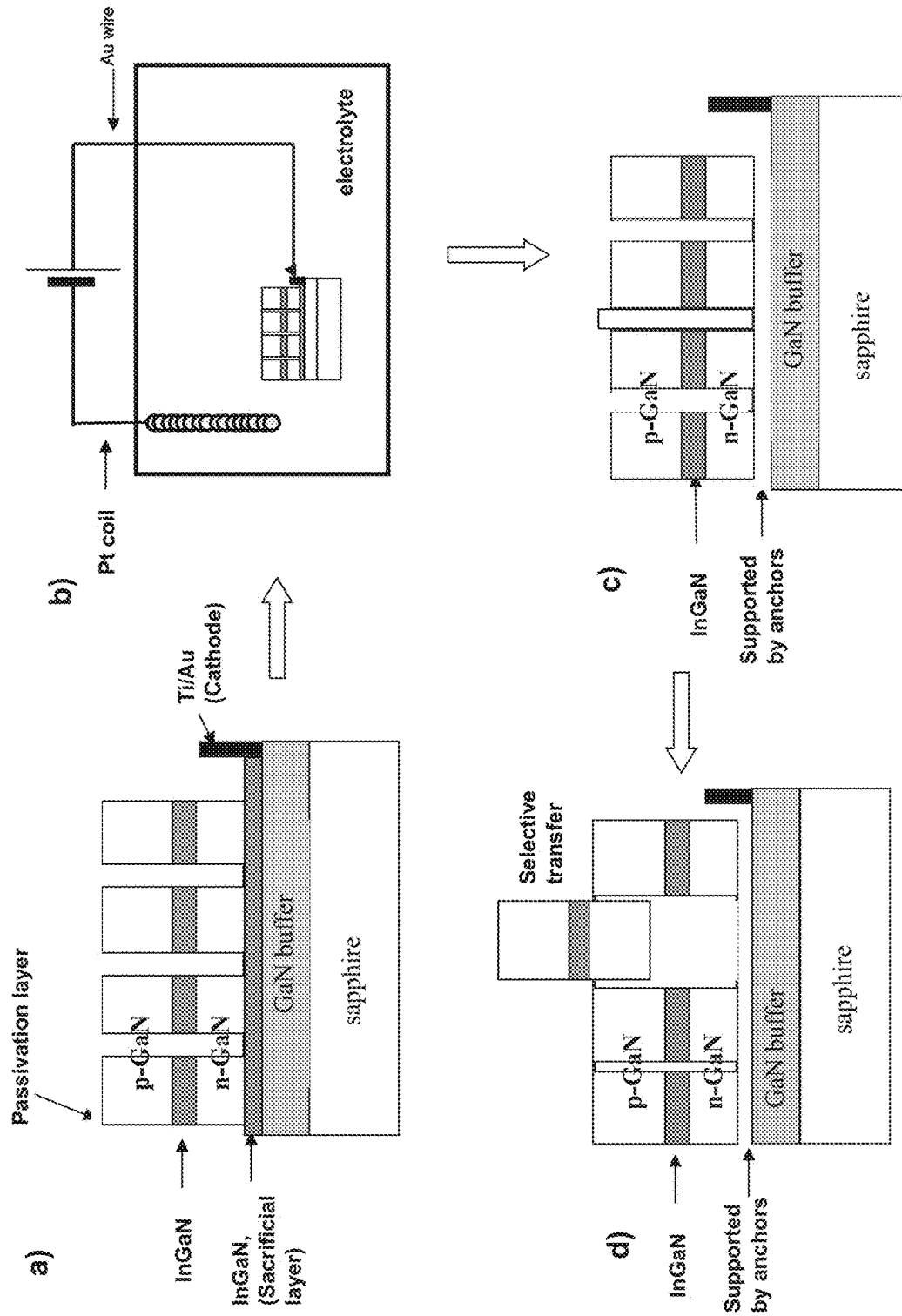

FIG. 42. Selective etching of sacrificial layer by EC (electrochemical) etching.

Figure 43:
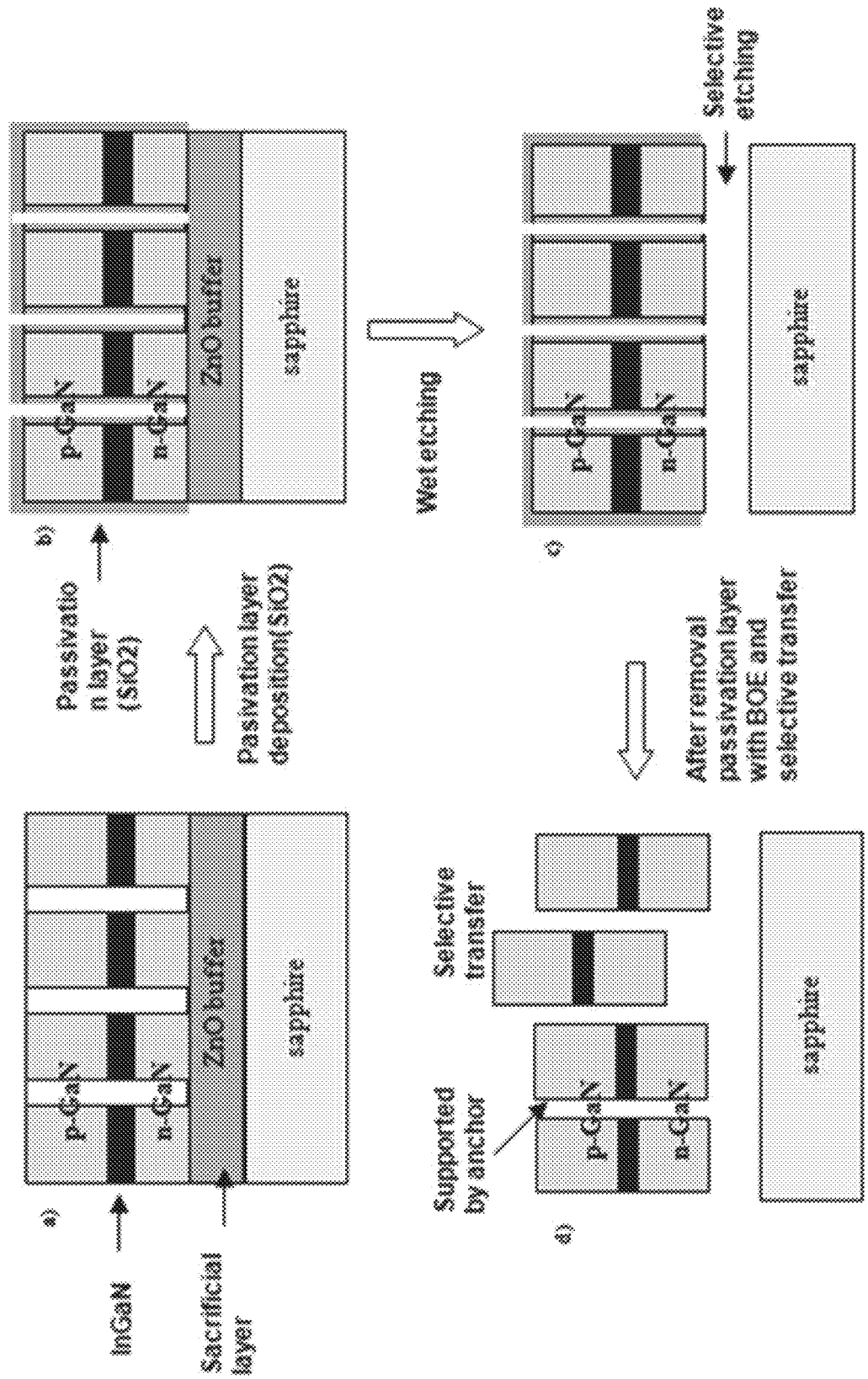

FIG. 43. Selective etching of sacrificial layer (i.e. ZnO) with specific etchant ($NH_4Cl$).

Figure 44:
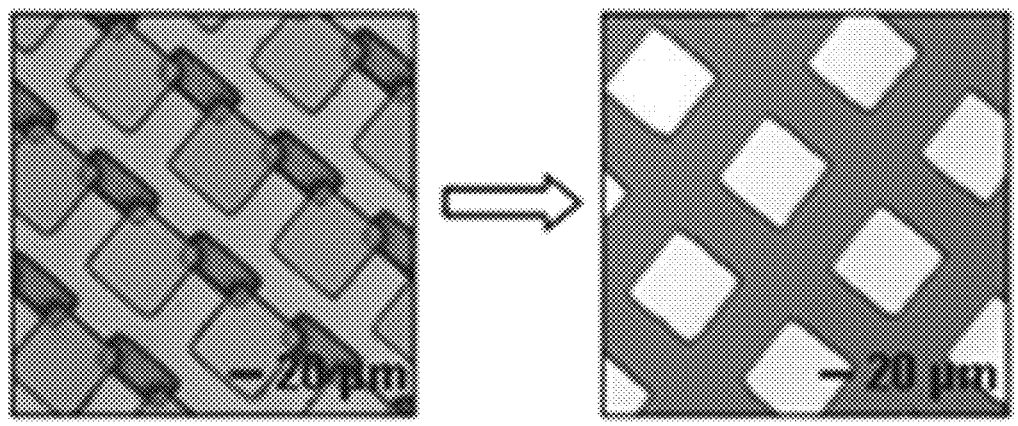

FIG. 44. Optical Microscopy (OM) image of heterogeneous anchoring structures.

Figure 45:
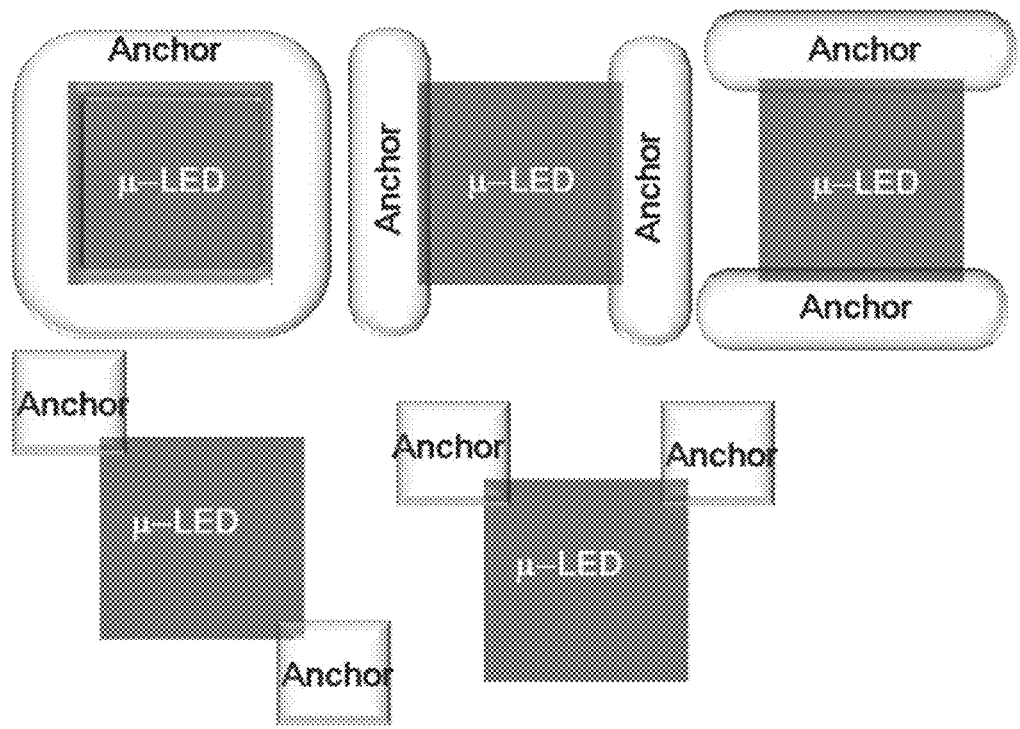

FIG. 45. Various geometries of heterogeneous anchoring structures.

Figure 46:
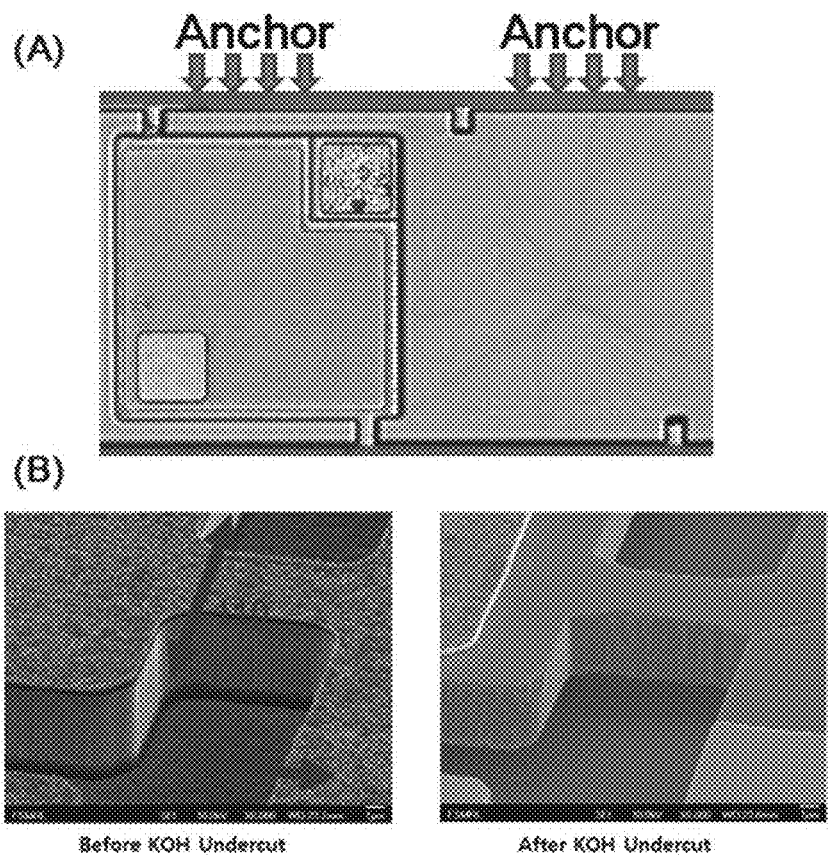

FIG. 46. (A) Optical microscopy (OM) image of homogeneous anchors; (B) scanning electron microscopy (SEM) images of homogeneous anchors.

Figure 47:
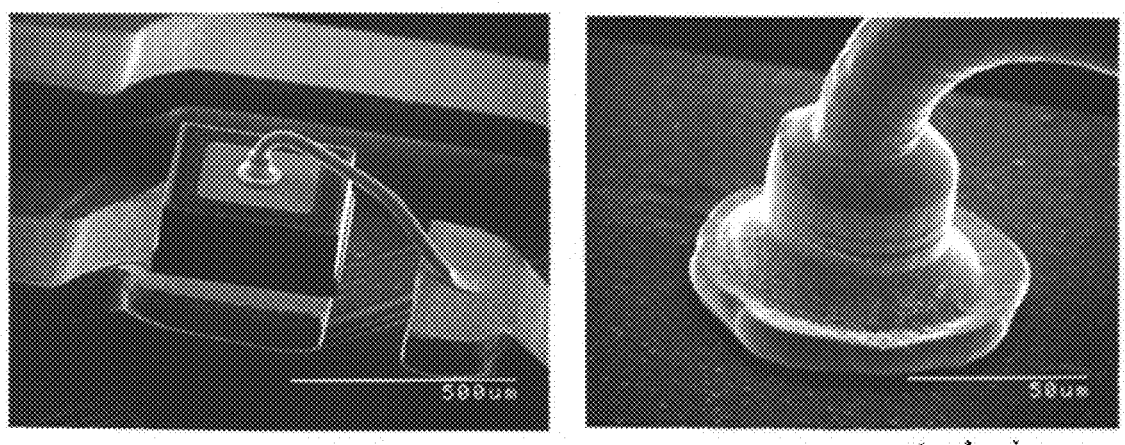

FIG. 47. SEM images of commercially available wire-bonded LED.

Figure 48:
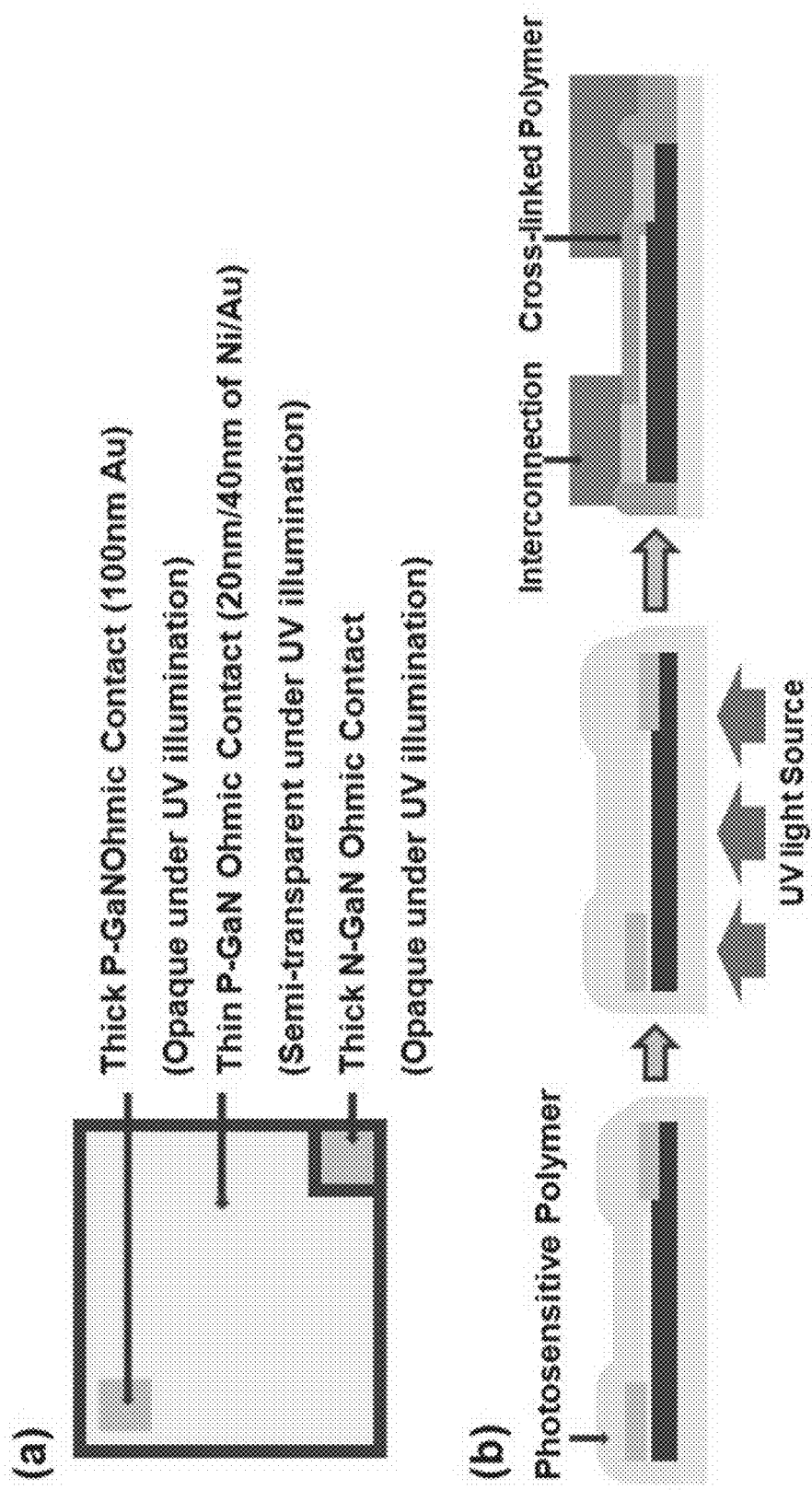

FIG. 48. (a) Schematic illustration of the cell design. (b) Process for encapsulation via back-side exposure.

Figure 49:
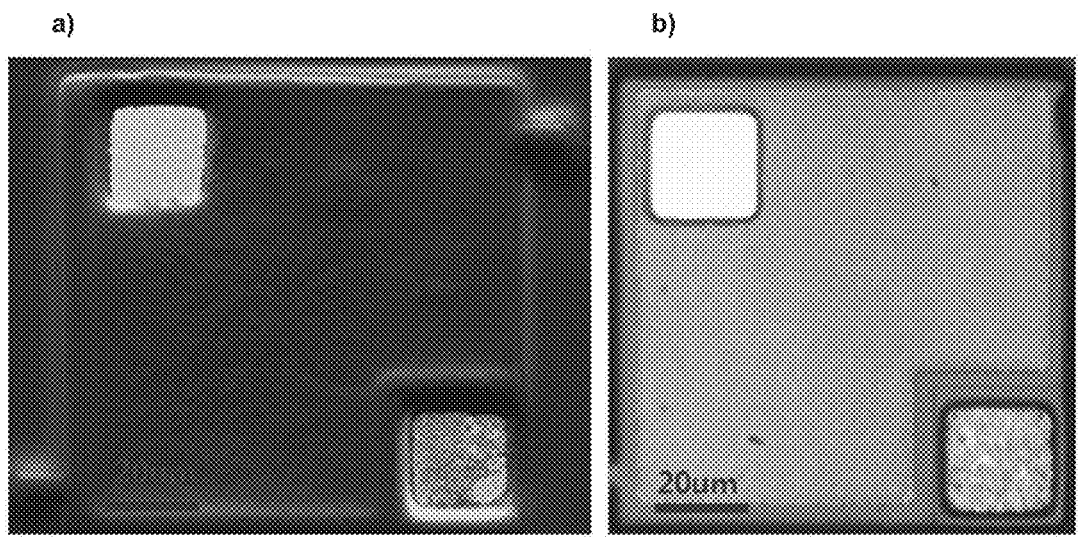

FIG. 49. (a) Scanning electron microscopy (SEM) image (b) optical microscopy (OM) image of passivated μ-GaN LED using encapsulation via back-side exposure process.

Figure 50:
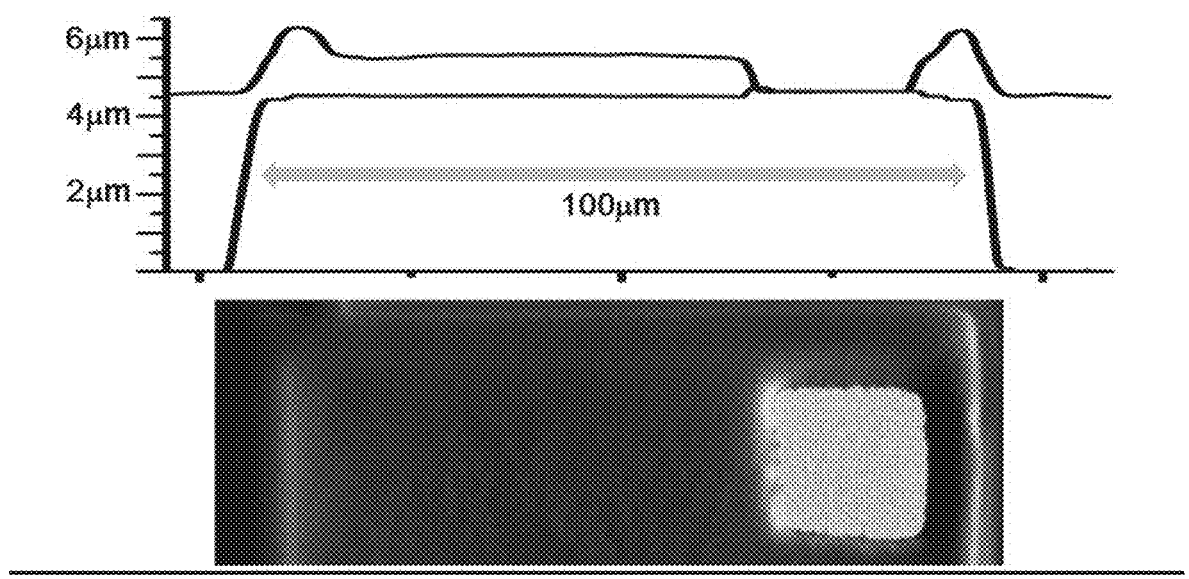

FIG. 50. Scanned profile using a profilometer of μ-GaN LED after the encapsulation via back-side exposure process.

Figure 51:
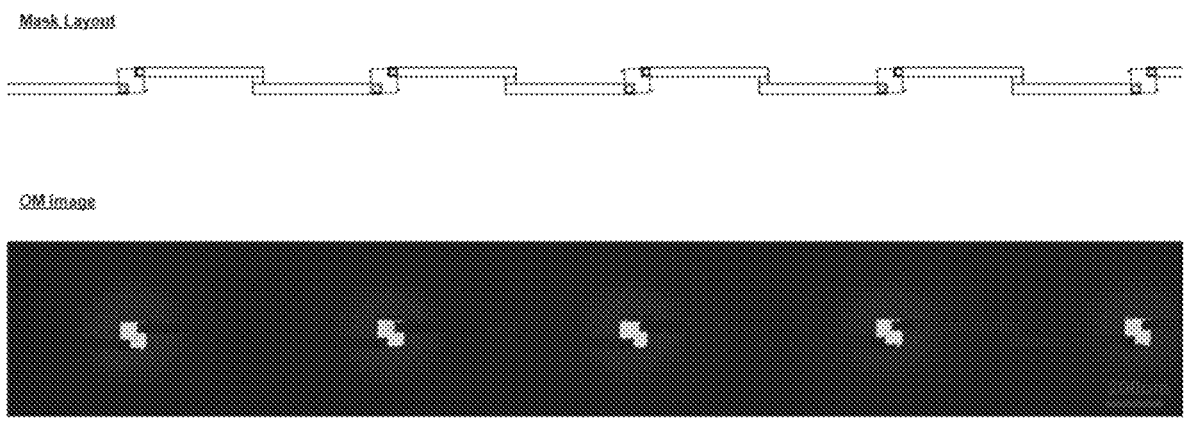

FIG. 51. Five μ-GaN LEDs connected in series.

Figure 52:

FIG. 52. Two strings of five μ-GaN LEDs connected in series.

Figure 53:
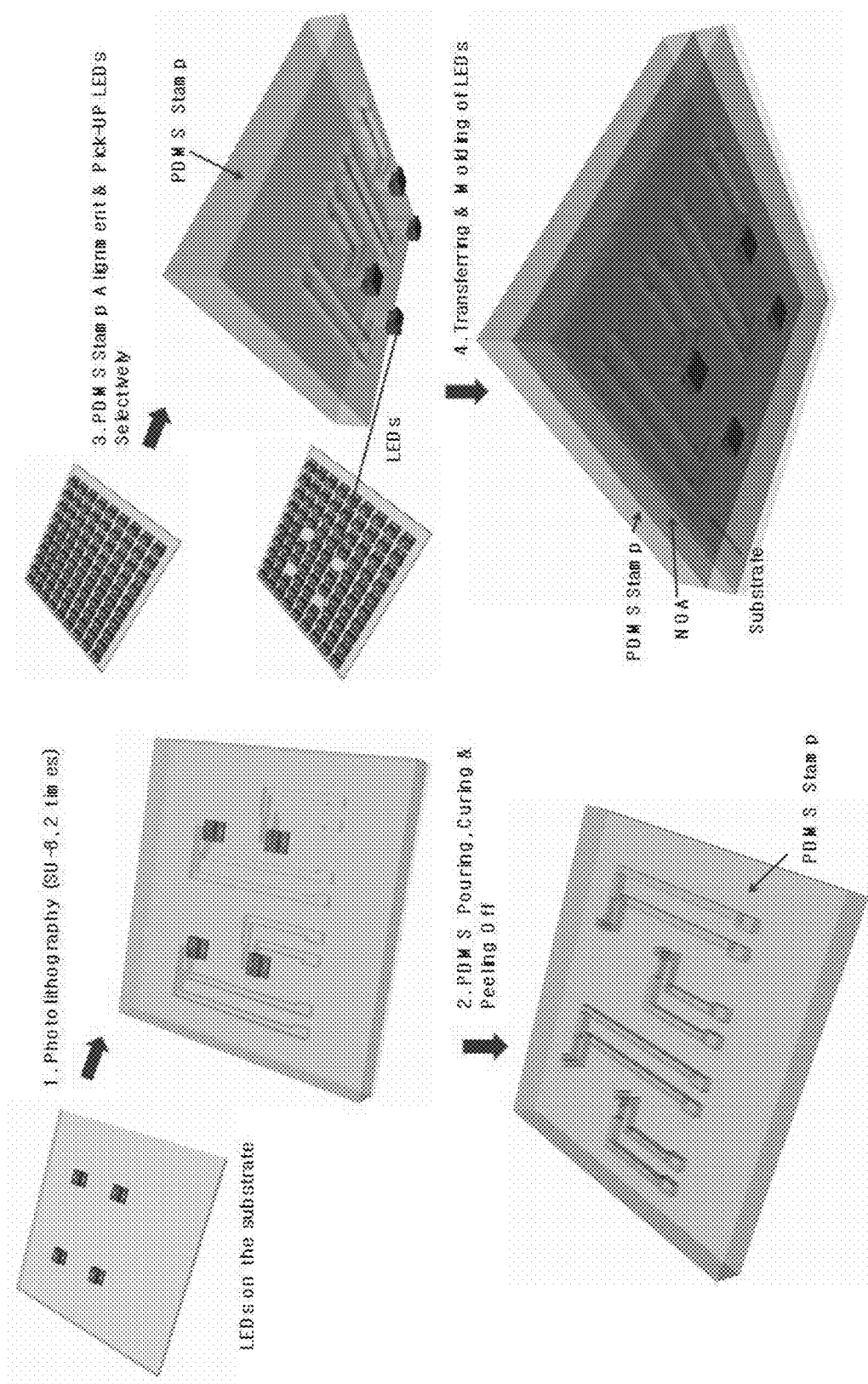

FIG. 53. Fabrication schematic for the molded interconnection.

Figure 54:
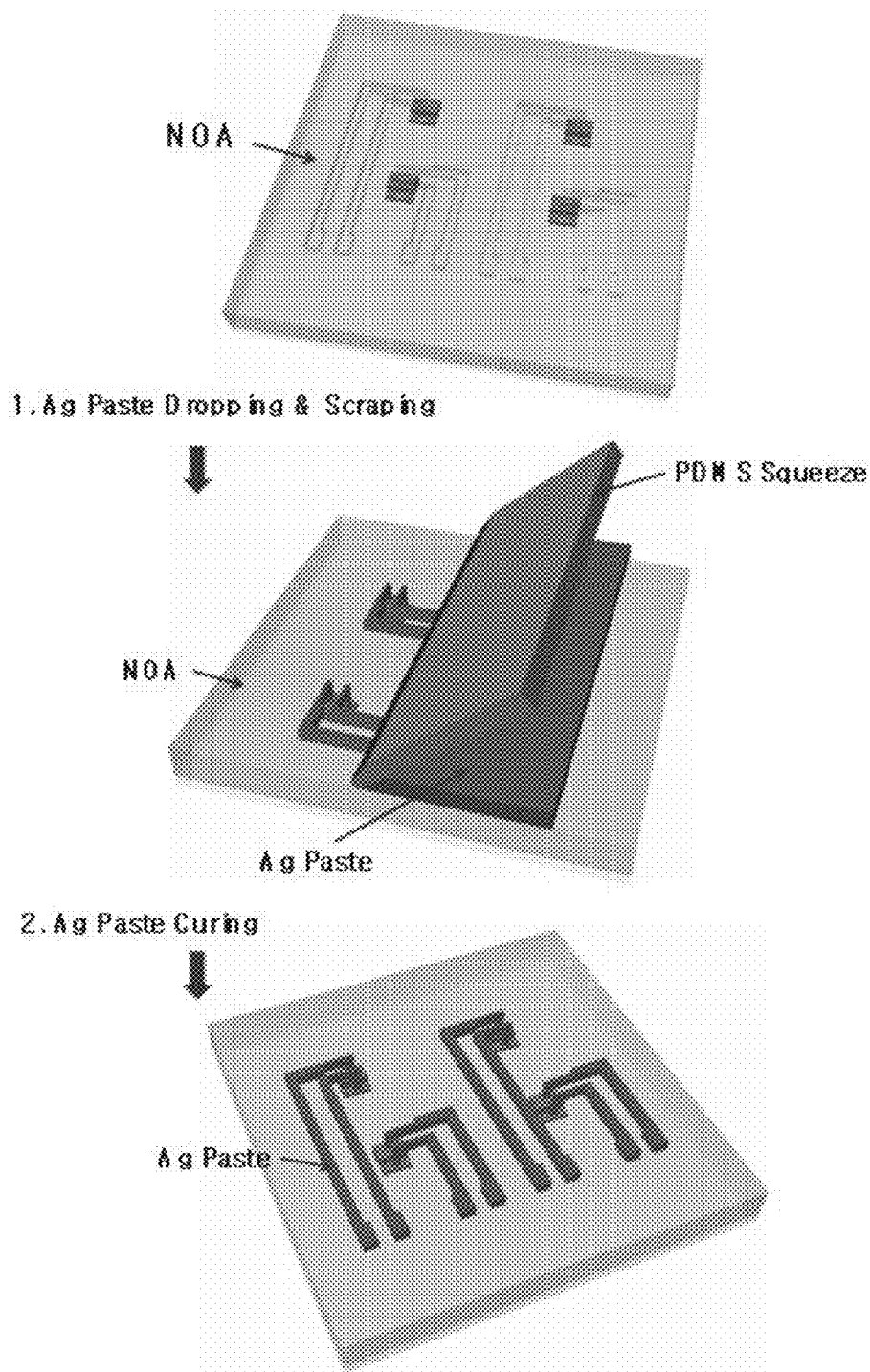

FIG. 54. Fabrication schematic for the molded interconnection.

Figure 55:
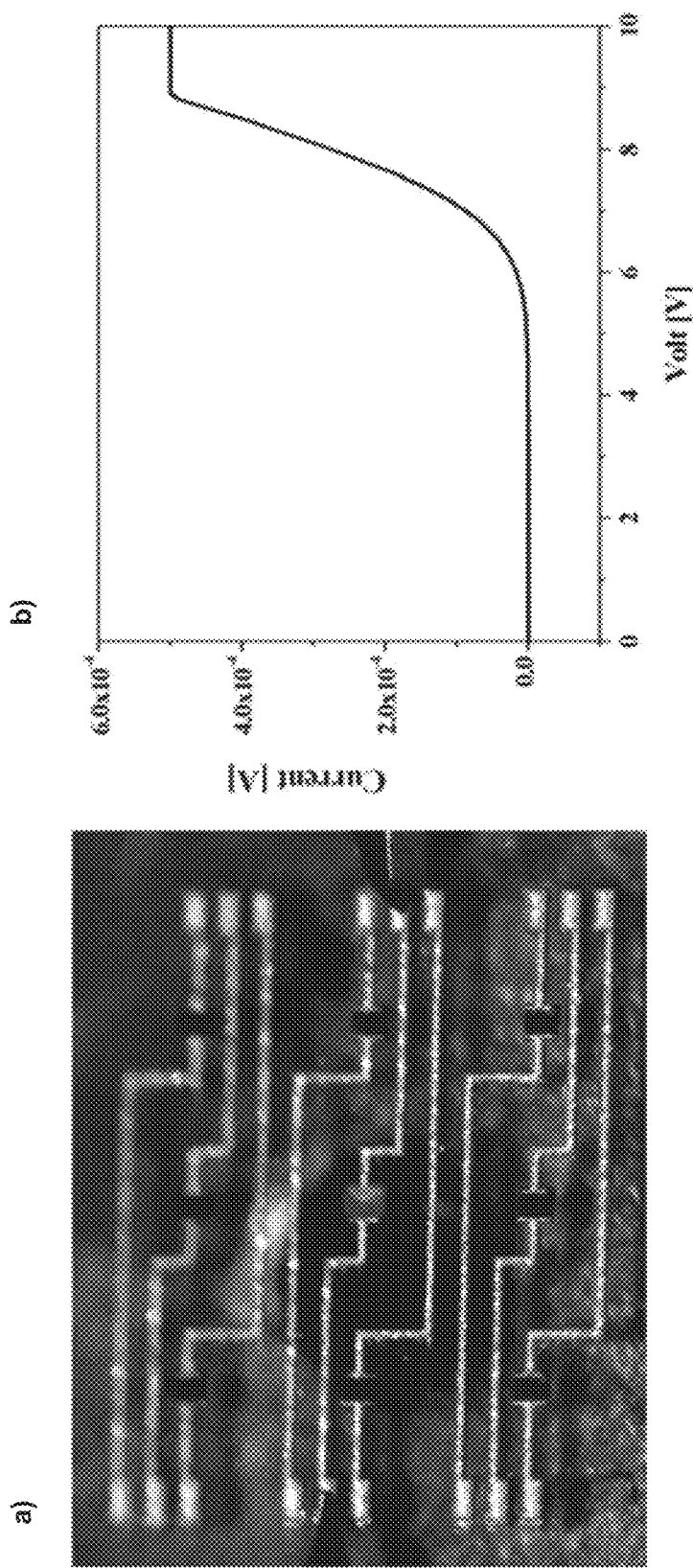

FIG. 55. (a) Optical Image of 1 GaAs LED cell. 9 GaAs LED cells with 250×250 μm$^2$ are independently metalized with a conductive silver paste. (b) Current-Voltage (I-V) characteristic of 1 GaAs LED.

Figure 56:
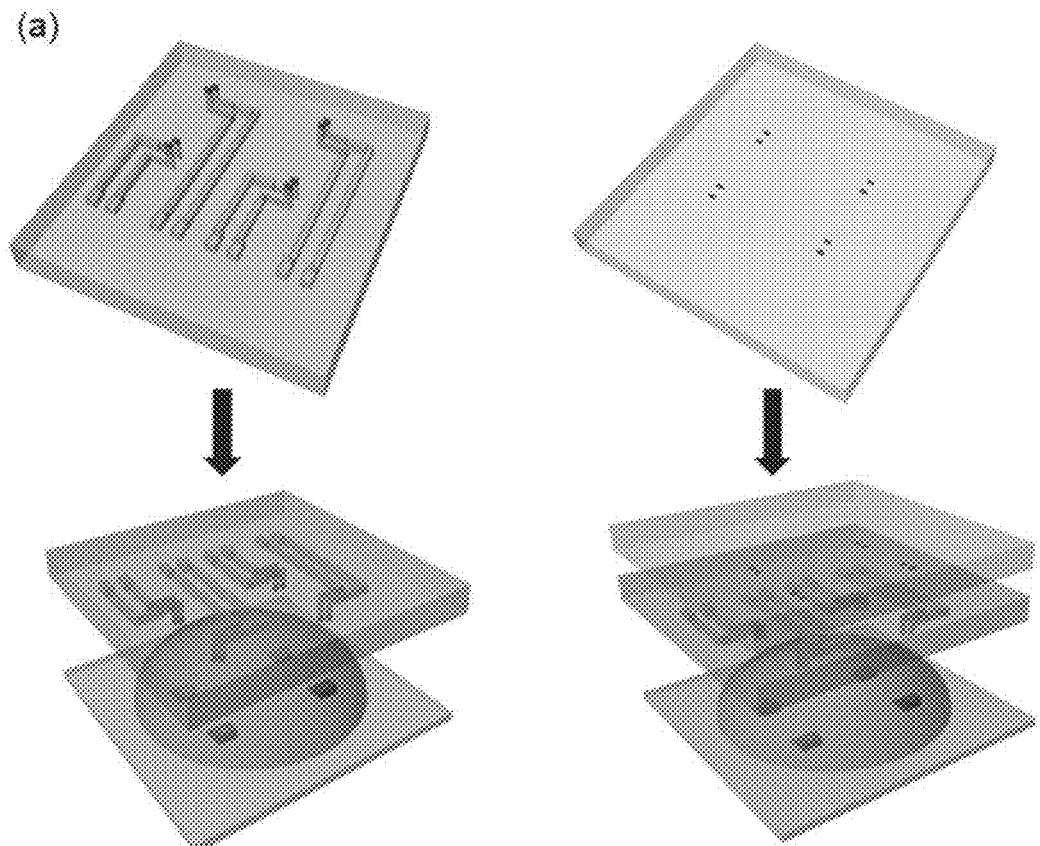

FIG. 56. Molded interconnection approach with addition of reflective layers for selective curing.

Figure 57:
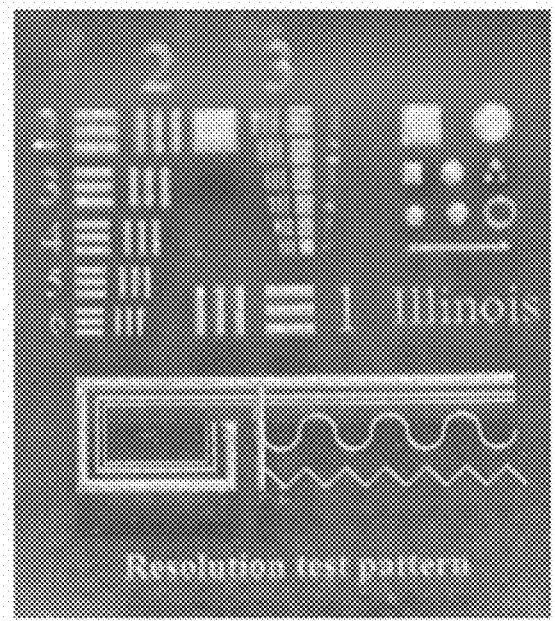

FIG. 57. Resolution of molded interconnection approach.

Figure 58:
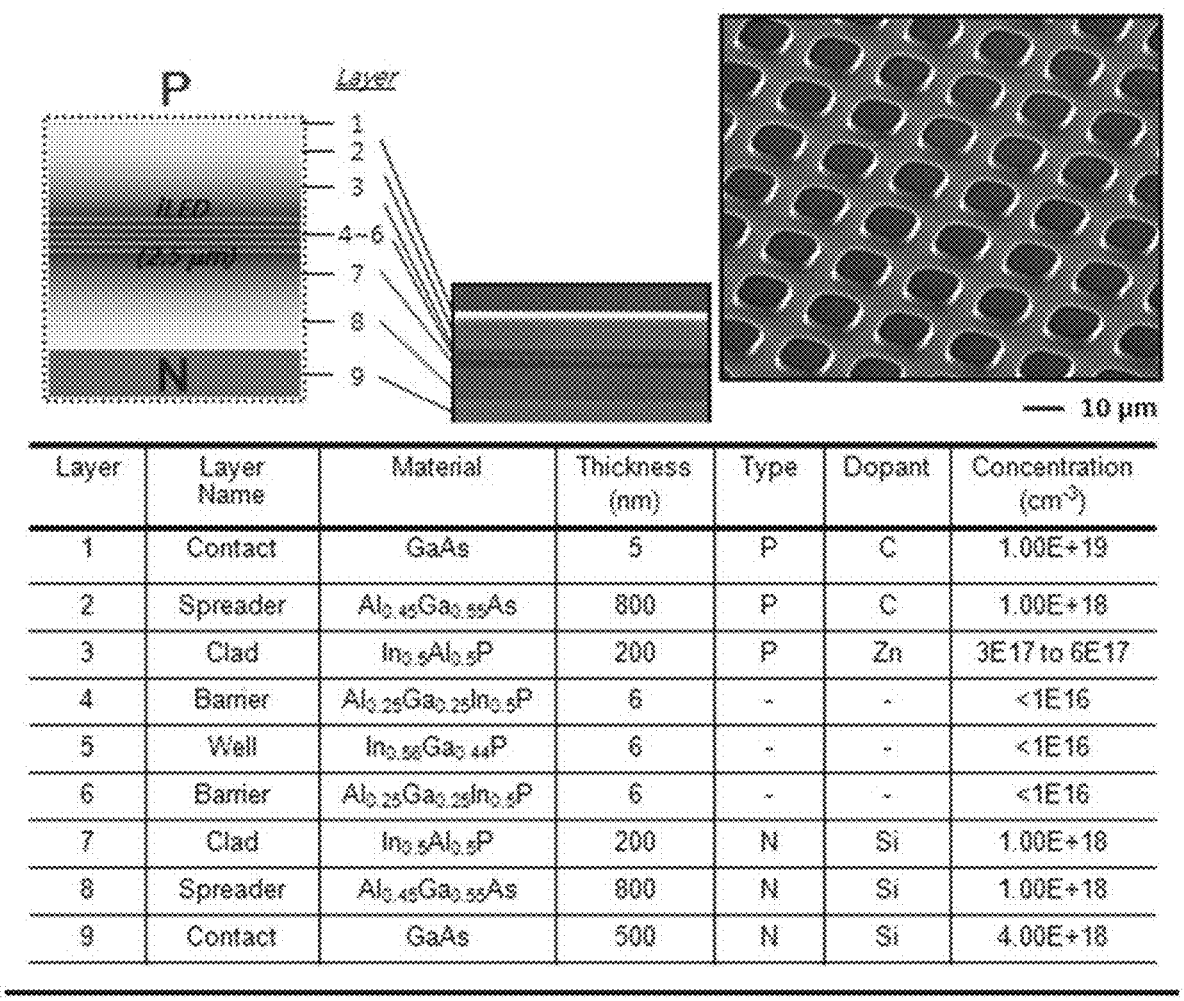

FIG. 58. GaAs vertical LED structure.

Figure 59:
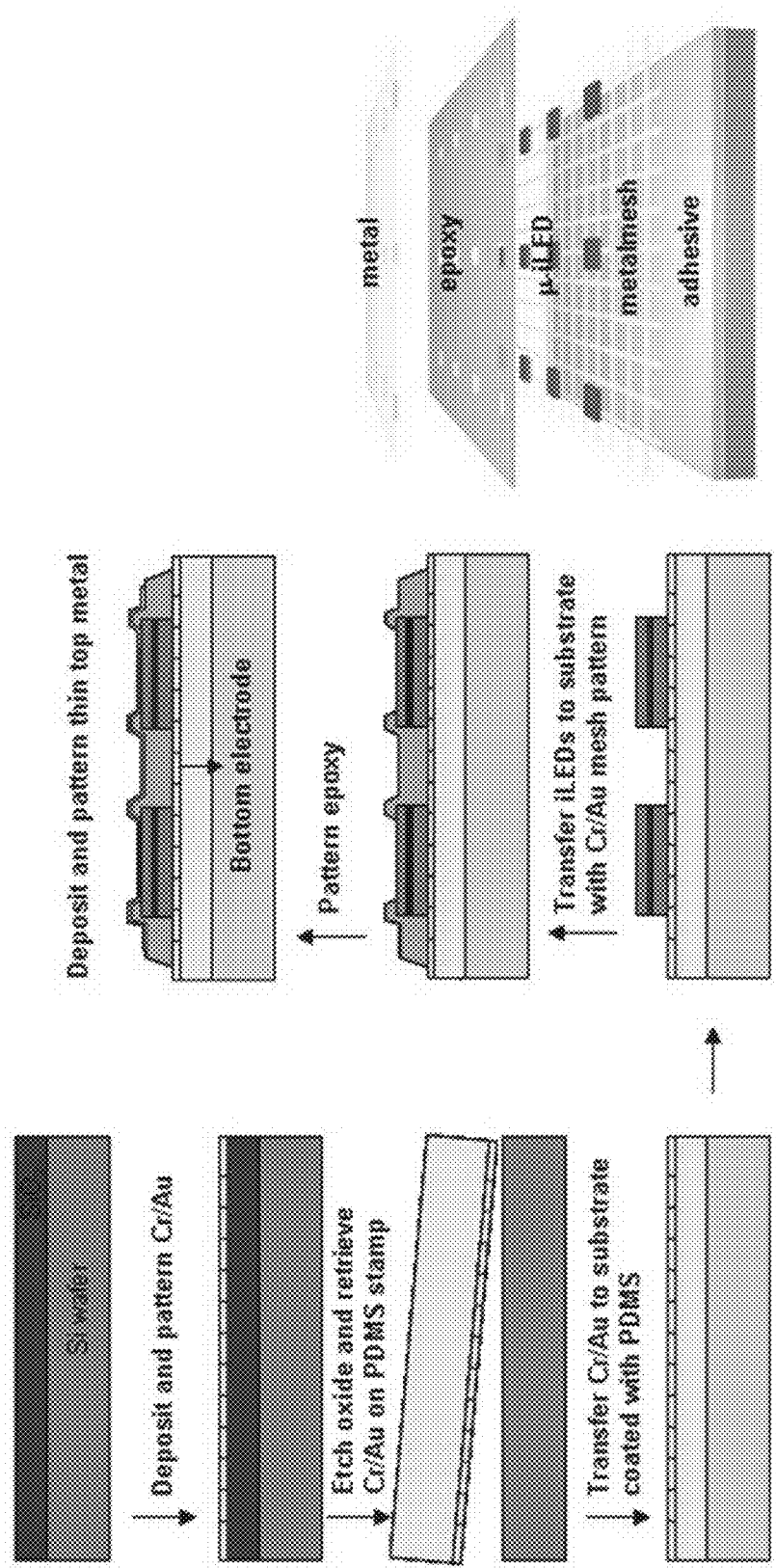

FIG. 59. Fabrication process for the mesh interconnection approach. Also exploded view schematic illustration of an array of ILEDs contacted by a metal mesh (bottom; n contacts) and a metal film (top; p contacts) is shown.

Figure 60:
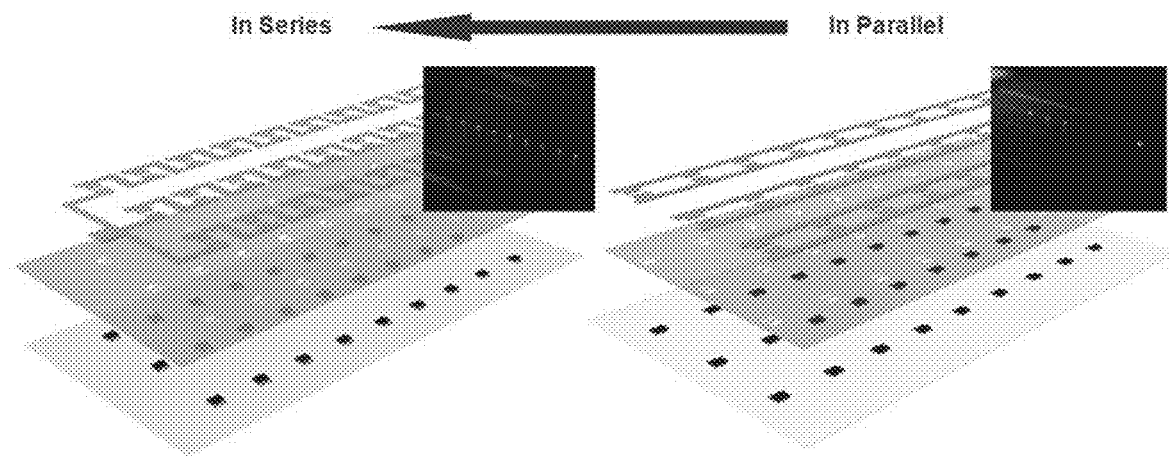

FIG. 60. A comparison between strings of μ-LEDs connected in series and in parallel.

Figure 61:
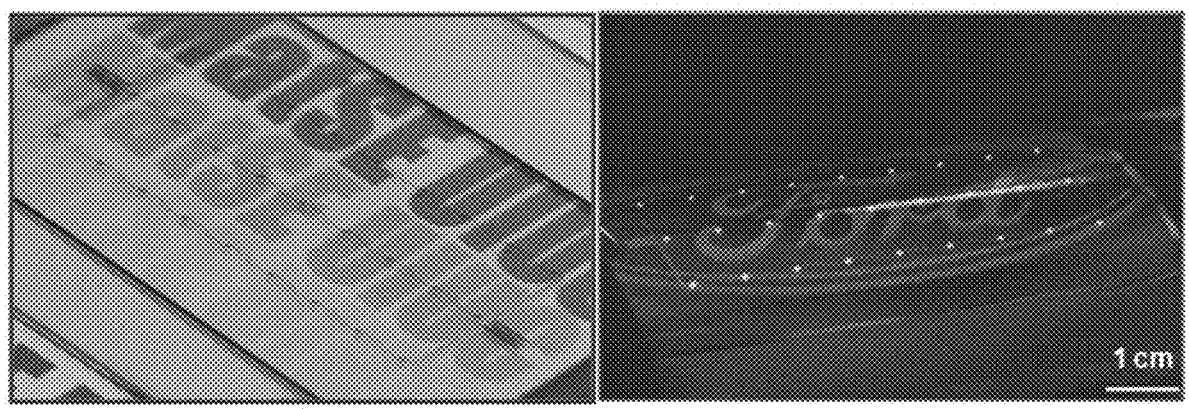

FIG. 61. Optical Image of serially connected strings of μ-LEDs printed on a plastic substrate.

Figure 62:
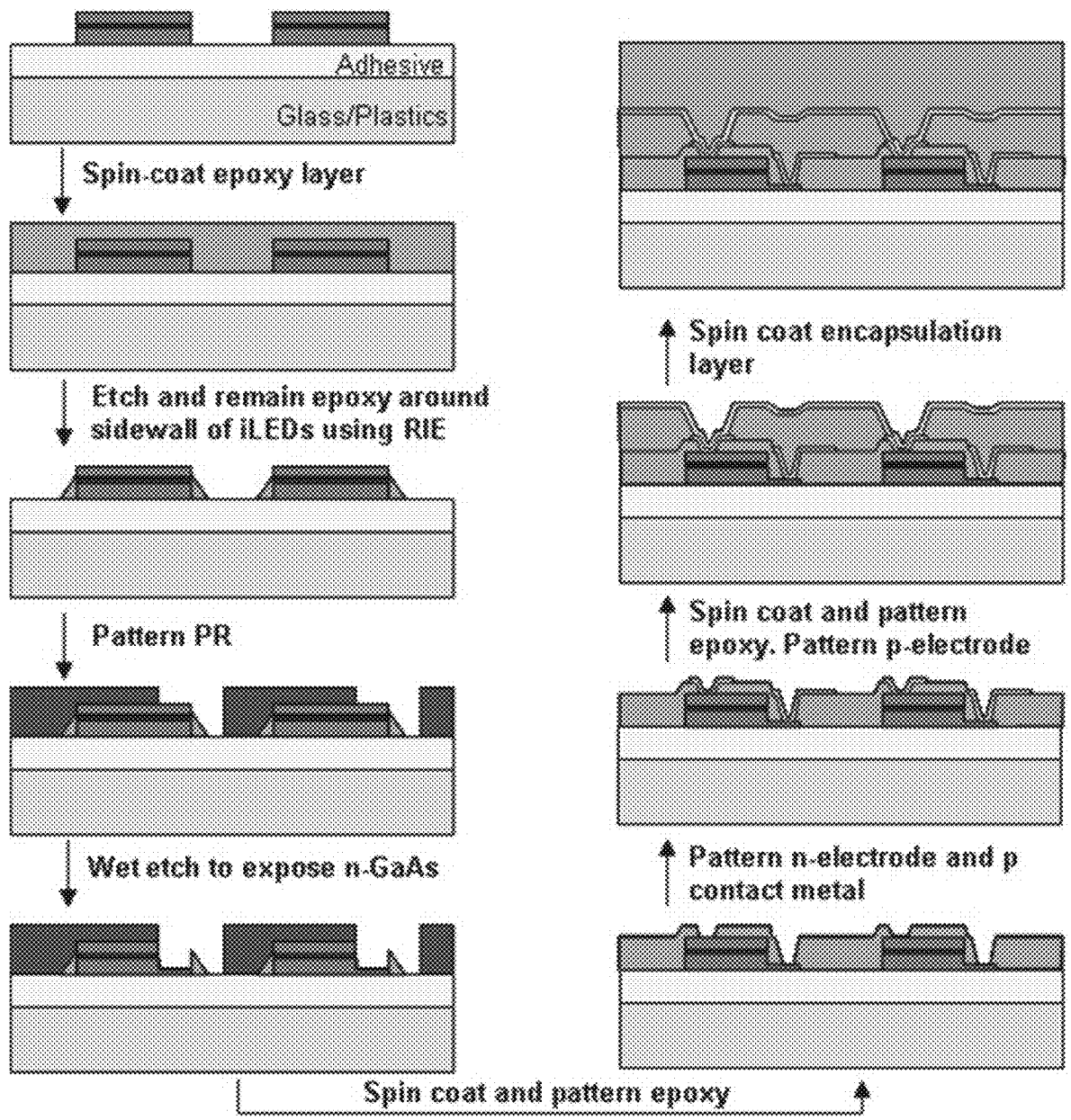

FIG. 62. Planar interconnection processing schematics for passive-matrix display using printed μ-LEDs.

Figure 63:
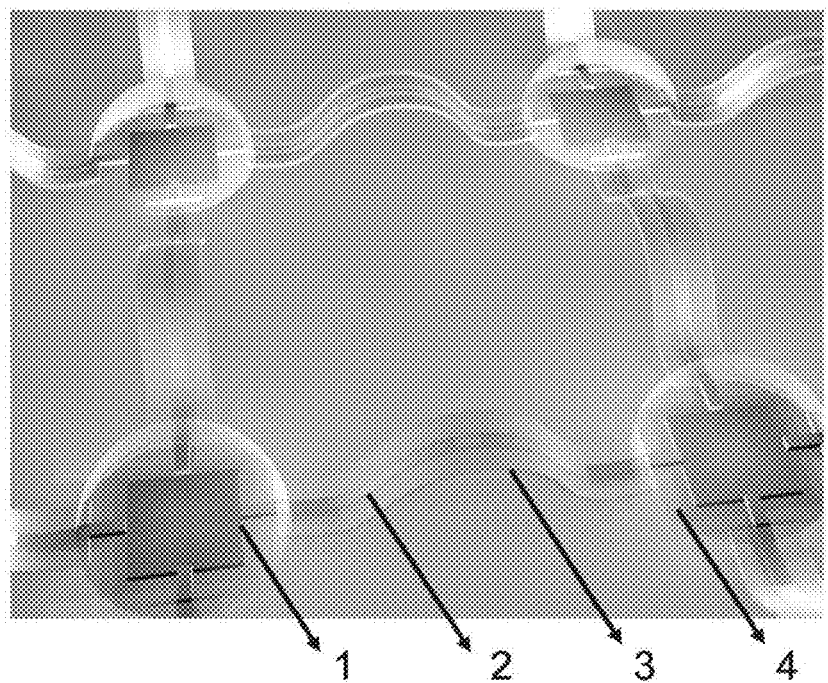

FIG. 63. Spatially independent micro-lens array fitted to a of five μ-GaN LEDs display with stretchable mechanical interconnects.

Figure 64:
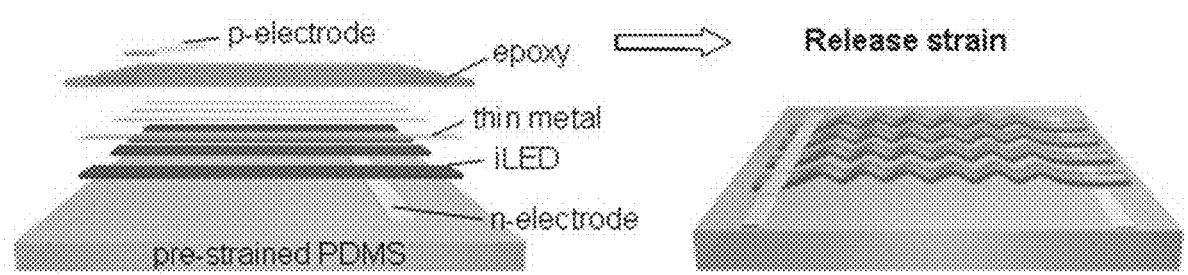

FIG. 64. Stretchable μ-LEDs.

Figure 65:
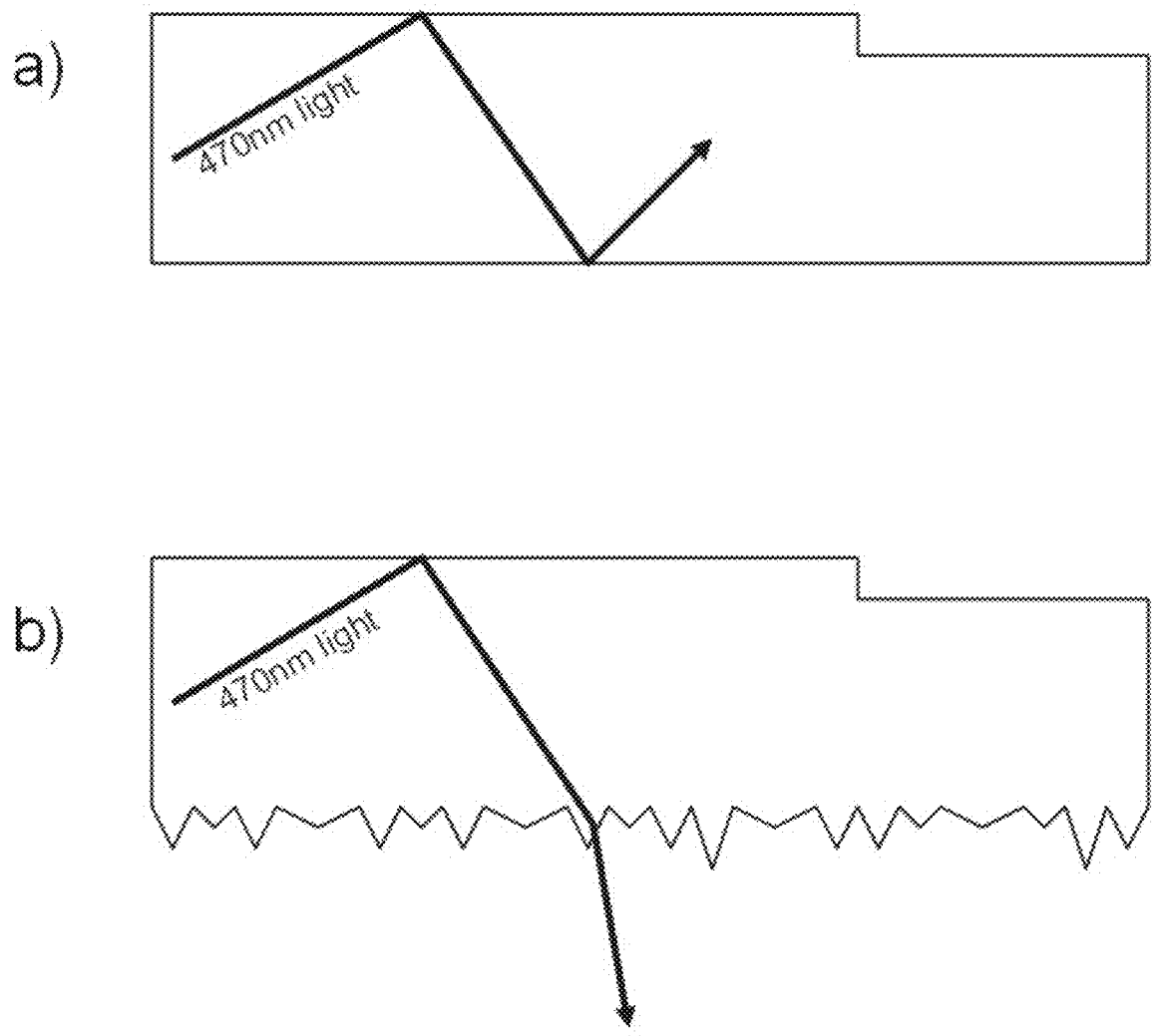

FIG. 65. a) Mirror-like facets increase internal reflection, but b) roughened surfaces reduces internal reflection.

Figure 66:
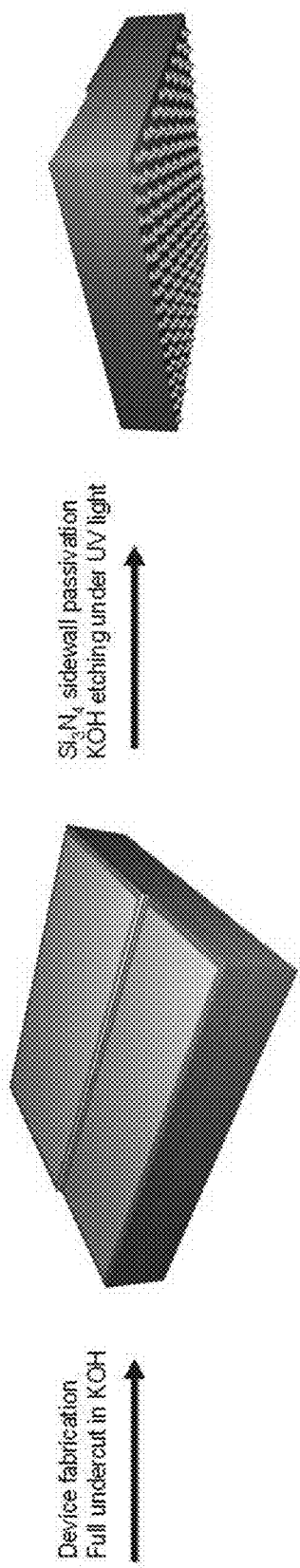

FIG. 66. Formation of pyramidal structures is performed by PEC KOH etching of a fully fabricated/undercut device in the presence of UV light.

Figure 67:
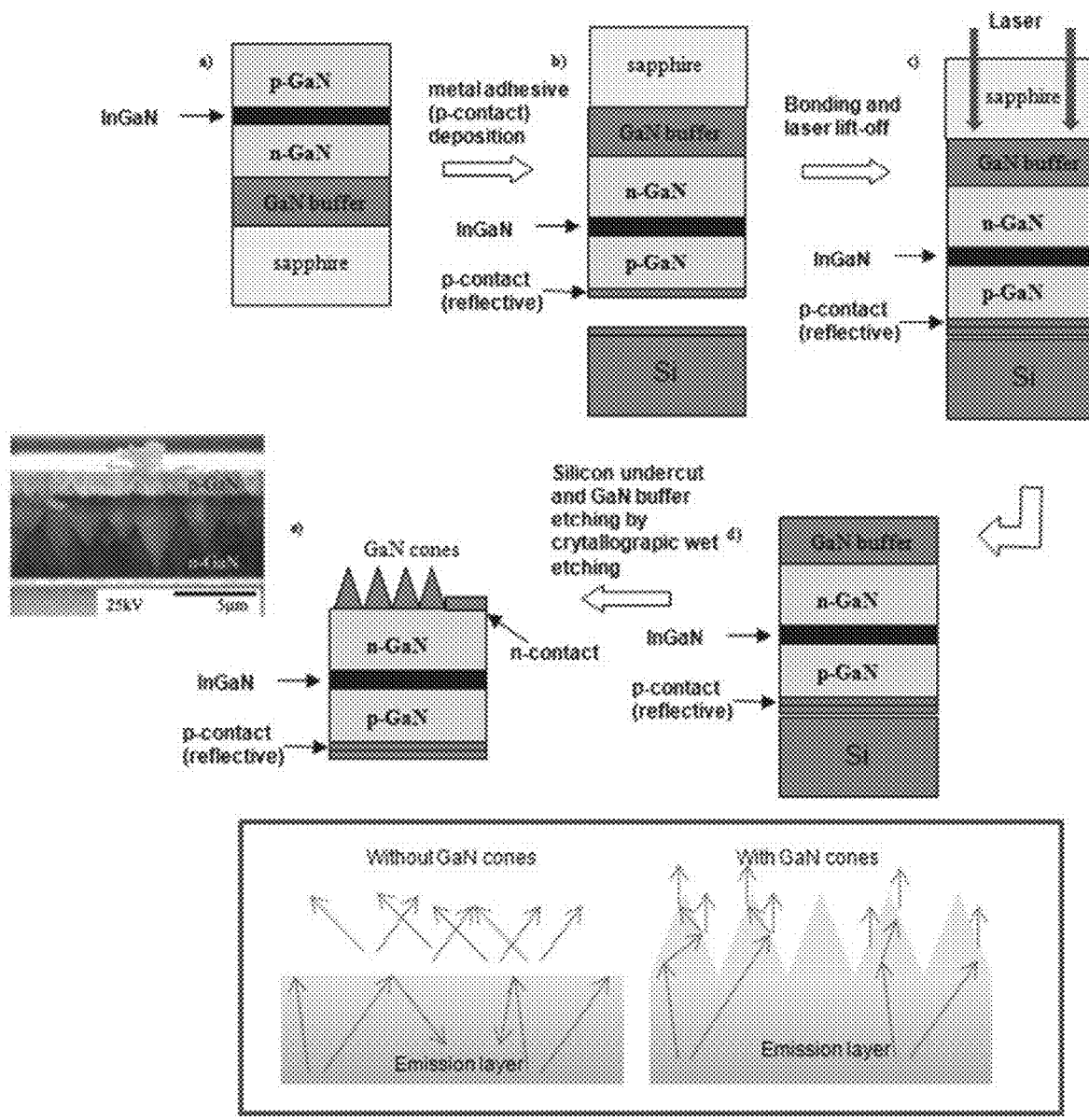

FIG. 67. Light Enhancement μ-GaN LED with outcoupling: GaN cone structures.

Figure 68:
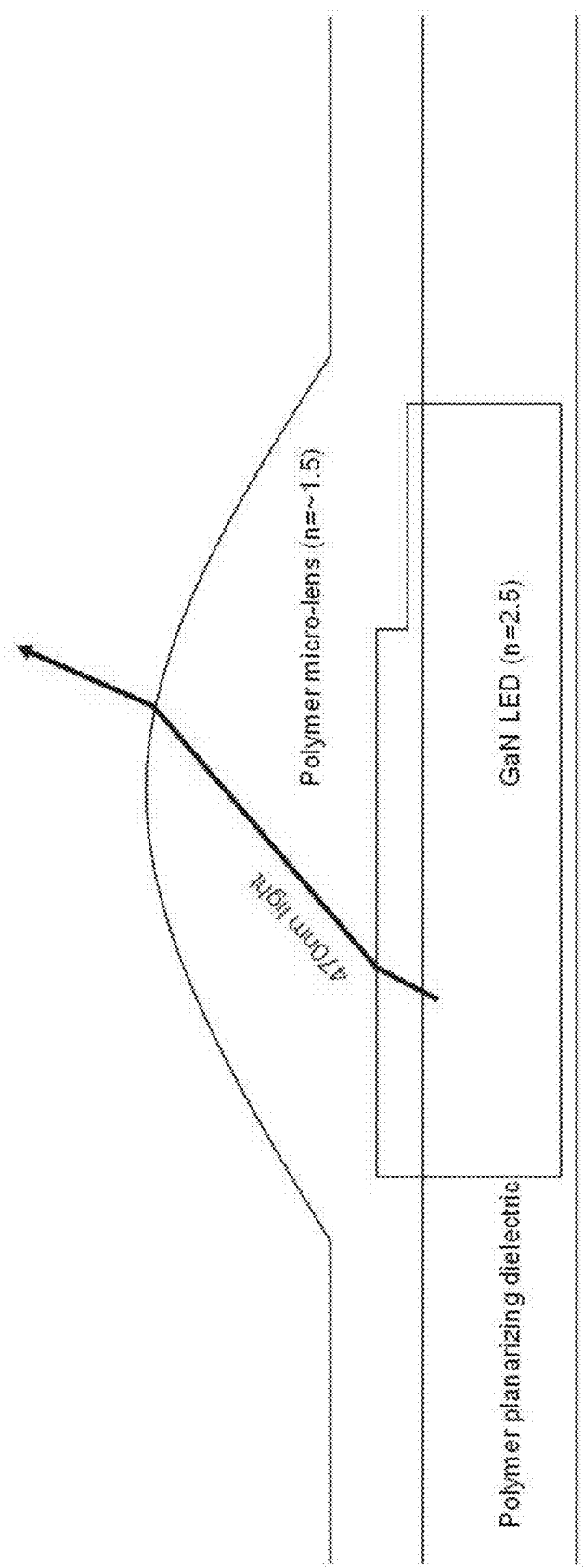

FIG. 68. GaN LED encapsulation in a polymer micro-lens increases light extraction efficiency.

Figure 69:
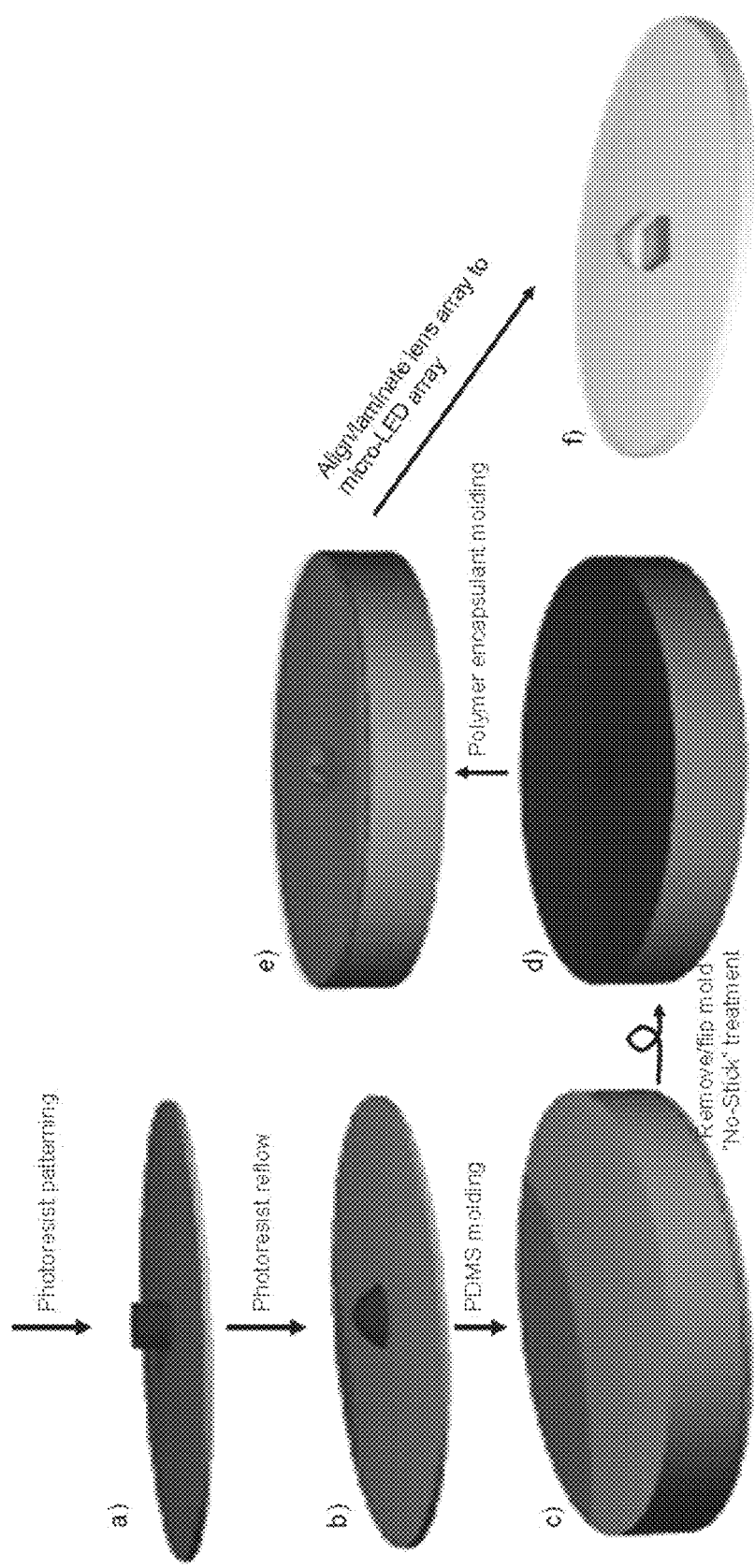

FIG. 69. Processing steps to form a micro-lens array fitted to a micro-LED display.

Figure 70:
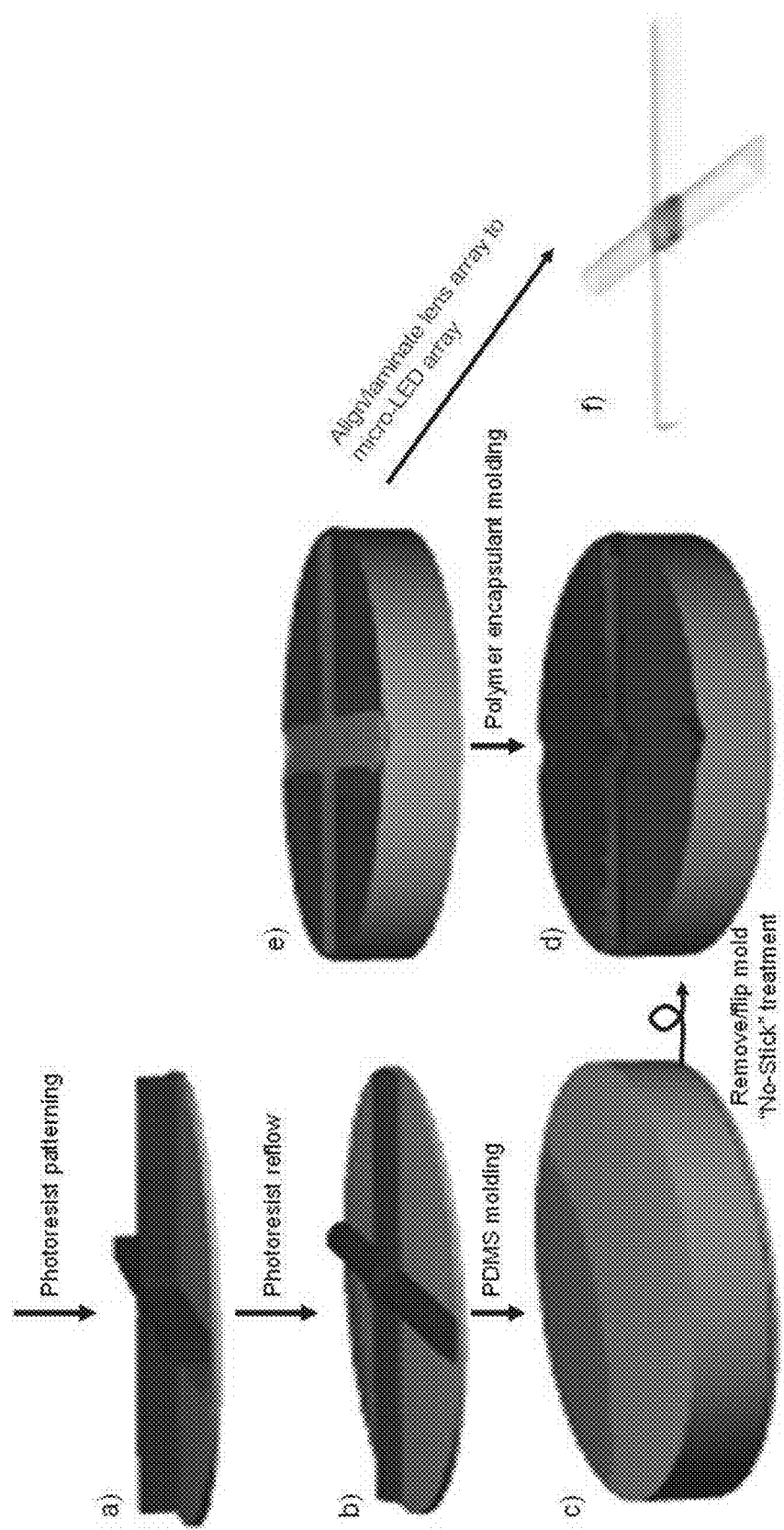

FIG. 70. Processing steps to form a spatially independent micro-lens array fitted to a micro-LED display.

Figure 71:
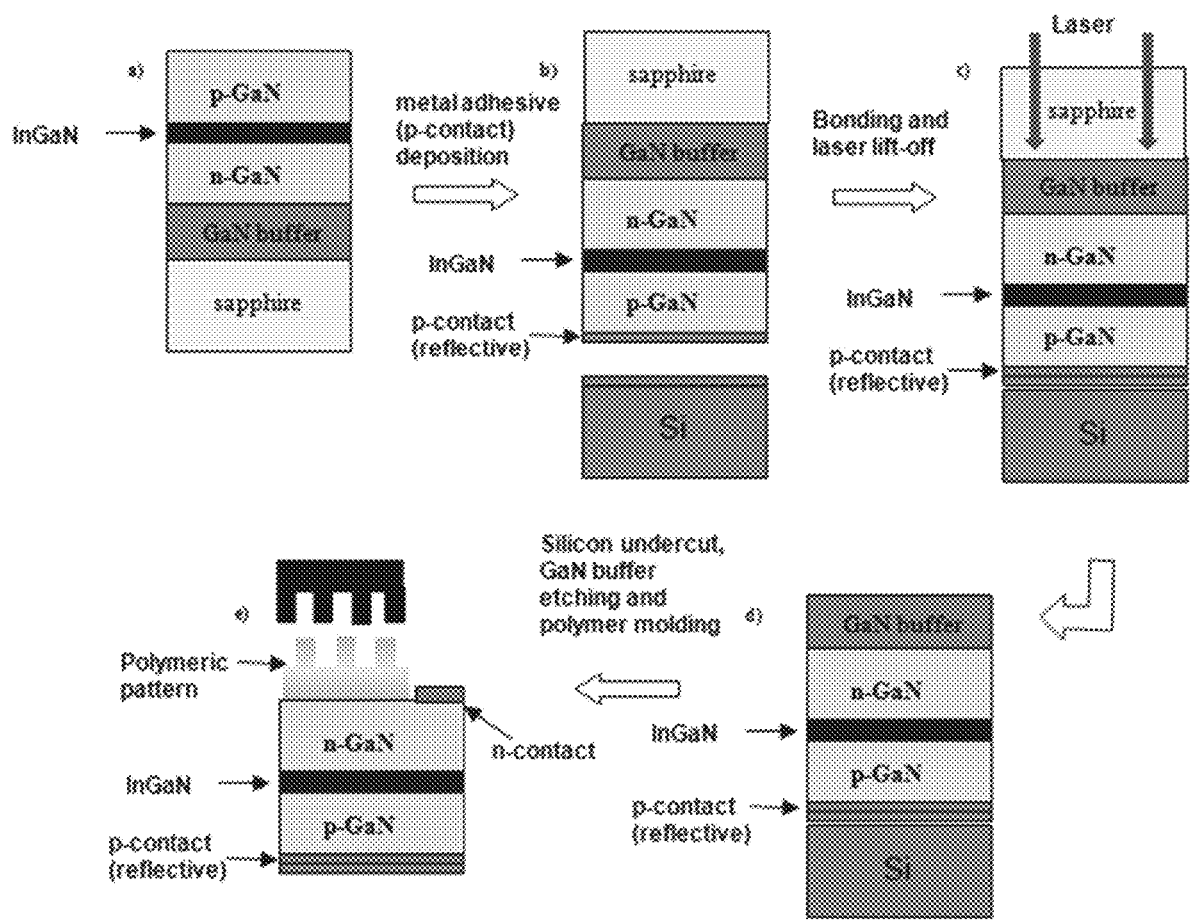

FIG. 71. Schematics for optically enhancement with polymeric pattern.

Figure 72:
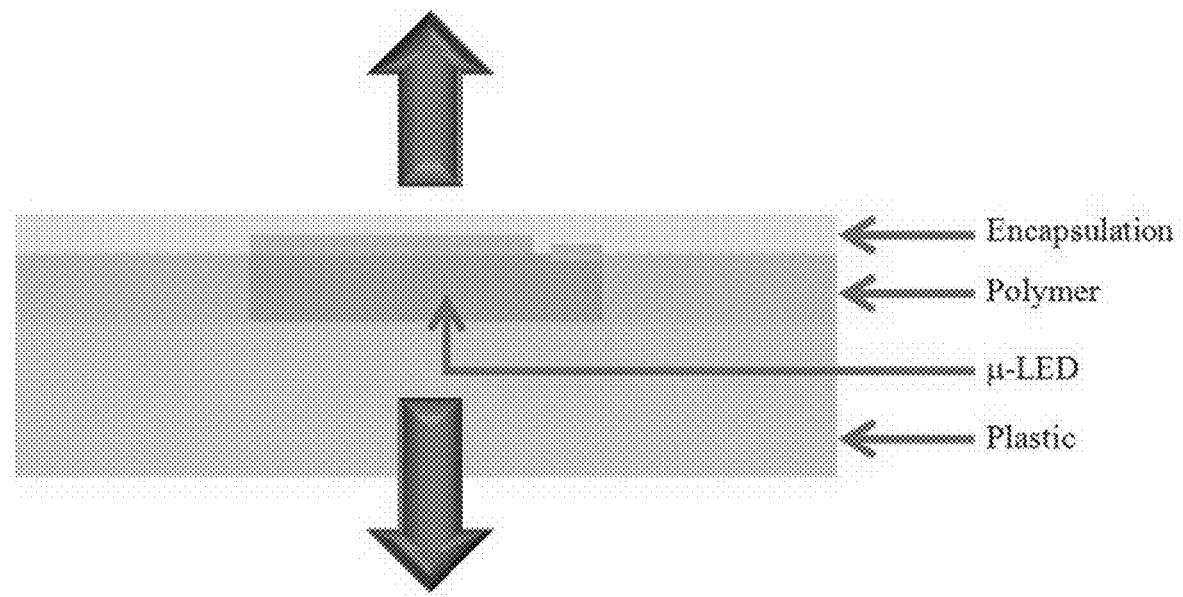

FIG. 72. Bi-directional nature of light output from the printed μ-LED on transparent substrates.

Figure 73:
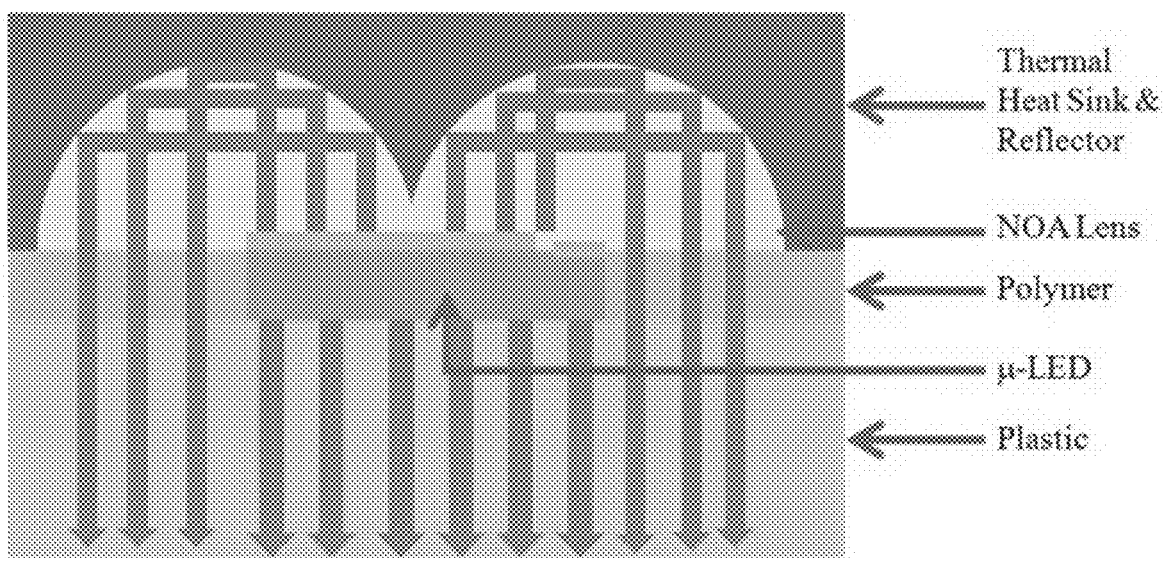

FIG. 73. Integration of reflector and thermal heat sink onto printed μ-LEDs.

Figure 74:
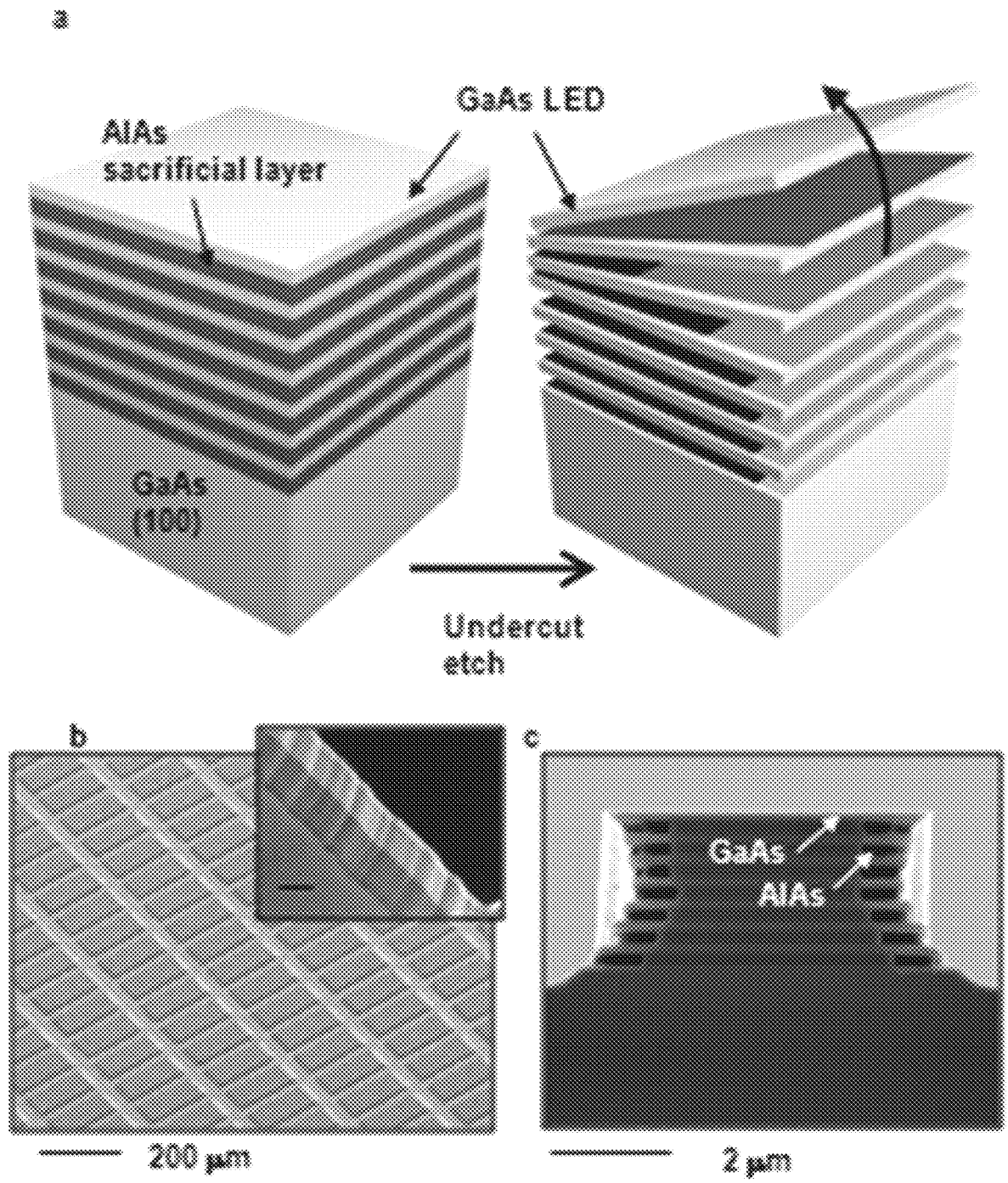

FIG. 74. Multiple stacks of μ-LEDs

Figure 75:
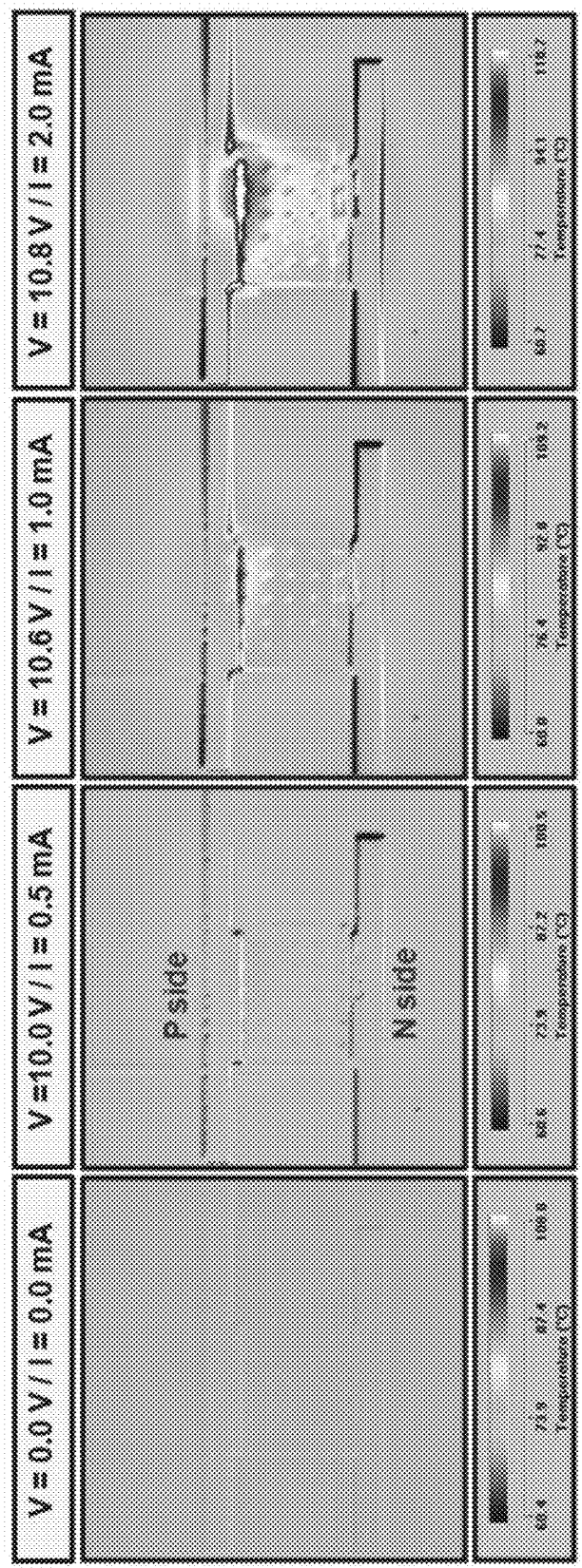

FIG. 75. Thermographic images at various driving conditions of AlInGaP μ-LED.

Figure 76:
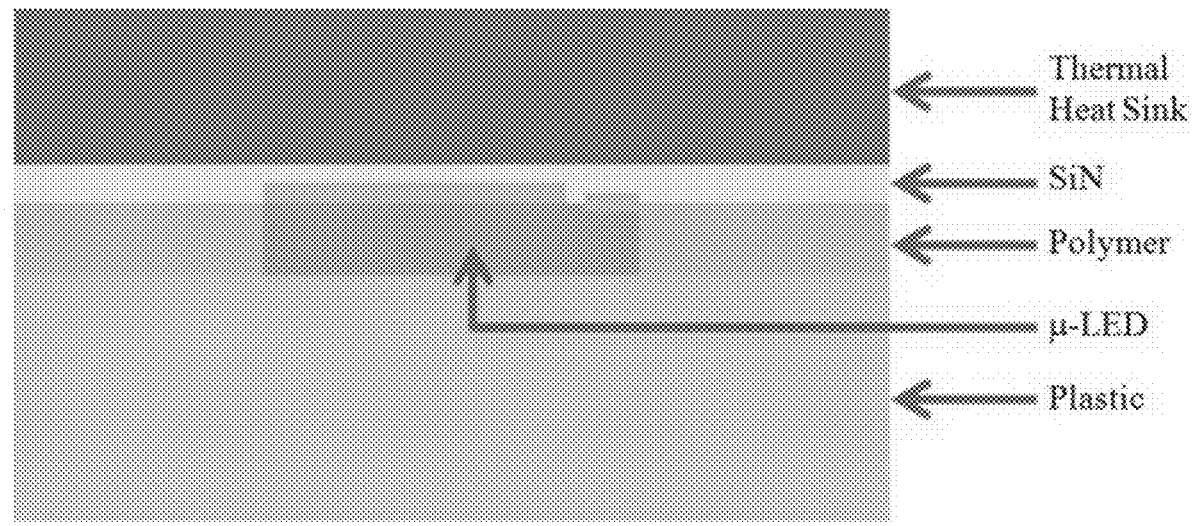

FIG. 76. Thermal management of printed μ-LED on plastic substrates.

Figure 77:
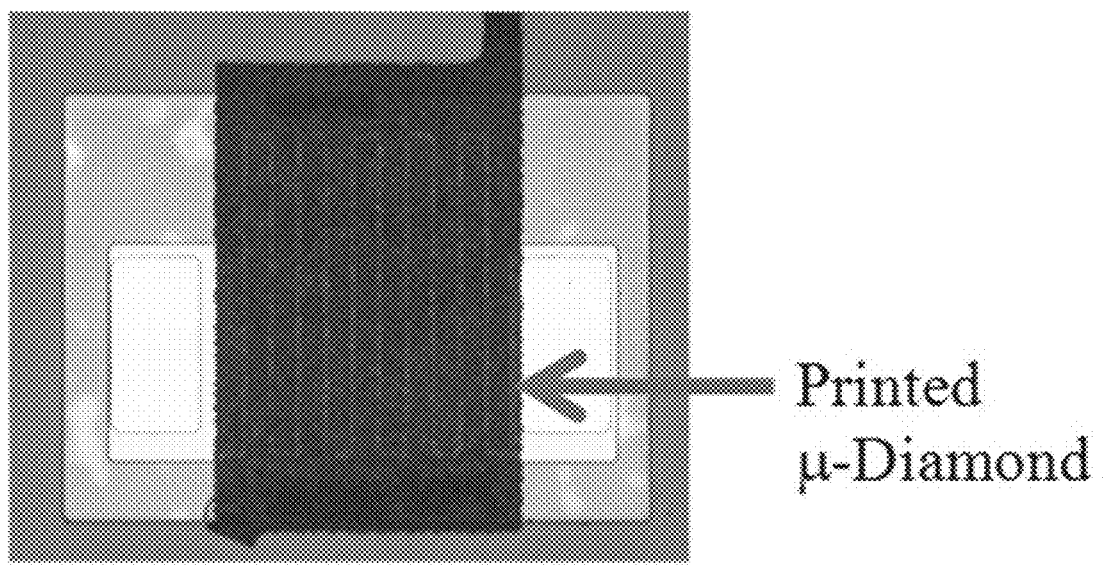

FIG. 77. Printed μ-diamond as a heat sink.

Figure 78:
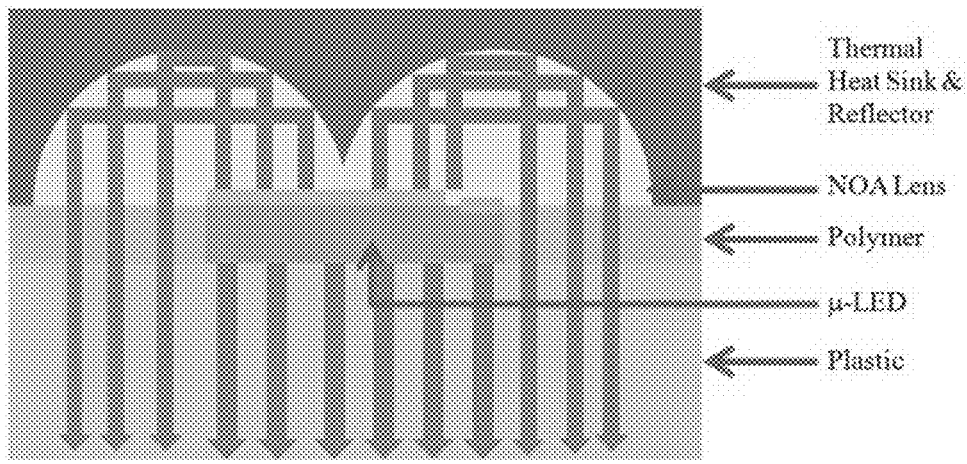

FIG. 78. Integration of reflector & thermal heat sink onto printed μ-LEDs.

Figure 79:
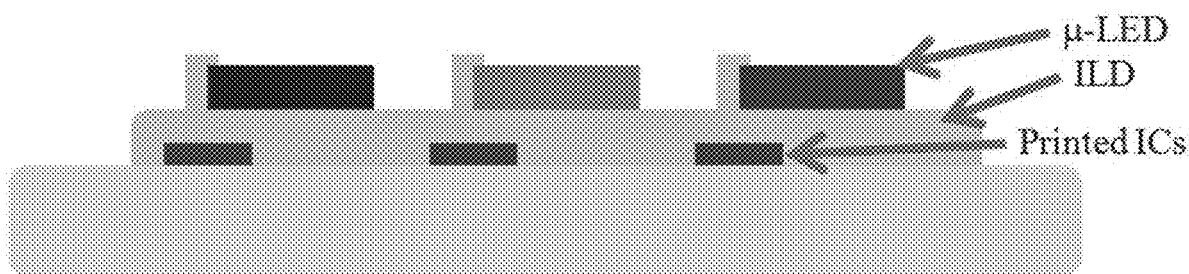

FIG. 79. Heterogeneous integration of μ-LEDs with printed electronics.

Figure 80:
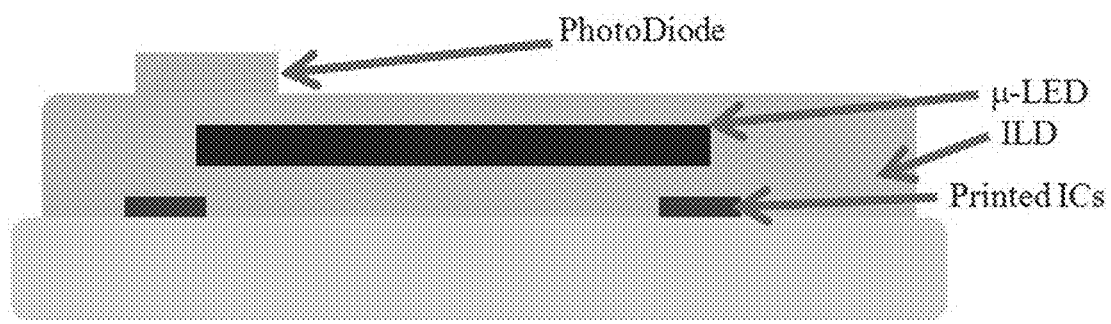

FIG. 80. Heterogeneous integration of photodiode with μ-LEDs for the in situ self-calibration of the light output.

Figure 81:
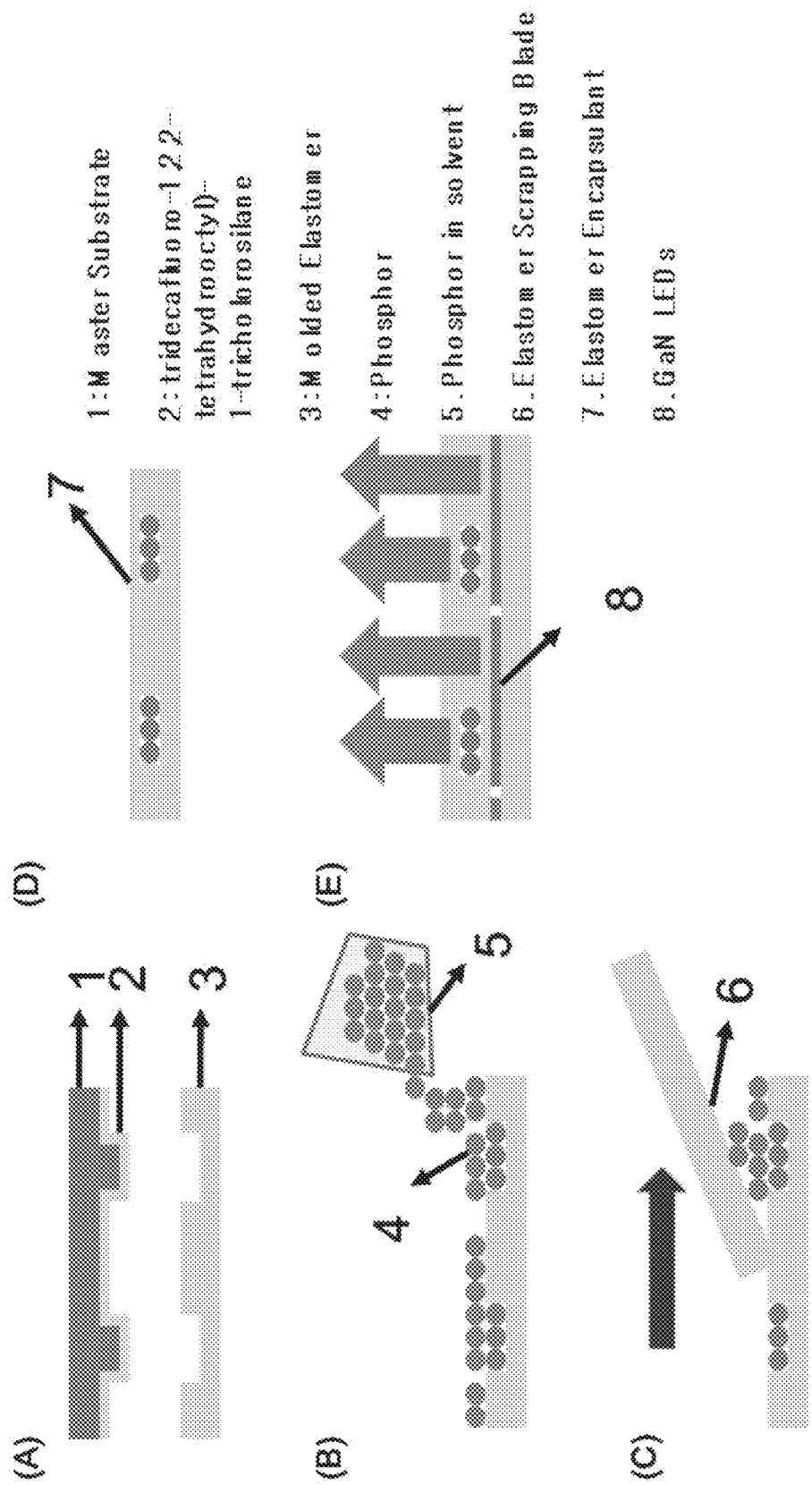

FIG. 81. Fabrication scheme of uniform phosphor array.

Figure 82:
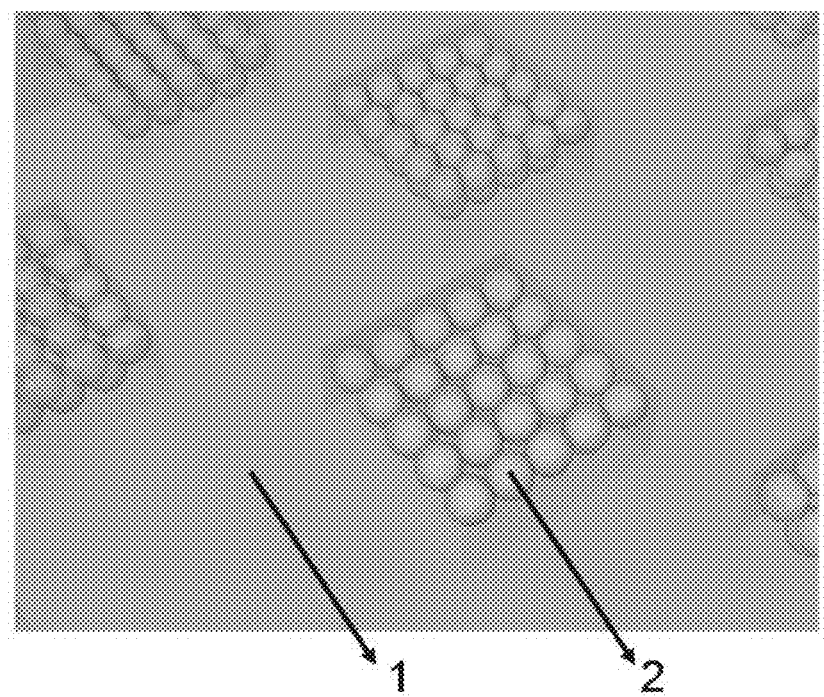

FIG. 82. Phosphors in elastomer cavities.

Figure 83:
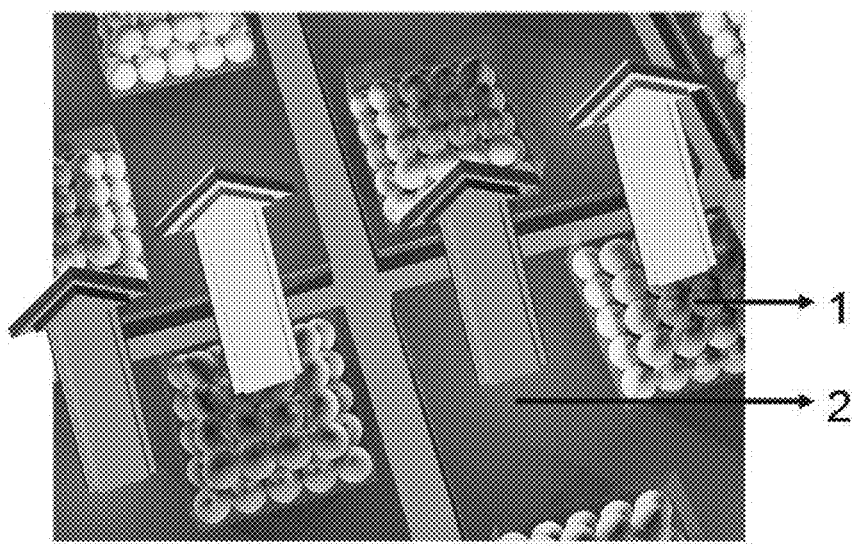

FIG. 83. Laminated Phosphor-encapsulated Elastomer on top of printed and packaged LEDs.

Figure 84:
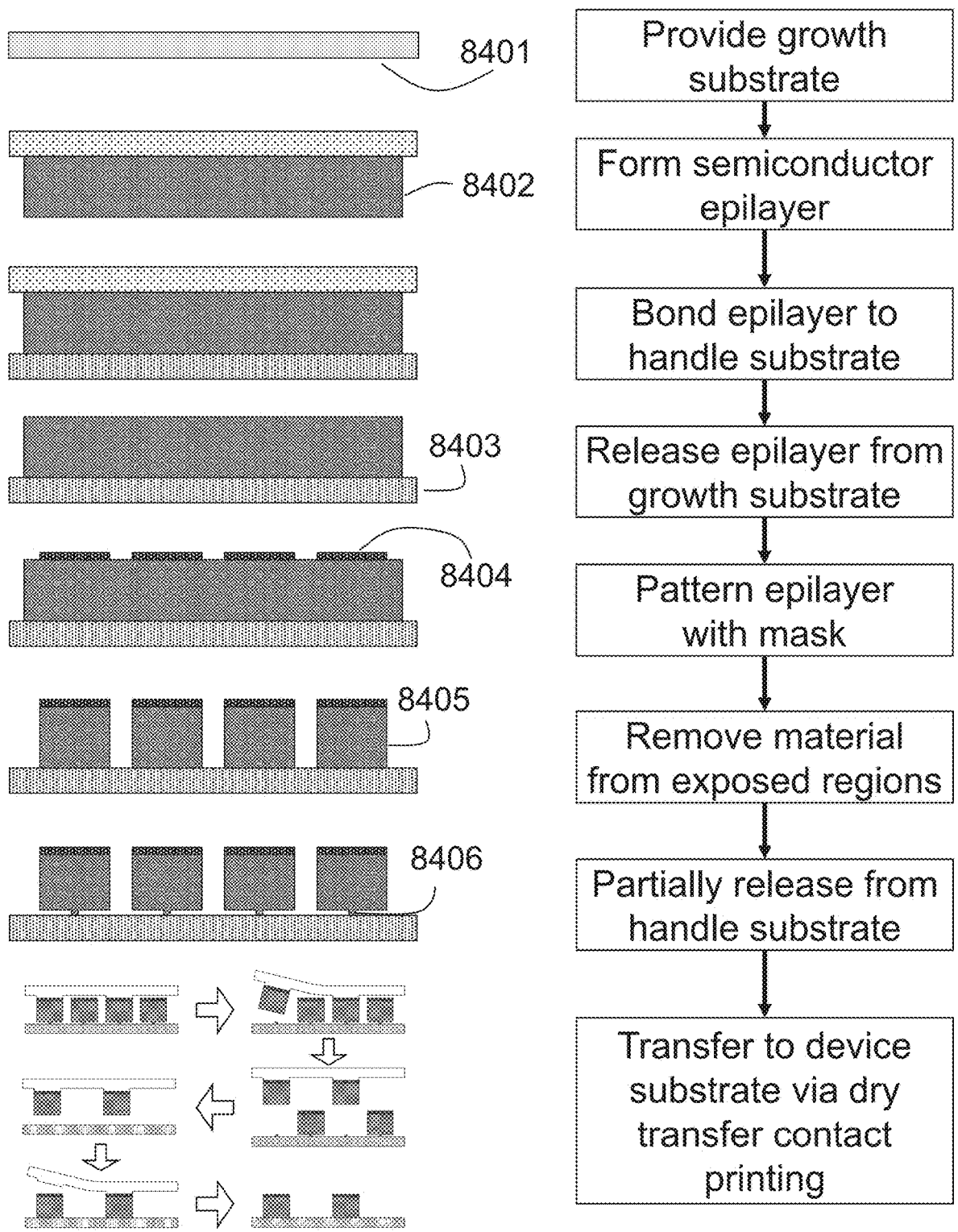

FIG. 84. Exemplary method of making semiconductor devices.

Figure 85:
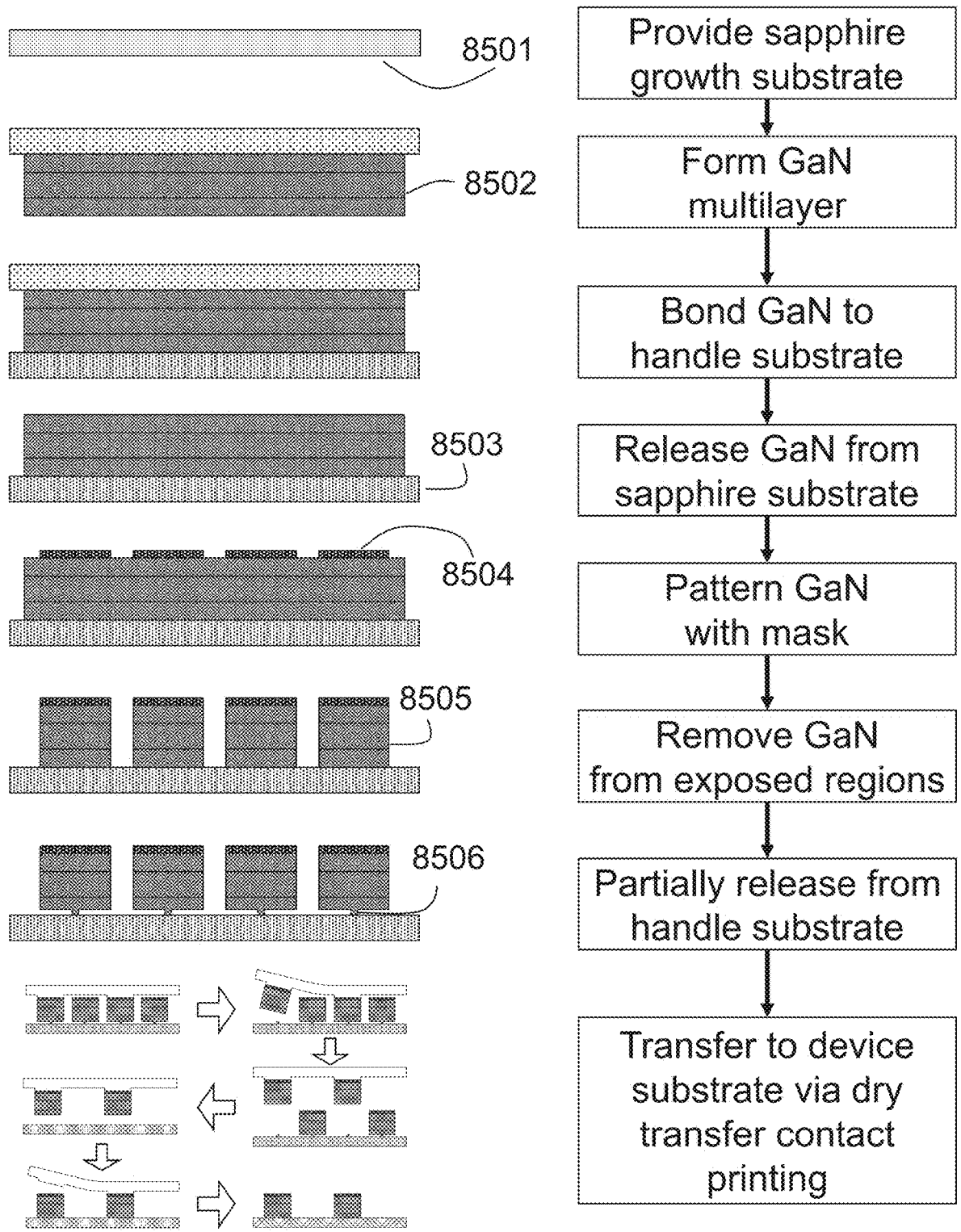

FIG. 85. Exemplary method of making GaN LED devices.

Figure 86:
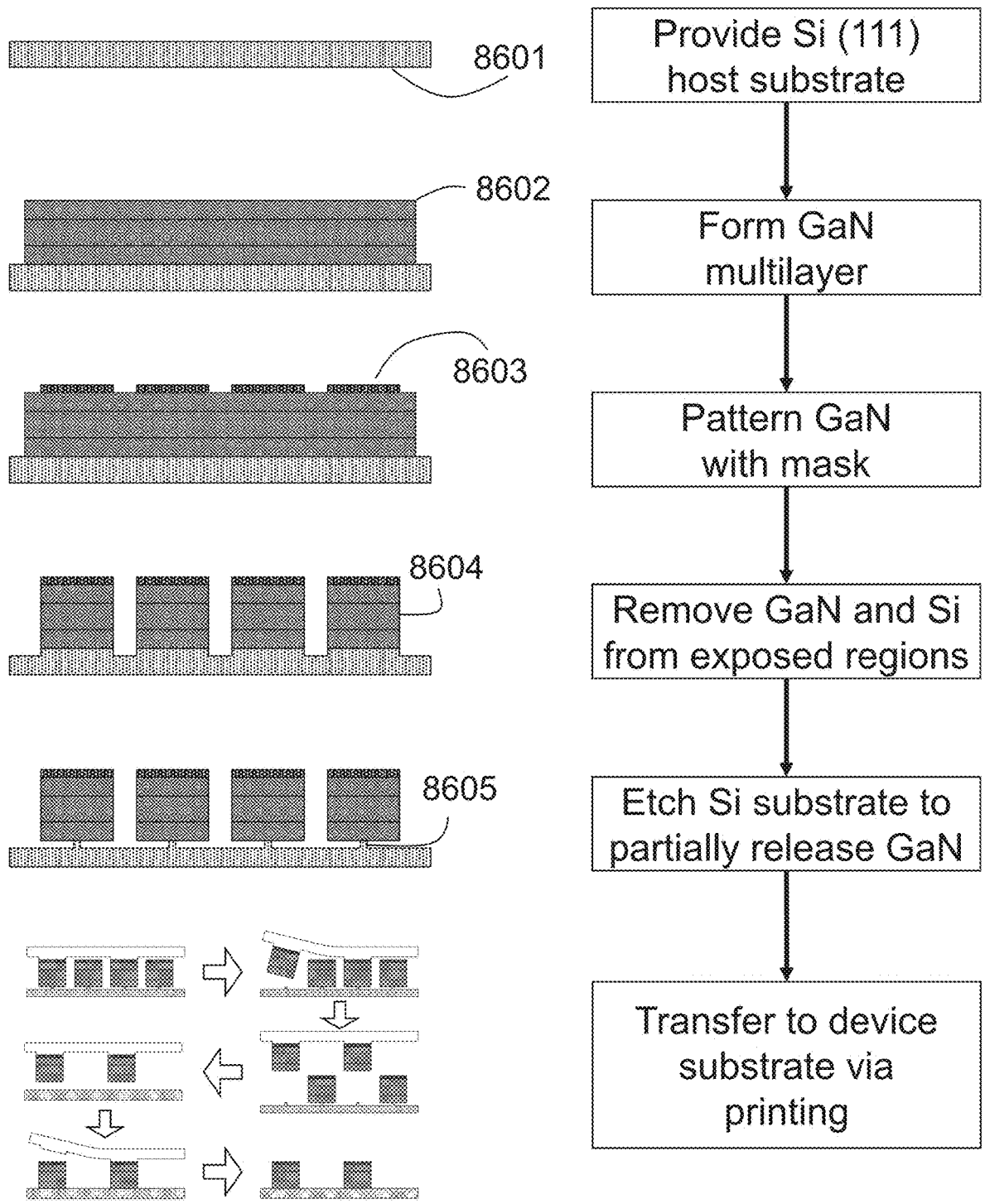

FIG. 86. Exemplary method of making GaN LED devices.

Figure 87:
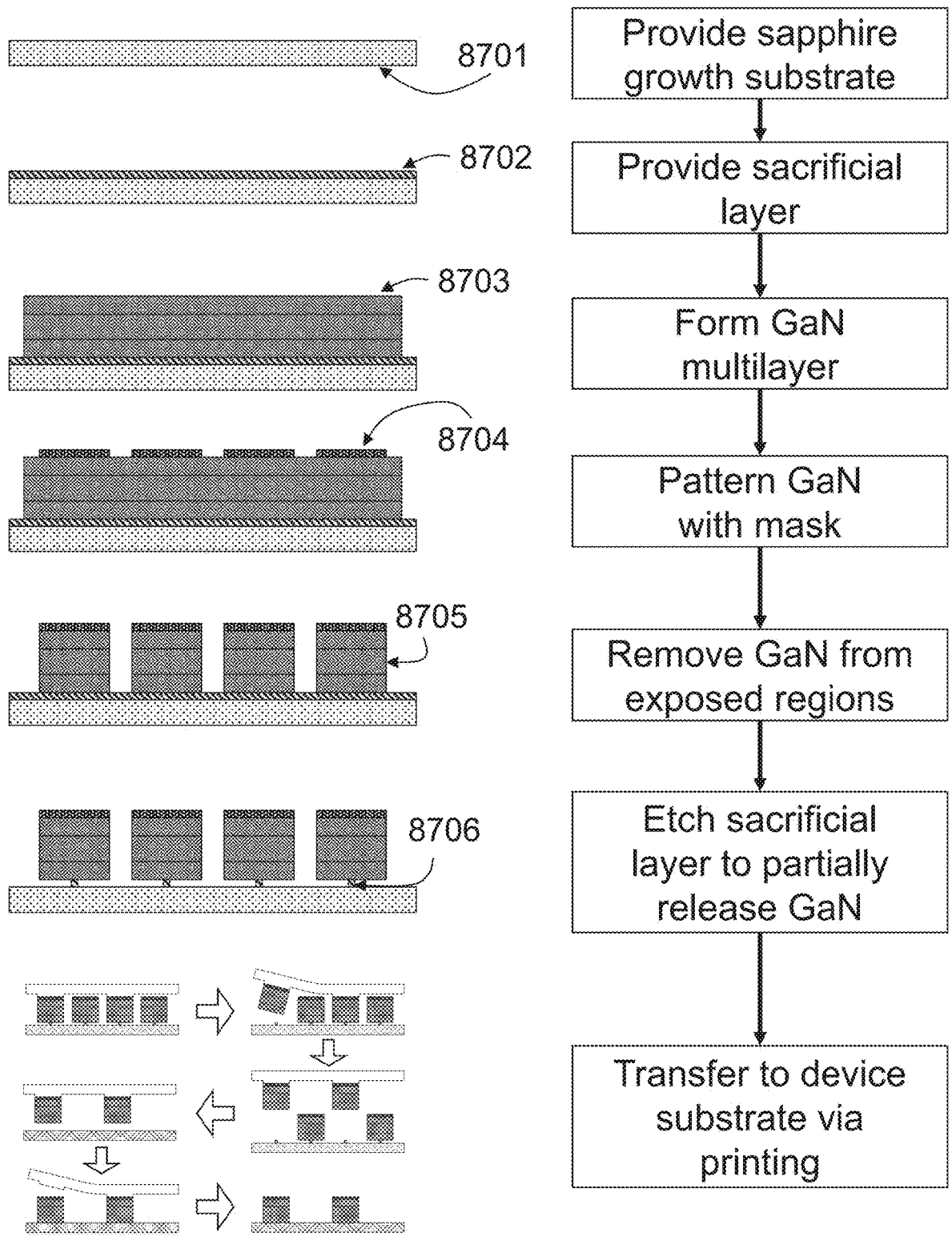

FIG. 87. Exemplary method of making GaN LED devices.

Figure 88:
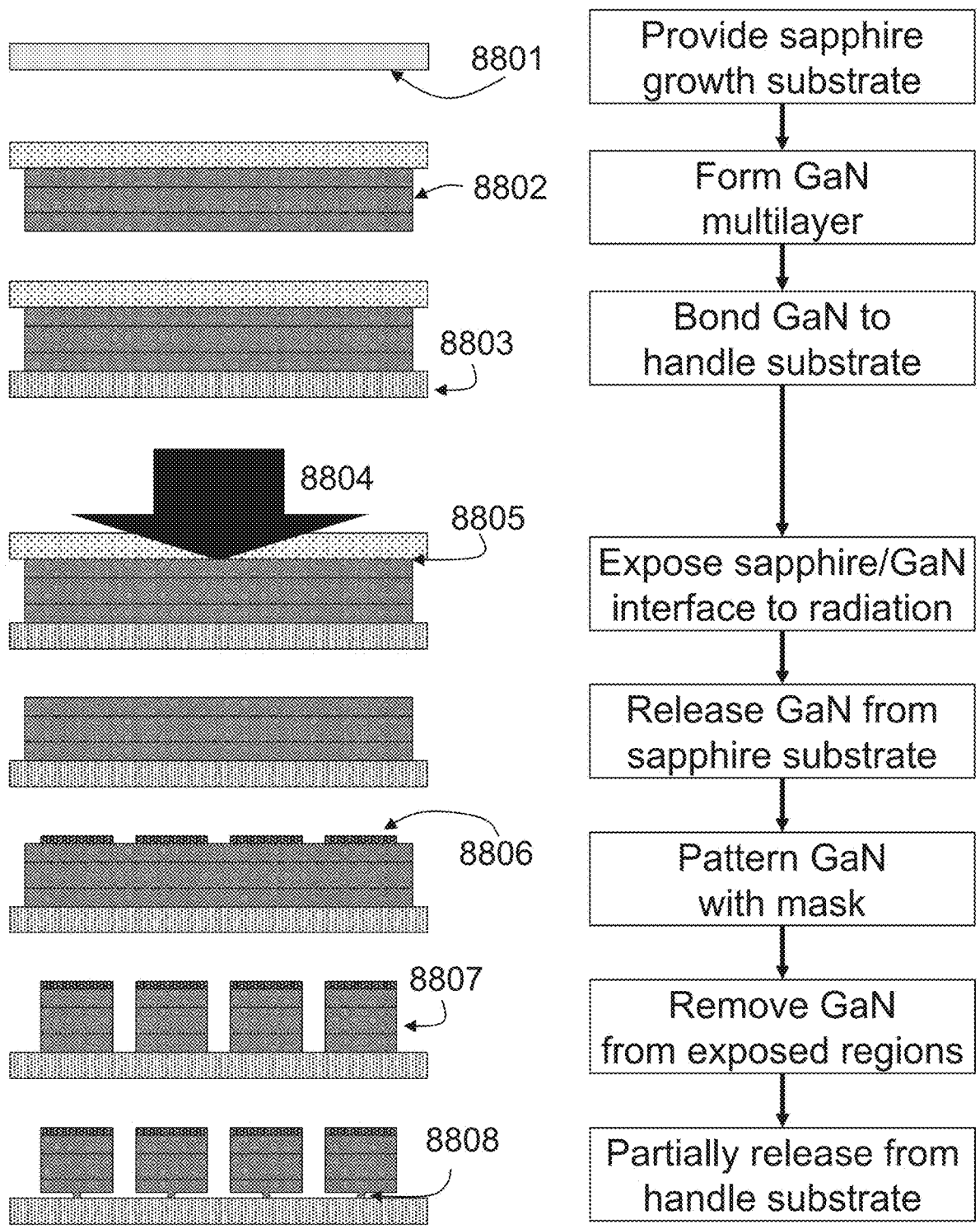

FIG. 88. Exemplary method of making GaN LED devices.

Figure 89:
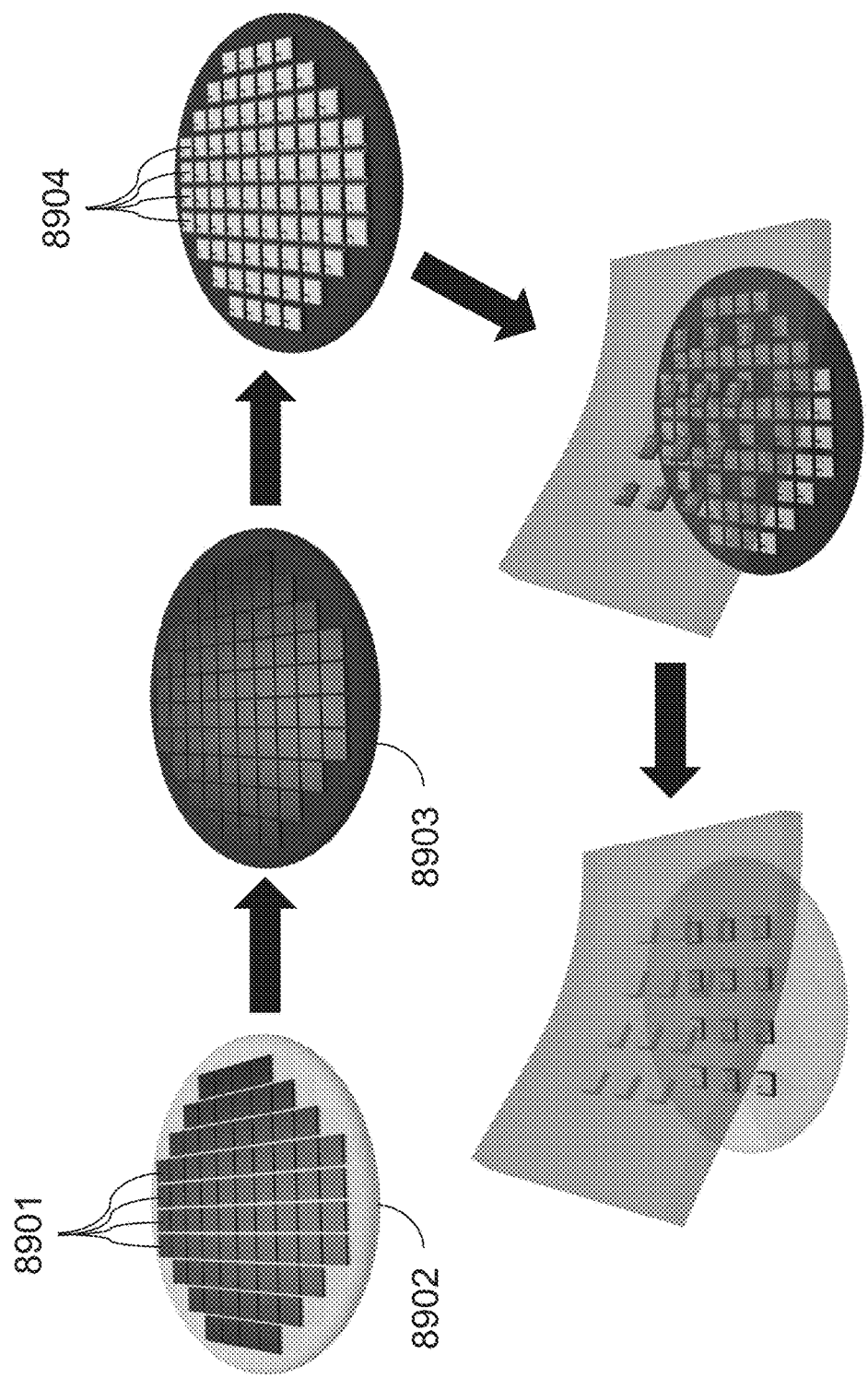

FIG. 89. Illustration of a scheme for processing electronic devices on a handle substrate.

Figure 90A:
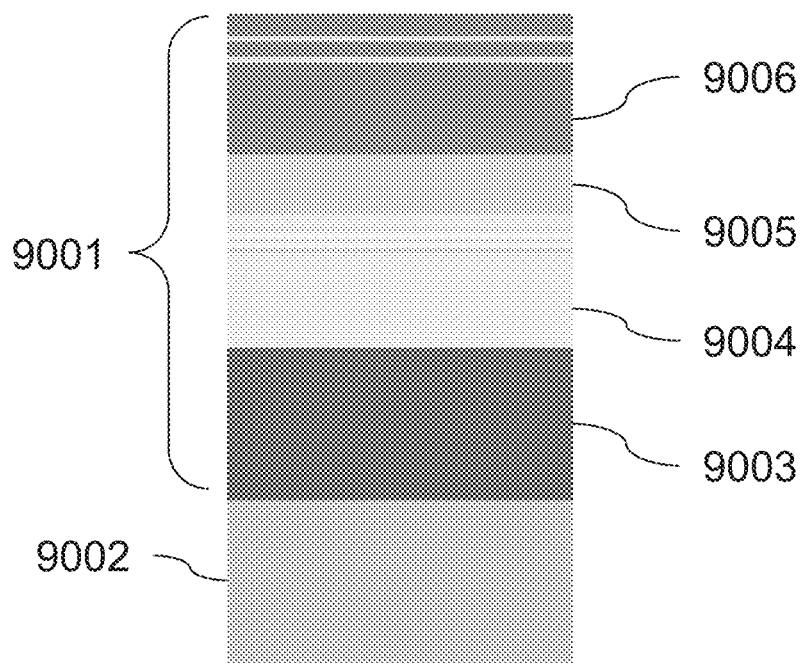
Figure 90A:
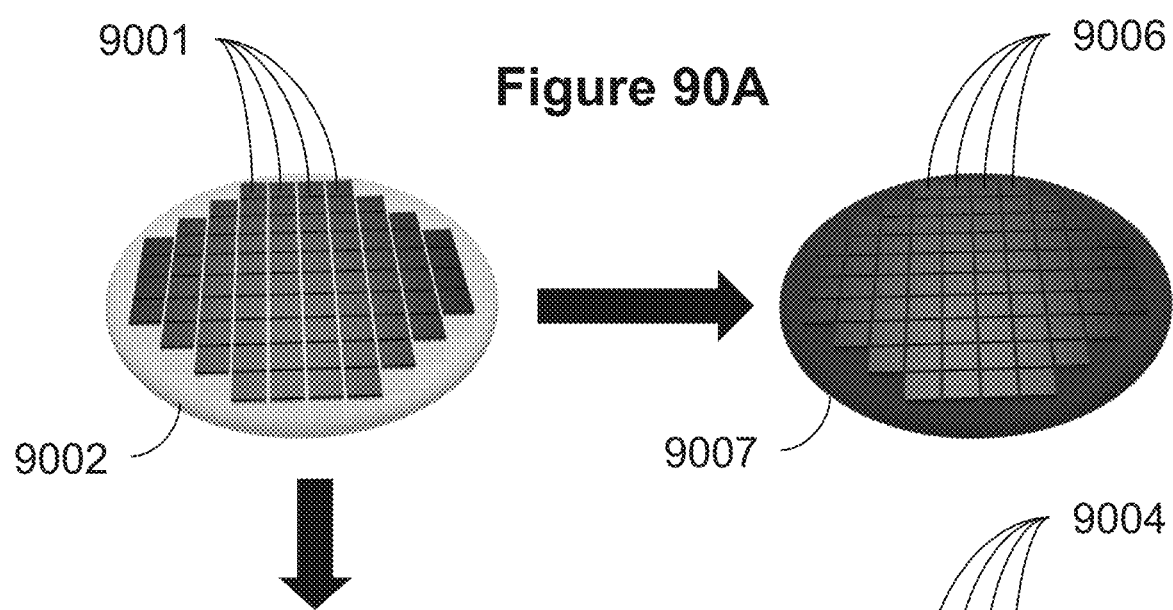
Figure 90B:
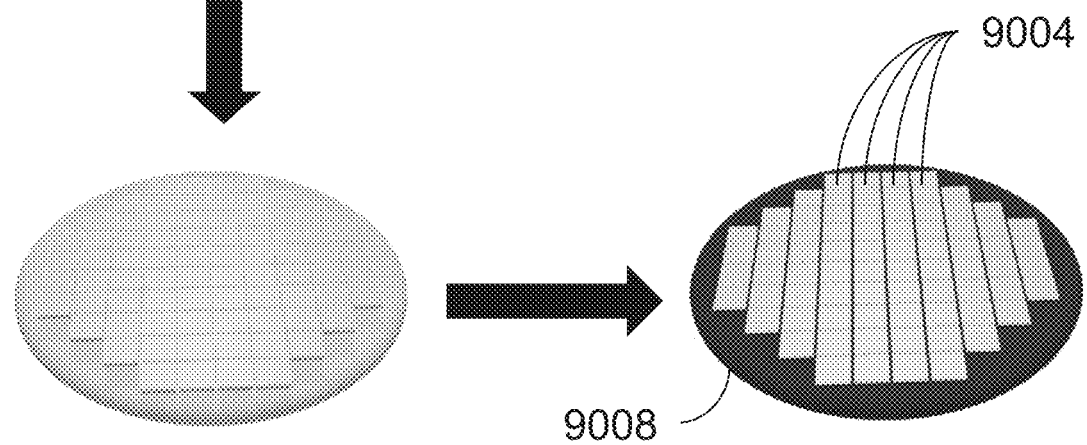

FIG. 90. FIG. 90A) Cross sectional view of an exemplary semiconductor structure grown on a growth substrate; FIG. 90B) Illustration of a transfer scheme for transferring portions of a semiconductor structure to two separate handle substrates.

Figure 91:
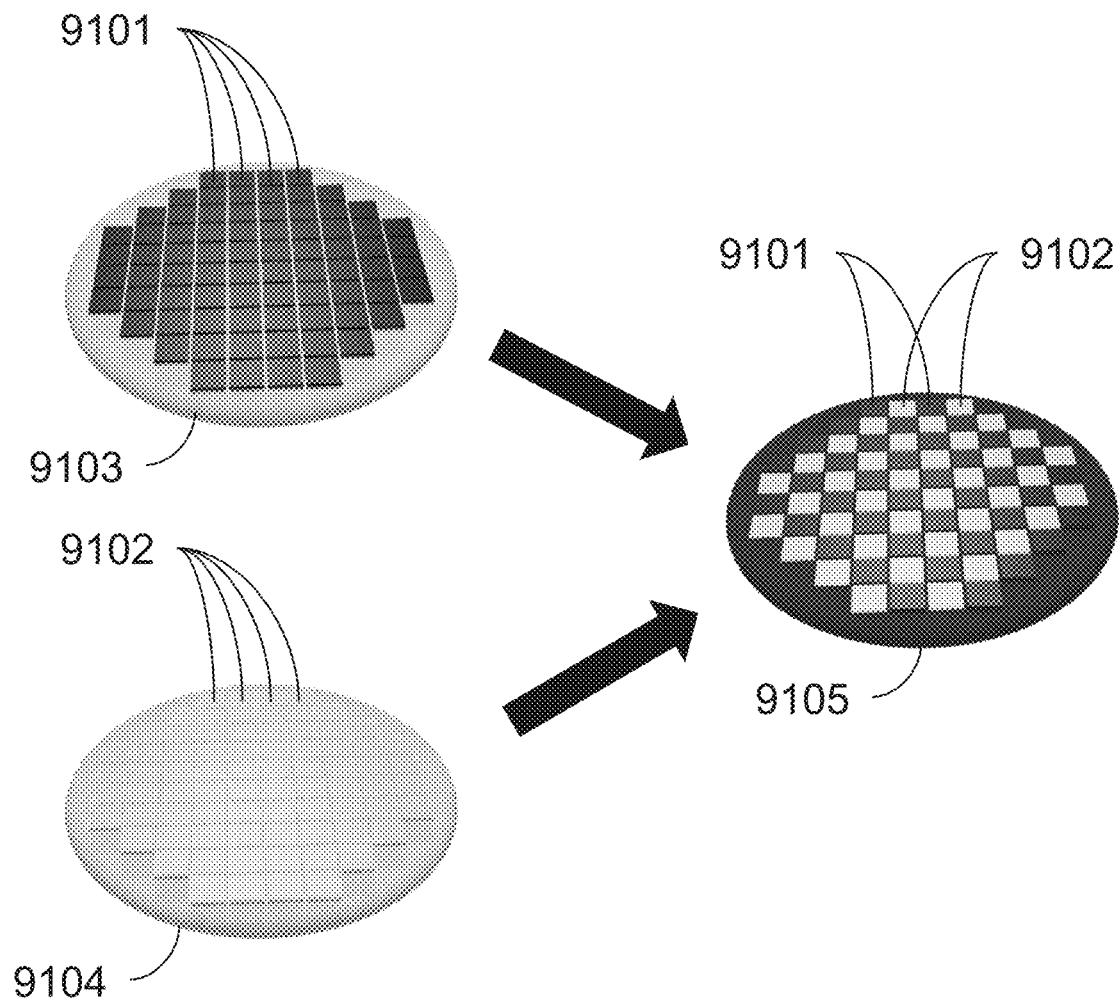

FIG. 91. Illustration of a scheme for assembly of electronic devices grown on separate growth substrates on a common handle substrate.

Figure 92A:
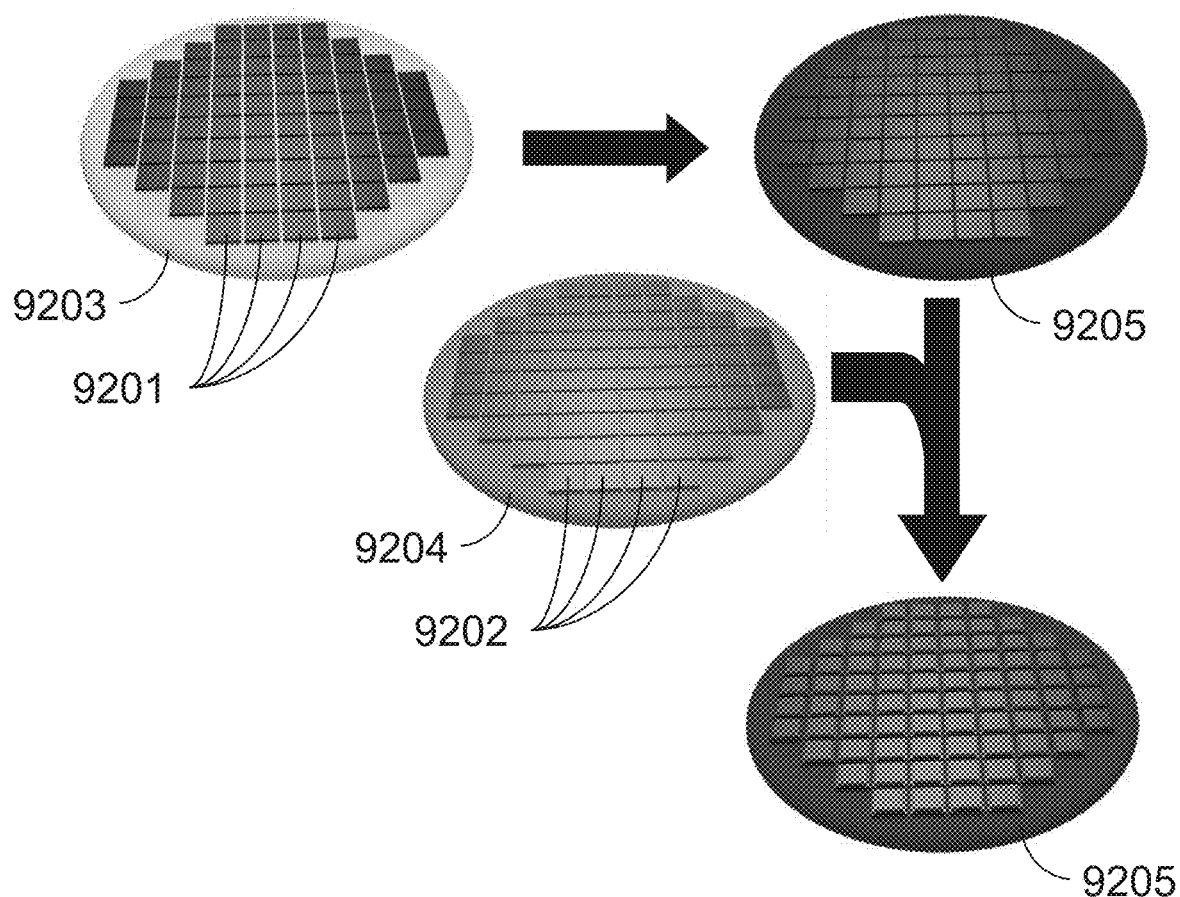
Figure 92B:
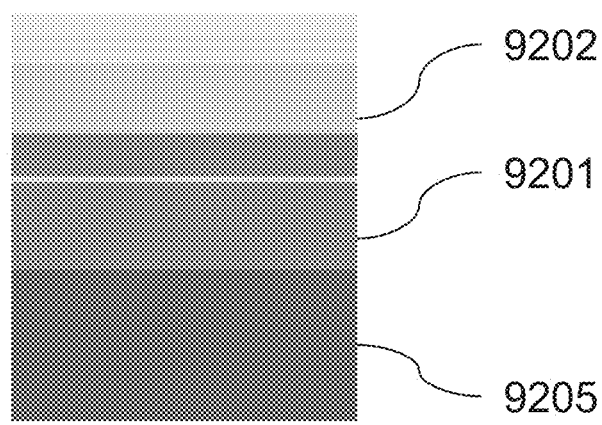

FIG. 92. FIG. 92A) Illustration of a scheme for assembly of electronic devices grown on separate growth substrates on a common handle substrate; FIG. 92B) Cross sectional view of the assembled electronic devices on the handle substrate.

Figure 93:
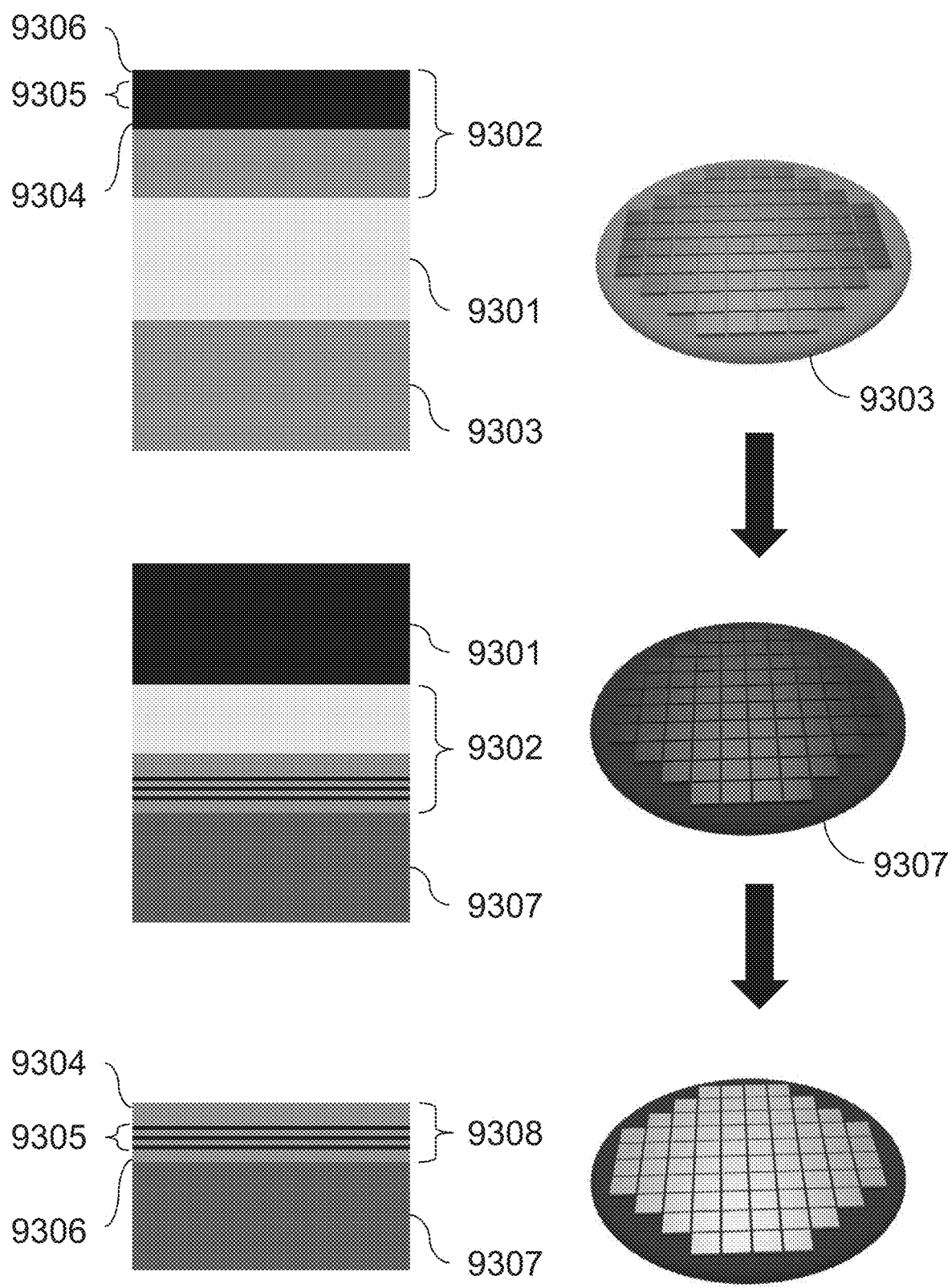

FIG. 93. Illustration of a scheme for processing electronic devices on a handle substrate.

Figure 94:
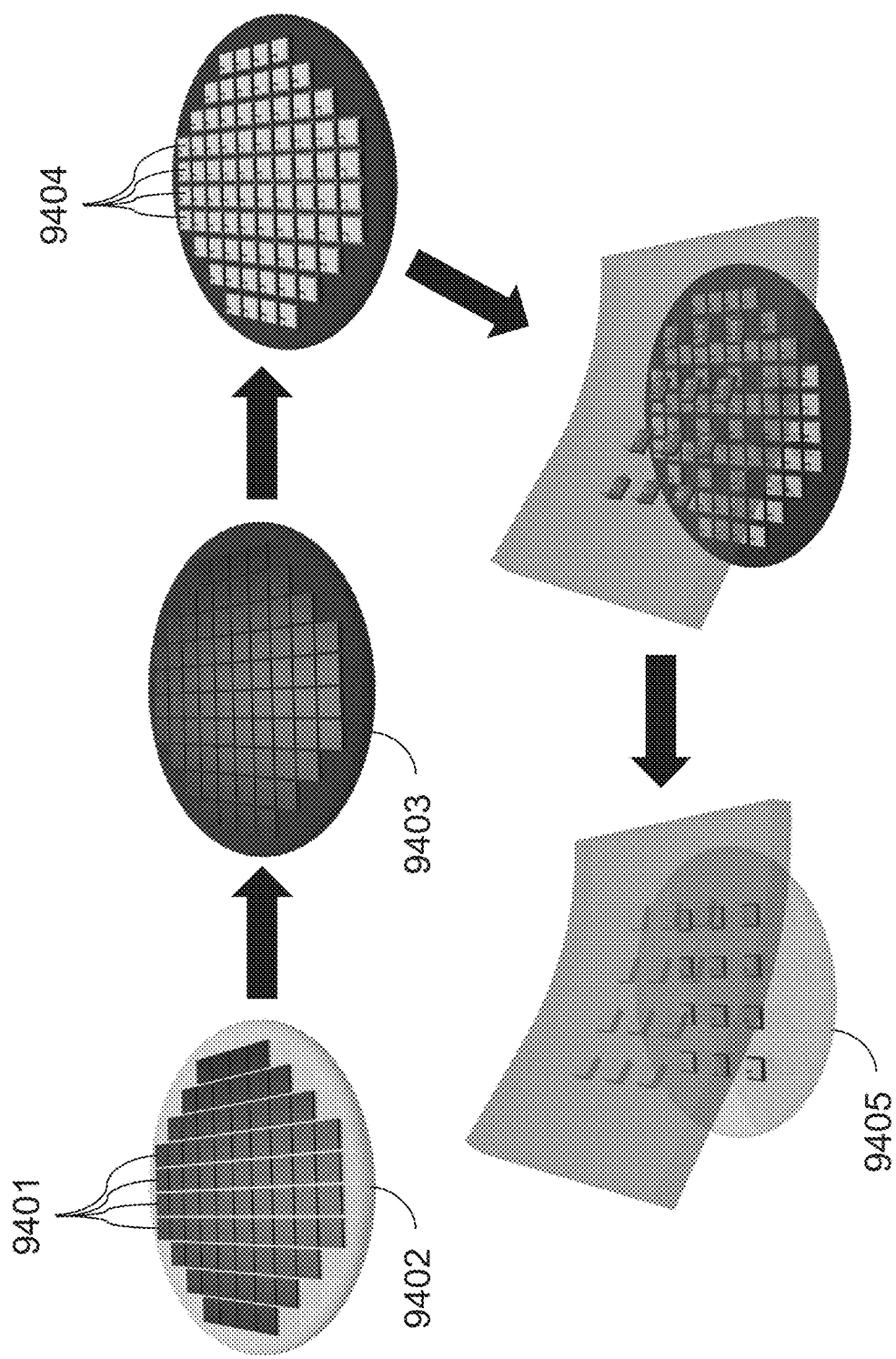

FIG. 94. Illustration of a scheme for processing electronic devices on a handle substrate.

DETAILED DESCRIPTION OF THE INVENTION

In general the terms and phrases used herein have their art-recognized meaning, which can be found by reference to standard texts, journal references and contexts known to those skilled in the art. The following definitions are provided to clarify their specific use in the context of the invention.

"Transferable" or "printable" are used interchangeably and relates to materials, structures, device components and/or integrated functional devices that are capable of transfer, assembly, patterning, organizing and/or integrating onto or into substrates. In an embodiment, transferring or printing refers to the direct transfer of a structure or element from one substrate to another substrate, such as from a multilayer structure to a device substrate or a device or component supported by a device substrate. Alternatively, transferable refers to a structure or element that is printed via an intermediate substrate, such as a stamp that lifts-off the structure or element and then subsequently transfers the structure or element to a device substrate or a component that is on a device substrate. In an embodiment, the printing occurs without exposure of the substrate to high temperatures (i.e. at temperatures less than or equal to about 400 degrees Celsius). In one embodiment, printable or transferable materials, elements, device components and devices are capable of transfer, assembly, patterning, organizing and/or integrating onto or into substrates via solution printing or dry transfer contact printing. Similarly, "printing" is used broadly to refer to the transfer, assembly, patterning, organizing and/or integrating onto or into substrates, such as a substrate that functions as a stamp or a substrate that is itself a target (e.g., device) substrate. Such a direct transfer printing provides low-cost and relatively simple repeated transfer of a functional top-layer of a multilayer structure to a device substrate. This achieves blanket transfer from, for example, a wafer to a target substrate without the need for a separate stamp substrate.

"Substrate" refers to a material having a surface that is capable of supporting a component, including a device, component or an interconnect. An interconnect that is "bonded" to the substrate refers to a portion of the interconnect in physical contact with the substrate and unable to substantially move relative to the substrate surface to which it is bonded. Unbonded portions, in contrast, are capable of substantial movement relative to the substrate. The unbonded portion of an interconnect generally corresponds to that portion having a "bent configuration," such as by strain-induced interconnect bending.

"Host substrate" and "handle substrate" interchangeably refer to a substrate on which an electronic device is assembled, processed or otherwise manipulated. In certain embodiments, a handle substrate is a substrate useful as a transitory substrate, for example for holding structures for subsequent transfer to another substrate, such as by transfer printing. In some embodiments, a handle substrate is useful as a processing substrate, where structures present on the handle substrate undergo additional processing steps. "Growth substrate" refers to a substrate useful for growing material, for example via epitaxial growth. In embodiments, a growth substrate comprises the same material as is being grown. In embodiments a growth substrate comprises material different from that being grown. Useful growth substrates include substrates which are lattice matched, or effectively lattice matched, to the material being grown. In some embodiments a growth substrate is a host substrate. "Device substrate" refers to a substrate useful for assembling device components. In some embodiments, a device substrate comprises functional device components. In some embodiments, a device substrate is a flexible substrate, a large area substrate, a pre-metalized substrate, a substrate pre-patterned with one or more device components, or any combination of these. In some embodiments a device substrate is a host substrate.

The term "surface" as used herein is intended to be consistent with its plain meaning which refers to an outer boundary of an object. In embodiments, surfaces may be given specific names, such as "receiving surface", "contact surface", "external surface". In some embodiments, named surfaces can refer to their target use and/or identify subregions of a surface. In some embodiments, named surfaces can refer to their orientation, for example relative to other nearby or adjacent components.

"Functional layer" or "device layer" refers to a layer capable of incorporation into a device or device component and that provides at least partial functionality to that device or device component. Depending on the particular device or device component, a functional layer can include a broad range of compositions. For example, a device that is a solar array can be made from a starting functional layer of III-V micro solar cells, including a functional layer that is itself made up a plurality of distinct layers as provided herein. In certain embodiments, release and subsequent printing of such layers provides the basis for constructing a photovoltaic device or device component. In contrast, a functional layer for incorporation into electronics (MESFETs), LEDs, or optical systems may have a different layering configuration and/or compositions. Accordingly, the specific functional layer incorporated into the multilayer structure depends on the final device or device component in which the functional layer will be incorporated.

"Release layer" (sometimes referred to as "sacrificial layer") refers to a layer that at least partially separates one or more functional layers. A release layer is capable of being removed or providing other means for facilitating separation of the functional layer from other layers of the multi-layer structure, such as by a release layer that physically separates in response to a physical, thermal, chemical and/or electromagnetic stimulation, for example. Accordingly, the actual release layer composition is selected to best match the means by which separation will be provided. Means for separating is by any one or more separating means known in the art, such as by interface failure or by release layer sacrifice. A release layer may itself remain connected to a functional layer, such as a functional layer that remains attached to the remaining portion of the multilayer structure, or a functional layer that is separated from the remaining portion of the multilayer structure. The release layer is optionally subsequently separated and/or removed from the functional layer.

"Buffer layer" refers to a layer of a device or device component which is useful for protecting other layers of the device component. In one embodiment, a buffer layer protects another device layer from etching. In an embodiment, a buffer layer does not impact or has a minimal impact on the function of the device. In one embodiment, an etch block layer is a buffer layer.

"Release" and "releasing" refer to at least partially separating two layers, devices or device components from one another, for example by mechanical or physical separation, or by removal of at least a portion of one layer, device or device component. In some embodiments, removal of a sacrificial layer results in the release of a layer, device or device component. In some embodiments, layers, devices or device components are released by etching away a portion of the layer, device or device component. In certain embodiments, released components remain attached to the object with they are released from by one or more anchors. In some embodiments, released components are subsequently attached to the object they are released from by one or more anchors.

"Etch" and "etching" refer to a process by which a portion of a layer, device or device component is reacted away, dissolved or otherwise removed. In embodiments, an anisotropic etch or a directional etch refers to an etching process which preferentially removes material along a specific direction. In embodiments, a wet etch refers to removal of material by exposure to a solution. In embodiments, a selective etch refers to removal of a specific material or class of materials. In embodiments, a reactive ion etch or an inductively coupled plasma reactive ion etch refers to an etching method which utilizes a plasma to etch away material, for example by reaction with ions in the plasma. The term "etchant" is used in the present description to broadly refer to a substance which is useful for removal of material by etching. The term "electrochemical etching" refers to an etching process which utilizes an applied electric potential, electric field or electric current. The term "photoelectrochemical etching" refers to an etching process which utilizes an applied electric potential, electric field or electric current and exposure to electromagnetic radiation.

An "etch mask" refers to material useful for preventing underlying material from being etched. In some embodiments, a thick etch mask refers to an etch mask of a sufficient thickness that the majority of the mask remains after an etching process. In embodiments a thick etch mask has a thickness selected over the range of 100 nm to 5 µm. In some embodiments a metal etch mask refers to an etch block layer.

The term "mask" refers to a material which covers or otherwise blocks portions of an underlying material. Use of the term "mask" is intended to be consistent with use of the term in the art of microfabrication. In embodiments, the term "mask" refers to an etch mask, an optical mask, a deposition mask or any combination of these.

The terms "masked region" and "exposed region" respectively refer to portions of an underlying material which are blocked and unblocked by a mask.

"Epitaxial regrowth" and "epitaxial growth" refers to a method of growing crystalline layer by deposition of material, for example gas or liquid phase deposition. The term "epilayer" refers to a layer grown via epitaxial growth.

The term "patterning" is used herein as in the art of microfabrication to broadly refer to a process by which portions of a layer, device or device component are selectively removed or deposited to create a specified structure.

"Supported by a substrate" refers to a structure that is present at least partially on a substrate surface or present at least partially on one or more intermediate structures positioned between the structure and the substrate surface. The term "supported by a substrate" may also refer to structures partially or fully embedded in a substrate.

"Printable electronic device" or "printable electronic device component" refer to devices and structures that are configured for assembly and/or integration onto substrate surfaces, for example by using dry transfer contact printing and/or solution printing methods. In embodiments, a printable electronic device component is a printable semiconductor element. In embodiments, printable semiconductor elements are unitary single crystalline, polycrystalline or microcrystalline inorganic semiconductor structures. In various embodiments, printable semiconductor elements are connected to a substrate, such as a mother wafer, via one or more bridge or anchor elements. In this context of this description, a unitary structure is a monolithic element having features that are mechanically connected. Semiconductor elements of various embodiments may be undoped or doped, may have a selected spatial distribution of dopants and may be doped with a plurality of different dopant materials, including p- and n-type dopants. Certain microstructured printable semiconductor elements include those having at least one cross sectional dimension greater than or equal to about 1 micron and nanostructured printable semiconductor elements having at least one cross sectional dimension less than or equal to about 1 micron.

Printable semiconductor elements useful for a variety of applications comprise elements derived from "top down" processing of high purity bulk materials, such as high purity crystalline semiconductor wafers generated using conventional high temperature processing techniques. In an embodiment, a printable semiconductor element comprises a composite heterogeneous structure having a semiconductor operationally connected to or otherwise integrated with at least one additional device component or structure, such as a conducting layer, dielectric layer, electrode, additional semiconductor structure or any combination of these. In some methods and systems of the present invention, the printable semiconductor element(s) comprises a semiconductor structure integrated with at least one additional structure selected from the group consisting of: another semiconductor structure; a dielectric structure; conductive structure, and an optical structure (e.g., optical coatings, reflectors, windows, optical filter, collecting, diffusing or concentration optic etc.). In some embodiments a printable semiconductor element comprises a semiconductor structure integrated with at least one electronic device component selected from the group consisting of: an electrode, a dielectric layer, an optical coating, a metal contact pad a semiconductor channel. In some embodiments, printable semiconductor elements comprise stretchable semiconductor elements, bendable semiconductor elements and/or heterogeneous semiconductor elements (e.g., semiconductor structures integrated with one or more additional materials such as dielectrics, other semiconductors, conductors, ceramics etc.). Printable semiconductor elements include printable semiconductor devices and components thereof, including but not limited to printable LEDs, lasers, solar cells, p-n junctions, photovoltaics, photodiodes, diodes, transistors, integrated circuits, and sensors.

"Electronic device component" refers to a printable semiconductor or electrical device. Exemplary electronic device component embodiments are configured for performing a function, for example emitting electromagnetic radiation or converting electromagnetic radiation into electrical energy. In specific embodiments, multiple electronic device components are electrically interconnected and perform a more complex task or function than the individual device components perform alone. Useful electronic device components include, but are not limited to P-N junctions, thin film transistors, single junction solar cells, multi-junction solar cells, photodiodes, light emitting diodes, lasers, CMOS devices, MOSFET devices, MESFET devices, photovoltaic cells, microelectricalmechanical devices and HEMT devices.

"Vertical type LED" refers to a light emitting diode device in which the functional components or layers of the device are arranged in a stacked configuration and the electrical contacts are made at the top and bottom of the stack.

"Solution printing" is intended to refer to processes whereby one or more structures, such as transferable or printable elements, are dispersed into a carrier medium and delivered in a concerted manner to selected regions of a substrate surface. In an exemplary solution printing method, delivery of structures to selected regions of a substrate surface is achieved by methods that are independent of the morphology and/or physical characteristics of the substrate surface undergoing patterning. Solution printing methods include, but are not limited to, ink jet printing, thermal transfer printing, and capillary action printing.

"Contact printing" refers broadly to a dry transfer contact printing method such as with a stamp that facilitates transfer of features from a stamp surface to a substrate surface. In an embodiment, the stamp is an elastomeric stamp. Alternatively, the transfer can be directly to a target (e.g., device) substrate or host substrate. The following references relate to self assembly techniques which may be used in methods of the present invention to transfer, assembly and interconnect transferable semiconductor elements via contact printing and/or solution printing techniques and are incorporated by reference in their entireties herein: (1) "Guided molecular self-assembly: a review of recent efforts", Jiyun C Huie Smart Mater. Struct. (2003) 12, 264-271; (2) "Large-Scale Hierarchical Organization of Nanowire Arrays for Integrated Nanosystems", Whang, D.; Jin, S.; Wu, Y.; Lieber, C. M. Nano Lett. (2003) 3(9), 1255-1259; (3) "Directed Assembly of One-Dimensional Nanostructures into Functional Networks", Yu Huang, Xiangfeng Duan, Qingqiao Wei, and Charles M. Lieber, Science (2001) 291, 630-633; and (4) "Electric-field assisted assembly and alignment of metallic nanowires", Peter A. Smith et al., Appl. Phys. Lett. (2000) 77(9), 1399-1401.

Useful contact printing methods for assembling, organizing and/or integrating transferable elements include dry transfer contact printing, microcontact or nanocontact printing, microtransfer or nanotransfer printing and self assembly assisted printing. Use of contact printing is beneficial because it allows assembly and integration of a plurality of transferable semiconductor in selected orientations and positions relative to each other. Contact printing also enables effective transfer, assembly and integration of diverse classes of materials and structures, including semiconductors (e.g., inorganic semiconductors, single crystalline semiconductors, organic semiconductors, carbon nanomaterials etc.), dielectrics, and conductors. Contact printing methods optionally provide high precision registered transfer and assembly of transferable semiconductor elements in preselected positions and spatial orientations relative to one or more device components prepatterned on a device substrate. Contact printing is also compatible with a wide range of substrate types, including conventional rigid or semi-rigid substrates such as glasses, ceramics and metals, and substrates having physical and mechanical properties attractive for specific applications, such as flexible substrates, bendable substrates, shapeable substrates, conformable substrates and/or stretchable substrates. Contact printing assembly of transferable structures is compatible, for example, with low temperature processing (e.g., less than or equal to 298K). This attribute allows the present optical systems to be implemented using a range of substrate materials including those that decompose or degrade at high temperatures, such as polymer and plastic substrates. Contact printing transfer, assembly and integration of device elements is also beneficial because it can be implemented via low cost and high-throughput printing techniques and systems, such as roll-to-roll printing and flexographic printing methods and systems.

"Stretchable" refers to the ability of a material, structure, device or device component to be strained without undergoing fracture. In an exemplary embodiment, a stretchable material, structure, device or device component may undergo strain larger than about 0.5% without fracturing, preferably for some applications strain larger than about 1% without fracturing and more preferably for some applications strain larger than about 3% without fracturing.

The terms "flexible" and "bendable" are used synonymously in the present description and refer to the ability of a material, structure, device or device component to be deformed into a curved shape without undergoing a transformation that introduces significant strain, such as strain characterizing the failure point of a material, structure, device or device component. In an exemplary embodiment, a flexible material, structure, device or device component may be deformed into a curved shape without introducing strain larger than or equal to about 5%, preferably for some applications larger than or equal to about 1%, and more preferably for some applications larger than or equal to about 0.5%.

"Semiconductor" refers to any material that is an insulator at very low temperatures, but which has an appreciable electrical conductivity at a temperatures of about 300 Kelvin. In the present description, use of the term semiconductor is intended to be consistent with use of this term in the art of microelectronics and electrical devices. Useful semiconductors include element semiconductors, such as silicon, germanium and diamond, and compound semiconductors, such as group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors alloys such as $Al_xGa_{1-x}As$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MoS_2$ and GaSe, oxide semiconductors such as CuO and $Cu_2O$.

The term semiconductor includes intrinsic semiconductors and extrinsic semiconductors that are doped with one or more selected materials, including semiconductor having p-type doping materials (also known as P-type or p-doped semiconductor) and n-type doping materials (also known as N-type or n-doped semiconductor), to provide beneficial electrical properties useful for a given application or device. The term semiconductor includes composite materials comprising a mixture of semiconductors and/or dopants. Useful specific semiconductor materials include, but are not limited to, Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, and GaInAsP. Porous silicon semiconductor materials are useful in the field of sensors and light emitting materials, such as light emitting diodes (LEDs) and solid state lasers. Impurities of semiconductor materials are atoms, elements, ions and/or molecules other than the semiconductor material(s) themselves or any dopants provided to the semiconductor material. Impurities are undesirable materials present in semiconductor materials which may negatively impact the electrical properties of semiconductor materials, and include but are not limited to oxygen, carbon, and metals including heavy metals. Heavy metal impurities include, but are not limited to, the group of elements between copper and lead on the periodic table, calcium, sodium, and all ions, compounds and/or complexes thereof.

In certain embodiments, the term "orientation" refers to a specific plane of a crystal structure, for example a semiconductor crystal. In certain embodiments, the term "direction" refers to a specific axis, or equivalent axes, of a crystal structure. In embodiments, use of the terms orientation and direction with a specific numeric indicator is intended to be consistent with use in the fields of crystallography and microfabrication.

"Quantum well" refers to an active layer of a light emitting diode device. In one embodiment, a quantum well is a layer of an LED device having a relatively narrow bandgap, surrounded on two sides by layers having a relatively wider bandgap. "Barrier layer" refers to a layer of a light emitting diode device which is positioned adjacent to a quantum well layer and has a larger bandgap than the quantum well material. In one embodiment, a quantum well layer is sandwiched between two barrier layers. In another embodiment, multiple quantum well layers are sandwiched between multiple barrier layers.

"Contact layer" refers to refers to a layer of a light emitting diode device, for example used to make electrical contact with external circuit components, such as electrical interconnects. "Spreader layer" refers to a layer of a light emitting diode device, for example useful for providing voltage or current from a contact layer across the area of a light emitting diode device. "Cladding layer" refers to a layer of a light emitting diode device, for example a layer surrounding the barrier layer and quantum well layer.

"Good electronic performance" and "high performance" are used synonymously in the present description and refer to devices and device components have electronic characteristics, such as field effect mobilities, threshold voltages and on-off ratios, providing a desired functionality, such as electronic signal switching and/or amplification. Exemplary printable elements exhibiting good electronic performance may have intrinsic field effect mobilities greater than or equal 100 $cm^2$ $V^{-1}$ $s^{-1}$, and for some applications, greater than or equal to about 300 $cm^2$ $V^{-1}$ $s^{-1}$. Exemplary transistors exhibiting good electronic performance may have device field effect mobilities great than or equal to about 100 $cm^2$ $V^{-1}$ $s^{-1}$, for some applications, greater than or equal to about 300 $cm^2$ $V^{-1}$ $s^{-1}$, and for other applications, greater than or equal to about 800 $cm^2$ $V^{-1}$ $s^{-1}$. Exemplary transistors of exhibiting good electronic performance may have threshold voltages less than about 5 volts and/or on-off ratios greater than about $1 \times 10^4$.

"Plastic" refers to any synthetic or naturally occurring material or combination of materials that can be molded or shaped, generally when heated, and hardened into a desired shape. Useful plastics include, but are not limited to, polymers, resins and cellulose derivatives. In the present description, the term plastic is intended to include composite plastic materials comprising one or more plastics with one or more additives, such as structural enhancers, fillers, fibers, plasticizers, stabilizers or additives which may provide desired chemical or physical properties.

"Prepolymer" refers to a material which is a polymer precursor and/or a material which, when cured, is a polymer. A "liquid prepolymer" refers to a prepolymer which exhibits one or more properties of a liquid, for example flow properties. Specific prepolymers include, but are not limited to, photocurable polymers, thermally curable polymers and photocurable polyurethanes.

"Curing" refers to a process by which a material is transformed such that the transformed material exhibits one or more properties different from the original, non-transformed material. In some embodiments, a curing process allows a material to become solid or rigid. In an embodiment, curing transforms a prepolymer material into a polymer material. Useful curing processes include, but are not limited to, exposure to electromagnetic radiation (photocuring processes), for example exposure to electromagnetic radiation of a specific wavelength or wavelength range (e.g., ultraviolet or infrared electromagnetic radiation); thermal curing processes, for example heating to a specific temperature or within a specific temperature range (e.g., 150° C. or between 125 and 175° C.); temporal curing processes, for example waiting for a specified time or time duration (e.g., 5 minutes or between 10 and 20 hours); drying processes, for example removal of all or a percentage of water or other solvent molecules; and any combination of these. For example, one embodiment for curing a silver epoxy comprises heating the silver epoxy to 150° C. for a duration of 5 minutes.

"Polymer" refers to a molecule comprising a plurality of repeating chemical groups, typically referred to as monomers. Polymers are often characterized by high molecular masses. Useful polymers include organic polymers and inorganic polymers, both of which may be in amorphous, semi-amorphous, crystalline or partially crystalline states. Polymers may comprise monomers having the same chemical composition or may comprise a plurality of monomers having different chemical compositions, such as a copolymer. Cross linked polymers having linked monomer chains are also useful for some embodiments. Useful polymers include, but are not limited to, plastics, elastomers, thermoplastic elastomers, elastoplastics, thermostats, thermoplastics and acrylates. Exemplary polymers include, but are not limited to, acetal polymers, biodegradable polymers, cellulosic polymers, fluoropolymers, nylons, polyacrylonitrile polymers, polyamide-imide polymers, polyimides, polyarylates, polybenzimidazole, polybutylene, polycarbonate, polyesters, polyetherimide, polyethylene, polyethylene copolymers and modified polyethylenes, polyketones, poly (methyl methacrylate, polymethylpentene, polyphenylene oxides and polyphenylene sulfides, polyphthalamide, polypropylene, polyurethanes, styrenic resins, sulfone based resins, vinyl-based resins or any combinations of these.

"Elastomer" refers to a polymeric material which can be stretched or deformed and return to its original shape without substantial permanent deformation. Elastomers commonly undergo substantially elastic deformations. Useful elastomers may comprise polymers, copolymers, composite materials or mixtures of polymers and copolymers. An elastomeric layer refers to a layer comprising at least one elastomer. Elastomeric layers may also include dopants and other non-elastomeric materials. Useful elastomer embodiments include, but are not limited to, thermoplastic elastomers, styrenic materials, olefenic materials, polyolefin, polyurethane thermoplastic elastomers, polyamides, synthetic rubbers, PDMS, polybutadiene, polyisobutylene, poly (styrene-butadiene-styrene), polyurethanes, polychloroprene and silicones.

"Transfer device" or "transfer substrate" refers to a substrate, device or device component capable of and/or configured for receiving and/or relocating an element or array of elements, such as printable elements. Useful transfer devices include conformal transfer devices, such as devices having one or more contact surfaces capable of establishing conformal contact with elements undergoing transfer. An elastomeric stamp and/or transfer device is useful with a variety of the methods and devices described herein. Useful elastomeric transfer devices include, but are not limited to, elastomeric stamps, composite elastomeric stamps, an elastomeric layer, a plurality of elastomeric layers and an elastomeric layer coupled to a substrate such as a glass, ceramic, metal or polymer substrate.

"Target substrate" is used broadly to refer to the desired final substrate that will support the transferred structure. In an embodiment, the target substrate is a device substrate. In an embodiment, the target substrate is a device component or element that is itself supported by a substrate.

"Large area" refers to an area, such as the area of a receiving surface of a substrate used for device fabrication, greater than or equal to about 36 square inches.

"Pre-metalized" refers to a structure which includes metallic layers, components or features.

"Pre-patterned" refers to a structure which includes one or more devices, components or relief features.

"Optical communication" refers to a configuration of two or more elements wherein one or more beams of electromagnetic radiation are capable of propagating from one element to the other element. Elements in optical communication may be in direct optical communication or indirect optical communication. "Direct optical communication" refers to a configuration of two or more elements wherein one or more beams of electromagnetic radiation propagate directly from a first device element to another without use of optical components for steering and/or combining the beams. "Indirect optical communication" refers to a configuration of two or more elements wherein one or more beams of electromagnetic radiation propagate between two elements via one or more device components including, but not limited to, wave guides, fiber optic elements, reflectors, filters, prisms, lenses, gratings and any combination of these device components.

"Electrical contact" and "electrical communication" refers to the arrangement of one or more objects such that an electric current efficiently flows from one object to another. For example, in some embodiments, two objects having an electrical resistance between them less than 100Ω are considered in electrical communication with one another. An electrical contact can also refer to a component of a device or object used for establishing electrical communication with external devices or circuits, for example an electrical interconnection.

"Electrical resistivity" refers to a property of a material characteristic of the resistance to flow of electrons through the material. In certain embodiments, the resistivity of a material ($\rho$) is related to the resistance (R) of a length of material (L) having a specific cross sectional area (A), e.g., $\rho = R \times A/L$.

"Electrical interconnection" and "electrical interconnect" refers to a component of an electrical device used for providing electrical communication between two or more device components. In some embodiments, an electrical interconnect is used to provide electrical communication between two device components spatially separated from one another, for example spatially separated by a distance greater than 50 nm, for some applications greater than 100 nm, for other applications greater than 1 µm, and for yet other applications greater than 50 µm. "Electrode contact" refers to a component of an electronic device or device component to which an electrical interconnect attaches or provides electrical communication to or from.

"Embed" refers to a process by which one object or device is buried, conformally surrounded or otherwise placed or positioned within or below the surface another object, layer or material. "Encapsulate" refers to the orientation of one structure such that it is entirely surrounded by one or more other structures. "Partially encapsulated" refers to the orientation of one structure such that it is partially surrounded by one or more other structures.

"Replicate" refers to a process by which one or more relief features are transferred and/or recreated during casting, molding, embedding, or embossing processes. Replicated features generally resemble the features they originate from except that the replicated features represent the negative of the original features; that is where the original features are raised features, the replicated features are recessed features and where the original features are recessed features, the replicated features are raised features.

"Relief feature" refers to portions of an object or layer exhibiting differences in elevation and slope between the higher and lower parts of the surface of a given area or portion of the object or layer. "Raised features" refer to relief features which extend above the surface or average surface level of an object or layer or relief features which have elevations higher than other portions of the surface of an object or layer. "Recessed feature" refer to relief features which extend below the surface or average surface level of an object or layer or relief features which have elevations lower than other portions of the surface of an object or layer.

"Conformal contact" refers to contact established between surfaces, coated surfaces, and/or surfaces having materials deposited thereon which may be useful for transferring, assembling, organizing and integrating structures (such as printable elements) on a substrate surface. In one aspect, conformal contact involves a macroscopic adaptation of one or more contact surfaces of a conformal transfer device to the overall shape of a substrate surface or the surface of an object such as a printable element. In another aspect, conformal contact involves a microscopic adaptation of one or more contact surfaces of a conformal transfer device to a substrate surface leading to an intimate contact without voids. The term conformal contact is intended to be consistent with use of this term in the art of soft lithography. Conformal contact may be established between one or more bare contact surfaces of a conformal transfer device and a substrate surface. Alternatively, conformal contact may be established between one or more coated contact surfaces, for example contact surfaces having a transfer material, printable element, device component, and/or device deposited thereon, of a conformal transfer device and a substrate surface. Alternatively, conformal contact may be established between one or more bare or coated contact surfaces of a conformal transfer device and a substrate surface coated with a material such as a transfer material, solid photoresist layer, prepolymer layer, liquid, thin film or fluid.

"Bind" and "bond" refers to the physical attachment of one object to another. Bind and bound can also refer the retention of one object on another. In one embodiment an object can bind to another by establishing a force between the objects. In some embodiments, objects are bound to one another through use of an adhesion layer. In one embodiment, an adhesion layer refers to a layer used for establishing a bonding force between two objects.

"Placement accuracy" refers to the ability of a transfer method or device to transfer a printable element, to a selected position, either relative to the position of other device components, such as electrodes, or relative to a selected region of a receiving surface. "Good placement accuracy" refers to methods and devices capable of transferring a printable element to a selected position relative to another device or device component or relative to a selected region of a receiving surface with spatial deviations from the absolutely correct position less than or equal to 50 microns, more preferably less than or equal to 20 microns for some applications and even more preferably less than or equal to 5 microns for some applications. Methods and devices described herein include those comprising at least one printable element transferred with good placement accuracy.

"Fidelity" refers to a measure of how well a selected pattern of elements, such as a pattern of printable elements, is transferred to a receiving surface of a substrate. Good fidelity refers to transfer of a selected pattern of elements wherein the relative positions and orientations of individual elements are preserved during transfer, for example wherein spatial deviations of individual elements from their positions in the selected pattern are less than or equal to 500 nanometers, more preferably less than or equal to 100 nanometers.

"Undercut" refers to a structural configuration wherein the bottom surfaces of an element, such as a printable element, bridge element and/or anchor element, are at least partially detached from or not fixed to another structure, such as a mother wafer or bulk material. Entirely undercut refers to a refers to a structural configuration wherein the bottom surfaces of an element, such as printable element, bridge element and/or anchor element, is completely detached from another structure, such as a mother wafer or bulk material. Undercut structures may be partially or entirely free standing structures. Undercut structures may be partially or fully supported by another structure, such as a mother wafer or bulk material, that they are detached from. Undercut structures may be attached, affixed and/or connected to another structure, such as a wafer or other bulk material, at surfaces other than the bottom surfaces.

"Anchor" refers to a structure useful for connecting or tethering one device or device component to another. "Anchoring" refers to a process resulting in the connection or tethering of one device or device component to another.

"Homogeneous anchoring" refers to an anchor that is an integral part of the functional layer. In general, methods of making transferable elements by homogenous anchoring systems is optionally by providing a wafer, depositing a sacrificial layer on at least a portion of a wafer surface, defining semiconductor elements by any means known in the art, and defining anchor regions. The anchor regions correspond to specific regions of the semiconductor element. The anchor regions can correspond to a geometrical configuration of a semiconductor layer, e.g., anchors defined by relatively large surface areas and are connected to transferable elements by bridge or tether elements. Such geometry provides a means for facilitating lift-off of specific non-anchored regions for either single-layer or multi-layer embodiments. Alternatively, anchors correspond to semiconductor regions that are attached or connected to the underlying wafer. Removing the sacrificial layer provides a means for removing or transferring semiconductor elements while the portion of semiconductor physically connected to the underlying wafer remains.

"Heterogeneous anchoring" refers to an anchor that is not an integral part of the functional layer, such as anchors that are made of a different material than the semiconductor layer or is made of the same material, but that is defined after the transferable semiconductor elements are placed in the system. One advantage of heterogeneous anchoring compared to homogeneous anchoring relates to better transfer defining strategies and further improvement to the effective useable wafer footprint. In the heterogeneous strategy embodiment, a wafer is provided, the wafer is coated with a sacrificial layer, semiconductor elements are defined, and heterogeneous anchor elements are deposited that anchor semiconductor regions. In an aspect, the anchor is a resist material, such as a photoresist or SiN (silicon nitride), or other material that has a degree of rigidity capable of anchoring and resisting a lift-off force that is not similarly resisted by non-anchored regions. The anchor may span from the top-most semiconductor layer through underlying layers to the underlying wafer substrate. Removal of sacrificial layer provides a means for removing unanchored regions while the anchored regions remain connected to the wafer, such as by contact transfer, for example. In another embodiment, for a multi-layer system, the anchor provides anchoring of a top layer to an underlying semiconductor layer. Alternatively, the anchoring system is for single-layer semiconductor layer systems.

"Carrier film" refers to a material that facilitates separation of layers. The carrier film may be a layer of material, such as a metal or metal-containing material positioned adjacent to a layer that is desired to be removed. The carrier film may be a composite of materials, including incorporated or attached to a polymeric material or photoresist material, wherein a lift-off force applied to the material provides release of the composite of materials from the underlying layer (such as a functional layer, for example).

"Dielectric" and "dielectric material" are used synonymously in the present description and refer to a substance that is highly resistant to flow of electric current. Useful dielectric materials include, but are not limited to, $SiO_2$, $Ta_2O_5$, $TiO_2$, $ZrO_2$, $Y_2O_3$, $Si_3N_4$, STO, BST, PLZT, PMN, and PZT.

"Device field effect mobility" refers to the field effect mobility of an electronic device, such as a transistor, as computed using output current data corresponding to the electronic device.

"Fill factor" refers to the percentage of the area between two elements, such as between two electrodes, that is occupied by a material, element and/or device component. In one embodiment, two electrodes are provided in electrical contact with one or more printable semiconductor elements that provide a fill factor between first and second electrodes greater than or equal to 20%, preferably greater than or equal to 50% for some applications and more preferably greater than or equal to 80% for some applications.

"Collecting" and "concentrating", as applied to optics and optical components, refers to the characteristic of optical components and device components that collect light from a first area, in some cases a large area, and optionally direct that light to another area, in some cases a relatively smaller area. In the context of some embodiments, collecting and concentrating optical components and/or optical components are useful for light detection or power harvesting by printed solar cells or photodiodes.

"Conductive material" refers to a substance or compound possessing an electrical resistivity which is typical of or equivalent to that of a metal, for example copper, silver or aluminum. In embodiments, the electrical resistivity of a conductive material is selected over the range of $1\times10^{-10}$ to $1\times10^{-2}$ $\Omega\cdot cm$. In the present description, use of the term conductive material is intended to be consistent with use of this term in the art of electronic devices and electric circuits. In embodiments, conductive materials are useful as electrical interconnections and/or for providing electrical communication between two devices. A "conductive paste" refers to a conductive material comprising a mixture which is generally soft and malleable. In some embodiments, cured conductive pastes lose their soft and malleable nature and generally exhibit properties of a solid or a monolithic body. Exemplary conductive pastes comprise metal micro- and/or nano-particles. Silver epoxy refers to a conductive paste comprising micro- and/or nano particles including metallic silver (Ag) and which, when cured, exhibits a low electrical resistivity, for example an electrical resistivity lower than $1\times10^{-5}$ $\Omega\cdot cm$ or selected over the range of $1\times10^{-10}$ to $1\times10^{-5}$ $\Omega\cdot cm$.

"Fill" and "filling" refer to a process of depositing a material into a recessed feature. In one embodiment, a recessed region is filled by scraping material across and into the recessed feature. A filling tool generally refers to a device for moving material into a recessed feature. In an embodiment, a filling tool refers to a device for scraping material across and/or into a recessed region. In a specific embodiment, a filling tool comprises a layer or solid body of PDMS. For certain embodiments, a filling process is conceptually similar to a screen printing process where a material is scraped across a recessed feature by a tool or device having dimensions larger than the recessed feature, thereby at least partially filling the recessed feature with the material.

"Align" refers to a process by which two objects are arranged with respect to one another. "Aligned off center" refers to a process by which the centers of two objects or two areas are arranged such that the two centers are not coincident with respect to one or more spatial dimensions. For certain embodiments, the term aligned off center refers to alignment of the center of two objects such that the centers of the objects are spatially separated by a distance greater than 50 nm, for some applications greater than 100 nm, for other applications greater than 1 μm, and for yet other applications greater than 50 μm.

"Young's modulus" refers to a mechanical property of a material, device or layer which refers to the ratio of stress to strain for a given substance. Young's modulus may be provided by the expression;

$$E = \frac{(\text{stress})}{(\text{strain})} = \left(\frac{L_0}{\Delta L} \times \frac{F}{A}\right)$$

where E is Young's modulus, $L_0$ is the equilibrium length, $\Delta L$ is the length change under the applied stress, F is the force applied and A is the area over which the force is applied. Young's modulus may also be expressed in terms of Lame constants via the equation:

$$E = \frac{\mu(3\lambda + 2\mu)}{\lambda + \mu}$$

where μ and λ are Lame constants. High Young's modulus (or "high modulus") and low Young's modulus (or "low modulus") are relative descriptors of the magnitude of Young's modulus in a give material, layer or device. In the present description, a High Young's modulus is larger than a low Young's modulus, about 10 times larger for some applications, more preferably about 100 times larger for other applications and even more preferably about 1000 times larger for yet other applications.

Described herein are printable structures and methods for making, assembling and arranging electronic devices. A number of the methods described herein are useful for assembling electronic devices where one or more device components are embedded in a polymer which is patterned during the embedding process with trenches for electrical interconnects between device components. Some methods described herein are useful for assembling electronic devices by printing methods, such as by dry transfer contact printing methods. Also described herein are GaN light emitting diodes and methods for making and arranging GaN light emitting diodes, for example for display or lighting systems.

FIG. 24 illustrates an exemplary embodiment of a method for assembling an electronic device. First, one or more electronic device components 2401 are provided. In this embodiment, the electronic device components are printable device components including electrode contacts 2402. A transfer substrate is also provided with a patterned surface 2403. In this embodiment, the patterned surface contains features for contacting and retrieving the device components onto the transfer substrate. The patterned surface also contains raised features 2404 which represent the orientation and configuration of electrical interconnects to be fabricated between some of the electronic device components.

Next, the patterned transfer substrate is brought into contact with the electronic device components 2401, where they are retrieved onto the transfer substrate. A host substrate having a prepolymer layer 2405 thereon is then provided to receive the electronic device components 2401. The patterned transfer substrate 2403 having the electronic device components 2401 thereon is brought into contact with the prepolymer layer 2405. The electronic device components 2401 are embedded into the prepolymer layer 2405 and, during this step, the patterned surface of the transfer substrate 2403 is also brought into contact with the prepolymer layer 2405. The raised features 2404 of the patterned surface are also embedded into the prepolymer layer 2405, at least partially, after which the prepolymer layer 2405 is cured into a hardened polymer layer 2406. As the prepolymer layer 2405 is cured, the embedded electronic device components 2401 are fixed into place within the polymer 2406, and the raised features of the patterned transfer surface are replicated as recessed features 2407 in the polymer layer 2406. Once the polymer layer 2406 is cured, the patterned transfer substrate 2403 and the polymer layer 2406 are separated and the electronic device components 2401 are retained in the polymer layer 2406. Further, the polymer layer includes a number of recessed features 2407.

Next, the recessed features 2407 are filled with a conducting material to form electrical interconnects 2408 between the electronic device components 2401. In one embodiment, a line of silver epoxy conductive paste is provided on the surface of the polymer. The silver epoxy is then filled into the recessed features by dragging a filling tool across the surface of the polymer. Optionally, the filling tool is dragged across the surface of the polymer multiple times and in multiple directions to fill the recessed features. If necessary or desired, additional silver epoxy can be provided on the surface and the dragging steps repeated to ensure that the recessed features are filled to the desired level. Once filled, the conductive paste is cured to form rigid electrical interconnections.

The invention may be further understood by the following non-limiting examples.

Example 1: Printed Assemblies of Inorganic Light-Emitting Diodes for Deformable and Semitransparent Displays This example describes methods for creating microscale inorganic light-emitting diodes (LEDs) and for assembling and interconnecting them into unusual display and lighting systems. The LEDs use specialized epitaxial semiconductor layers that allow delineation and release of large collections of ultrathin devices. Diverse shapes are possible, with dimensions from micrometers to millimeters, in either flat or "wavy" configurations. Printing-based assembly methods can deposit these devices on substrates of glass, plastic, or rubber, in arbitrary spatial layouts and over areas that can be much larger than those of the growth wafer. The thin geometries of these LEDs enable them to be interconnected by conventional planar processing techniques. Displays, lighting elements, and related systems formed in this manner can offer interesting mechanical and optical properties.

Display devices represent ubiquitous, central components of nearly all consumer electronics technologies. Organic light emitting diodes (OLEDs) are rapidly emerging as an attractive alternative to backlit liquid crystals due to their comparatively high refresh rates, contrast ratios, power efficiencies, and capacity for vibrant color rendering. Inorganic light emitting diodes (ILEDs) can also form displays, with properties such as brightness, lifetime, and efficiency that can exceed those possible with OLEDs. These displays exist, however, only in ultralarge-area, low-resolution formats (square meters; billboard displays), limited by processing and assembly procedures that do not scale effectively to small (<~200 μm by 200 μm), thin (<~200 μm) light emitters or to dense, high-pixel count arrays. An ability to replace existing methods for fabricating ILEDs (i.e., wafer sawing, serial pick-and-place, wire bonding, and packaging on a device-by-device basis) and for incorporating them into displays (i.e., robotic assembly into tiles followed by interconnection using large quantities of bulk wiring) with those that more closely resemble the planar, batch processing of OLEDs greatly expands the application opportunities. Examples include not only ILED displays for desktop monitors, home theater systems, and instrumentation gauging, but also, when implemented in flexible or stretchable forms, wearable health monitors or diagnostics and biomedical imaging devices. In microscale sizes, such ILEDs can also yield semitransparent displays, with the potential for bidirectional emission characteristics, for vehicle navigation, heads-up displays, and related uses.

This example provides routes to create ultrathin, ultrasmall ILEDs in flat or "wavy" geometries and to assemble them into addressable arrays using scalable processing techniques, on substrates ranging from glass to plastic and rubber. The strategy includes four components: (i) epitaxial semiconductor multilayers designed for lateral delineation and release from a source wafer to yield isolated arrays of ILEDs, each of which remains tethered to the wafer by polymeric "breakaway" anchor structures; (ii) printing techniques for manipulating the resulting ILEDs in schemes that enable formation of large-scale arrays on foreign substrates and in arbitrary spatial layouts; (iii) planar processing methods for establishing electrical interconnects to the devices, in direct or matrix addressable configurations; and (iv) integration strategies capable of yielding ILED displays in flexible or stretchable formats and with conventional, semitransparent, or bidirectional emission characteristics. Certain aspects build on previously reported procedures for etching and manipulating epitaxial semiconductor layers and for fabricating flexible and stretchable electronics.

Figure 1:
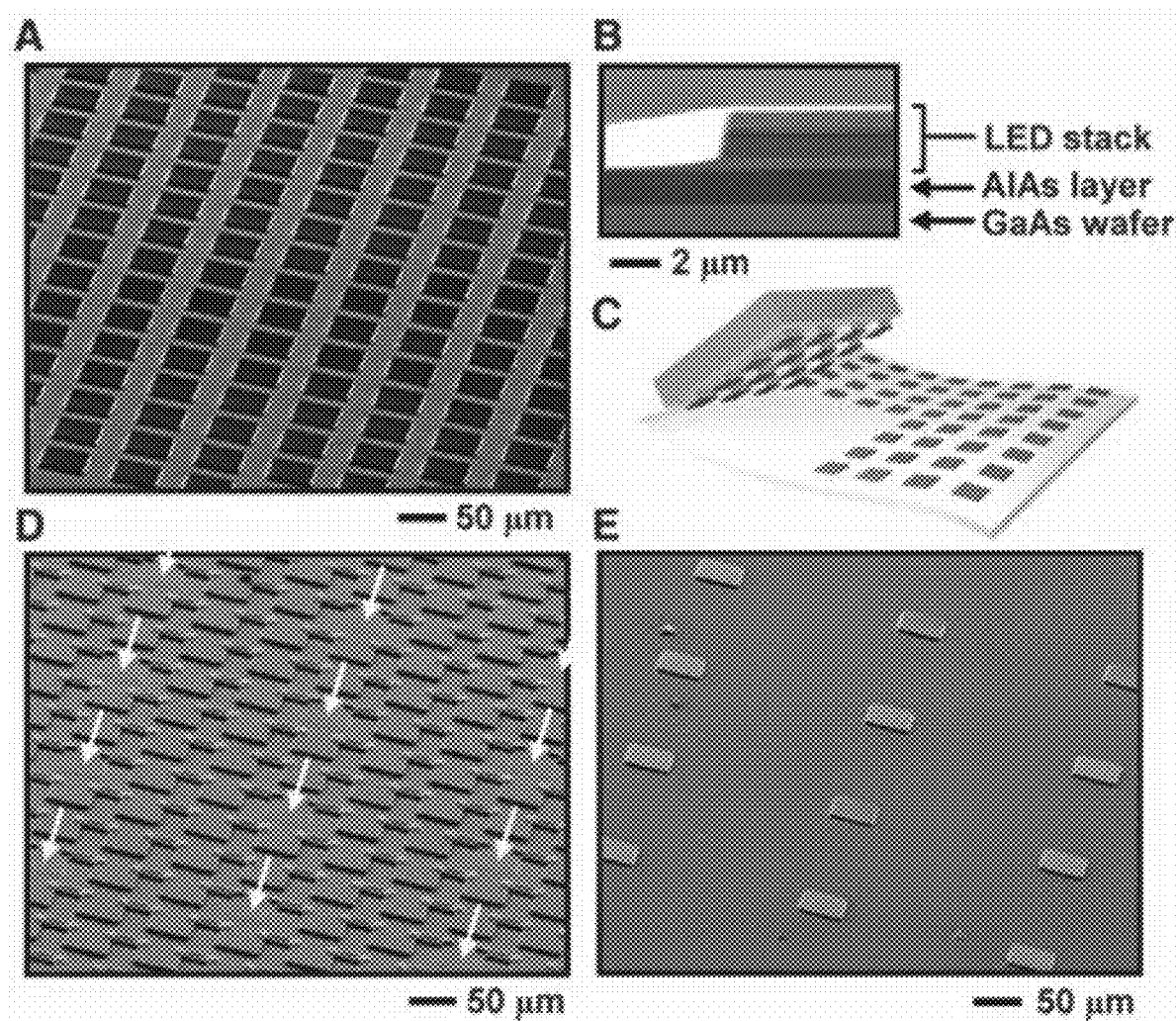
FIG. 1. (A) SEM image of a square array of AlInGaP LED structures (50 μm by 50 μm) created by vertical, patterned etching through an epitaxial multilayer stack grown on a GaAs wafer. (B) Cross-sectional SEM view of one of these structures, showing the LED semiconductor layers (quantum wells, as well as cladding, spreading, and contact layers) on a sacrificial epilayer of AlAs. (C) Schematic illustration of a printing-based assembly method for transferring collections of LEDs (gray) released from the GaAs wafer to a target substrate (shown here as a flexible sheet). (D) SEM image of the GaAs wafer after removing a set of LEDs (indicated by white arrows) with a stamp. (E) SEM image of a region of the target substrate printed with this stamp. (F) Angled-view SEM image of an individual LED (i.e., ILED) from the array in (D). A pair of "breakaway" photoresist (PR) anchors at the two far corners of the device holds it above the GaAs wafer in the suspended configuration of a diving board, for ease of liftoff with a stamp. The white arrow points to the region of removed AlAs. (G) SEM image of a dense collection of such devices on a piece of a GaAs wafer. The black arrow and white dot indicate, roughly, the region of this chip that corresponds to the image of (F). (H) Optical image of a target substrate printed with sparse arrays of devices at different spacings, derived from the chip shown in (G). (I) Large-scale collection of ILEDs (1600 devices, in a square array with pitch of 1.4 mm) printed onto a thin, flexible sheet of plastic, shown here wrapped onto a cylindrical glass substrate (main panel). The inset shows a similar collection of ILEDs (1600 devices, in a square array with pitch of 1.4 mm) printed onto a plate of glass. For these cases, relatively large ILEDs were selected for ease of viewing; devices with dimensions of (E) are invisible at this magnification.
Figure 1:
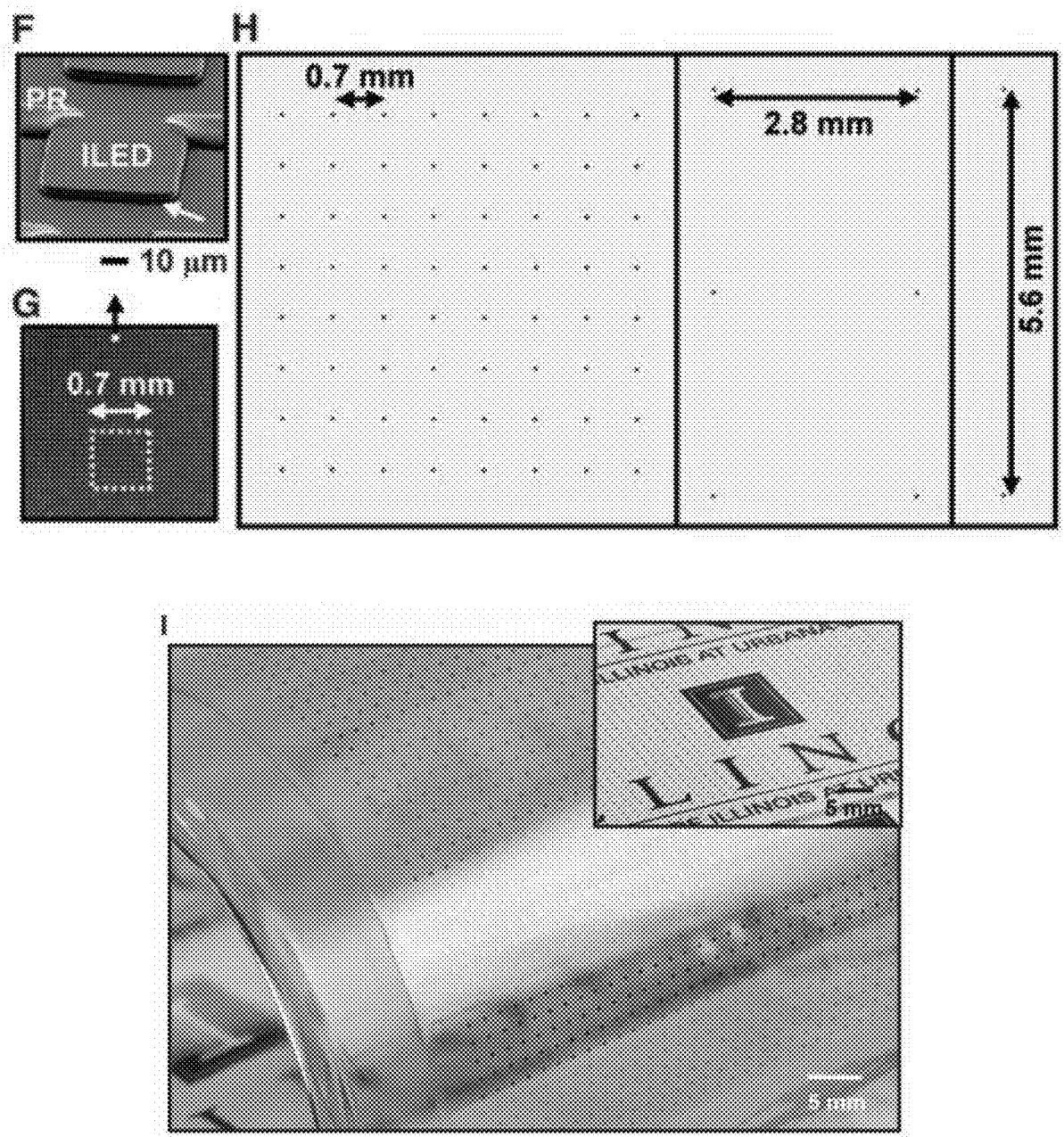

FIG. 1 presents aspects of the first two of the components. The epitaxial semiconductor layers include AlInGaP quantum well structures (6-nm-thick $In_{0.56}Ga_{0.44}P$ wells, with 6-nm-thick barriers of $Al_{0.25}Ga_{0.25}In_{0.5}P$ on top and bottom), cladding films (200-nm thick layers of $In_{0.5}Al_{0.5}P$:Zn and $In_{0.5}Al_{0.5}P$:Si for the p and n sides, respectively), spreaders (800-nm-thick layers of $Al_{0.45}Ga_{0.55}As$:C and $Al_{0.45}Ga_{0.55}As$:Si for the p and n sides, respectively), and contacts (5-nm-thick layer of GaAs:C and 500-nm-thick layer of GaAs:Si for the p and n sides, respectively), for a total thickness of ~2.523 μm, all grown on AlAs (1500-nmthick layer of $Al_{0.96}Ga_{0.04}As:Si$) on a GaAs substrate (FIG. 5). The AlAs can be removed by etching with hydrofluoric (HF) acid, in procedures that do not alter the overlying layers or the underlying substrate. The process for defining the ILEDs first involves forming a pattern of vertical trenches through the epitaxial layers by inductively coupled plasma reactive ion etching through a mask of $SiO_2$ defined photolithographically (FIG. 6). This step determines the lateral geometries of the devices (FIG. 5). FIGS. 1, A and B, shows top and cross-sectional scanning electron microscope (SEM) images collected after this etching process for a representative case, where the device islands in FIG. 1 are 50 μm by 50 μm. Creating a pattern of photoresist posts (i.e., "breakaway" anchors) located at two of the four corners of each island, followed by immersion in concentrated HF, leads to the undercut release of an organized array of ILEDs. The anchors hold the devices in their lithographically defined locations to prevent liftoff into the etching bath, even after complete undercut (FIG. 6). Next, an automated printing tool (FIG. 7) brings a soft elastomeric stamp with features of relief embossed onto its surface into aligned contact with a selected set of these ILEDs. Peeling the stamp away fractures the photoresist anchors and leaves the devices adhered via Van der Waals interactions to the raised regions of relief. FIGS. 1, C and D, shows schematic illustrations of the printing process and an SEM image of an array of anchored ILEDs on the source wafer after one cycle of printing (FIG. 8). The white arrows in FIG. 1D highlight the collection of ILEDs removed by this process, corresponding to every third device along the two orthogonal axes of the square array. FIG. 1E provides an SEM image of these devices printed onto a glass substrate. The engineering design of the breakaway anchors is such that they are sufficiently robust to hold the ILEDs in their lithographically defined locations during the undercut etching and drying processes but sufficiently fragile to enable high-yield liftoff during printing. Three design aspects are the use of (i) a pair of anchors on the same side of each ILED, to yield, after undercut, suspended, "diving board" layouts (FIG. 1F) that enable transfer of torques large enough to fracture the photoresist upon peel-back of the stamp; (ii) stamps with relief structures that are slightly smaller than the ILEDs and are offset from the centers of the devices to maximize these torques and also to minimize overlap with the anchors; and (iii) photoresist structures that fracture more readily than the semiconductor material. This type of anchoring scheme (i.e., heterogeneous anchoring) is much more efficient in active materials utilization and versatile in design choices than corresponding methods demonstrated previously for transistors and solar cells, where peripheral parts of the devices themselves serve as the anchors (i.e., homogeneous anchoring). Conventional wafer dicing and pick-and-place methods are not suitable for devices with the thicknesses and dimensions in the range reported here, due to challenges associated with wafer utilization, device fragility, and size. Such techniques also lack the high-throughput, parallel operation of the type of printing methods described above.

FIG. 1G shows a micrograph of a densely packed array of anchored, undercut ILEDs on a source wafer. FIG. 1H shows sparse assemblies of these devices formed by printing in a step-and-repeat fashion from this wafer to a glass substrate, coated with a thin (~10 mm) layer of poly(dimethylsiloxane) (PDMS) to promote dry, conformal adhesion. As examples of high yields, large areas, and compatibility with plastic substrates, FIG. 11 presents images of collections of ILEDs printed onto a thin sheet of polyethylene terephthalate (PET, 50 μm thick), shown as wrapped around a cylindrical glass support (1600 devices, in a square array with pitch of 1.4 mm; radius of cylinder ~25 mm) and onto a plate of glass (inset; 1600 devices, in a square array with pitch of 1.4 mm). The overall fabrication yields, including delineation and undercut of the ILEDs and subsequent printing of them onto the target substrates, were 100% in both cases. The devices were selected to have sizes (i.e., 250 μm by 250 μm) large enough to be visible in the images; those with sizes of FIG. 1D are too small to be seen clearly at these scales.

Figure 2:
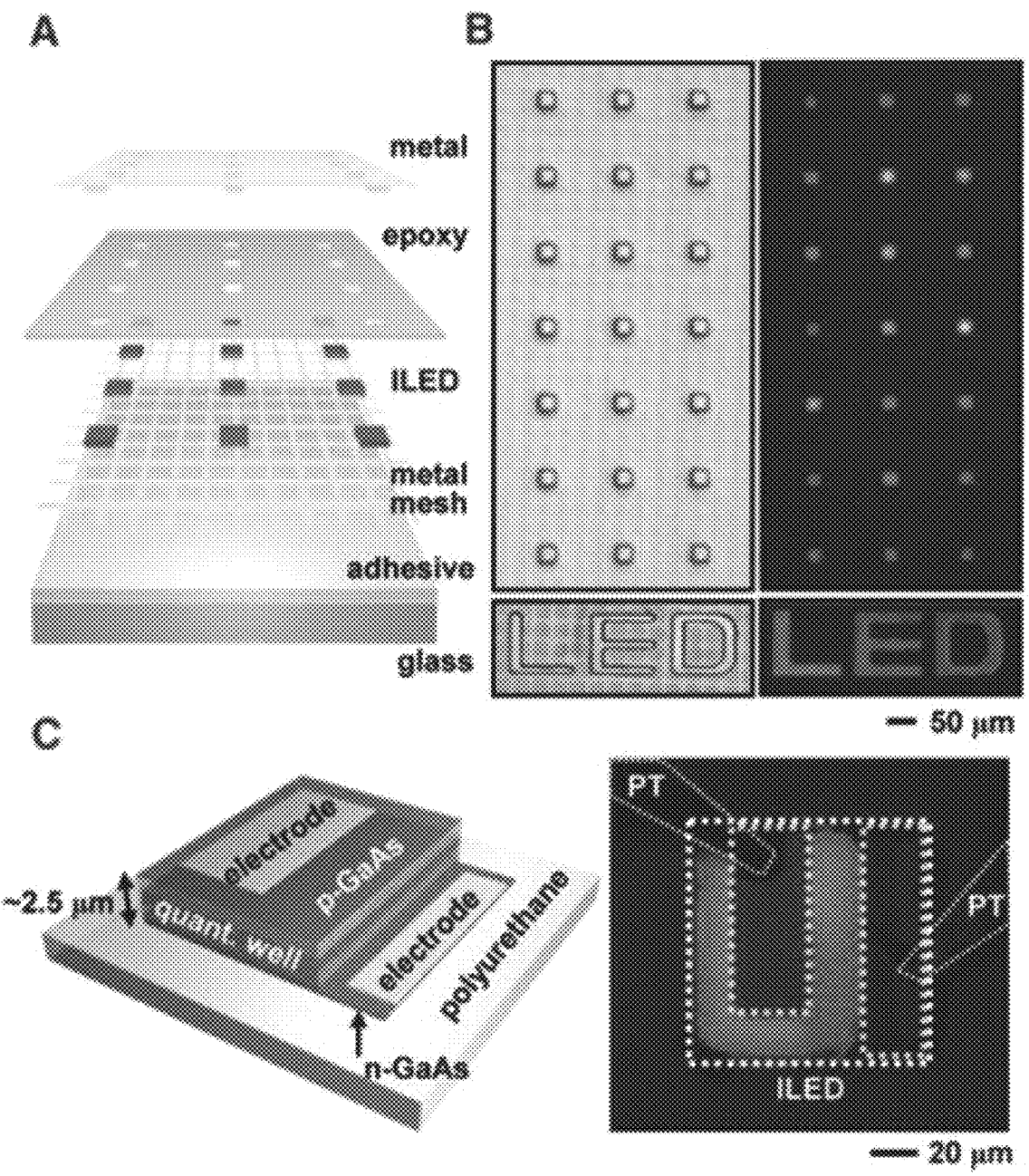
FIG. 2. (A) Exploded view schematic illustration of an array of ILEDs contacted by a metal mesh (bottom; n contacts) and a metal film (top; p contacts). A thin adhesive layer of PDMS facilitates printing onto the glass substrate. A photopatterned layer of epoxy on top of the devices prevents shorting of the top film to the bottom mesh. (B)Optical micrographs of an array of ILEDs (top: 25 μm by 25 μm, square geometries; bottom: characters "LED") in their off state with frontside illumination (left) and in their on state without illumination (right). (C) Schematic illustration of an ILED with integrated ohmic contacts (left) and optical image of an operating device (right), showing uniform emission characteristics at all regions not directly blocked by the contacts or probe tips. The areas delineated by yellow and white dashed boxes correspond to the contact electrodes and the device periphery, respectively. The regions labeled "PT" correspond to the probe tips used to evaluate the device operation. (D) Current-voltage-emission characteristics of a representative device before undercut etching on the GaAs wafer, and after transfer printing onto a polyurethane-coated glass slide. The inset provides a histogram of the bias voltages needed to produce currents of 0.1 mA in a collection of devices. (E) Spectral characteristics of emission for a typical device on the wafer and after transfer printing.
Figure 2:
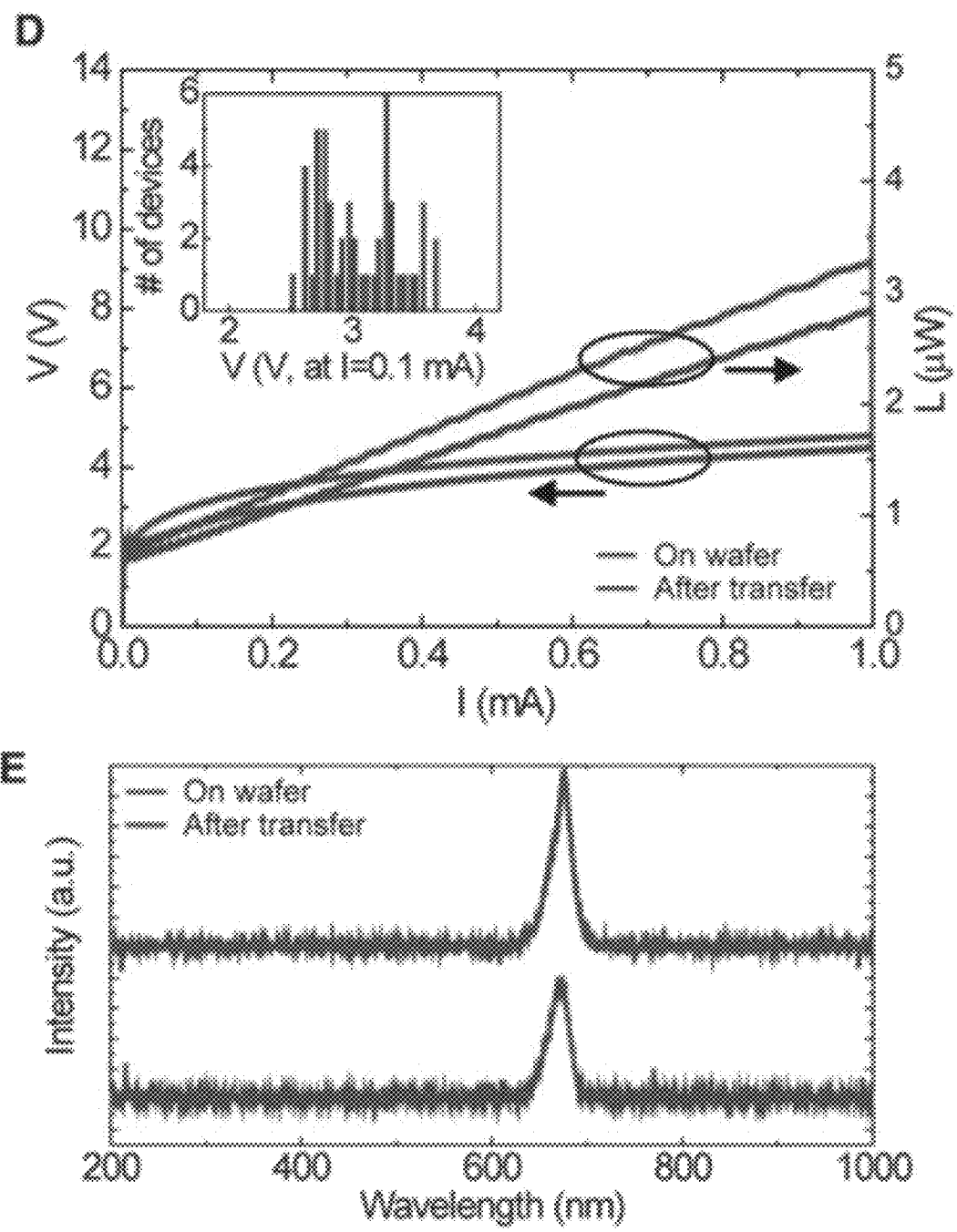
Figure 3:
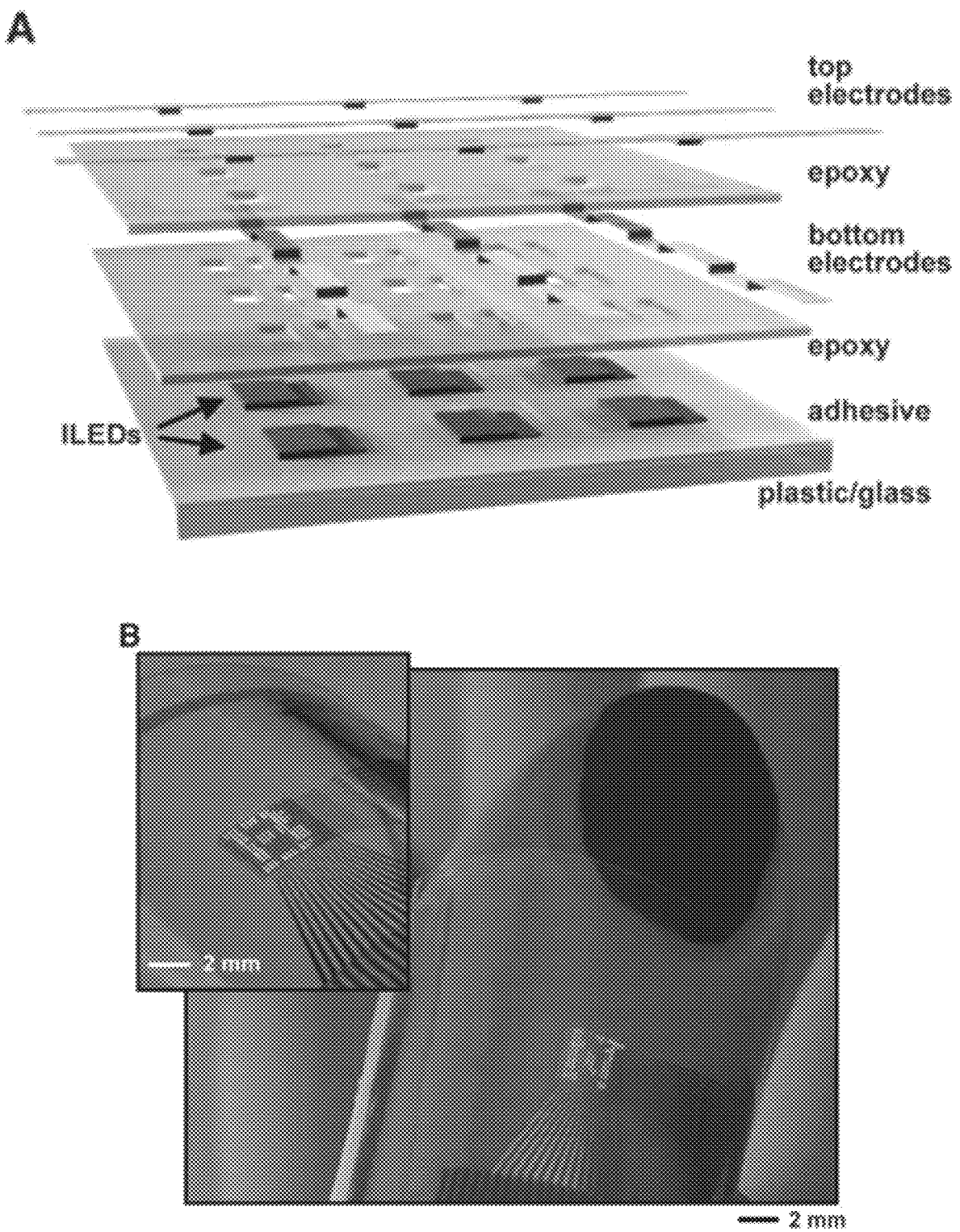
FIG. 3. (A) Schematic illustration of a planar scheme for interconnecting a printed array of ILEDs in a passive matrix layout. Coordinated control of voltages applied to the row and column electrodes allows operation in a passive matrix display mode. (B) Images of a flexible display that incorporates a 16 by 16 array of ILEDs in the layout shown in (A), on a sheet of plastic (PET), wrapped around the thumb of a mannequin hand (main panel; human scale; radius ~8 mm) and a cylindrical glass tube (inset; radius ~12 mm). External interface to control electronics occurs through ribbon cables bonded to column and row electrodes that emerge from the periphery of the display. (C) Image of a comparatively large, semitransparent display that uses a similar layout but with a sparse array of ILEDs on a glass substrate. The camera is focused on the paper in the background; the white dashed box illustrates the perimeter of the active region of the display. (D) Image of a similar device (bottom right) displaying a different pattern in front of a mirror (upper left), to illustrate the bidirectional emission property. In this system, the ILEDs represent only ~0.8% of the total area. The inset shows a magnified view of a region of the display in its off state, to illustrate the small areal coverage of the devices. The black arrow points to one of the ILEDs, which is barely visible at this magnification.
Figure 3:
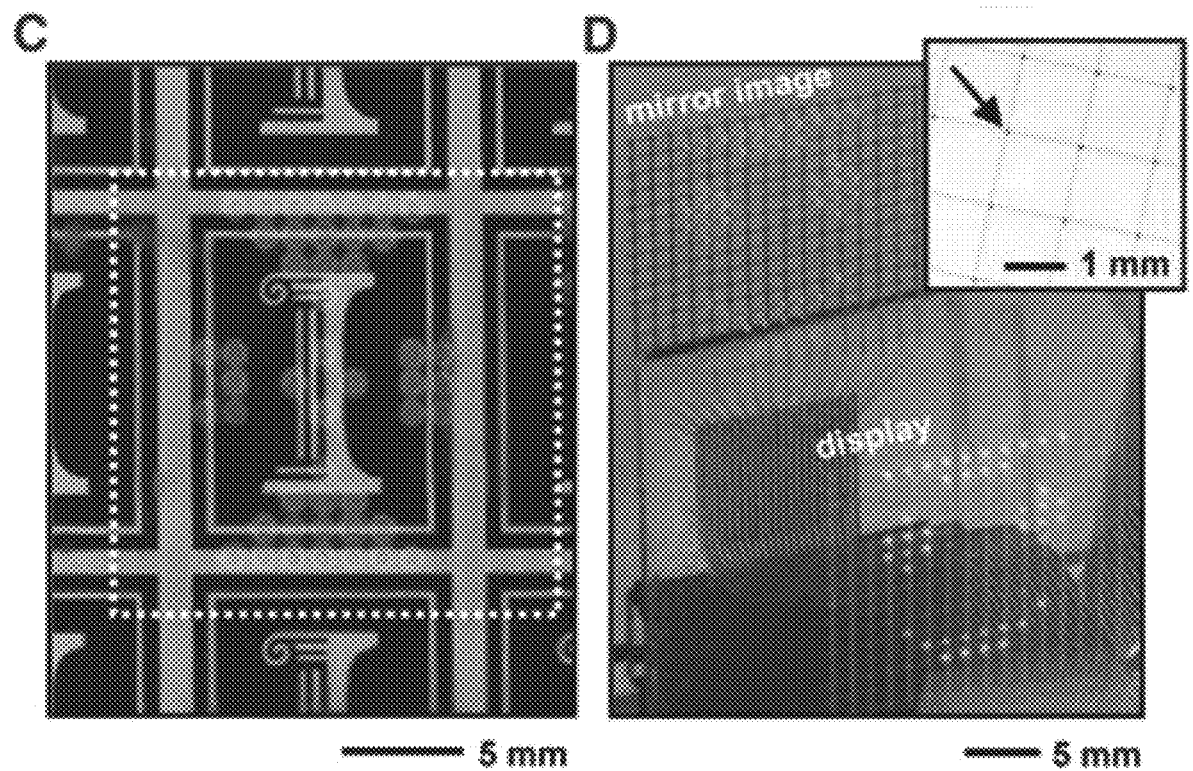

Establishing electrical connections to these printed ILEDs yields lighting elements or addressable displays. The small thickness (~2.5 μm) of the devices enables the use of conventional thin-film processing, thereby providing a route to displays and related devices that is simpler, more scalable, and applicable to much smaller pixel geometries than established wire bonding and packaging techniques. To demonstrate the most basic scheme, we printed a collection of devices onto a thin, metal mesh on a transparent substrate, to form bottom contacts, and then established separate top contacts using a planar lithographic process (FIG. 9). FIGS. 2, A and B, shows an exploded view schematic illustration and optical micrograph of an array of small, square devices (~25 μm by 25 μm), as well as those with shapes that spell "LED." The results indicate bright emission, even out to the edges of the devices, consistent with the relatively low surface recombination velocity in AlInGaP materials. For improved performance, ohmic contacts can be implemented by using established metallization and annealing schemes. One strategy involves additional processing on the source wafer to yield released devices with integrated ohmic contacts, suitable for printing and interconnection even on low-temperature substrates such as plastic or rubber. An alternative is to use low-temperature approaches to establish the ohmics directly on such substrates. For this work, we pursued the second strategy, using processes that involve temperatures below 175° C. (see FIG. 10 for transmission line model analysis of the contact resistances). FIG. 2C shows the layout of an ILED with ohmic contacts printed onto a thin layer of polyurethane on a glass substrate, and an optical micrograph of emission from a directly probed device. FIGS. 2, D and E, presents electrical and optical characteristics of a set of such devices, recorded on the wafer before undercut etching and after printing. The processing in this case used a passivation scheme to eliminate moderate degradation in performance associated with the HF etching step on unprotected devices (FIG. 11). The resulting current-voltage-emission behavior of the printed devices is comparable to that of the devices on the wafer. FIG. 3A provides a schematic illustration of an interconnect scheme for passive matrix addressing. Photolithography and electron beam evaporation define patterned metal electrodes [Ti (20 nm)/Au (300 nm)] that connect p and n contacts (nonohmic for the cases of FIGS. 3 and 4) of devices in common columns and rows, respectively. Two spin-cast, photopatterned layers of epoxy (1.2 μm thick) provide openings to these contacts; the top layer electrically separates the column and row electrodes at their crossing points. Connecting terminal pads at the ends of these electrode lines to external computer control systems via ribbon cables that use anisotropic conductive films (ACFs) enables passive matrix addressing (see FIG. 12 for details). FIG. 3B shows images of a small display that uses this design, formed on a thin sheet of plastic (PET, 50 μm thick) with a layer of a photocurable polyurethane as an adhesive. The ILEDs have dimensions of 100 μm by 100 μm and are configured into a 16 by 16 square array. The yields on the individual pixels for the case of FIG. 3B are 100%; at the level of the display, one column and two rows do not function, due to breaks in the contacts to the ACF ribbon cable [FIG. 13; see FIG. 14 for an example of similar display with even smaller ILEDs (50 µm by 50 µm)]. Such systems can be bent to radii of curvature of ~7 mm, with no observable degradation, even for several hundred cycles of bending (FIG. 14). Analytical calculation shows that even at the minimum bend radius investigated here, the maximum strain in the ILED is 0.21%, with a somewhat smaller strain (0.19%) in the quantum well region. Analysis using literature parameters to determine the dependence of the bandgap on strain suggests changes in emission wavelength of ~2.4 nm for the smallest bend radius. As shown in FIG. 1, step-and-repeat printing can yield systems that cover areas much larger than those of the constituent ILEDs or the source wafer. One important outcome is the ability to form displays that can offer an effectively high level of transparency, where only the ILEDs (and the electrodes, if they are not made with transparent conductors) are opaque. FIGS. 3, C and D, shows examples of a 16 by 16 array, formed on glass. Here the area of the display is ~325 mm$^2$; the cumulative area of all the ILEDs is only ~2.5 mm$^2$, corresponding to less than ~1% of the display area. FIG. 3C illustrates the operation of such a system positioned above a sheet of paper with printed logos; the focus of the image is on the paper, thereby illustrating a practical level of transparency for application in a heads-up display, for example. FIG. 3D shows the same device (lower right), operating in front of a mirror (upper left) to demonstrate bidirectional emission characteristics. The inset provides a magnified view of a region of this display, in its off state to show the small sizes of the ILEDs compared to the unit cells. These layouts are important for many applications, due to the efficient utilization of the LED material, for reduced cost. For the examples shown, we achieved ~98% yields on the individual devices, and ~80% yields on the interconnections, limited by breaks in the metal lines and failed contacts to the ACF ribbon cable (FIG. 16).

The devices and integration methods reported here are compatible with strategies to produce stretchable electronics, thereby providing a route to conformable displays and lighting systems of the type that might be interesting for integration with the human body and other curvilinear, deformable surfaces, all of which demand more than simple bending (e.g., FIG. 3B). FIG. 4A shows an example of a stretchable ILED with the shape of a ribbon. This device was formed by transfer printing and bonding to a prestrained, rubber substrate of PDMS. Relaxing the prestrain creates a device with a "wavy," sinusoidal profile; this structure responds elastically to applied strain with a physics similar to that of an accordion bellows to yield a stretchable ILED device. The top panels provide finite element simulation of the mechanics of the system in compressed (left) and stretched (right) configurations. The results indicate maximum strains in the ILED and the quantum well region of 0.36 and 0.053%, respectively (see SOM for details). The bottom panels show optical micrographs in the off (top) and on (bottom) states, with and without external illumination, respectively, in configurations similar to those illustrated in FIG. 22A. The emission characteristics show no noticeable change in color with applied strain or associated changes in device geometry from "wavy" to flat (see FIGS. 17 and 18 for details). This observation is consistent with a calculated change in emission wavelength of less than ~0.7 nm based on our computed strain values and analysis similar to that performed for the flexible display.

Figure 4:
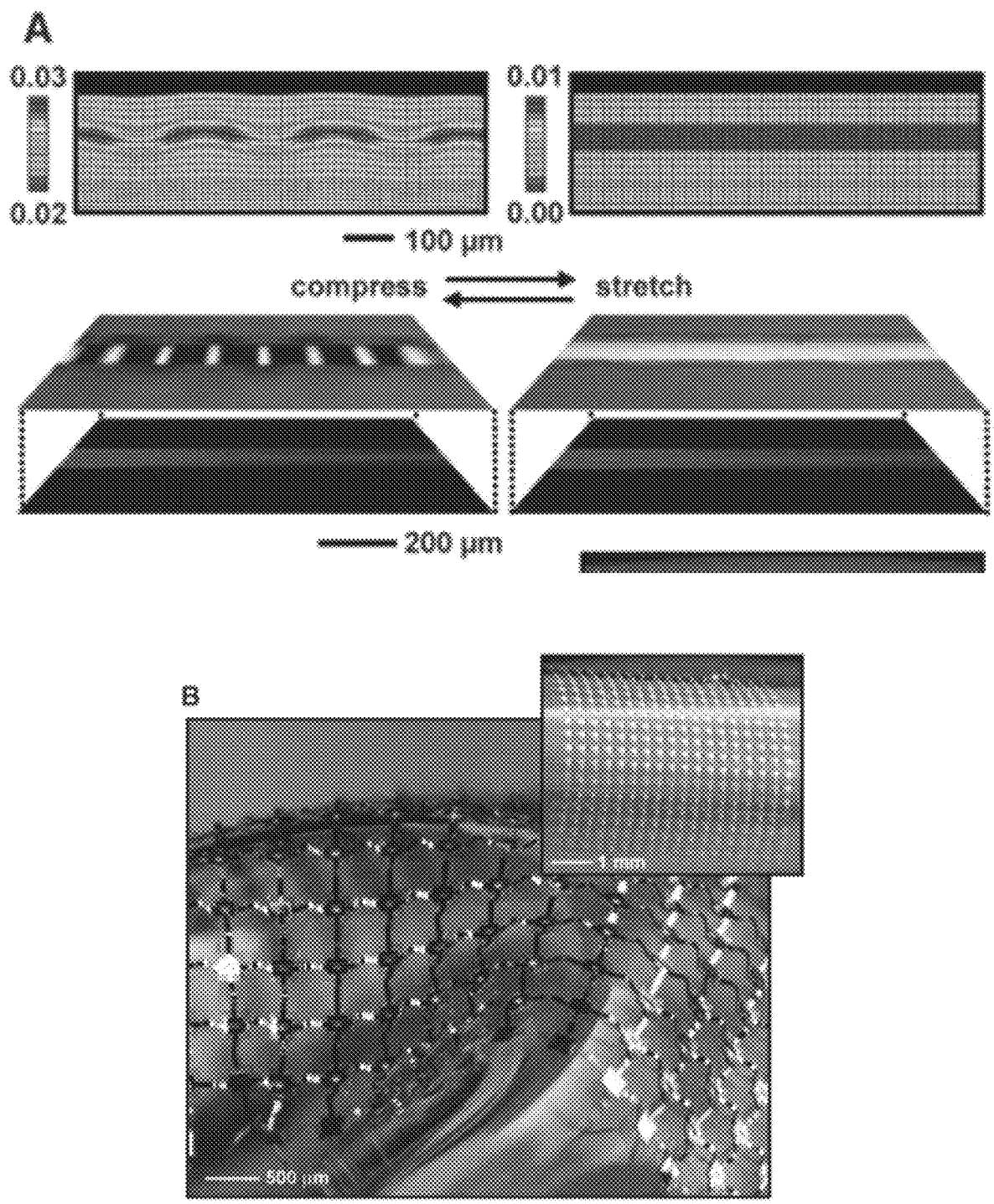
FIG. 4. (A) Color plots of the strain distributions (in percent) at the quantum well region and the corresponding finite element mesh used for simulation (top) and optical micrographs (bottom) of a stretchable ILED on a rubber substrate in unstrained and strained states. The bottom panels show optical micrographs in the off (top) and on (bottom) states, with and without external illumination, respectively. (B) Passive matrix, stretchable ILED display that uses a noncoplanar mesh configuration, on a rubber substrate. Here, interconnect lines between adjacent devices are supported by arc-shaped bridge structures that can deform in response to applied strain. Both the main panel and the inset images were collected with an automated camera system that combines pictures captured at different focal depths to provide a sharp, composite image. (C)
Figure 4:
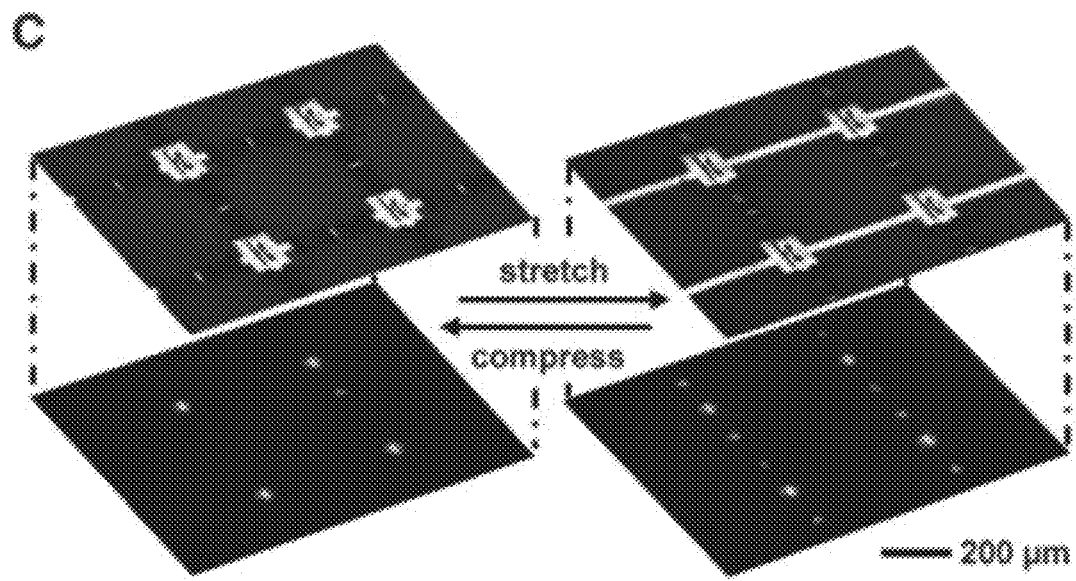
Figure 4:
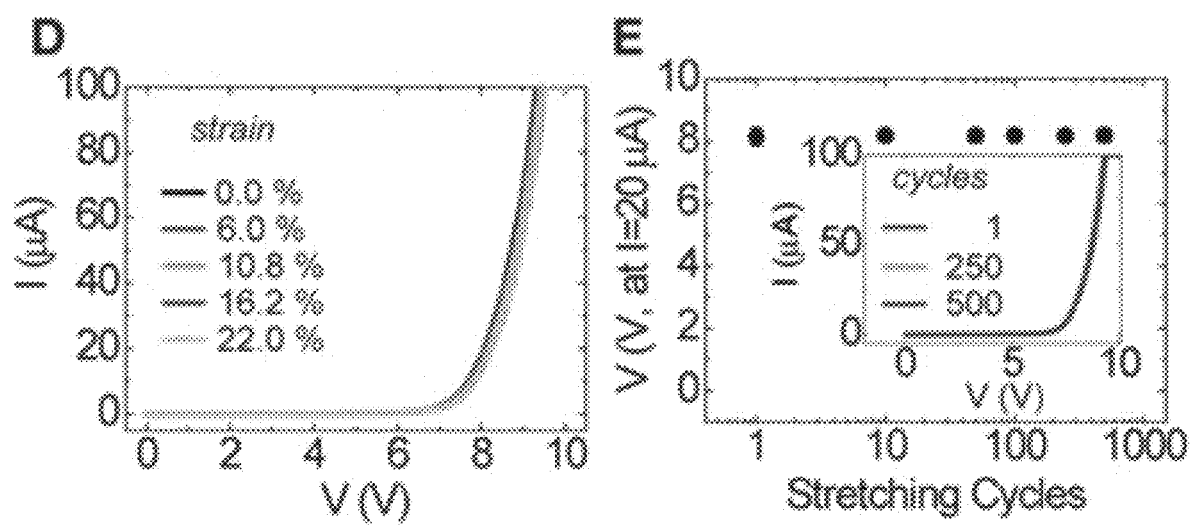

The "wavy" strategy of FIG. 4A can accommodate only a relatively modest range of applied strains (i.e., up to a few percent, for the designs reported here). A path to displays with high levels of stretchability uses non-coplanar mesh designs adapted from schemes reported for integrated circuits. FIG. 4B presents optical micrographs of such a system, composed of a 16 by 16 square array of ILEDs bonded to a PDMS substrate and interconnected by electrodes supported by arc-shaped bridges, with a fraction of the pixels turned on (overall yield >80%) (see FIG. 19 for details). The shapes of these bridges change in response to deformations of the display, in a way that isolates the ILEDs from any significant strains (FIGS. 20 and 21). In particular, calculation shows that for strains of 24%, as defined by the change in separation between inner edges of adjacent device islands, the maximum strains in the ILED and quantum well are only 0.17 and 0.026%, respectively. The computed change in emission wavelength is less than ~0.3 nm. FIG. 4C provides optical micrographs of four pixels in this display, in their off and on states, with (top) and without (bottom) external illumination, respectively, in compressed and stretched configurations. The images show the expected reduction in the heights of the arc-shaped bridges that lie in the direction of the applied tensile force (i.e., along the interconnects that run from lower left to upper right), together with an increase in the heights of the bridges in the orthogonal direction, due to the Poisson effect. This mechanical response is fully elastic—the bending-induced strains in the interconnects are small, the strains in the ILEDs are negligible, and the strain in the PDMS is well within its linear response regime. The data in FIGS. 4, D and E, are consistent with this mechanics, as are the associated mechanics calculations. In particular, the current-voltage characteristics of a typical device do not change in a measurable way for applied strains up to ~22%, and we observe no degradation on cycling up to a few hundred times (500 times). Recent work demonstrates the use of smaller collections of large, conventional ILEDs in deformable devices that use different designs.

The schemes reported here for creating thin, small inorganic LEDs and for integrating them into display and lighting devices create design options that are unavailable with conventional procedures. The planar processing approaches for interconnect resemble those that are now used for organic devices and, for example, large-area electronics for liquid crystal displays, thereby conferring onto inorganic LED technologies many of the associated practical advantages. In large area, high-pixel count systems (e.g., 1 million pixels per square meter), the ability to use LEDs with sizes much smaller than those of the individual pixels is important to achieve efficient utilization of the epitaxial semiconductor material, for reasonable cost. The minimum sizes of devices reported here are limited only by the resolution and registration associated with manual tools for photolithography.

Materials and Methods

The materials and methods for this project, including epitaxial semiconductor multilayer design, polymeric anchor structures, large scale printing techniques, and electrical interconnection in direct or matrix addressable configurations, are described in the following, for the flexible display, the large area display, the array of inorganic light emitting diode (ILED) devices with ultrasmall sizes/arbitrary shapes, the wavy ribbon devices, and the stretchable display.

Preparation of ILEDs

FIG. 5 shows the epi-stack design for our ILEDs, capable of release from a source wafer by undercut etching, grown on a GaAs wafer (Epiworks, Inc.). The sequence of processing steps used to retrieve ILEDs array appears below. Polymeric anchor structures support the ILEDs during undercut etching of the $Al_{0.96}Ga_{0.04}As$ sacrificial layer (FIG. 6).

Processing Scheme for Preparing ILEDs from a Source Wafer

Delineating the ILEDs

1. Clean an epi-stack ILED wafer chip (acetone, isopropyl alcohol (IPA), deionized (DI) water).
2. Deposit 800 nm $SiO_2$ by plasma enhanced chemical vapor deposition (plasma enhanced chemical vapor deposition (PECVD); PlasmaTherm SLR).
3. Pretreat with hexamethyldisilazane (HMDS) for 1 min.
4. Pattern photoresist (PR; Clariant AZ5214, 3000 rpm, 30 sec) with 365 nm optical lithography through an iron oxide mask (Karl Suss MJB3). Develop in aqueous base developer (Clariant AZ327 MIF) and bake on hot plate (110° C., 3 min).
5. Etch oxide with buffered oxide etchant (BOE; Fisher, 130 sec).
6. Etch with an inductively coupled plasma reactive ion etcher (ICP-RIE; Unaxis SLR 770 System, 2 mTorr, $Cl_2$ 4 sccm, $H_2$ 2 sccm, Ar 4 sccm, RF1: 100 W, RF2: 500 W, ~21 min).

Undercut Etching of the ILEDs

7. Clean the processed wafer chip from step 6 above with HF (Fisher, 49%, diluted 10:1, 2 sec).
8. Pattern PR and bake at 110° C. for 5 min to form polymeric anchors at the corners of the μ-ILEDs.
9. Dip the wafer chip in diluted HF (Fisher, 49%, diluted 100:1) for an appropriate time (μ-ILEDs with 50 μm×50 μm dimension: ~4 hrs, 100 μm×100 μm: ~5.5 hrs) to remove the $Al_{0.96}Ga_{0.04}As$ (sacrificial layer) underneath the ILEDs. Rinse by-product using DI water at 1.5 hr intervals.

Device Fabrication

Processing Scheme for ILED Devices of FIG. 2A; Schematic Illustration of these Steps Appears in FIG. 9.

Preparing a Substrate with Metal Mesh

1. Deposit 300 nm $SiO_2$ with PECVD onto a silicon wafer
2. Pretreat surface with HMDS for 1 min, and then pattern PR.
3. Deposit 7/70 nm of Cr/Au by electron beam evaporation.
4. Lift-off PR in acetone to yield a pattern of Cr/Au in the geometry of a mesh.
5. Etch oxide with HF (49%, 38 sec).
6. Transfer print mesh to a glass substrate coated with poly(dimethylsiloxane) (PDMS; Sylgard 184, Dow Corning, spun at 600 rpm/5 sec, 3000 rpm/30 sec, cured in oven at 70° C. for 90 min) formed by mixing the base and curing agent with a ratio of 10:1 followed by thermal curing.

Printing the ILEDs

7. Liftoff ILEDs using a flat PDMS stamp formed by mixing the base and curing agent with a ratio of 8.5:1.5, and then thermally cure.
8. Print ILEDs onto the glass substrate with Cr/Au mesh (n-contact).
9. Remove PR by washing in acetone.

Forming the Interlayer and p-Contact Metallization

10. Spin coat the substrate from step 9 with a photodefinable epoxy (SU8-2, Microchem, spun at 1,500 rpm for 30 s). Soft bake at 65° C. and 95° C. for 1 min and 1.5 min, respectively.
11. Pattern epoxy by exposing to ultraviolet (UV) light in a mask aligner for 14 sec, baking at 95° C. for 2 min, developing (SU8 developer, Microchem) for 15 sec, rising (IPA), and curing (110° C., 35 min, slow cooling).
12. Pattern PR.
13. Deposit 7 nm of Pd—Au by sputtering.
14. Lift-off PR in acetone to leave a thin layer of Pd—Au on the top surfaces of the ILEDs (pcontact).

Processing Scheme for ILED Devices with Ohmic Contacts of FIG. 2C

Preparing the Substrate

1. Clean a glass slide (25 mm×25 mm) (acetone, IPA, DI water)
2. Expose to ultraviolet induced ozone (UVO) for 5 min.
3. Spin coat with polyurethane (NOA61; Norland Products Inc., spun at 5000 rpm/60 sec).

Delineating the ILEDs

4. Clean an epi-stack ILED wafer chip (acetone, IPA, DI water).
5. Deposit 800 nm $SiO_2$ with PECVD.
6. Pretreat with HMDS for 1 min.
7. Pattern PR and bake on hot plate (110° C., 3 min).
8. Etch oxide with BOE (130 sec).
9. Etch with ICP-RIE (2 mTorr, $Cl_2$ 4 sccm, $H_2$ 2 sccm, Ar 4 sccm, RF1: 100 W, RF2: 500 W, ~16 min) to expose $Al_{0.96}Ga_{0.04}As$ (sacrificial layer) underneath the ILEDs.

Forming a Passivation Layer and Undercut Etching of the ILEDs

10. Clean the processed wafer chip from step 9 above (acetone, IPA, DI water).
11. Spin coat with epoxy (SU8-2, spun at 3,000 rpm for 30 sec). Soft bake at 65° C. and 110° C. each for 1 min and 1 min, respectively.
12. Pattern epoxy by exposing to UV, baking, developing, rising (IPA), and curing. The pattern includes a passivation structure to protect μ-ILEDs and an anchor structure to suspend ILEDs during the undercut etching.
13. Dip the wafer chip in diluted HF (49%, diluted 100:1) for ~2 hrs to remove the $Al_{0.96}Ga_{0.04}As$ (sacrificial layer) underneath the μ-ILEDs.

Printing the ILEDs

14. Liftoff ILEDs using a flat PDMS stamp formed by mixing the base and curing agent with a ratio of 10:1, followed by thermal curing. Contact 'inked' stamp against the substrate from step 13.
15. Retrieve the stamp after UV exposure (through the stamp) for 20 min. Cure the polyurethane layer by UV exposure for 2 hours.

Defining the n-Contact Regions

16. Reactive ion etch (RIE; PlasmaTherm 790 Series, 50 mTorr, 20 sccm $O_2$, 100 W, ~12 min) to remove the epoxy on the top surface of the ILEDs.
17. Pattern PR and bake at 110° C. for 2 min.
18. Wet etch C-doped p-GaAs/p-spreader ($Al_{0.45}Ga_{0.55}As$) by $H_3PO_4/H_2O_2/H_2O$ (volume ratio 1:13:12) for 25 sec, InGaP-based active region by $HCl/H_2O$ (2:1) for 15 sec and Si-doped nspreader ($Al_{0.45}Ga_{0.55}As$) by $H_3PO_4/H_2O_2/H_2O$ (1:13:12) for 23 sec to expose Si-doped n-GaAs.
19. Remove PR by washing in acetone.

Defining the n-Ohmic Contact Metallization

20. Pattern PR.
21. Clean the surface of n-GaAs with HCl:DI water (1:1) for 30 sec.
22. Deposit 5/35/70 nm of Pd/Ge/Au by electron beam evaporation.
23. Lift-off PR in acetone to remain Pd/Ge/Au on the top surface of n-GaAs.
24. Anneal at 175° C. for 60 min under $N_2$ ambient Defining the p-Ohmic Contact Metallization 25. Pattern PR.

26. Clean the surface of p-GaAs with HCl:DI water (1:1) for 30 sec.

27. Deposit 10/40/10/70 nm of Pt/Ti/Pt/Au by electron beam evaporation.

28. Lift-off PR in acetone to remain Pt/Ti/Pt/Au on the top surface of p-GaAs.

Processing Scheme for Flexible ILED Displays of FIG. 3B

Preparing the Substrate

1. Clean a glass slide (30 mm×30 mm) (acetone, IPA, DI water).

2. Treat with ultraviolet induced ozone (UVO) for 5 min.

3. Spin coat with PDMS (spun at 600 rpm/5 sec, 3000 rpm/30 sec), formed by mixing the base curing agent with a ratio of 10:1.

4. Cure PDMS in an oven (70° C., 90 min).

5. Clean a sheet of polyethylene terephthalate (PET; Grafix DURA-LAR, 32 mm×32 mm×50 μm) (IPA, DI water).

6. Laminate the PET sheet onto the PDMS coated glass slide, as a carrier for the following processing steps.

7. Spin coat with polyurethane (NOA61; Norland Products Inc., spun at 5000 rpm/60 sec).

Printing the ILEDs

8. Liftoff an array of ILEDs (16×16 array of devices with dimensions of 100 μm×100 μm) using a flat PDMS stamp. Contact 'inked' stamp against the substrate from step 7.

9. Retrieve the stamp after UV exposure (through the stamp) for 20 min.

10. Remove PR by washing in acetone and then cure the polyurethane layer by UV exposure for 2 hours.

Defining the n-Contact Regions

11. Reactive ion etch (RIE; PlasmaTherm 790 Series, 50 mTorr, 20 sccm $O_2$, 100 W, 8 min) to remove the polyurethane layer covering the ILEDs.

12. Pattern PR and bake at 110° C. for 2 min.

13. Wet etch C-doped p-GaAs/p-spreader ($Al_{0.45}Ga_{0.55}As$) by $H_3PO_4/H_2O_2/H_2O$ (volume ratio 1:13:12) for 25 sec, InGaP-based active region by $HCl/H_2O$ (2:1) for 15 sec and Si-doped nspreader ($Al_{0.45}Ga_{0.55}As$) by $H_3PO_4/H_2O_2/H_2O$ (1:13:12) for 23 sec to expose Si-doped n-GaAs.

14. Remove PR by washing in acetone.

Defining the n-Contact Metallization

15. Spin coat with epoxy (SU8-2, spun at 3,000 rpm for 30 sec). Soft bake at 65° C. and 110° C. each for 1 min and 1 min, respectively.

16. Pattern epoxy by exposing to UV, baking, developing, rising (IPA), and curing.

17. Deposit 20/300 nm of Ti/Au by electron beam evaporation.

18. Pattern PR and bake at 110° C. for 2 min.

19. Wet etch Ti/Au for 45/90 sec by BOE and Au etchant (Transene, Inc.).

20. Remove PR by washing in acetone.

Defining the p-Contacts and p-Contact Metallization

21. Spin coat with epoxy (SU8-2, spun at 3,000 rpm for 30 s). Soft bake at 65° C. and 110° C. for 1 min and 1 min, respectively.

22. Pattern epoxy by exposing to UV, developing, rising, and curing.

23. Deposit 20/300 nm of Ti/Au by electron beam evaporation.

24. Pattern PR and bake at 110° C. for 2 min.

25. Wet etch Ti/Au for 45/90 s by BOE and Au etchant.

26. Remove PR by washing in acetone.

Forming an Encapsulation Layer

27. Spin coat with epoxy (SU8-5, Microchem, spun at 3,000 rpm for 30 s). Soft bake at 65° C. and 110° C. for 1 min and 1.5 min, respectively.

28. Pattern epoxy by exposing to UV for 14 sec, baking at 95° C. for 2 min, developing (SU8 developer) for 18 sec, rising (IPA), and curing (110° C., 35 min, slow cooling)

Processing Scheme for Large Area ILEDs Displays of FIGS. 3, C and D

Preparing the Substrate

1. Clean a glass slide (50 mm×50 mm) (acetone, IPA, DI water)

2. Deposit 50 nm of Ti by electron beam evaporation.

3. Pattern PR and bake on a hot plate (110° C., 2 min) to form guide lines to assist in registration of ILEDs printed with an automated printer system.

4. Wet etch Ti with BOE (70 sec).

5. Remove PR by washing in acetone.

6. Expose to ultraviolet induced ozone (UVO) for 15 min.

7. Spin coat with PDMS (spun at 600 rpm/5 sec, 2500 rpm/30 sec) formed by mixing the base and curing agent with a ratio of 10:1.

8. Cure PDMS in an oven (70° C., 90 min)

Printing the ILEDs

9. Selectively liftoff ILEDs (100 μm×100 μm lateral dimensions) using a composite stamp in automated printing machine (FIGS. 7, 8) and print them onto the substrate from step 8, in a step and repeat fashion to form a 16×16 array.

10. Remove PR by washing in acetone.

Patterning the p-Contact Metallization

11. Spin coat with epoxy (SU8-2, spun at 1,500 rpm for 30 s). Soft bake at 65° C. and 110° C. for 1 min and 1 min, respectively.

12. Pattern epoxy by exposing to UV, baking, developing, rising, and curing.

13. Deposit 10/70 nm of Ti/Au by electron beam evaporation.

14. Pattern PR and bake at 110° C. for 2 min.

15. Wet etch Ti/Au with BOE and gold etchant for 35/20 sec.

16. Remove PR by washing in acetone.

17. Reactive ion etch (RIE, 50 mTorr, 20 sccm $O_2$, 100 W, 13 min) to remove remaining epoxy around the sidewalls of the ILEDs (FIG. 12).

Defining the n-contact regions

18. Pattern PR and bake at 110° C. for 2 min.

19. Wet etch C-doped p-GaAs/p-spreader by $H_3PO_4/H_2O_2/H_2O$ (1:13:12) for 25 sec, InGaP-based active region by $HCl/H_2O$ (2:1) for 15 sec and Si-doped n-spreader by $H_3PO_4/H_2O_2/H_2O$ (1:13:12) for 23 sec to expose Si-doped n-GaAs.

20. Remove PR by washing in acetone.

Patterning the n-Contact Metallization

21. Spin coat with epoxy (SU8-2, spun at 3,000 rpm for 30 sec). Soft bake at 65° C. and 110° C. for 1 min and 1 min, respectively.

22. Pattern epoxy by exposing to UV, baking, developing, rising, and curing.

23. Deposit 20/300 nm of Ti/Au by electron beam evaporation.

24. Pattern PR and bake at 110° C. for 2 min.

25. Wet etch Ti/Au for 45/90 sec with BOE and Au etchant.

26. Remove PR by acetone rinse.

Defining the p-Contact Regions and Metallization

27. Spin coat with epoxy (SU8-2, spun at 3,000 rpm for 30 s). Soft bake at 65° C. and 110° C. for 1 min and 1 min, respectively.

28. Pattern epoxy with exposing UV, developing, rising, and curing.

29. Deposit 20/300 nm of Ti/Au by electron beam evaporation.

30. Pattern PR and bake at 110° C. for 2 min.

31. Wet etch Ti/Au for 45/90 s by BOE and Au etchant.

32. Remove PR by acetone.

Forming an Encapsulation Layer

33. Spin coat with epoxy (SU8-5, spun at 3,000 rpm for 30 s). Soft bake at 65° C. and 110° C. for 1 min and 1.5 min, respectively.

34. Pattern epoxy by exposing to UV, baking, developing, rising, and curing.

Processing Scheme for Stretchable ILEDs of FIG. 4A

Exploded View Schematic Illustration of the Processing Step Appears in FIG. 18.

Preparing Ribbon Shaped ILEDs

1. Clean an epi-stack ILED wafer chip (acetone, IPA, DI water).

2. Pattern PR and bake for 2 min.

3. Wet etch C-doped p-GaAs/p-spreader by $H_3PO_4/H_2O_2/H_2O$ (1:13:12) for 25 sec, InGaP-based active region by $HCl/H_2O$ (2:1) for 15 sec and Si-doped n-spreader by $H_3PO_4/H_2O_2/H_2O$ (1:13:12) for 35 sec to expose $Al_{0.96}Ga_{0.04}As$ (sacrificial layer) underneath the µ-ILEDs.

4. Remove PR by washing in acetone.

Forming an Encapsulation Layer and Undercut Etching

5. Pattern PR on the top surface of the ribbons.

6. Deposit 3/15 nm of Ti/Au by electron beam evaporation.

7. Lift-off PR in acetone to remain Ti/Au on the top surface of the ribbons.

8. Spin coat with epoxy (SU8-2, spun at 3,000 rpm for 30 s). Soft bake at 65° C. and 95° C. for 1 min and 1.5 min, respectively.

9. Pattern epoxy by exposing to UV, baking, developing, rising (IPA), and curing.

10. Dip the ILED in diluted HF (100:1) for 1 hr to release the ribbons from the wafer.

11. Rinse in DI water for 5 min.

12. Print ribbons onto a pre-strained substrate of PDMS with prepatterned metal lines.

Processing Scheme for Stretchable ILED Display of FIGS. 4, B and C

Schematic illustration of the processing steps appears in FIG. 20.

Preparing the Carrier Substrate

1. Clean a glass slide (25 mm×25 mm) (acetone, IPA, DI water).

2. UVO treatment for 5 min.

3. Spin coat with PMMA (A2, Microchem, spun at 3,000 rpm for 30 sec).

4. Anneal at 180° C. for 3 min.

5. Spin coat with polyimide (PI, poly(pyromellitic dianhydride-co-4,4'-oxydianiline), amic acid solution, Sigma-Aldrich, spun at 4,000 rpm for 60 sec).

6. Anneal at 110° C. for 3 min and 150° C. for 10 min.

7. Anneal at 250° C. for 50 min in $N_2$ atmosphere.

8. Spin coat with epoxy (SU8-2, spun at 3,000 rpm for 30 sec). Soft bake at 65° C. and 95° C. for 1 min and 1 min, respectively.

Printing the ILEDs

9. Liftoff ILEDs (16×16 array of devices with dimensions of 50 µm×50 µm) using a flat PDMS stamp and contact the 'inked' stamp with the substrate from step 8.

10. Remove the stamp after UV exposure (through the stamp) for 60 sec and baking at 110° C. for 10 min.

11. Remove PR by washing with acetone. Fully cure the epoxy layer at 150° C. for 20 min.

Forming the Sidewall Region

12. Spin coat with epoxy (SU8-2, spun at 3,000 rpm for 30 sec). Soft bake at 65° C. and 95° C. for 1 min and 1 min, respectively.

13. Expose to UV for 14 sec and bake at 110° C. for 1 min.

14. Anneal at 150° C. for 20 min.

15. Reactive ion etch (RIE; PlasmaTherm 790 Series, 50 mTorr, 20 sccm $O_2$, 100 W, 13 min) to remove remaining epoxy around the sidewalls of the ILEDs.

Defining the n-Contact Regions

16. Pattern PR and bake at 110° C. for 5 min.

17. Wet etch C-doped p-GaAs/p-spreader by $H_3PO_4/H_2O_2/H_2O$ (1:13:12) for 25 sec, InGaP-based active region by $HCl/H_2O$ (2:1) for 15 sec and Si-doped n-spreader by $H_3PO_4/H_2O_2/H_2O$ (1:13:12) for 23 sec to expose Si-doped n-GaAs.

18. Remove PR by washing with acetone.

Defining the n- and p-Contact Metallization

19. Spin coat with epoxy (SU8-2, spun at 3,000 rpm for 30 s). Soft bake at 65° C. and 95° C. for 1 min and 2 min, respectively.

20. Pattern epoxy by exposing to UV for 14 sec, developing for 15 sec, rising, and curing (110° C., 35 min, slow cooling).

21. Deposit 20/300 nm of Ti/Au by electron beam evaporation.

22. Pattern PR and bake at 110° C. for 2 min to define n-contact electrodes, designed as line patterns connected to n-GaAs, and p-contact electrodes, designed as line patterns that avoid crossing over the n-contact electrodes (FIG. 20).

23. Wet etch Ti/Au for 45/90 sec by BOE and Au etchant.

24. Remove PR by washing with acetone.

Interconnecting the p-Contact Metallization

25. Spin coat with epoxy (SU8-2, spun at 3,000 rpm for 30 sec). Soft bake at 65° C. and 95° C. for 1 min and 2 min, respectively.

26. Pattern epoxy by exposing to UV, developing, rising, and curing.

27. Deposit 20/300 nm of Ti/Au by electron beam evaporation.

28. Pattern PR and bake at 110° C. for 2 min.

29. Wet etch Ti/Au for 45/90 sec by BOE and Au etchant.

30. Remove PR by washing with acetone.

Forming and Encapsulation Layer

31. Spin coat with epoxy (SU8-2, spun at 3,000 rpm for 30 sec). Soft bake at 65° C. and 95° C. for 1 min and 1.5 min, respectively.

32. Pattern epoxy by exposing to UV, developing, rising, and curing.

Forming the Island/Bridge Structures

33. Deposit 150 nm $SiO_2$ by PECVD.

34. Pattern PR and bake at 110° C. for 2 min.

35. RIE (50 mTorr, $CF_4/O_2$ 40/1.2 sccm, 150 W, 8 min) to etch $SiO_2$.

36. RIE (150 mTorr, $O_2$ 20 sccm, 150 W, 50 min) to etch epoxy/PI layers.

37. Etch oxide with BOE (20 sec).

Transferring the Mesh

38. Immerse the ILEDs array mesh from step 37 in acetone (80° C.) for ~10 min to dissolve the PMMA.

39. Lift off the mesh using a PDMS stamp formed by mixing a base and agent with a ratio of 8.5:1.5.

40. Selectively deposit 5/30 nm of Ti/$SiO_2$ by electron beam evaporation on the bottom of island regions through a shadow mask.

41. Transfer the ILED mesh to a biaxially pre-strained PDMS substrate.

42. Anneal in an oven at 70° C. and release the strain.

Measurement of Emission Spectra

Emission spectra were measured using a spectrometer (Oceanoptics, HR4000) which enabled signal collected through an optical fiber directly mounted in an electrical probing station.

Measurement of Surface Profile of Wavy ILEDs

The wavelength and amplitude of stretchable ILEDs of FIG. 4A were measured by a surface profiler (Sloan Dektak3). A diamond stylus in contact with a sample surface scans along the length of ribbon and measures physical surface variation at different positions.

Bending Test

To evaluate the bending performance of flexible ILEDs displays, bending test were performed (FIGS. 16A, B). The displays were bent and released, with bend radii down to ~7.3 mm. The electrical properties of 32 different pixels in the display were measured and averaged to assess the performance.

Fatigue Test

To evaluate the fatigue performance of flexible ILED displays, multiple cycling tests were performed under repetitive bending and releasing up to 500 times (FIG. 16C, D). Electrical measurements were performed on 16 different pixels, for a bend radius of ~8.8 mm. Stretching tests were performed with mechanical stages capable of applying uniaxial strain to evaluate the performance of stretchable ILED display under repetitive stretching and releasing up to 500 times (FIG. 4). Electrical properties of 14 different pixels in the display were measured and averaged. In all cases, the testing was performed at a rate of roughly one cycle per second.

Modeling of Flexible ILED Displays of FIG. 3B

The encapsulation, electrode, ILED, adhesive and plastic shown in FIG. 12 can be modeled as a composite beam subject to a bend curvature. The distance between the neutral mechanical plane and the top surface in each cross section is given by $$\sum_{i=1}^{N} \overline{E}_i h_i \left( \sum_{j=1}^{i} h_j - \frac{h_i}{2} \right) / \sum_{i=1}^{N} \overline{E}_i h_i,$$

where N is the total number of layers, $h_i$ is the thickness of the $i^{th}$ layer (from the top), and $\overline{E}_i h_i / 1-v_i^2$ is related to the Young's modulus $E_i$ and Poisson's ratio $v_i$ of the $i^{th}$ layer. The strain in the μ-ILED, including the quantum well, is given by y/R, where R is the bend radius, and y is the distance from the neutral mechanical plane. The elastic properties and layer thicknesses used for bendable display are (1) $E_{encapsulation}$=4.4 GPa, $v_{encapsulation}$=0.44, and $h_{encapsulation1}$=4.0 μm and $h_{encapsulation2}$=0.877 μm for the two encapsulation layers above and below the electrode, respectively; (2) $E_{electrode}$=78 GPa, $v_{electrode}$=0.44, and $h_{electrode}$=300 nm; (3) $E_{ILED}$=77.5 GPa, $v_{ILED}$=0.312, and $h_{ILED}$=2.523 μm; (4) $E_{adhesive}$=1 GPa, $v_{adhesive}$=0.3, and $h_{adhesive}$=2.5 μm; and (5) $E_{plastic}$=4 GPa, $v_{plastic}$=0.44 and $h_{plastic}$=50 μm. These give the neutral mechanical plane 19.76 μm below the top surface. The maximum distance from the ILED is then 14.58 μm to the neutral mechanical plane, which gives the maximum strain 0.21% in the ILED for the bend radius R=7 mm. The quantum well is 1.011 μm below the top surface of ILED (FIG. 5), and is therefore 13.57 μm to the neutral mechanical plane. This gives the maximum strain 0.19% for the bent radius R=7 mm.

Modeling and Simulation of Stretchable ILEDs of FIG. 4A: The Wavy Design

As shown in FIG. 18A, the stretchable ILED consists of the encapsulation, electrode and μ-ILED, and can be modeled as a composite beam with the effective tensile stiffness $$\overline{EA} = \sum_{i=1}^{3} \overline{E}_i h_i$$

and bending stiffness $$\overline{EI} = \sum_{i=1}^{3} \overline{E}_i h_i \left[ \left( \sum_{j=1}^{i} h_j \right)^2 - \left( \sum_{j=1}^{i} h_j \right) h_i + \frac{h_i^2}{3} \right] - \frac{\left[ \sum_{i=1}^{3} \overline{E}_i h_i \left( \sum_{j=1}^{i} h_j - \frac{h_i}{2} \right) \right]^2}{\overline{EA}},$$

where the summation is for the 3 layers of encapsulation, electrode and ILED, $h_i$ is the thickness of the $i^{th}$ layer (from the top), and $\overline{E}_i = E_i/(1-v_i^2)$ is related to the Young's modulus $E_i$ and Poisson's ratio $v_i$ of the $i^{th}$ layer. The distance between the neutral mechanical plane and the top surface in each cross section is given by $$\sum_{i=1}^{3} \overline{E}_i h_i \left( \sum_{j=1}^{i} h_j - \frac{h_i}{2} \right) / \overline{EA}.$$

The device was formed by transfer printing and bonding to a pre-strained substrate of PDMS. Relaxing the pre-strain creates a device with a 'wave' of the amplitude A and wavelength λ. The bending energy and membrane energy of the wavy device are $$U_{bending} = \frac{4\pi^4 \overline{EI} L A^2}{\lambda^4} \text{ and}$$

$$U_{membrane} = \frac{1}{2} \overline{EA} L \left[ \pi^2 \left( \frac{A}{\lambda} \right)^2 + \varepsilon_{pre} \right]^2,$$

where L is the length of device and $\in_{pre}$ (<0) is the compressive strain on the device upon the release of the pre-strain in the PDMS.

The strain energy in the PDMS substrate due to the sinusoidal displacement profile on its top surface is $$U_{substrate} = \overline{E}_s L \frac{\pi A^2}{4\lambda},$$

where $\overline{E}_s = E_s/(1-v_s^2)$ is related to the Young's modulus $E_s$ and Poisson's ratio $v_s$ of the PDMS substrate. The minimization of the total energy $U_{total} = U_{bending} + U_{membrane} + U_{substrate}$ gives analytically the wave length and amplitude as $$\lambda = 2\pi \left( \frac{4\overline{EI}}{\overline{E}_s} \right)^{1/3}, \tag{1}$$

$$A = \frac{\lambda}{\pi}\sqrt{|\varepsilon_{pre}| - \varepsilon_{crit}}, \quad (2)$$

$$\text{where } \varepsilon_{crit} = \frac{3}{2}\left[\frac{\overline{EIE_s^2}}{2(\overline{EA})^3}\right]^{1/3}$$

is the critical strain for buckling.

The strain in the ILED, including the quantum well, is given by $$4\pi^2 \frac{A}{\lambda^2} y,$$

where y is the distance from the neutral mechanical plane. The elastic properties and layer thicknesses used for the device are (1) $E_{encapsulation}$=4.4 GPa, $v_{encapsulation}$=0.44, and $h_{encapsulation1}$=1 μm; (2) $E_{electrode}$=78 GPa, $v_{electrode}$=0.44, and $h_{electrode}$=10 nm; and (3) $E_{ILED}$=77.5 GPa, $v_{ILED}$=0.312, and $h_{ILED}$=2.523 μm. These give the neutral mechanical plane 2.22 μm below the top surface. The maximum distance from the ILED is then 1.31 μm from the neutral mechanical plane, which gives the maximum strain 0.36% in the ILED for the experimentally measured wavelength 275 μm and amplitude 5.15 μm. The quantum well is 1.011 μm below the top surface of ILED (FIG. 5), and is therefore 0.2 μm to the neutral mechanical plane, which gives a very small strain 0.053% in the quantum well.

The finite element method has also been used to determine the strains in the 1.0 μm-thick SU8 encapsulation, 10 nm-thick Au thin film and 2.523 μm-thick ILED on 1 mm-thick PDMS substrate. Eight-node, hexahedral brick elements (C3D8) and four-node multi-layer shell elements (S4R) in the finite element analysis software ABAQUS (2007) are used for the substrate and the thin film, respectively. The multi-layer shell is bonded to the substrate by sharing the nodes. Each layer of thin film is linear elastic, while the PDMS substrate is modeled as a hyper-elastic material. The eigenvalues and eigenmodes of the system are first obtained. The eigenmodes are then used as initial small geometrical imperfections to trigger buckling of the system. The imperfections are always small enough to ensure that the solution is accurate. As shown in FIG. 4A and FIG. 23, the numerical results give strains that agree very well with the analytical model.

Simulation of Stretchable ILED of FIGS. 4, B and C: The Island-Bridge Design

The finite element method has also been used to determine the strains in island-bridge design of stretchable ILED shown in FIG. 20. Eight-node, hexahedral brick elements (C3D8) in the finite element analysis software ABAQUS (2007) are used for the substrate, which is modeled as a hyper-elastic material. Four-node, multi-layer shell elements (S4R) are used for the islands and bridges, which are linear elastic. The islands are bonded to the substrate by sharing the nodes, but the bridges do not. FIG. 24 shows the strain distribution in the top, middle and bottom surfaces of the ILED as the bridge length is reduced from 310 μm to 250 μm. The maximum strain is 0.17%, and that in the quantum well is only 0.026%.

Analysis of Flexible/Stretchable ILED System for Strain Sensitivity of Emission Wavelength The calculated maximum uniaxial strains in the quantum well of the ILED system are 0.19% tensile in flexible ILED displays, 0.053% tensile in stretchable ILED, and 0.026% compressive in stretchable ILED displays. On the basis of the kp perturbation theory (S1, 2) for strain induced effect on semiconductor band structures, emission wavelength shift of the ILED associated with bending or stretching can be evaluated.

The bending and stretching deformations explored correspond to in-plane uniaxial stress defined as in the x direction here, and the stresses in the y and z directions are zero ($\sigma_{yy}=\sigma_{zz}$=0) due to free contraction by Poisson's effect. Thus the strains in these directions are given by $\in_{yy}=\in_{zz}=-v\in_{xx}$, where $$\frac{v}{1-v} = \frac{C_{12}}{C_{11}},$$

and v is Poisson's ratio, $C_{11}$ and $C_{12}$ are elastic stiffness constants. For the small stress range examined here, the strain induced bandgap shifts for heavy hole (HH) and light hole (LH) are given by $\theta Eg^{LH}=\theta E_H+\theta E_S$, $\theta Eg^{HH}=\delta E_H-\delta E_S$, where $\delta E_H=a(\in_{xx}+\in_{yy}+\in_{zz})$, $$\delta E_s = \frac{b}{2}(\varepsilon_{xx} + \varepsilon_{yy} - 2\varepsilon_{zz}),$$

and $\delta E_H$, and $\delta E_S$ are the hydrostatic pressure shift and the uniaxial stress-induced valence-band splitting, respectively (S1-3), and a and b are the corresponding deformation potentials.

For the quantum well ($In_{0.56}Ga_{0.44}P$) in the ILED structure, the parameters used for the present calculation are a=−7.42 eV, b=1.91 eV, $C_{11}$=11.936×10$^{11}$ dyne/cm$^2$, and $C_{12}$=5.975×10$^{11}$ dyne/cm$^2$ (S4). Assuming HH is the ground state for the quantum well (S4), the maximum uniaxial mechanical stress induced bandgap shift in the ILED system studied here is calculated to be ~7.1 meV (or ~2.4 nm). This small shift can be considered negligible for most applications.

Example 2: Electrically Interconnected Assemblies of Microscale Device Components by Printing and Molding This example presents approaches for deterministic assembly and electrical interconnection of micro/nanoscale devices into functional systems with useful characteristics. Transfer printing techniques provide deterministic control over an assembly process that occurs prior to or simultaneously with a soft lithographic molding step that defines relief features in a receiving polymer. Filling these features with conducting materials that are processable in the form of liquids or pastes yields integrated interconnects and contacts aligned to the devices. Studies of the underlying aspects and application to representative systems in photovoltaics and solid state lighting indicators provide insights into the process and its practical use.

Unusual microsystems for electronics/optoelectronics, solid state lighting and photovoltaics can be formed with assemblies of micro/nanoscale components or material elements to achieve system level outcomes that are not possible using conventional approaches. Examples include flexible/stretchable designs, curvilinear layouts and systems that exploit heterogeneous materials integration in two or three dimensional layouts. The assembly process can occur either by deterministic methods based on transfer printing or guided approaches based on fluidic delivery and surface/shape recognition. In all cases, electrically interconnecting the assembled devices to form integrated systems represents a practically challenging aspect of the fabrication, particularly for systems in solid state lighting and photovoltaics where long interconnect wiring traces with minimal resistances are preferred. The most straightforward and widely explored approaches rely on conventional techniques, such as photolithography, to pattern uniform layers of metal formed by vacuum deposition (possibly followed by electroplating). The cost structures, however, preclude their use in many systems of interest. Conventional soft lithographic methods can be used, but their application over surface topography associated with assembled device components can be difficult. Screen printing or ink jet printing of pastes or liquid suspensions of conductive particles provide alternatives, but their modest resolution limits the utility. Newer techniques that rely on electrohydrodynamic jet printing or direct writing avoid these problems. Achieving adequate throughput with these serial methods and developing them into forms suitable for realistic application are subjects of this example. The research described here provides a simple scheme designed specifically to address the classes of systems described above; it combines aspects of transfer printing for assembly, with soft imprint lithography and certain aspects of screen printing for contacts and interconnect. In the following, the basic features of this method are described, and its applications to representative systems of interest in monocrystalline silicon photovoltaics and AlInGaP lighting indicators are demonstrated.

FIG. 24 presents a schematic illustration of the process, in which transfer printing for device placement and molding for electrical interconnect occur simultaneously. The first step involves fabricating the devices (i.e. square blocks with rectangular electrode pads; FIG. 24a) on a source substrate using procedures discussed subsequently in the context of different demonstration examples. Next, techniques for transfer printing lift these devices onto an elastomeric stamp/mold with relief that defines contacts to the electrode regions and trenches for interconnect. In this example (FIG. 24b), the relief consists of two different levels such that the devices rest with their electrodes in contact with the highest features; the others are associated with interconnect. The stamp/mold 'inked' with devices then contacts a thin layer of a liquid prepolymer cast on a target substrate. Allowing this liquid to flow and conform to the relief, photochemically or thermally curing it into a solid form and then removing the stamp/mold yields the structure illustrated in FIG. 24c. The polymer acts as an adhesive and an encapsulant for the devices, with molded features that define the geometry of the interconnect wiring. Scraping a conductive paste over the top surface using methods conceptually similar to those for screen printing fills the recessed regions in the molded polymer to form these interconnects (FIG. 24d). For the experiments described in the following, a photocurable polyurethane (PU; NOA61, Norland Products Inc.) and a silver epoxy (H20E Epo-Tek®, Ted Pella Inc.) served as the mold material and the conductive paste, respectively. In certain cases, we found that a thin residue of the PU remained on the contacts of the devices, necessitating a short reactive ion etching step (50 mtorr, $O_2$ 20 sccm, 100 W, 3-5 min; Plasmatherm) to remove this residue just before application of the conductive paste. The silver epoxy underwent a thermal cure at 150° C. for 5 minutes to obtain low electrical resistivity. The casting and curing procedures of soft lithography were used to form stamps/molds of the elastomer poly(dimethylsiloxane) (PDMS; Sylgard, Dow Corning).

In a first set of experiments, the basic features of this method as applied to interconnects and contacts to test structures were examined. The molding step relies on established methods for soft imprint lithography. Concepts for using the molded features as trenches to be filled with conductive pastes, and accomplishing the molding at the same time as printing are both unusual aspects of the process reported here. The filling procedures involve first dispensing a line of silver epoxy along one edge of a flat region of the substrate, located a short (e.g. 3-5 mm) distance away from the molded features. As an implement for scraping this epoxy over the surface, we used a slab of PDMS roughly 3 cm long, 1 cm thick and with a width somewhat larger than that of the molded substrate. This element has a ~45° beveled edge, similar to squeegees used for screen printing. Scraping this edge across the substrate at an angle of ~30 degrees several times filled the trenches with epoxy and left only small amounts of residue on the top surfaces. Scraping several additional times with another PDMS element soaked in acetone removed these residues. FIG. 25a shows a pattern of conducting features formed in this fashion on a molded layer of PU (20 µm depth) on a substrate of polyethylene terephthalate (PET). These results illustrate the range of feature sizes (line widths 20-200 µm, lengths 0.2-2.0 mm, in straight, curved and zig-zag geometries, and in text) and shapes that can be formed easily, and the good levels of uniformity that are possible. The limit of resolution is determined by the sizes of particles in the silver epoxy (10-15 µm), rather than by the fidelity in the molding step. FIG. 25b shows cross sectional views of lines formed with aspect ratios (depth to width) of 1 and 0.1. The limits at the high and low ends of this range are defined, respectively, by inability to push epoxy into deep, narrow features, and tendency to scrape it completely away from the center regions of shallow, wide features. Decreasing the viscosity and particle sizes in the epoxy can improve the former aspect; increasing the stiffness of the slab of material (PDMS in this case) used to scrape the epoxy into the grooves can improve the latter. Independent of dimension in the acceptable range, we found values of electrical resistivity (3.0-6.0×$10^{-4}$ Ω·cm) roughly two orders of magnitude higher than bulk silver (1.6×$10^{-6}$ Ω·cm), for curing temperatures of 150 and times of 5 minutes, consistent with specifications from the vendor. Contacts to devices and electrical crossovers can be formed in the manner of FIG. 24. FIG. 25c shows such an example, where metal pads (Cr/Au, 100/1000 nm; 500×500 µm) formed in a square array (1.5 mm pitch) on a PET substrate provide an equivalent of the devices in FIG. 24. Defining trenches in PU using a stamp/mold with a design similar to that of FIG. 24 followed by filling with silver epoxy yielded the structure shown in the image of FIG. 25(c). The bottom left and right frames provide a schematic cartoon illustration and a top view optical micrograph, respectively. The lines here have widths of 100 µm and depths of 20 µm. The contacts to the electrode pads are defined by molded features with depths of 40 µm and lateral dimensions of 100×300 µm. Current/voltage data (FIG. 25(d)) collected by probing contact pads to different combinations of row (r1, r2, etc) and column (c1, c2, etc) electrodes verifies electrical continuity along given columns and rows and electrical isolation (i.e. >GΩ) between all other pairs of lines.

To demonstrate this concept in real devices, AlInGaP light emitting diodes (LEDs; 250×250 µm) formed in ultrathin (2.5 µm thick) layouts were used. Here, the printing step to transfer these devices from a GaAs wafer to a glass substrate occurred first, followed by molding to define contacts and interconnect. FIG. 26(a) shows a set of six such LEDs, with an independent pair of electrical leads to each. The top inset provides a top view optical micrograph. The three devices in the middle were connected to a power supply to induce light emission, for the purpose of illustration. The current/voltage characteristics shown in FIG. 26b are similar to those observed in devices (non-ohmic contacts) interconnected with conventional procedures of photolithography and lift-off.

Microscale monocrystalline silicon solar cells provide another device example. Here, collection of five such cells were formed into interconnected arrays for a minimodule using the schemes as shown in FIG. 24, where printing and molding occurred simultaneously. See FIG. 27a. The process steps for fabricating the cells appear elsewhere. Each cell consists of a bar of monocrystalline silicon (width, length and thickness of 50 µm, 1.55 mm and 20 µm, respectively) with ohmic contacts of metal (Cr/Au, 100/1000 nm; 50 µm width and 100 µm length for the p contact; 50 µm width and 1.4 mm length for the n contact). FIG. 27(b) shows a sample, with an inset that provides a cross sectional view of part of the structure. In these systems, illumination occurs through the backside surface of the transparent substrate; the interconnect lines and metal layers serve as reflectors. FIG. 27(c) gives current/voltage characteristics carried out at room temperature using a DC source meter (Model 2400, Keithley) operated by Labview5®, and a 1000 W full spectrum solar simulator (Model 91192, 4×4 inch source diameter, ±4° collimation, Oriel) equipped with AM 0 and AM 1.5 direct filter. The efficiency ($E_{ff}$) and fill factor (FF) of this solar cell, corresponding to measurement on all five interconnected cells in the module, were 6.5% and 0.61 respectively, obtained using standard procedures and considering only the geometrical sizes of the cells (not explicitly separating flux from the sidewalls). These properties are in the same range as those of arrays of similar devices interconnected using conventional procedures.

In summary, the procedures reported here might provide an attractive solution to electrical interconnection of classes of systems that incorporate assemblies of micro/nanoscale devices or material elements. Although their use in prototype devices for photovoltaics and lighting indicators demonstrates the key aspects, the same methods can also be used to establish electrodes and/or interconnects in related systems that use micro/nanoscale material elements, such as nanowires, nanomembranes, nanotubes, and others. The printing and molding can occur either sequentially or simultaneously, depending on requirements. The final, embedded configurations of the devices that result from this process have practical advantages for encapsulation. The ultimate limits in the resolution are defined by the soft imprint molding procedures (e.g. ~1-2 nm for PDMS molds) and the conductive pastes (e.g. 5-100 nm for Au or Ag nanoparticles). Their use in realistic applications will also be limited by achievable registration of the stamp/mold elements to the device components or material elements. Flexible sheets of plastic or glass can form support structures for thin layers of PDMS, to reduce distortions to one or two micron levels over areas of hundreds of square centimeters, or larger. The characteristics of the methods described here, their simplicity and potential for low cost operation over large areas, and the diversity of materials and devices with which they can be applied suggest a potential for broad utility.

Example 3: Printed GaAs LEDs

GaAs LED device fabrication starts out with the epitaxially grown LED wafer. Epitaxial layers of GaAs wafers are shown in FIG. 28. The stack structures of this particular GaAs LED wafer used for the experiments are also listed in Table 1 below.

From the multi-quantum well (MQW) which is shown as layer 5 in FIG. 28 and Table 1, barrier, cladding, spreading, and contact layers symmetrically distributed to form a Vertical-type LED (VLED). Epitaxial structures for GaAs LED are, however, not restricted to this particular structures. There are many variant structure designs for different purposes and applications, and transfer-printing technology should be compatible regardless of this epitaxial structure designs.

The processing schematics for µ-GaAs LED is shown in FIG. 29. The fabrication process starts out with the commercially available GaAs LED epitaxial wafer with an embedded sacrificial layer as shown in FIG. 28. First, $SiO_2$ layer is deposited onto the GaAs LED wafer and photolithographically patterned $SiO_2$ layer serves as an etch mask for the isolation step which is carried out by dry-etching (i.e. ICP RIE with $Cl_2$). GaAs can also be isolated using wet etchant (i.e. HCl), and Photo-resist (PR) can be sufficient as an etch mask in this case. The point is that $SiO_2$ can be any other etch mask depending which isolation route is considered. Once GaAs LED cells are isolated on the host wafer, heterogeneous anchors are photolithographically defined as illustrated in FIG. 29. Scanning Electron Microscopy (SEM) images along with Optical Microscopy (OM) images of these GaAs LEDs after isolation (A), anchoring (B), and printing (C) processes are shown in FIG. 30.

TABLE 1

Epitaxial Layers of GaAs LED wafer

| Layer | Layer Name | Material | Thickness (nm) | Type | Dopant | Concentration (cm$^{-3}$) |
|---|---|---|---|---|---|---|
| 1 | Contact | GaAs | 5 | P | C | 1.00E+19 |
| 2 | Spreader | $Al_{0.45}Ga_{0.55}As$ | 800 | P | C | 1.00E+18 |
| 3 | Clad | $In_{0.5}Al_{0.5}P$ | 200 | P | Zn | 3E17 to 6E17 |
| 4 | Barrier | $Al_{0.25}Ga_{0.25}In_{0.5}P$ | 6 | — | — | <1E16 |
| 5 | Well | $In_{0.56}Ga_{0.44}P$ | 6 | — | — | <1E16 |
| 6 | Barrier | $Al_{0.25}Ga_{0.25}In_{0.5}P$ | 6 | — | — | <1E16 |
| 7 | Clad | $In_{0.5}Al_{0.5}P$ | 200 | N | Si | 1.00E+18 |
| 8 | Spreader | $Al_{0.45}Ga_{0.55}As$ | 800 | N | Si | 1.00E+18 |
| 9 | Contact | GaAs | 500 | N | Si | 4.00E+18 |
| 10 | | $Al_{0.96}Ga_{0.04}As$ | 1500 | N | Si | 1.00E+17 |

TABLE 1-continued

Epitaxial Layers of GaAs LED wafer

| Layer | Layer Name | Material | Thickness (nm) | Type | Dopant | Concentration (cm$^{-3}$) |
|---|---|---|---|---|---|---|
| 11 | | GaAs | 1500 | N | Si | 1.00E+17 |
| 12 | | Al$_{0.96}$Ga$_{0.04}$As | 500 | N | Si | 1.00E+17 |
| 13 | Substrate | GaAs | | N | Si | >1E18 |

Example 4: Printed GaN LEDs from Silicon

GaN device fabrication begins with a host wafer with a suitable epitaxial layer stack as shown in FIG. 32. This particular GaN LED structures are epitaxially grown on Si (111) wafer. However, similar fabrication process can be employed on GaN LED structures grown on Sapphire or any other host substrates.

Following from FIG. 33, access to the n-GaN is achieved by a) ICP-RIE etching of the p-GaN and quantum well region. Mixed metal ohmic contacts, first n-contacts then p-contacts, are subsequently deposited and annealed with a standard high temperature rapid thermal annealing process. Device isolation is achieved via patterning Si$_3$N$_4$ and a thick metal etch mask and ICP-RIE etching for the isolation. Since this system is concerned with utilizing the anisotropic etching characteristics of the underlying Si(111) substrate, sufficient etch depth into the Si substrate must be obtained. Potassium hydroxide (KOH) or Tetramethylammonium hydroxide (TMAH) is used as the anisotropic etchant of Si(111) which results in suspended devices tethered to the host wafer via anchor bars as shown in FIG. 34. It is, however, not restricted to used KOH or TMAH. As a matter of fact, drying etching silicon using gases such as SF$_6$, CF$_6$, and XeF$_2$, could isotropically etch underlying silicon to generate free-standing μ-LEDs chiplets. For KOH-based etching system, Si$_3$N$_4$ is used in the previous etch mask to serve as a protective barrier to ohmic contacts from the harsh conditions of the strongly alkaline KOH solution. Individual devices are removed from the host substrate via contacting with a soft elastomeric stamp, namely PDMS, and pulling the stamp quickly in the vertical direction. This device is then transferred to a secondary substrate coated with a thin polymer adhesive layer (i.e. PDMS, SU-8, polyimide, BCB, sol-gel silica, etc) or without any such layer.

Utilizing a step-and-repeat process, devices can be removed from a very dense array and be printed to a sparse array of any desired spacing. An optical image of a donor substrate during the step-and-repeat process is shown in FIG. 35. It shows retrieved LED cells which are transferred onto the foreign substrate. This step-and-repeat concept is not restricted to GaN LED, but can be employed in wide variety of materials including GaAs LED, which is shown in FIG. 36. The transfer can be accomplished with a patterned or an un-patterned stamp. The transfer can be facilitated by the use of specialized relief structures, embedded actuators (balloons, local heaters, and the like) or by externally applied forces or radiation (laser exposure, etc). In some cases, it is possible, for example, to print the LEDs directly onto a pre-metalized substrate to achieve transfer and, at the same time, electrical interconnect and interface with heat spreading structures. In addition to these variants in printing, the processing sequence of FIG. 33 can be implemented in different orders—e.g. the ohmic contacts can be defined on the foreign substrate, after printing.

Current-voltage (I-V) characteristics of undercut and printed devices were measured using an Agilent 4155C Semiconductor Parameter Analyzer as shown in FIG. 37(b). Light emission spectrum was collected using a spectrometer from Ocean Optics and according to FIG. 37(c) the peak emission wavelength is 472.3 nm. As shown in FIG. 37(b), an individual μ-GaN LED exhibits forward bias voltage of ~4.2V at the forward current of 50 mA with an emission wavelength at around 470 nm.

Experimental results have shown slight etching of the GaN stack upon extended exposure (~20 min) to KOH. FIG. 38 shows two SEM images of a 100 μm×100 μm device immediately following the ICP-RIE deep etching with the Ni/Si$_3$N$_4$ etch mask still intact. Slight sidewall striations can be noticed due to the anisotropic etching of the ICP-RIE. Following KOH undercut of the device, moderate roughening of the device sidewall is observed.

Etching of GaN is very slow and is considered negligible in the context of LED fabrication, i.e. sidewall roughening has no effect on device performance. If pristine sidewalls are desired, an additional passivation step can be included in the fabrication process, FIG. 39. Following ICP-RIE deep etching, a) Ni etch mask is removed followed by Si$_3$N$_4$ deposition by PECVD. A b) timed RIE etch then removes Si$_3$N$_4$ from the trench "floors" and c) SF$_6$ RIE treatment will etch the underlying Si substrate. The device e) can then be undercut in KOH then f) transfer printed to a secondary substrate followed by buffered oxide etchant removal of the remaining Si$_3$N$_4$.

Printed GaN LEDs from Sapphire

Due to the relatively large mismatch in lattice constants of GaN and Si(111), sapphire has always been the predominant substrate for GaN growth. Sapphire, however, is very inert, making etching of the material very difficult. Grinding, polishing and other process approaches might be suitable. An alternative route to printed devices from a sapphire substrate (also applicable to SiC and other substrates) utilizes the laser lift-off method, which is shown in FIG. 40. Alternatively, releasing the GaN stack from handle wafer by selective etching of a sacrificial layer are also shown in FIGS. 41 and 42.

Laser Lift Off with Wafer-LED Layer Bonding

FIG. 40 shows steps for processing GaN LEDs grown on a sapphire substrate then wafer-bonded to a Si (111) substrate and removed from the sapphire via laser lift-off. The first steps include b) n-contact deposition and annealing then c) wafer bonding and laser lift-off. Exposed interface between GaN and sapphire is easily delaminated and transferred from sapphire to receiver wafer, as can be shown in c), d). Freestanding GaN layers are fabricated for LED devices by silicon undercut etching with KOH (similar to procedures described in the previous sections), GaN buffer layer elimination (via polishing, as illustrated here, or by etching or related procedures) and e) n-contact electrode patterning. The inset image shows experimental results of sections of GaN epimaterial bonded to a Si (111) wafer coated with Au. GaN structures here are composed of 5×5 mm$^2$ squares on 2 inch sapphire. Receptor wafer is 3 inch diameter with <111> direction. Trench etching and other approaches, not explicitly indicated here, are often necessary to achieve high yields in this overall process flow.

Sacrificial Layer for Undercut Etching: PEC Etching

As mentioned above, sacrificial layer inserted in GaN stack can be used as an alternative to wafer bonding. Various sacrificial layers (InGaN, SiO$_2$, AlAs, Si$_3$N$_4$, ZnO, and etc.) can be used which are etched selectively in solutions (i.e. HF, HCl, and H$_3$PO$_4$). Etching methods are various. Directional wet etching, PEC (photoelectrochemical) etching and EC (electrochemical) etching can be utilized to form free-standing GaN LED layers suitably configured for printing. FIG. 41 presents one example.

FIG. 41 presents InGaN sacrificial layer and selectively etching of this layer by the PEC etching method. Here, a sacrificial layer such as InGaN layer is inserted between GaN stack and GaN buffer layer. Selective etchants (such as HCl, KOH, and etc) can be utilized for PEC etching (i.e. GaN etching rate ~0). After dry etched a), entire device substrates on sapphire are etched with PEC etching. The metal in the field serves as a cathode during PEC etching b) in diluted HCl (0.004M) with 1000 W Xe lamp. The lamp photo-generates carriers and associated PEC etching, while an intentionally doped GaN film filters out the light with energy higher than band gap of GaN, thereby limiting etching to the lower band gap InGaN sacrificial layer. Selectively undercut GaN devices are transferred by protruding PDMS mold, d).

Sacrificial Layer for Undercut Etching with EC (Electrochemical Etching)

FIG. 42 explains one of examples of an EC etching method. It is quite similar with PEC etching, however, photo irradiation is not needed in this system. The electrolyte can help a sacrificial layer be decomposed and etched. In panel (a) of FIG. 42, GaN/InGaN multilayer structures are covered with a passivation layer, such as SiN$_x$ or SiO$_2$, and a cathode (e.g., Ti/Au) is fabricated on the InGaN sacrificial layer. Panel (b) of FIG. 42 shows connection of the cathode to power supply in an electrolyte (e.g., 0.008 M HCl). As shown in panel (c) of FIG. 42, the sacrificial layer can be removed, followed by removal of the passivation layer, for example with buffered oxide etchant (BOE). Finally, as shown in panel (d) of FIG. 42, the structures are selectively transferred by transfer/contact printing Sacrificial Layer for Undercut Etching: Selectively Wet Etching Sacrificial layers that can be removed without PEC or related schemes for selectively are also possible.

FIG. 43 presents an example of wet etching strategy for freestanding GaN LED cells. ZnO buffer layer can be used for template of GaN epitaxial process. ZnO layer is selectively etched by 5% diluted NH$_4$Cl in water. Materials such as SiO$_2$ can be used for passivation, as they are not removed by this etchant.

Example 5: Anchoring Structures

During the process of generating free-standing μ-LEDs structures (i.e. μ-GaAs LED, μ-GaN LED, and etc), anchoring structures were used to hold μ-LED chiplets in place preventing them from being disturbed or being displaced. Various anchoring schemes are proposed in this example. In large, the anchoring structures can be divided into two different categories: Heterogeneous anchoring and Homogeneous anchoring.

Heterogeneous Anchoring Structures

Heterogeneous anchoring represents anchor structures that are different materials than the chiplet materials. (i.e. polymer anchor, and etc). One type of heterogeneous anchoring system is shown in FIG. 44.

In this particular heterogeneous anchoring structure shown in FIG. 44, photolithographically defined photoresist (PR) is used as an anchor. It is, however, not restricted to photoresist. In fact, any material (i.e. organic, inorganic, ceramic, and etc) that withstands the etchant or etching species can be served as an anchor. As illustrated in the FIG. 45, various geometries of heterogeneous anchoring structures can be employed depending on process conditions. Anchoring geometries shown in FIG. 45 are only few examples from many possible variances.

Homogeneous Anchoring Structures

In the case of μ-GaN LED chiplets on silicon (111), natural homogeneous anchors are formed if chiplets are aligned parallel to the [110] direction of the silicon (111) wafer. Anisotropic Si etchant (i.e. KOH, TMAH, and etc) exhibits significant etch rate variation depending on crystalline direction they are etching. For example, KOH etches [110] and [100] direction several hundred times faster than [111] direction. In other words, if μ-GaN LED chiplets are aligned parallel to [110] direction, etch rate difference between (110) and (111) planes produces a natural anchoring system as shown in FIG. 46. Since these anchors are same material as the μ-GaN LED chiplets, we refer them as Homogeneous anchors.

Example 6: Encapsulation & Interconnection

Once μ-LED cells are transfer printed onto a foreign substrate, the cells can be passivated and encapsulated in a manner that leaves the contact regions exposed for electrical interconnection. On conventional LED process, electrical connection from LED to the external pins are often realized via wire bonding. Wire bonding process requires the ball size of about 100 μm in diameter as shown in FIG. 47.

Consequently, the light-emitting area effectively gets reduced by the size of the ball required for the wire bonding process. Unless the ball size for the wire bonding is dramatically reduced, reducing the LED die size simply becomes unrealizable. Recent work with GaAs based devices demonstrates the ability to use planar processing techniques to establish interconnects that are much smaller than those possible with wire bonding. These strategies can also be implemented with GaN devices, alone or in combination with wire bonding, screen printing, transfer printing/molding and other approaches.

Encapsulation Via Back-Side Exposure (EBSE)

This example describes a self-aligned process that is referred to herein as Encapsulation via Back-Side Exposure, as illustrated in FIG. 48.

First, photosensitive polymers (negative tone) can be spin-coated or spray-deposited onto the transferred μ-GaN LEDs on a transparent substrate. Photosensitive polymers with a sufficient thickness can encapsulate the entire substrate conformally as illustrated in FIG. 48. P-ohmic contact metal composition can be selected to have a high transparency in the emission wavelength and but only partial transparency at the UV wavelengths for the process of FIG. 48. Thick contact pads are deposited on P-ohmic contact metal. By taking advantage of transparent nature of the substrate and reflective nature of the P-contact pads, the photosensitive polymer layer can be exposed from the backside of the substrate with the optimum exposure dose. During the back-side (flood) exposure step, thick contact pads on the LED chiplet simply serve as self-aligned masking layers such that the photosensitive polymer in these regions is not exposed by the backside irradiation. These regions can be selectively removed during a subsequent developing step. After the final curing step, conventional photolithography or related approaches can be used for the interconnection between LEDs. Many variations of these basic concepts are possible.

Scanning Electron Microscopy (SEM) and Optical Microscopy (OM) images of μ-GaN LED after Encapsulation via Back-Side Exposure process are shown in FIG. 49 above. Profilometer data on μ-GaN LED after the process appears in FIG. 50 below. Blue and Black profiles represent the as-printed μ-GaN LED cell before the encapsulation process and printed μ-GaN LED cell after the encapsulation process, respectively.

A fully interconnected string of μ-GaN LEDs are shown in FIG. 51 above. Incorporating a series connection between μ-GaN LEDs results in highly uniform light output from one μ-GaN LED to another because of identical current flowing through these μ-GaN LEDs. Furthermore, two strings of five μ-GaN LEDs connected in series are shown in FIG. 52 below.

Example 7: Molded Interconnection for μ-LEDs

As an alternative to the process of FIG. 48, LED isolation and interconnection can be done in a single step (or multiple, sequential steps) using the molded interconnection method as illustrated in the FIG. 53 and FIG. 54.

As illustrated in FIG. 53 above, selectively transferred LEDs can serve as a template for creating a master for the PDMS mold. By photolithographically patterning photosensitive polymer (i.e. Su-8 from Microchem), trenched patterns can be fabricated leading from the LED contacts. These trenched patterns can be designed following the desired interconnection patterns. Therefore, the molded elastomer stamp using this master would have protruded interconnection structures. 3D patterned elastomer stamp can be used to selectively pick up LEDs from their donor substrate, and transfer them onto the target substrate using photocurable polymer such as NOA (Norland Optical Adhesive) creating embossed structures. Elastomer stamp can be simply peeled off after photo-curing adhesive polymer resulting in trenched patterns for the interconnection between LEDs similar to the master substrate. When applied silver paste would simply fill up the previously created trenches and silver paste on the top surface can simply be scrapped off leaving silver paste only in the trenched regions. Resulted silver paste in the trenched regions can now serve as an interconnection between LEDs and external contacts as illustrated in FIG. 54.

An optical image and the electrical measurement on metalized LEDs are illustrated in FIG. 55.

Furthermore, this molded interconnection approach can be slightly modified to generate by including the opaque or reflective layers on the areas of stamp that contact the device electrodes as illustrated in FIG. 56. In this way, the photo-curable molding material would not be exposure to irradiation and hence be left uncured only on those locations enabling easy removal with appropriate solvent. In FIG. 56(*a*), metal is deposited or transferred only on the surface of PDMS relief features which is supposed to be in contact with electrodes of devices. Another approach is depicted in FIG. 56(*b*) where patterned mask which corresponds to electrodes of device is place on the backside of PDMS stamp during the UV curing effectively serving as a masking layer.

The ultimate limits in the resolution of the molded interconnection approach are defined by the soft imprint molding procedures and the Ag particle size. Average Ag particle size used in the experiment above is about 10~15 μm, which makes it difficult to generate finer interconnection. Using Ag nano-particles with the average size of 5 nm~100 nm, the resolution of molded interconnection could improve dramatically down to sub-micron regime.

Besides the molded interconnection approach, e-jet printing approach and direct-ink writing approaches can also be used as alternative interconnection schemes.

Example 8: Mesh Interconnection for Vertical LED (V-LED)

Interconnection for a vertical LED (a type of LED where electrical contact for N and P are made top and bottom as shown in FIG. 58) can be accomplished by Mesh Interconnection approach, which is illustrated in FIG. 59.

Fabrication Process for the Mesh Interconnection is illustrated in FIG. 59. As shown in FIG. 59, metal mesh gets transfer printed onto the plastic substrate with the adhesive layer. Since metal-mesh structure is only partially covering the adhesive layer underneath, μ-LEDs can effectively be transfer-printed onto the substrate. These metal mesh can not only serve as a electrical connection to the printed μ-LEDs, but also as a heat sink. A thin adhesive layer of PDMS (although it is not restricted to PDMS) facilitates printing onto the glass substrate. A photo-patterned layer of epoxy on top of the devices prevents shorting of the top film to the bottom mesh.

Serial Interconnection Vs. Parallel Interconnection for μ-LEDs

μ-LED, like any diode, has an exponential relationship between current and voltage. In other words, a slight variation in the forward voltage between cells could result in a much larger difference in the operating current, and hence different luminescence. When a large number of μ-LEDs are connected in parallel, a μ-LED with a smaller forward voltage, or turn-on voltage, would draw most of the supplied current instead of all μ-LEDs receiving the same amount of current. In a series connection, however, all μ-LEDs would receive equal amount of current since there's only one possible current path in a serially connected string of μ-LEDs as illustrated in FIG. 60. As shown in FIGS. 60 and 61, combination of series/parallel connection generates more uniform light output from large number of interconnected μ-LEDs.

Planar Interconnection

As mentioned in previous section, the ultrathin property of these printed μ-LEDs enable a conventional planar interconnection schemes as illustrated in FIG. 62. Conventional LEDs with vertical thickness in an order of several hundred μm, simple planar interconnection scheme suggested here becomes extremely challenging or almost impossible to achieve due to the extremely high step coverage, which is why the wire-bonding approach has become the main stream approach as shown in FIG. 47 earlier.

Example 9: Stretchable Lighting System Based on Printed μ-LEDs

The interconnects of the spatially independent micro-lens array can be fabricated in a serpentine-like (not shown) or accordion-like (shown in FIG. 63) fashions to serve as a force dampening mechanism. With such a design, the module can be stretched and bent but the interconnect will stretch and flex so as to absorb the lateral forces exerted due the change in relative position of each pixel keeping the curvature of the micro-lens unchanged. Furthermore the surface of these micro-lens can be roughened to serve as the diffusion stage.

The approach in FIG. 63 is used for creating a stretchable interconnection, while that of FIG. 64 is used for creating stretchable μ-LED, per se, for possible outcoupling of the light output via strain-induced modification of the band structures of μ-LEDs.

Example 10: Enhancement in Light Extraction from μ-GaN LEDs

Recent research on GaN blue LEDs has led to a rapid development of the quality of the devices, pushing the performance to ever higher levels. GaN based LEDs are expected to soon take over conventional (incandescent, fluorescent, and compact fluorescent) lighting systems but progress has been slowed by the relatively poor light extraction. Due to the high refractive index (~2.5) of GaN, the critical angle for light escape into air is ~23.6°, as calculated by Snell's law. Light incident upon the inside surface outside of this angle is reflected back into the device where absorption in the epi-layers subsequently quench the light. To this end, several technologies can be applied to this flexible array of GaN LEDs which will enhance the optical performance of the system.

Example 11: Textured and/or Roughened Surface for Improved Light Extraction

The normal, "mirror-like" surface of a GaN LED leads to a large fraction of light to be internally reflected thereby decreasing the light extraction efficiency of the device. A method to increasing light extraction is to roughen to the bottom surface serving as a means to reducing internal reflection and scattering the light outwards from the LED as shown in FIG. 65.

Fabrication of a roughened surface will closely follow established μ-GaN LED fabrication methods, as described previously. Following complete device fabrication individual pixels will be undercut by anisotropic potassium hydroxide (KOH) etching of the silicon substrate, performed in an environment free of ultra-violet (UV) light (i.e. cleanroom). Upon complete undercut, a plasma enhanced chemical vapor deposition (PECVD) passivation layer of $Si_3N_4$ is deposited to protect ohmic contacts and sidewalls of the fabricated device. Further etching in KOH in the presence of UV light will promote the photoelectrochemical (PEC) etching of the exposed (bottom) side of the μ-GaN LED, forming pyramidal shaped structures that serve as efficient light scattering centers as shown in FIG. 66.

These LEDs are well suited for bottom emission, with the potential to enhance light extraction by 100% or more. Bottom emission can be efficiently achieved by using a thick, reflective p-contact. Contact schemes utilizing Pt/Ag as the p-contacts have reportedly shown reflectance values of 80%. Additional reflectance can be realized by the addition of a top-side reflector made of thick Al or Ag which demonstrate very high reflectivity at 470 nm.

Schematics for optically enhancement with outcoupling is shown in FIG. 67 below. Although schematics in FIG. 67 is illustrated with μ-GaN LED from Sapphire substrate using Laser Lift-off approach, the concept of using GaN cones structures for outcoupling the light is not restricted to this particular process. After the wafer bonding ((a)~(d)), residual GaN buffer layer could be selectively etched by crystallographic wet etching, (e). GaN buffer layer can be etched by $H_3PO_4$ etchant and PEC etching. Inset SEM image shows an example of GaN cones made by the crystallographic wet etching (D. A. Stocker et al Appl. Phys. Lett. 73, 2654 (1998)). Below two illustrations demonstrate the light emission path comparison between LEDs with GaN cones and without GaN cones. By Snell's law, impinged light by the interface is randomly emitted. On the other hands, with GaN cones device light can be emitted with straight propagation after impinged on surface.

Micro-Lens, Polymeric Molded Structures for Improved Light Extraction

Towards the realization of highly efficient top emitting LEDs, micro-lens arrays can be incorporated into the final device. Lens structures, being fabricated from a higher index material (typically a polymer of n~1.5) increase the light extraction cone at the GaN/polymer interface. The lens shape is better capable of extracting light from the polymer medium to surrounding air.

Micro-lens arrays can be fabricated through a series of established photolithographic techniques. Processing begins with patterning of a photoresist. Elevated temperatures will cause the photoresist to reflow in a manner that reduces surface energy, resulting in a lens-like shape. This pattern can be captured by molding an uncured polymer such as PDMS to the micro-lens array. Final lens geometry is obtained by molding an optically clear polymer (i.e. Norland Optical Adhesive) to the PDMS mold. The lens can be removed from the mold, aligned, and laminated to the LED array.

The above micro-lens geometry can be optimized to an LED array when the array is left in an un-bent state. Upon bending, lateral forces in the lens array will cause deformation in the individual lens structures thereby decreasing the optical performance of the lens. In an effort to achieve total flexibility the following system is proposed that offers a spatially independent lens array in which the movement of a pixel does not exert lateral forces conducive to lens deformation on its neighbor pixel.

Processing of a spatially independent lens array follows a similar fabrication route as above. Pixel interconnects are patterned along with each micro-lens feature. The independent nature of this array arises in molding the polymer encapsulant (step "e" in FIG. 70) when a sufficiently thin polymer film is spun such that only the depressed (lens and interconnect) features are filled. Upon removal from the mold the spatially independent lens array is then aligned and laminated to the micro-LED array.

Processing schematics for fabricating polymeric patterns for optical enhancement of μ-GaN LED is shown in FIG. 71. After wafer bonding ((a)-(d)) and residual GaN polishing, polymeric patterns can be formed by molding, imprint, colloidal lithography, etc. Patterned polymeric structures can manipulate light intensity, light wave length shift. Duty ratio and polymeric beads size can control emission properties.

Fabrication of micro-lens and polymeric structures are not restricted only to the above processes. Micro-lens can also be fabricated in various approaches such as casting, molding, imprint, colloidal lithography, screen printing, ink-jet printing, E-jet printing, and etc. These micro-lens and polymeric structures can be either fabricated on the already-printed μ-GaN LED, or can be fabricated on the different substrate and be transfer-printed onto the μ-GaN LED afterwards.

Furthermore, besides those added modifications (i.e. micro-lens, cone structures, and etc), the thin and small geometries of these printed μ-LED results in higher extraction efficiency per unit area. These printed μ-LED have a size much smaller (100 μm² to 10,000 μm²) than conventionally LEDs (100,000 μm² to 1,000,000 μm²). In other words, μ-LEDs fabricated here are as much as 10,000 times smaller than conventional LEDs. Attributing to its micro-size effects as well as to more efficient usage of the injected current, light from the quantum well is more likely to be escaped from the LED because of smaller number of internal reflections and larger surface-to-volume ratio.

Example 12: Merging the Light Output from the Bi-Direction LED

μ-LED printed onto a transparent substrate such as a glass or a plastic exhibits bi-axial illumination as shown in FIG. 72. In other words, light from the printed μ-LED can be emitted from the top as well as from the bottom.

Highly reflective metals (e.g. Al, Ag, Pt, and etc) can be deposited on the top of the printed μ-LED or μ-LED can printed on highly reflective metal foil to reflect the light to merge the light emission into one-direction, which in turn increases the light output.

As illustrated in FIG. 73, a micro-lens can be fabricated or placed on the printed μ-LED. These micro-lenses can simply be molded using photo-curable resin as illustrated in the figure above or be fabricated elsewhere and be transfer-printed onto μ-LED. Highly reflective and thermally conductive metals, such as Ag, can be plated, evaporated, or sputtered on top of the these structures to create a mirror-like structures to reflect the light emitted from the printed μ-LED. These reflectors can also be placed on the side to direct the light emitting from the edges of printed μ-LED. As mentioned in this example, the above system is suited for the margining the bi-directional light output into the bottom emission. However, a similar system can be incorporated into top emission system simply by transfer-printing μ-LED onto the already fabricated the micro-lens system with a reflective mirror. Additionally, re-directed light output using various approaches mentioned above, optical fibers can be incorporated in various ways to manipulate the focused light direction arbitrary. Furthermore, these reflectors can also be served as a heat sink due to its high thermal conductivity.

Example 13: Multiple Stacks of μ-LEDs

Epitaxial wafer of compound material is a considerably more expensive process than the Cz process of silicon. Cost saving process for generating epitaxial wafer is proposed in FIG. 74. As shown in FIG. 74, multiple μ-LED layers can be grown initially. Although the schematic in FIG. 74 illustrates the multi-layer GaAs LED structures, the similar concept can be employed in GaN-based LED or any other structures from III-V and III-N compound materials. After the lattice mismatch issue between the substrate and the epitaxial layers is resolved by the growth of a buffer layer, an appropriate sacrificial layer and active LED layer can be grown in alternating fashion as illustrated in the figure. This growth process can be repeated several times to generate multiple layers of identical sacrificial layer and the active layers. μ-LEDs from the top most layer (or the 1st layer of μ-LEDs as depicted in the figure) can be defined in the free-standing fashion by undercutting the sacrificial layer as shown in the figure. These μ-LEDs can be transfer printed in various ways as we have mentioned in previous sections. Once the 1st layer is fully processed and transfer printed onto the foreign substrate, the 2nd layer is exposed and is ready to be processed identically as the 1st layer was processed. Hence, we can generate much more μ-LEDs from the single wafer. Hence, the total cost of fabricating μ-LEDs can get effectively reduced.

Example 14: Thermal Management for μ-LEDs

When a plastic substrate is used, thermal management of μ-LEDs is important because a plastic substrate is intrinsically an insulator. Printed μ-LED, however, has a size much smaller (100 μm² to 10,000 μm²) than conventionally LEDs (100,000 μm² to 1,000,000 μm²). In other words, μ-LEDs fabricated here are as much as 10,000 times smaller than conventional LEDs. Sparse array of smaller μ-LEDs could exhibit better thermal distribution than one larger LED because generated heat for a smaller μ-LED is far less than a larger conventional LED. Furthermore, sparser array geometry enables better heat dissipation than a larger conventional LED simply because heat generated for a larger conventional LED is more concentrated around the LED itself.

FIG. 75 illustrates the thermographic images of printed μ-LED on a plastic substrate without any heat sink in the proximity. The baseline temperature is fixed at 70° C. for this particular experiment.

Metallic Heat Sink on Top of μ-LEDs

Placing a thermally conductive heat sink in a proximity of the printed μ-LED can significantly improve the thermal dissipation from the printed μ-LEDs. A cross-sectional schematic of such a system is illustrated in the FIG. 76.

An electrical insulating dielectric layer with a higher thermal conductivity than organic polymer (i.e. SiN with thermal conductivity of 30 W/mK compared to 0.24 W/mK of PET), can be deposited on top of the printed μ-LEDs on a plastic substrate. A material with a high thermal conductivity, such as Ag and Cu, can be deposited on top of the μ-LED with an dielectric layer (i.e. SiN) in between for electrical isolation. Furthermore, a dielectric layer such as SiN can be controlled such that a very thin layer of a SiN layer is enough for electrical isolation.

Transfer Printing Materials with High Thermal Conductivity on Top of μ-LEDs

The materials for the heat sink can be metals, or any other material with a high thermal conductivity, such as a poly-crystalline diamond shown in FIG. 77. These materials can be transfer-printed via either active or passive system.

Use of printed μ-Diamond as a heat sink is shown in FIG. 77. μ-Diamond can be easily formulated in Chemical Vapor Deposition (CVD) process at a low cost. Grown μ-Diamond layer can be patterned and be lifted off from the mother wafer similar to μ-LED process described previously. These μ-Diamonds can be transfer printed on top of already-printed μ-LED serving as a efficient heat spreader & heat sink due to its exceptionally high thermal conductivity (>1000 W/mK). As shown in FIG. 75, thermal dissipation is not uniform, rather it is concentrated in a certain part of the printed μ-LED. Thermal management strategy described here can be designed such that the heat sink is placed strategically on the hot spot.

Placing a Heat Sink on Micro-Lens Used for Merging the Light Output from the Bi-Direction LED A μ-LED printed onto a transparent substrate such as a glass or a plastic exhibits bi-axial illumination. Highly reflective metals (e.g. Al, Ag, Pt, and etc) can be deposited on the top of the printed μ-LED or μ-LED can be printed on highly reflective metal foil to reflect the light to merge the light emission as discussed previously.

As illustrated in FIG. 78, a micro-lens can be fabricated or placed on the printed μ-LED. These microlenses can simply be molded using photo-curable resin as illustrated in FIG. 78. Highly reflective and thermally conductive metals, such as Ag, can be plated, evaporated, or sputtered on top of the these structures to create a mirror-like structures to reflect the light emitted from the printed μ-LED. Furthermore, these reflector can also be served as a heat sink due to its high thermal conductivity.

Example 15: Heterogeneous Integration of μ-LEDs with Printed Electronics

Utilizing step-and-repeat process, different classes of materials (i.e. μ-GaAs LEDs, μ-GaN LEDs, and printed μ-Si electronics, and etc) can be printed in a sequence into a single substrate for combining advantages of those different materials. For example, μ-Si is well suited for developing a complex electronics based on its stable electronic properties and matured processing technologies on both digital and analog circuits. Instead of μ-Si, μ-GaAs chiplets or μ-GaN chiplets could be used as a building block for developing high-frequency operating analog circuits for Radio Frequency (RF) optoelectronics on unusual substrates such as a plastic. In FIG. 79, one example of combing μ-GaAs LED, μ-GaN LEDs, and μ-Si electronics for developing full-colored inorganic active-matrix display is proposed.

Furthermore, carbon-based materials such as Carbon Nanotube (CNT) or Graphene films can be grown on another substrate and be transfer-printed onto already-printed μ-LEDs for developing a transparent electrodes and interconnection (as an alternative to ITO or ZnO transparent electrodes) to prevent the interconnection lines from blocking the light output. Additionally, a photodiode can also be heterogeneously integrated onto the printed μ-LEDs as illustrated in FIG. 80. A photodiode would simply detect the light intensity from the printed μ-LED and the output response of the photodiode can be fed back to the driving ICs for the μ-LEDs for the real-time self-calibration purpose.

Example 16: Integration of Phosphors and μ-GaN LEDs

White LED produced by combination of phosphor and a blue LED has several challenges to hurdle. One major challenge is the color uniformity. Due to the lack of uniformity in phosphor coverage, the resulting emission from the underlying blue LED and the phosphor varies considerably. As a result, the edges appear to be yellow whereas the center of the beam appear to be blue. LUMILED has developed a patented process on conformal coating of phosphor technology and thus far is the only LED manufacturer that can produce white LED with high uniformity.

FIG. 81 illustrates a new technique to disperse phosphor particles in uniform and array-like fashion. As illustrated in FIG. 81, elastomer is molded with an array of cavities. Geometries of these cavities can easily be controlled by patterning the master substrate into the desirable shapes and depths. Phosphor particles which have the diameter in the range of several microns can be mixed in the solvent, and poured onto the elastomer. Phosphors on the surface of the elastomer can be scrapped away by the elastomer blade leaving phosphors only in the cavities. By bonding the thin elastomer onto the molded elastomer, phosphors can effectively be bound inside the cavities in array-like fashion. Packaged elastomer with encapsulated phosphors can be directly laminated against the packaged μ-GaN LEDs on the flexible substrate as illustrated in FIG. 81(E). The distance between phosphors and LEDs and spacing between phosphor cells can be precisely controlled resulting in the highest level of uniformity. 3D cartoons are shown in FIG. 82 and FIG. 83 for more clear illustrations. Micro-lens structures mentioned in a previous example can be incorporated as well simply by lamination.

Example 17: Methods for Making μ-LEDs

FIG. 84 illustrates an exemplary embodiment for making an array of semiconductor devices. A growth substrate 8401 is provided and a semiconductor epilayer 8402 is grown on the surface via epitaxial growth. The epilayer 8402 is bonded to a handle substrate 8403 and is subsequently released from the growth substrate 8401. Next, a mask 8404 is patterned over the epilayer 8402 to define masked regions and exposed regions. Material is removed from the exposed regions to define the array of semiconductor devices 8405. The semiconductor devices 8405 are partially released from the handle substrate 8403, and remain connected by anchors 8406. Optionally, the patterned mask is removed (not shown). The partially released semiconductor devices 8405 are subsequently selectively printed onto a device substrate via a contact printing method.

FIG. 85 illustrates an exemplary embodiment for making an array of GaN LED devices. A sapphire growth substrate 8501 is provided and a GaN multilayer 8502 is grown on the surface via epitaxial growth. The multilayer 8502 is bonded to a handle substrate 8503 and is subsequently released from the sapphire substrate 8501. Next, a mask 8504 is patterned over the multilayer 8502 to define masked regions and exposed regions. Material is removed from the exposed regions to define the array of GaN LED devices 8505. The GaN LED devices 8505 are partially released from the handle substrate 8503, and remain connected by anchors 8506. Optionally, the patterned mask is removed (not shown). The partially released GaN LED devices 8505 are subsequently selectively printed onto a device substrate via a contact printing method.

FIG. 86 illustrates an exemplary embodiment for making an array of GaN LED devices. A silicon (111) growth substrate 8601 is provided and a GaN multilayer 8602 is grown on the surface via epitaxial growth. Next, a mask 8603 is patterned over the multilayer 8602 to define masked regions and exposed regions. Material is removed from the exposed regions to define the array of GaN LED devices 8604. In this embodiment, a portion of the silicon substrate 8601 is removed from the exposed region by the etching process. The GaN LED devices 8604 are partially released from the silicon substrate 8601, for example by a direction etch along <110> directions of the silicon substrate 8601. In this embodiment, the GaN LED devices remain connected to the substrate by anchors 8605. Optionally, the patterned mask is removed (not shown). The partially released GaN LED devices 8604 are subsequently selectively printed onto a device substrate via a contact printing method.

FIG. 87 illustrates an exemplary embodiment for making an array of GaN LED devices. A sapphire growth substrate 8701 is provided and a sacrificial layer 8702 is deposited thereon. A GaN multilayer 8703 is grown over the sacrificial layer 8602 via epitaxial growth. Next, a mask 8704 is patterned over the multilayer 8703 to define masked regions and exposed regions. Material is removed from the exposed regions to define the array of GaN LED devices 8705. The GaN LED devices 8505 are partially released from the sapphire substrate 8701 by etching portions of the sacrificial layer. In this embodiment, the GaN LED devices remain connected to the substrate by anchors 8706. Optionally, the patterned mask is removed (not shown). The partially released GaN LED devices 8705 are subsequently selectively printed onto a device substrate via a contact printing method.

FIG. 88 illustrates an exemplary embodiment for making an array of semiconductor devices. A sapphire growth substrate 8801 is provided and a GaN multilayer 8802 is grown on the surface via epitaxial growth. The GaN multilayer 8802 is bonded to a handle substrate 8803. To release the GaN multilayer 8802 from the sapphire substrate 8801, the interface 8805 between the sapphire substrate 8801 and the GaN multilayer 8802 is exposed to laser radiation 8804, thereby releasing the GaN multilayer 8802 from the sapphire substrate 8801. Next, a mask 8806 is patterned over the GaN multilayer 8802 to define masked regions and exposed regions. Material is removed from the exposed regions to define the array of GaN LEDs 8807. The GaN LED devices 8807 are partially released from the handle substrate 8803, and remain connected by anchors 8808. Optionally, the patterned mask is removed (not shown). The partially released semiconductor devices 8808 are subsequently selectively printed onto a device substrate via a contact printing method (not shown).

Example 18: Handle Substrate Processing

In some embodiments, a handle substrate is useful as an intermediate processing platform. For example, devices transferred to a handle substrate may undergo one or more patterning, growth, polishing, deposition, implantation, etching, annealing or other processing steps. Processing of electronic devices on a handle substrate may be useful, for example, if the handle substrate is capable of withstanding high temperatures or chemically inert. Such advantages are further advantageous if the growth and/or device substrates are, for example, not capable of withstanding high temperatures or not chemically inert. A handle substrate may also be useful, for example, as an assembly stage, where multiple electronic device components are positioned relative to one another to reduce the number of overall process steps and/or to limit processing steps on a device or growth substrate.

FIG. 89 illustrates a scheme for processing electronic devices on a handle substrate. In this embodiment, electronic devices 8901 are grown and patterned on a growth substrate 8902. At least a portion of the electronic devices 8901 are transferred to a handle substrate 8903, for example using methods described above, where they undergo additional processing. In this embodiment, handle substrate is capable of withstanding high temperature processing, for example for patterning ohmic contacts 8904 onto electronic devices 8901. After electronic devices 8901 are patterned with ohmic contacts 8904, they are transferred to a device substrate 8905 via a contact printing method. Additional processing of electronic devices 8901 while on the handle substrate 8903 is further contemplated.

FIGS. 90A and 90B illustrates another scheme for processing electronic devices on a handle substrate. In this embodiment, multilayer devices 9001 are grown on a growth substrate 9002. The multilayer device 9001 shown in FIG. 90A comprises a seed/buffer layer 9003 separating a lower active device layer(s) 9004 from the growth substrate 9002. A sacrificial layer 9005 separates the lower active device layer(s) 9004 from an upper active device layer(s) 9006. FIG. 90B illustrates a useful transfer scheme for such multilayer devices 9001 via transfer to handle substrates 9007 and 9008. The prepared multilayer devices 9001 are first processed to transfer upper active device layers 9006 to a first handle substrate 9007, for example by at least partially removing sacrificial layers 9005 followed by a transfer step. Lower active device layers 9004 are then left exposed and still attached to growth substrate 9002, after which they are transferred to a second handle substrate 9008, for example using methods described above.

FIG. 91 illustrates another scheme for processing electronic devices on a handle substrate. In this embodiment, electronic devices 9101 and 9102 are prepared on separate growth substrates 9103 and 9104, respectively. After growth and any necessary processing on the growth substrate (not shown), portions of each of the electronic devices 9101 and 9102 are transferred to a handle substrate 9105. Methods such as these allow for heterogeneously integrated electronic devices in a lateral configuration to be assembled onto a handle substrate. Optionally, electronic devices 9101 and 9102 undergo additional processing while on handle substrate 9105 before transfer to an appropriate device substrate (not shown). In one embodiment, electronic devices 9101 are first transferred to handle substrate 9105 followed by transfer of electronic devices 9102 to handle substrate 9105. In an embodiment, electronic devices 9101 and 9102 are transferred to handle substrate 9105 in a step-wise fashion, where one or more of electronic devices 9101 are transferred to handle substrate 9105 in one step, followed by transfer of one or more electronic devices 9102 to handle substrate 9105 in another step; additional transfer steps for electronic devices 9101 and 9102 are further contemplated, as are transfer of additional electronic devices to handle substrate 9105.

Alternative to or in addition to lateral configuration, devices can be heterogeneously integrated in a vertical configuration. Such a scheme for processing is shown in FIGS. 92A and 92B. In this embodiment, two different light emitting diode devices 9201 and 9202 are prepared on two different growth substrates, 9203 and 9204, respectively. At least a portion of light emitting diode devices 9201 are first transferred to a handle substrate 9205. At least a portion of light emitting diode devices 9202 are subsequently transferred to handle substrate 9205 on top of light emitting diode devices 9201. Optionally, intermediate processing of light emitting diode devices 9201 take place before transfer of light emitting diode devices 9202. FIG. 92B illustrates a cross sectional view of the vertically configured heterogeneously integrated devices on handle substrate 9205. Optionally, additional devices are further vertically integrated on handle substrate 9205. In a specific embodiment, light emitting diode devices 9201 emit blue light and light emitting diode devices 9202 emit red light.

FIG. 93 shows another example of processing an electronic device on a handle substrate. In this embodiment, buffer layer 9301 and electronic device 9302 are grown and optionally pre-processed on growth substrate 9303. In this specific embodiment, electronic device 9302 is a vertical type LED comprising n-type GaN region 9304, quantum well region 9305 and p-type GaN region 9306. Buffer layer 9301 and electronic device 9302 are detached from growth substrate 9303 and transferred to handle substrate 9307, for example using methods described above. While on handle substrate 9307, buffer layer 9301 is removed and, optionally, a portion of electronic device 9302 is also removed. Buffer layer 9301 and portions of electronic device 9302 are optionally removed by methods known in the art, such as chemical-mechanical polishing (CMP). The polished devices 9308 may subsequently be transferred to a device substrate and/or undergo additional processing while on the handle substrate (not shown).

FIG. 94 shows another example of processing an electronic device on a handle substrate. In this embodiment, electronic devices 9401 are grown and optionally patterned on a growth substrate 9402. At least a portion of the electronic devices 9401 are transferred to a handle substrate 9403, for example using methods described above. Here, heat management structures 9404 are patterned over the electronic devices 9401 on the handle substrate 9403. After patterning of heat management structures 9404, at least a portion of electronic devices 9401 and heat management structures 9404 are transferred to a device substrate 9405, for example via a contact printing method. In specific embodiments, patterning of heat management structures 9404 is a high temperature process and handle substrate 9403 is capable of withstanding the associated processing conditions with would otherwise damage or destroy growth substrate 9402 or device substrate 9405.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups are disclosed separately. When a Markush group or other grouping is used herein, all individual members of the group and all combinations and subcombinations possible of the group are intended to be individually included in the disclosure. Specific names of compounds or materials are intended to be exemplary, as it is known that one of ordinary skill in the art can name the same compounds or materials differently.

Every formulation or combination of components described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, reagents, synthetic methods, purification methods, analytical methods, assay methods and methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

REFERENCES

S.-C. Lo, P. L. Burn, *Chem. Rev.* 107, 1097 (2007).
F. So, J. Kido, P. Burrows, *MRS Bull.* 33, 663 (2008).
D. A. Gaul, W. S. Rees Jr., *Adv. Mater.* 12, 935 (2000).
S. Nakamura, G. Fasol, *The Blue Laser Diode: GaN Based Light Emitters and Lasers* (Springer, New York, 1997).

E. Yablonovitch, D. M. Hwang, T. J. Gmitter, L. T. Florez, J. P. Harbison, *Appl. Phys. Lett.* 56, 2419 (1990).

H. X. Jiang, S. X. Jin, J. Li, J. Shakya, J. Y. Lin, *Appl. Phys. Lett.* 78, 1303 (2001).

M. Konagai, M. Sugimoto, K. Takahashi, *J. Cryst. Growth* 45, 277 (1978).

E. Yablonovitch, T. Gmitter, J. P. Harbison, R. Bhat, *Appl. Phys. Lett.* 51, 2222 (1987).

C. Camperi-Ginestet, M. Hargis, N. Jokerst, M. Allen, *IEEE Trans. Photon. Tech. Lett.* 3, 1123 (1991).

C. Carter-Coman, R. Bicknell-Tassius, A. S. Brown, N. M. Jokerst, *Appl. Phys. Lett.* 70, 1754 (1997).

M. A. Meitl et al., *Nat. Mater.* 5, 33 (2006).

D. Y. Khang, H. Jiang, Y. Huang, J. A. Rogers, *Science* 311, 208 (2006).

D.-H. Kim et al., *Proc. Natl. Acad. Sci. U.S.A.* 105, 18675 (2008).

J. Yoon et al., *Nat. Mater.* 7, 907 (2008).

M. Tamura et al., *Jpn. J. Appl. Phys.* 37, 3576 (1998).

E. F. Schubert, *Light-Emitting Diodes* P. 43, (Cambridge Univ. Press, Cambridge, UK, 2003).

C. L. Chen et al., *Appl. Phys. Lett.* 48, 535 (1986).

G. Stareev, *Appl. Phys. Lett.* 62, 2801 (1993).

D. P. Bour et al., *IEEE J. Quantum Electron.* 30, 593 (1994).

F. H. Pollak, *Surf. Sci.* 37, 863 (1973).

M. Chandrasekhar, F. H. Pollak, *Phys. Rev. B* 15, 2127 (1977).

S. H. Pan et al., *Phys. Rev. B* 38, 3375 (1988).

H. Jiang et al., *Proc. Natl. Acad. Sci. U.S.A.* 104, 15607 (2007).

D. S. Gray, J. Tien, C. S. Chen, *Adv. Mater.* 16, 393 (2004).

F. Axisa, F. Bossuyt, T. Vervust, J. Vanfleteren, $2^{nd}$ Electronics System-integration Technology Conference (ESTC 2008), 1387, Greenwich, UK, 1 to 4 Sep. 2008.

D. Khang, H. Jiang, Y. Huang, and J. A. Rogers, *Science* 311, 208 (2006).

D. Kim, J. Ahn, W. Choi, H. Kim, T. Kim, J. Song, Y. Y. Huang, Z. Liu, C. Lu, and J. A. Rogers, *Science* 320, 507 (2008).

T. Kim, W. Choi, D. Kim, M. A. Meitl, E. Menard, H. Jiang, J. A. Carlisle, and J. A. Rogers, *Adv. Mater.* 20, 2171 (2008).

H. Ko, M. P. Stoykovich, J. Song, V. Malyarchuk, W. Choi, C. Yu, J. B. Geddes, J. Xiao, S. Wang, Y. Huang, and J. A. Rogers, *Nature* 454, 748(2008).

H. O. Jacobs, A. R. Tao, A. Schwartz, D. H. Gracias, and G. M. Whitesides, *SCIENCE* 296, 323 (2002).

S. A. Stauth and Parviz B A, *Proc. Natl. Acad. Sci. USA* 103, 13922 (2006).

J. Ahn, H. Kim, K. Lee, S. Jeon, S. Kang, Y. Sun, R. G. Nuzzo, and J. A. Rogers, *Science* 314, 1754 (2006).

S. Kang, C. Kocabas, T. Ozel, M. Shim, N. Pimparkar, M. A. Alam, S. V. Rotkin, and J. A. Rogers, *Nat. Nanotechnol.* 2, 230 (2007).

A. Javey, S. Nam, R. S. Friedman, H. Yan, and C. M. Lieber, *Nano Lett.* 7, 773 (2007).

Z. Fan, H. Razavi, J. Do, A. Moriwaki, O. Ergen, Y. Chueh, P. W. Leu, J. C. Ho, T. Takahashi, L. A. Reichertz, S. Neale, K. Yu, M. Wu, J. W. Ager, and A. Javey, *Nat. Mater.* 8, 648 (2009).

Y. G. Sun and J. A. Rogers, *Nano Lett.* 4, 1953 (2004).

M. A. Meitl, Z. T. Zhu, V. Kumar, L. J. Lee, X. Feng, Y. Y. Huang, I. Adesida, R. G. Nuzzo, and J. A. Rogers, *Nat. Mater.* 5, 33 (2006).

Z. Fan, J. C. Ho, Z. A. Jacobson Z A, R. Yerushalmi, R. L. Alley, H. Razavi H, and A. Javey, *Nano Lett.* 8, 20 (2008).

K. Lee, M. J. Motala, M. A. Meitl, W. R. Childs, E. Menard, J. A. Rogers, R. G. Nuzzo and A. Shim, *Adv. Mater.* 17, 2332 (2005).

W. Zheng, J. Chung, H. O. Jacobs, *J. Microelectromech. Syst.* 15, 864 (2006).

S. A. Stauth, B. A. Parviz, *Proc. Natl. Acad. Sci. USA* 103, 13922 (2006).

G. M. Whitesides and M. Boncheva, *Proc. Natl. Acad. Sci. USA* 99, 4769 (2002).

J. B. Pan, G. L. Tonkay, and A. Quintero, *J. Electronics Manufacturing* 9, 203 (1999).

W. Chang, T. Fang, H. Lin, Y. Shen, and Y. Lin, *J. Display Technol.* 5, 178 (2009).

E. Tekin, P. J. Smith, and U. S. Schubert, *Soft Matter* 4, 703 (2008).

E. Menard, M. A. Meitl, Y. Sun, J. Park, D. J. L. Shir, Y. Nam, S. Jeon, and J. A. Rogers, *Chem. Rev.* 107, 1117 (2007).

J. Park, M. Hardy, S. Kang, K. Barton, K. Adair, D. K. Mukhopadhyay, C. Y. Lee, M. S. Strano, A. G. Alleyne, J. G. Georgiadis, P. M. Ferreira, and J. A. Rogers, *Nature Mater.* 6, 782 (2007).

T. Sekitani, Y. Noguchi, U. Zschieschang, H. Klauk H, and T. Someya, *Proc. Natl. Acad. Sci. USA* 105, 4976 (2008).

B. Y. Ahn, E. B. Duoss, M. J. Motala, X. Guo, S. Park, Y. Xiong, J. Yoon, R. G. Nuzzo, J. A. Rogers, and J. A. Lewis, *Science* 323, 1590 (2009).

Y. Xia, J. A. Rogers, K. E. Paul and G. M. Whitesides, *Chem. Rev.* 99, 1823 (1999).

S. Park, Y. Xiong, R. Kim, P. Elvikis, M. Meitl, D. Kim, J. Wu, J. Yoon, C. Yu, A. Liu, Y. Huang, K. Hwang, P. Ferreira, X. Li, K. Choquette, and J. A. Rogers, *Science* 325, 977 (2009).

J. Yoon, A. J. Baca, S.-I. Park, P. Elvikis, J. B. Geddes, L. Li, R. H. Kim, J. Xiao, S. Wang, T. H. Kim, M. J. Motala, B. Y. Ahn, E. B. Duoss, J. A. Lewis, R. G. Nuzzo, P. M. Ferreira, Y. Huang, A. Rockett, and J. A. Rogers, *Nature Mater.* 7, 907 (2008).

F. Hua, A. Gaur, Y. Sun, M. Word, N. Jin, I. Adesida, M. Shim, A. Shim, and J. A. Rogers, *IEEE Trans. Nanotechnol.* 5, 301 (2006).

K. Murata, J. Matsumoto, A. Tezuka, Y. Matsuba, and H. Yokoyama, *Microsyst. Techchnol.* 12, 2 (2005).

D. Kim, S. Jeong, S. Lee, B. Park, and J. Moon, *Thin Solid Films* 515, 7692 (2007).

E. Menard, L. Bilhaut, J. Zaumseil, and J. A. Rogers, *Langmuir* 20, 6871 (2004).

H. Schmid, H. Wolf, R. Allenspach, H. Riel, S. Karg, B. Michel, and E. Delamarche, *Adv. Fund. Mater.* 13, 145 (2003).

J.-U. Park et al, Nature Materials, 6, 782 (2007)

B. Y. Ahn et al, Science, 323, 1590 (2009)

We claim:

1. An electronic device, comprising:
   a handle substrate comprising an adhesion layer; and
   a semiconductor epilayer bonded to the handle substrate by way of the adhesion layer,
   wherein the handle substrate comprises a material different from the semiconductor epilayer;
   wherein the semiconductor epilayer has an exposed contact surface on a side of the semiconductor epilayer opposite the handle substrate;
   wherein the exposed contact surface is patterned with a mask to form exposed regions and one or more masked regions of the exposed contact surface; and
   wherein the exposed regions have removed material undercutting the semiconductor epilayer, generating one or more at least partially released suspended semiconductor structures supported by anchors on the handle substrate, wherein the anchors are heterogeneous anchors made of a different material from the semiconductor epilayer.

2. The electronic device of claim 1, wherein the semiconductor epilayer is a GaN epilayer and the GaN epilayer is a multi-layer comprising at least one p-doped GaN semiconductor layer in electrical contact with at least one n-doped GaN semiconductor layer.

3. The electronic device of claim 1, wherein the one or more semiconductor structures are LED device structures.

4. The electronic device of claim 1, wherein the semiconductor epilayer is a first semiconductor epilayer, and comprising a second semiconductor epilayer bonded to the handle substrate, and wherein the first semiconductor epilayer is bonded to the second semiconductor epilayer so that the second semiconductor epilayer is disposed between the handle substrate and the first semiconductor epilayer and the first semiconductor epilayer is bonded to the handle substrate by means of the second semiconductor epilayer.

5. The method of claim 1, wherein the semiconductor epilayer is selected from the group consisting of: a GaN layer, an InGaN layer, a GaAsN layer, an AlGaN layer, an AlGaAsN layer, a GaAs layer, an InGaAs layer, an AlGaAs layer, an AlGaAsP layer, a GaAsSbN layer and an InN layer; and wherein said growth substrate is selected from the group consisting of: sapphire, Si (111), SiC, ZnO, Si (100), MgAl2O4(100), MgAl2O4 (111), A-plane sapphire, M-plane sapphire, AlN, MnO, ZrB2, LiGaO2, (La,Sr)(Al,Ta)O3, LiAlO2, GaAs and InP.

6. The method of claim 1, wherein the semiconductor epilayer has a thickness selected from the range of 1 μm to 5 μm.

7. The method of claim 1, wherein the semiconductor epilayer is a multilayer comprising a plurality of semiconductor layers having different compositions, doping or both.

8. The method of claim 7, wherein the semiconductor epilayer is a multilayer comprising at least one p-type semiconductor layer in electrical contact with at least one n-type semiconductor layer.

9. The method of claim 7, wherein the multilayer comprises a plurality of LED device layers selected from the group consisting of: contact layers, spreader layers, cladding layers and barrier layers.

10. The method of claim 7, wherein the multilayer comprises a plurality of GaN layers having different doping, thicknesses or both.

11. The method of claim 7, wherein the multilayer comprises at least one p-type GaN layer in electrical contact with at least one n-type GaN layer.

12. The method of claim 7, wherein the multilayer comprises a plurality of GaN layers selected from the group consisting of: InGaN, GaN, AlGaN, GaN:Mg, GaN:Si, GaN:AlN and GaN:ZnO.

13. The method of claim 7, wherein the multilayer comprises a plurality of GaN layers corresponding to a vertical type GaN LED.

* * * * *